United States Patent
Tazawa et al.

(10) Patent No.: US 11,130,299 B2
(45) Date of Patent: Sep. 28, 2021

(54) LENS-ATTACHED SUBSTRATE, STACKED LENS STRUCTURE, CAMERA MODULE, AND MANUFACTURING APPARATUS AND METHOD

(71) Applicant: SONY SEMICONDUCTOR SOLUTIONS CORPORATION, Kanagawa (JP)

(72) Inventors: Hiroshi Tazawa, Kanagawa (JP); Toshihiro Kurobe, Kanagawa (JP); Sotetsu Saito, Tokyo (JP); Hiroyasu Matsugai, Kanagawa (JP); Hiroyuki Itou, Kanagawa (JP); Suguru Saito, Kanagawa (JP); Keiji Ohshima, Tokyo (JP); Nobutoshi Fujii, Kanagawa (JP); Toshiaki Shiraiwa, Kanagawa (JP); Minoru Ishida, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 296 days.

(21) Appl. No.: 15/741,335

(22) PCT Filed: Jul. 15, 2016

(86) PCT No.: PCT/JP2016/003352
§ 371 (c)(1),
(2) Date: Jan. 2, 2018

(87) PCT Pub. No.: WO2017/022190
PCT Pub. Date: Feb. 9, 2017

(65) Prior Publication Data
US 2018/0196170 A1    Jul. 12, 2018

(30) Foreign Application Priority Data
Jul. 31, 2015   (JP) ............................. JP2015-152918

(51) Int. Cl.
*B29D 11/00*         (2006.01)
*G02B 3/00*          (2006.01)
(Continued)

(52) U.S. Cl.
CPC .. *B29D 11/00307* (2013.01); *B29D 11/00375* (2013.01); *G02B 3/0062* (2013.01);
(Continued)

(58) Field of Classification Search
CPC .......................... B29C 43/18; B29D 11/00307
See application file for complete search history.

(56) References Cited

U.S. PATENT DOCUMENTS

| 2009/0109515 | A1  | 4/2009 | Pan |
| 2009/0159200 | A1* | 6/2009 | Rossi ................. H04N 5/2257 |
| | | | 156/292 |

(Continued)

FOREIGN PATENT DOCUMENTS

| CN | 102169198 | 8/2011 |
| EP | 1251365   | 10/2002 |

(Continued)

OTHER PUBLICATIONS

International Search Report and Written Opinion prepared by the European Patent Office dated Dec. 5, 2016, for International Application No. PCT/JP2016/003352.

(Continued)

*Primary Examiner* — Philip C Tucker
*Assistant Examiner* — John Blades
(74) *Attorney, Agent, or Firm* — Sheridan Ross P.C.

(57) ABSTRACT

To suppress occurrence of contamination or damage to a lens. In the present technology, for example, a manufacturing apparatus allows a spacer which is thicker than a height of a lens resin portion protruded from a substrate to be adhered to the substrate. In addition, for example, in the (Continued)

present technology, the manufacturing apparatus molds the lens resin portion inside a through-hole formed in the substrate by using a mold frame configured with two layers of molds and, after molding the lens resin portion, in the state that one mold is adhered to the substrate, the manufacturing apparatus demolds the substrate from the other mold. The present technology can be applied to, for example, a lens-attached substrate, a stacked lens structure, a camera module, a manufacturing apparatus, a manufacturing method, an electronic apparatus, a computer, a program, a storage medium, a system, or the like.

8 Claims, 92 Drawing Sheets

(51) Int. Cl.
*H01L 27/146* (2006.01)
*B29C 43/18* (2006.01)
*B29C 43/50* (2006.01)

(52) U.S. Cl.
CPC .............. *B29C 43/18* (2013.01); *B29C 43/50* (2013.01); *B29D 11/00865* (2013.01); *G02B 3/0068* (2013.01); *H01L 27/14618* (2013.01); *H01L 27/14625* (2013.01); *H01L 27/14627* (2013.01)

(56) References Cited

U.S. PATENT DOCUMENTS

| | | |
|---|---|---|
| 2009/0309176 A1 | 12/2009 | Akram et al. |
| 2009/0323206 A1* | 12/2009 | Oliver .................. G02B 3/0012 359/776 |
| 2010/0079635 A1 | 4/2010 | Yano et al. |
| 2011/0211105 A1 | 9/2011 | Yamada et al. |
| 2012/0081801 A1* | 4/2012 | Duparre .......... B29D 11/00307 359/811 |
| 2013/0048208 A1 | 2/2013 | Lin et al. |

FOREIGN PATENT DOCUMENTS

| | | |
|---|---|---|
| EP | 2485070 | 8/2012 |
| JP | 2010-204642 | 9/2010 |
| JP | 2011-138089 | 7/2011 |
| JP | 2011-180292 | 9/2011 |
| WO | WO 2009/158105 | 12/2009 |
| WO | WO 2010/041579 | 4/2010 |
| WO | WO 2010/050290 | 5/2010 |
| WO | WO 2010/139343 | 12/2010 |

OTHER PUBLICATIONS

Official Action (with English translation) for Chinese Patent Application No. 201680039466.X, dated Jul. 3, 2019, 14 pages.

* cited by examiner

FIG. 5
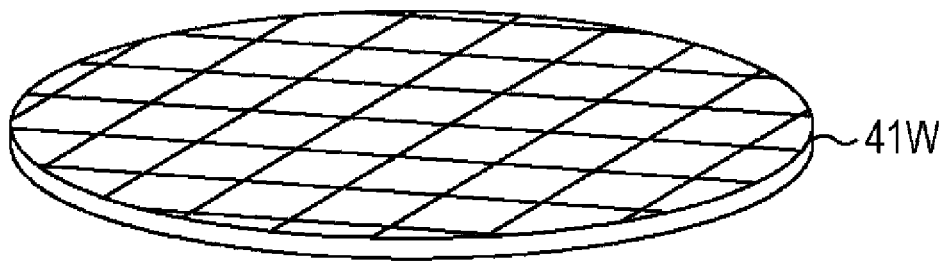
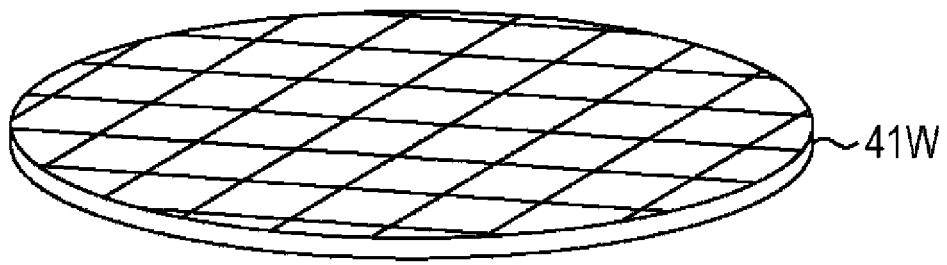
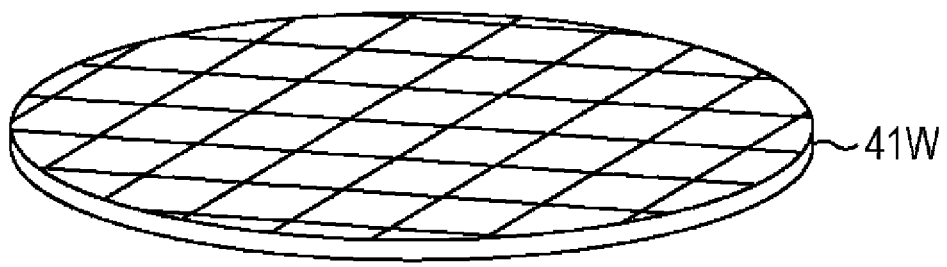
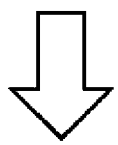
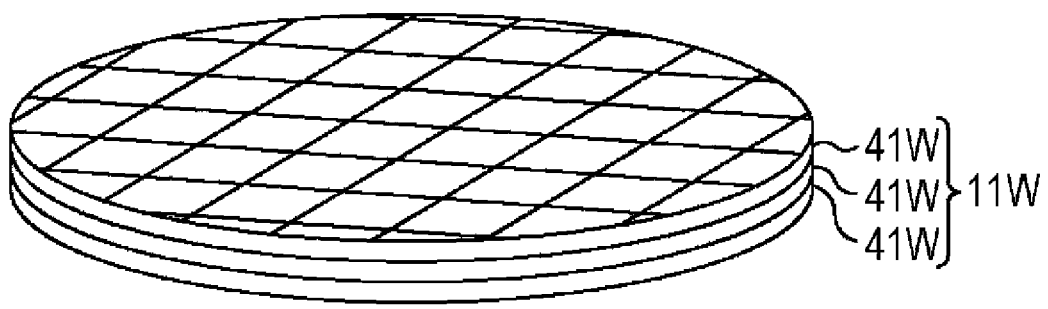

FIG. 20
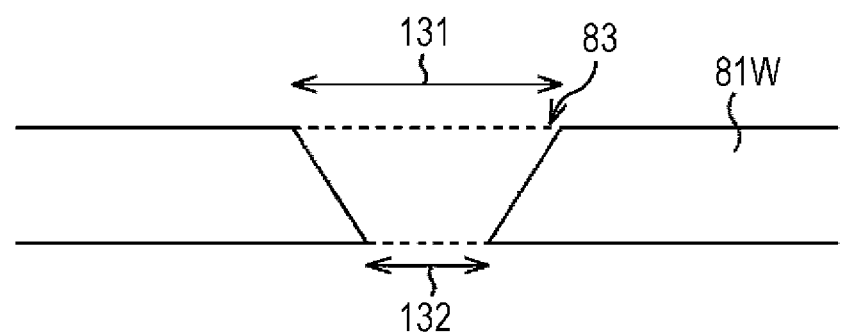
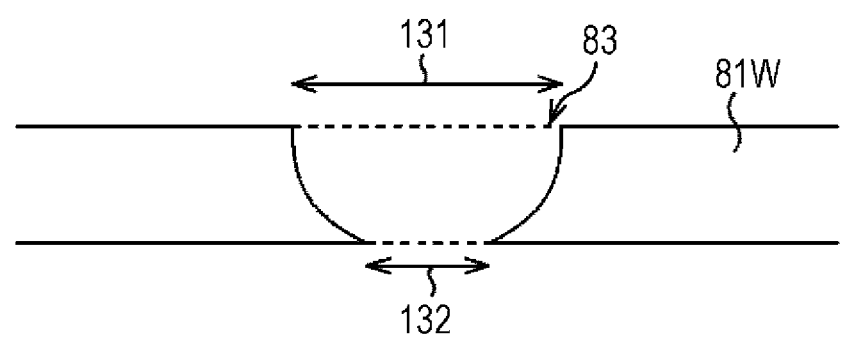
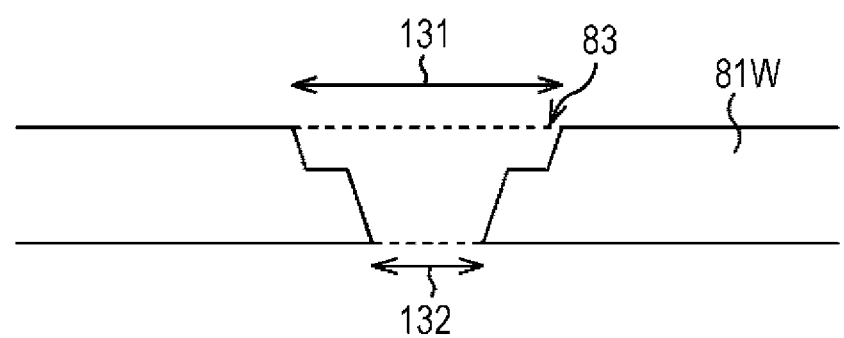

FIG. 31
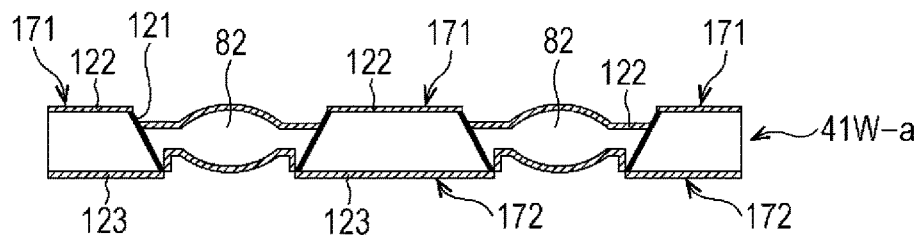
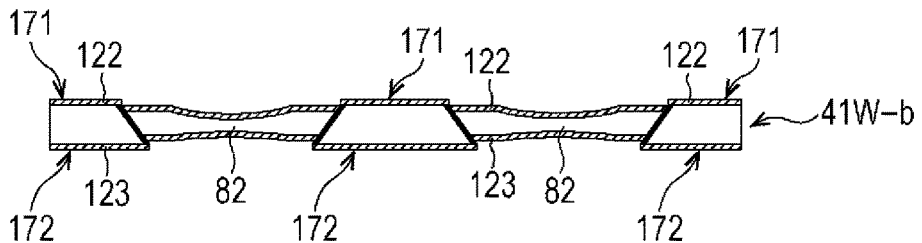
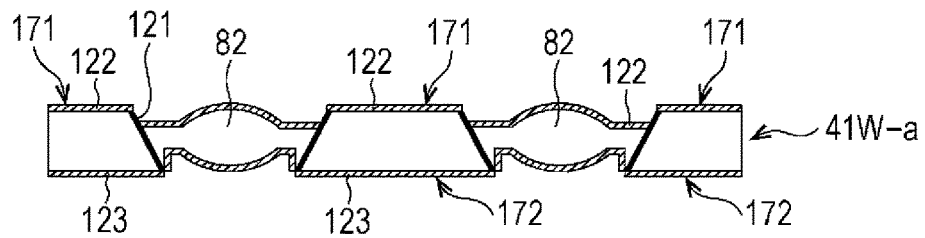
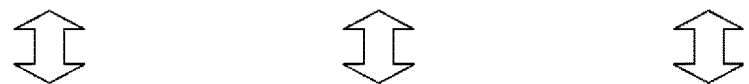
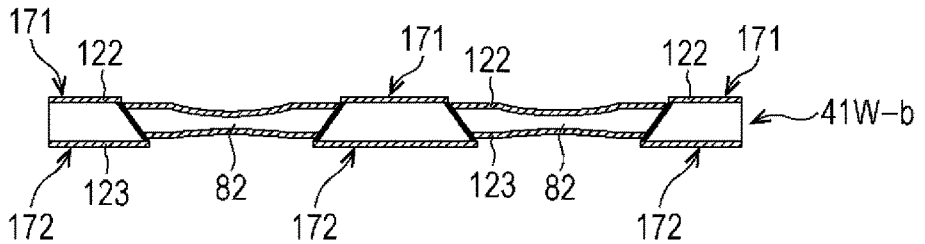

FIG. 40
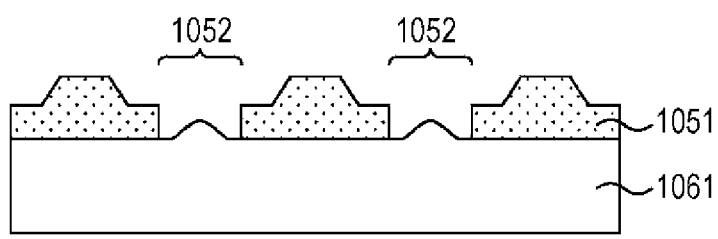
A
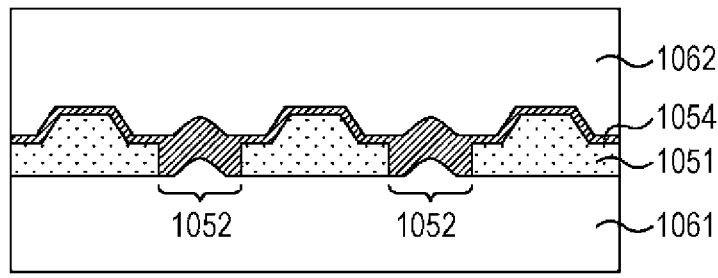
B
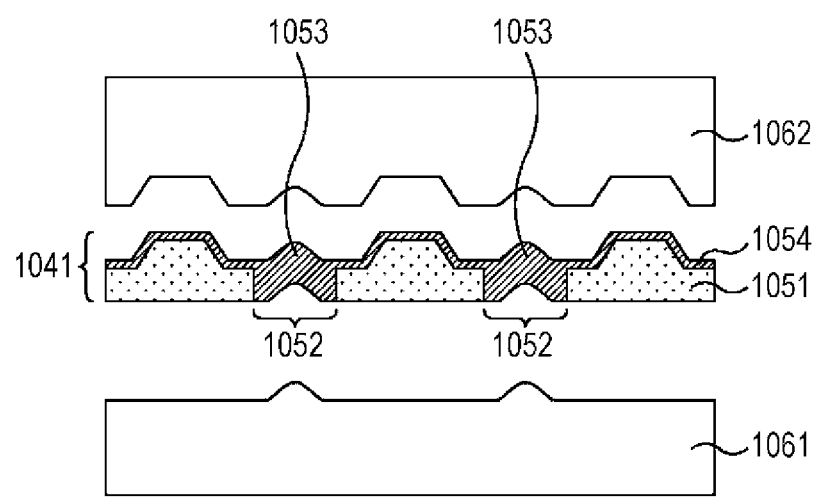
C

FIG. 46
A
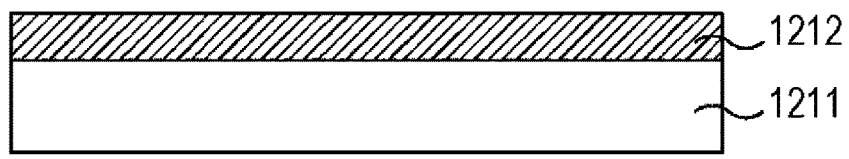
B
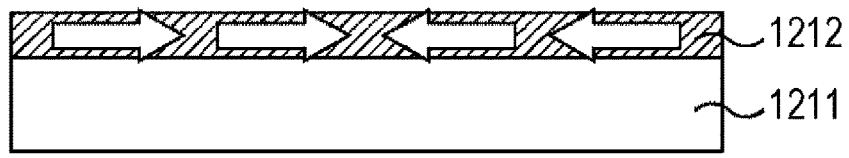
C
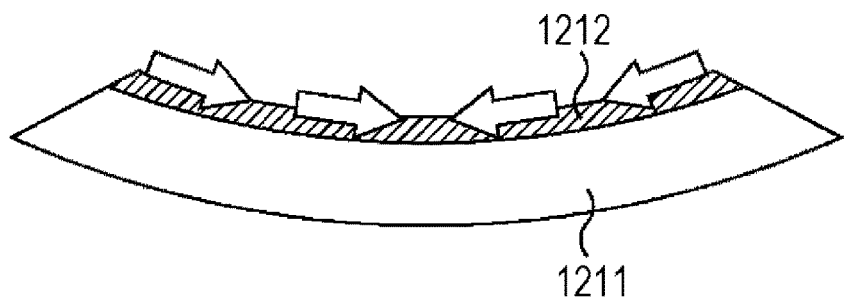

FIG. 47
A
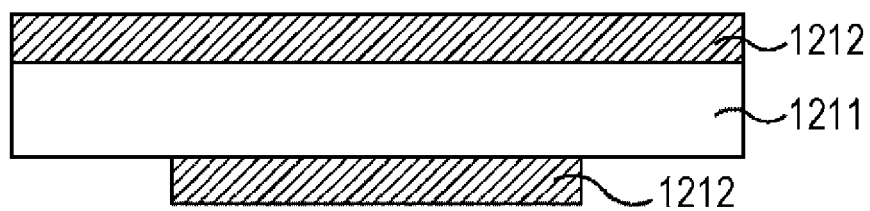
B
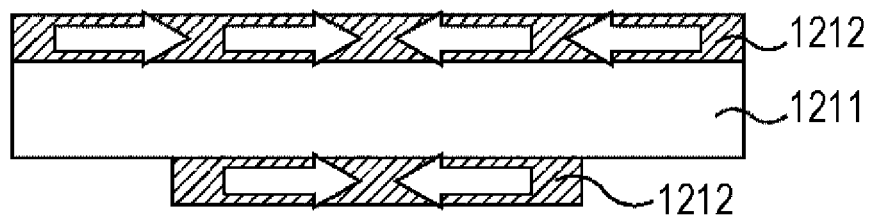
C
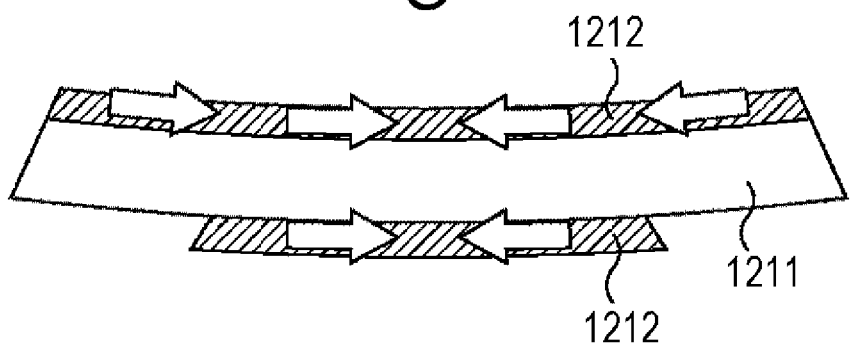

FIG. 48
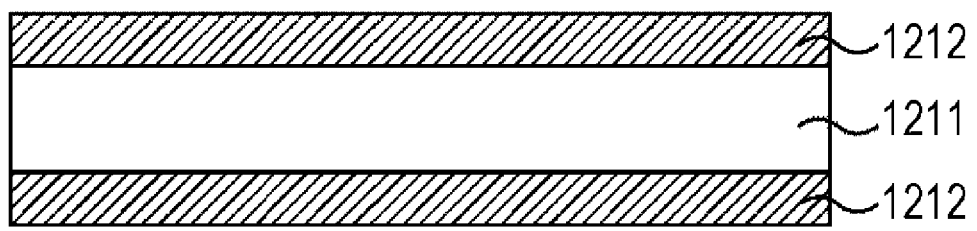
A
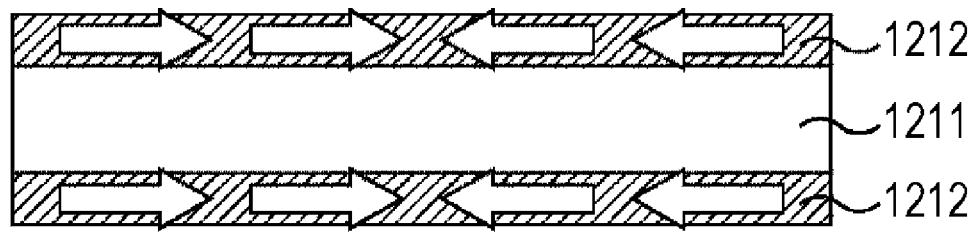
B
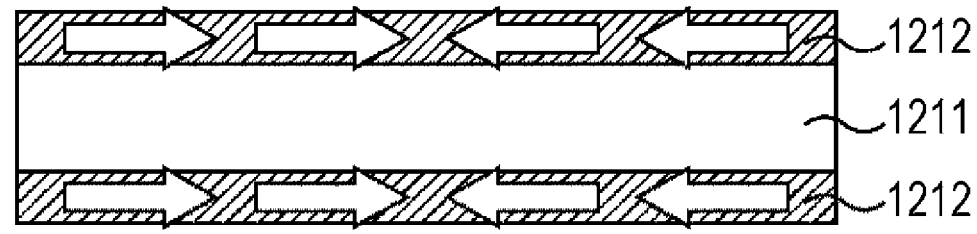
C

FIG. 69
A
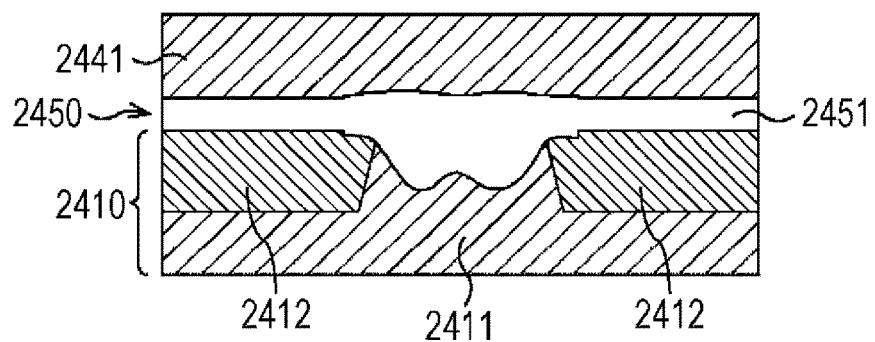
B
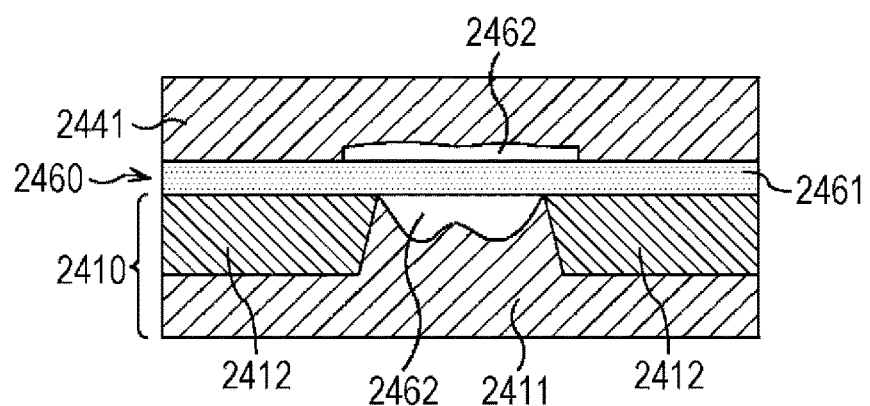
C
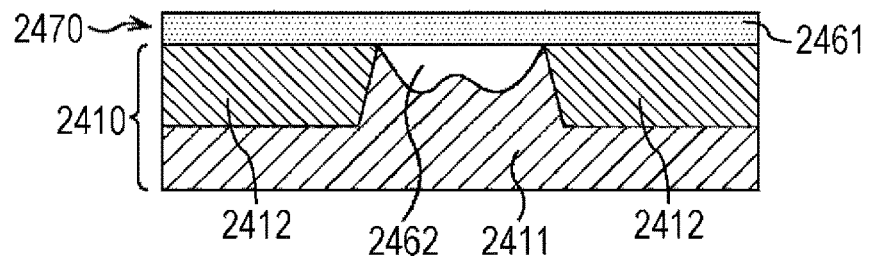

FIG. 74
A
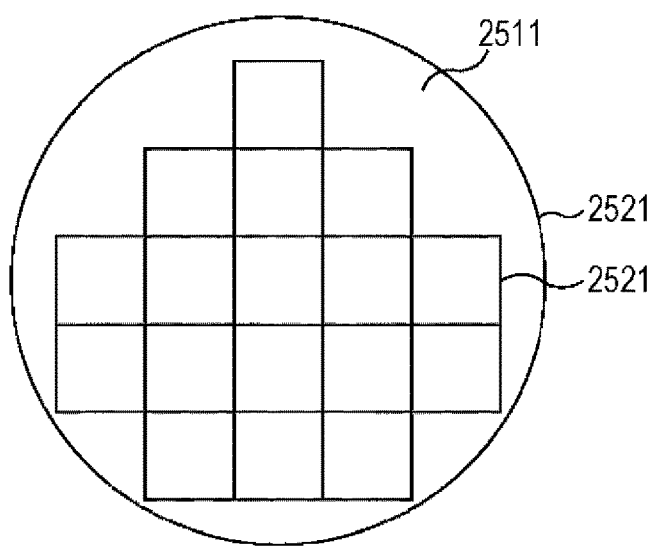
B
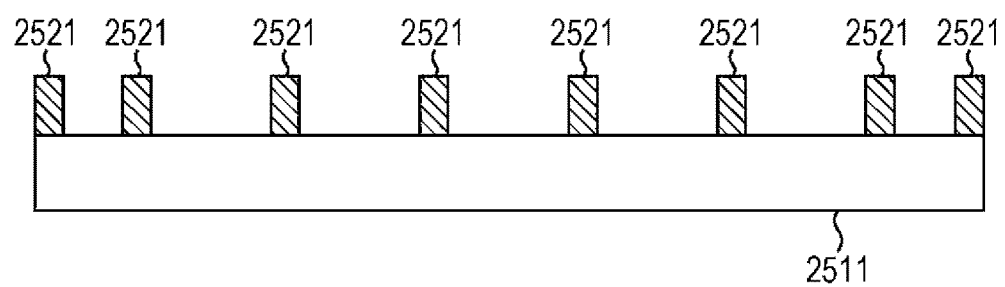

FIG. 77
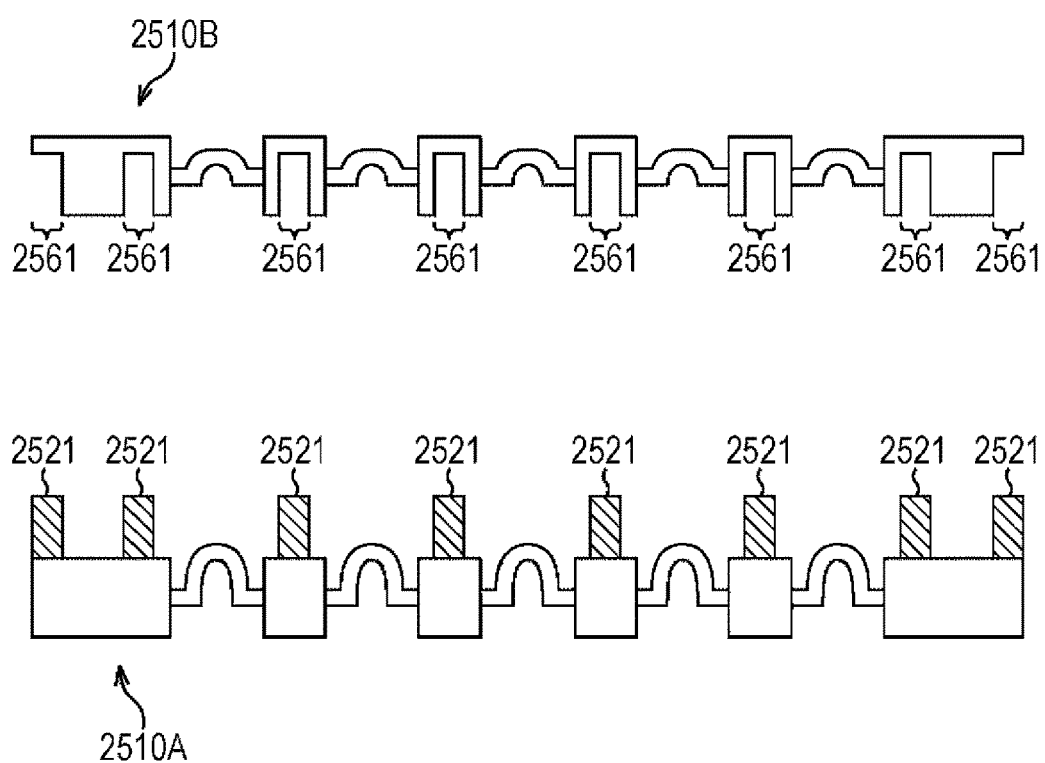
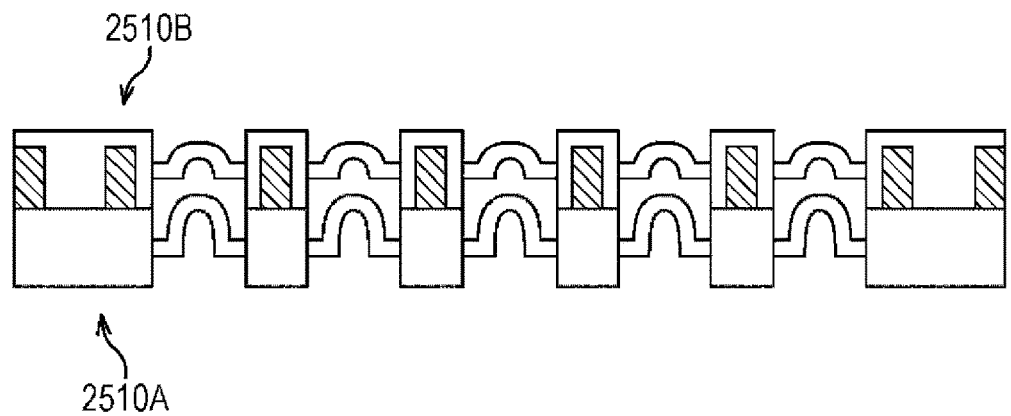

FIG. 78
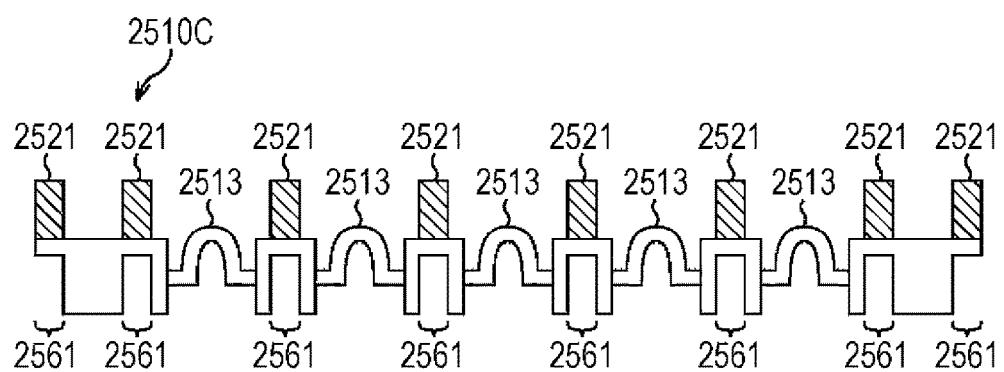
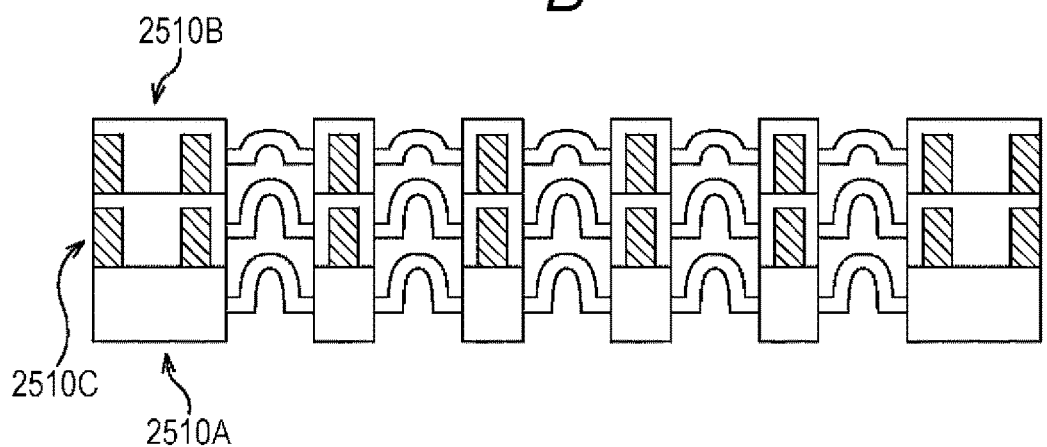

FIG. 83
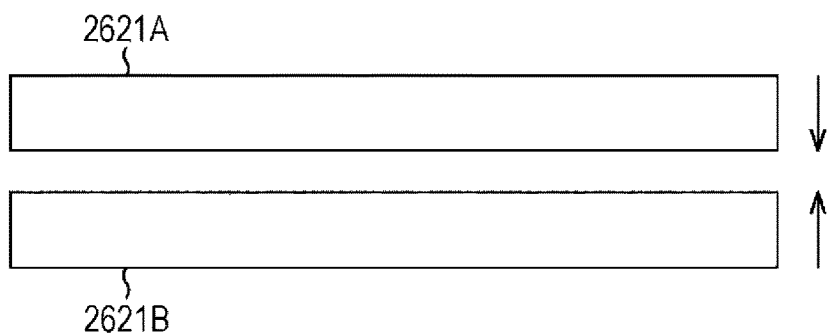
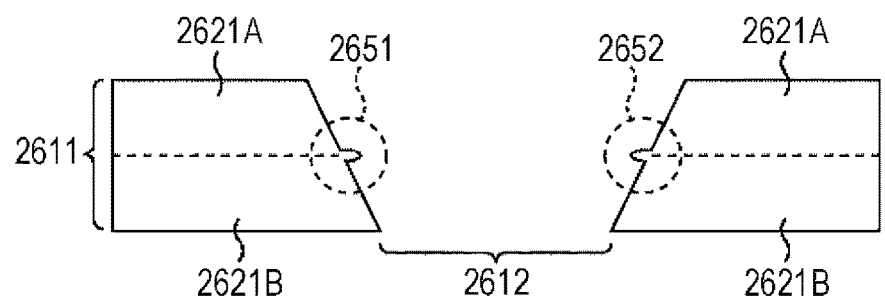
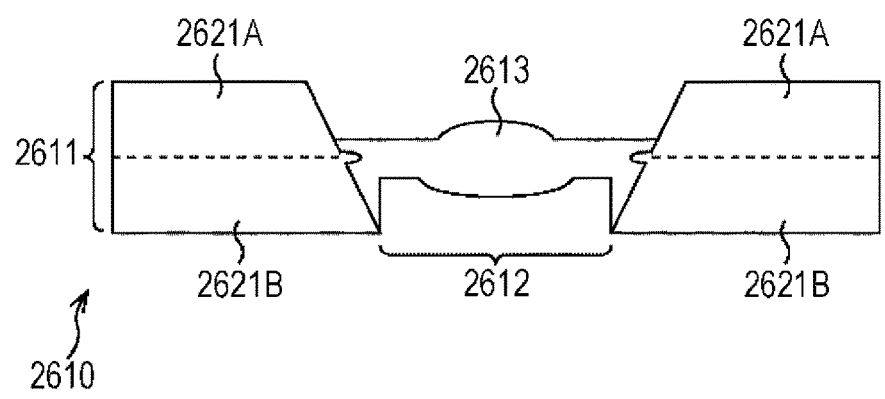

FIG. 87
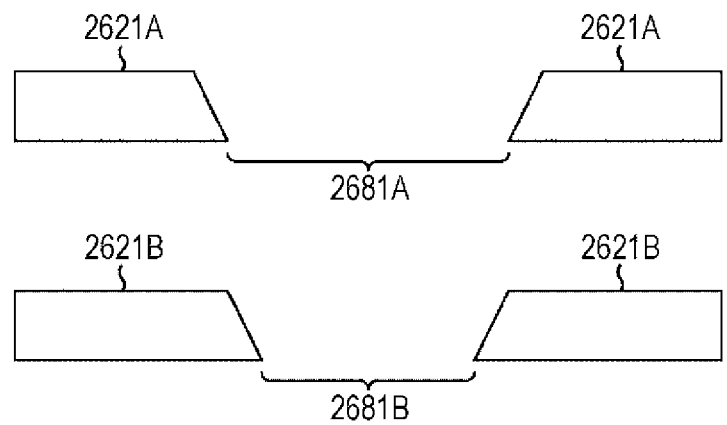
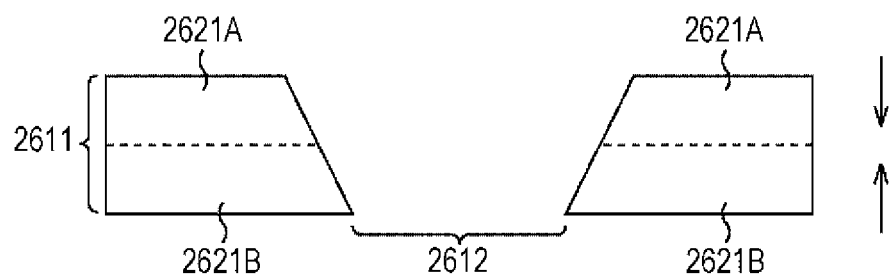
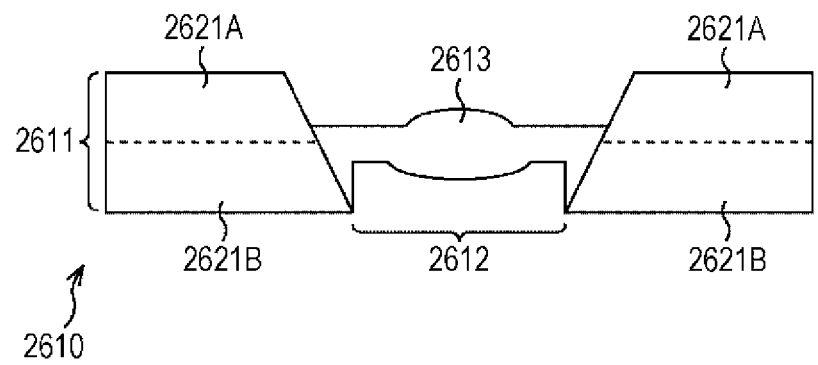

LENS-ATTACHED SUBSTRATE, STACKED LENS STRUCTURE, CAMERA MODULE, AND MANUFACTURING APPARATUS AND METHOD

CROSS-REFERENCE TO RELATED APPLICATIONS

This application is a national stage application under 35 U.S.C. 371 and claims the benefit of PCT Application No. PCT/JP2016/003352 having an international filing date of 15 Jul. 2016, which designated the United States, which PCT application claimed the benefit of Japanese Priority Patent Application JP 2015-152918 filed on Jul. 31, 2015, the entire contents of which are incorporated herein by reference.

TECHNICAL FIELD

The resent technology relates to a lens-attached substrate, a stacked lens structure, a camera module, and a manufacturing apparatus and method, and more particularly, to a lens-attached substrate having a lens formed therein, a stacked lens structure, a camera module, and a manufacturing apparatus and method which can be used for manufacturing electronic devices such as a semiconductor device or a flat panel display device.

BACKGROUND ART

In a wafer-level lens process of arranging a plurality of lenses in planar directions of a wafer substrate, requirements for shape accuracy and position accuracy at the time of forming the lenses are strict. Particularly, a degree of difficulty of a process of manufacturing a stacked lens structure by stacking wafer substrates is very high, and in a mass production level, stacking of three or more layers has not been realized.

With respect to the wafer-level lens process, up to now, various techniques have been contrived and proposed. For example, in the related art, a hybrid type wafer lens which is formed on a glass substrate, a monolithic type wafer lens formed with only a resin material, and the like have been proposed. In addition, PTL 1 discloses a method of forming a lens in a through-hole of a substrate.

CITATION LIST

Patent Literature

PTL 1: JP 2011-180292 A

SUMMARY OF INVENTION

Technical Problem

However, in case of the method disclosed in PTL 1, there is a possibility that a lens protrudes from the substrate (through-hole) according to a shape of the lens. In this case, at the time of transporting the substrate or in a following-stage manufacturing process such as thin film formation, the lens may be in contact with a manufacturing apparatus, a mounting stage, or the like, and thus, there is a possibility of causing contamination or damage to the lens.

The present technology has been proposed in view of the foregoing, and it is desirable to suppress the occurrence of contamination or damage to a lens in a manufacturing process or the like.

Solution to Problem

According to an embodiment of the present disclosure, there is provided a method of manufacturing a lens substrate, the method comprising: providing a substrate that includes a through-hole with a lens portion formed therein, wherein the lens portion protrudes from the substrate; and adhering a spacer to the substrate, wherein a thickness of the spacer is greater than a height of the lens portion protruding from the substrate.

According to an embodiment of the present disclosure, there is provided a method of manufacturing a substrate including a lens, the method comprising: forming a through-hole in the substrate; forming a lens portion in the through-hole of the substrate, the lens portion having a protruding portion that protrudes from the substrate; and adhering a spacer to the substrate, wherein a thickness of the spacer is greater than a height of the lens portion protruding from the substrate.

According to an embodiment of the present disclosure, there is provided a method of manufacturing a lens substrate, the method comprising: providing a substrate that includes a through-hole with lens material disposed therein; molding the lens material into a lens portion using a mold frame, wherein a first portion of the mold frame contacts the lens material and a second portion of the mold frame adheres to a side of the substrate; and after molding the lens material into the lens portion, disengaging the first portion of the mold frame from the lens portion.

According to an embodiment of the present disclosure, there is provided a method of manufacturing a camera module including a stacked lens structure and a sensor substrate including an optical sensor, the method comprising: providing a substrate that includes a through-hole with a lens portion formed therein, wherein the lens portion protrudes from the substrate; adhering a spacer to the substrate, wherein a thickness of the spacer is greater than a height of the lens portion protruding from the substrate; removing the spacer from the substrate; stacking and bonding a plurality of lens substrates to form the stacked lens structure, wherein each lens substrate of the plurality of lens substrates includes a through-hole with a lens portion formed therein; and stacking and bonding the stacked lens structure and the sensor substrate.

According to an embodiment of the present disclosure, there is provided a method of manufacturing a camera module including a stacked lens structure and a sensor substrate including an optical sensor, the method comprising: providing a substrate that includes a through-hole with lens material disposed therein; molding the lens material into a lens portion using a mold frame, wherein a first portion of the mold frame contacts the lens material and a second portion of the mold frame adheres to a side of the substrate; after molding the lens material into the lens portion, disengaging the first portion of the mold frame from the lens portion; removing the second portion of the mold frame from the side of the substrate; stacking and bonding a plurality of lens substrates to form the stacked lens structure, wherein each lens substrate of the plurality of lens substrates includes a through-hole with a lens portion formed therein; and stacking and bonding the stacked lens structure and the sensor substrate.

According to an embodiment of the present disclosure, there is provided a lens substrate comprising: a substrate including a through-hole and a convex portion formed on a light-incidence-side surface of the substrate or a light-emitting-side surface of the substrate; and a lens portion formed at an inner side of the through-hole, wherein part of the lens portion protrudes from the through-hole with a height which is lower than a height of the convex portion.

According to an embodiment of the present disclosure, there is provided a stacked lens structure including a plurality of stacked lens substrates, each lens substrate of the plurality of stacked lens substrates comprising: a substrate including a through-hole and a convex portion formed on a light-incidence-side surface of the substrate or a light-emitting-side surface of the substrate; and a lens portion formed at an inner side of the through-hole, wherein part of the lens portion protrudes from the through-hole and has a height which is lower than a height of the convex portion.

According to an embodiment of the present disclosure, there is provided a camera module comprising: a stacked lens structure including a plurality of stacked lens substrates, each lens substrate of the plurality of stacked lens substrates including: a substrate including a through-hole and a convex portion formed on a light-incidence-side surface of the substrate or a light-emitting-side surface of the substrate, and a lens portion formed at an inner side of the through-hole, wherein part of the lens portion protrudes from the through-hole and has a height which is lower than a height of the convex portion; and an optical sensor formed on a sensor substrate, wherein the sensor substrate and the stacked lens structure are stacked.

According to an embodiment of the present disclosure, there is provided a method of manufacturing a lens substrate, the method comprising: forming a convex portion on a light-incidence-side surface of a substrate or a light-emitting-side surface of the substrate; forming a through-hole in the substrate; and forming a lens portion at an inner side of the through-hole so that a portion thereof protrudes from the through-hole with a height which is lower than a height of the convex portion.

According to an embodiment of the present disclosure, there is provided a method of manufacturing a stacked lens structure, the method comprising: forming a convex portion on a light-incidence-side surface of a lens substrate or a light-emitting-side surface of the lens substrate, forming a through-hole in the substrate forming a lens portion at an inner side of the through-hole so that a portion thereof protrudes from the through-hole with a height which is lower than a height of the convex portion; and stacking and bonding a plurality of lens substrates to form a stacked lens structure, wherein each lens substrate of the plurality of lens substrates includes a through-hole with a lens portion formed therein.

According to an embodiment of the present disclosure, there is provided a method of manufacturing a stacked lens structure, the method comprising: forming a convex portion on a light-incidence-side surface of a lens substrate or a light-emitting-side surface of the lens substrate, forming a through-hole in the lens substrate, forming a lens portion at an inner side of the through-hole so that a portion thereof protrudes from the through-hole with a height which is lower than a height of the convex portion, and stacking and bonding a plurality of lens substrates.

According to an embodiment of the present disclosure, there is provided a method of manufacturing a camera module including a stacked lens structure and a sensor substrate including an optical sensor, the method comprising: forming a convex portion on a light-incidence-side surface of a lens substrate or a light-emitting-side surface of the lens substrate, forming a through-hole in the lens substrate, and forming a lens portion at an inner side of the through-hole so that a portion thereof protrudes from the through-hole with a height which is lower than a height of the convex portion, and stacking and bonding a plurality of lens substrates to form a stacked lens structure, wherein each lens substrate of the plurality of lens substrates includes a through-hole with a lens portion formed therein; and stacking and bonding the stacked lens structure and the sensor substrate.

According to an embodiment of the present disclosure, there is provided a lens substrate comprising: a stacked substrate including a plurality of substrates; a through-hole formed in the stacked substrate; and a lens portion formed at an inner side of the through-hole.

According to an embodiment of the present disclosure, there is provided a stacked lens structure including a plurality of stacked lens substrates, each lens substrate of the plurality of lens substrates comprising: a stacked substrate including a plurality of substrates; a through-hole formed in the stacked substrate; and a lens portion formed at an inner side of the through-hole.

According to an embodiment of the present disclosure, there is provided a camera module including a stacked lens structure stacked on a sensor substrate, the camera module comprising: a stacked lens structure including a plurality of stacked lens substrates, each lens substrate of the plurality of lens substrates including: a stacked substrate including a plurality of substrates, a through-hole formed in the stacked substrate, and a lens portion formed at an inner side of the through-hole, wherein the sensor substrate includes an optical sensor.

According to an embodiment of the present disclosure, there is provided a method of manufacturing a lens substrate, the method comprising: stacking and adhering a plurality of substrates thereby forming a stacked substrate; forming a through-hole in the stacked substrate; and forming a lens portion in the through-hole.

According to an embodiment of the present disclosure, there is provided a method of manufacturing a stacked lens structure including a lens substrate, comprising: stacking and adhering a plurality of substrates, forming a lens portion in a through-hole formed in a stacked substrate where a plurality of the substrates are stacked and adhered, and stacking and bonding a plurality of lens substrates to form a stacked lens structure.

According to an embodiment of the present disclosure, there is provided a method of manufacturing a camera module including a stacked lens structure and a sensor substrate including an optical sensor, the method comprising: stacking and adhering a plurality of substrates, forming a lens portion in a through-hole formed in a stacked substrate where a plurality of the substrates are stacked and adhered, and stacking and bonding a plurality of lens substrates thereby forming a stacked lens structure, wherein each lens substrate of the plurality of lens substrates includes a through-hole with a lens portion formed therein; and stacking and bonding the stacked lens structure and the sensor substrate.

BRIEF DESCRIPTION OF DRAWINGS

FIG. 5 is a diagram illustrating a process of forming a camera module of FIG. 1.

FIG. 20 is a diagram for explaining a manufacturing method for a lens-attached substrate.

FIG. 31 is a diagram for explaining joining of substrate-state lens-attached substrates.

FIG. 40 is a diagram for explaining a manufacturing method for the lens array substrate of FIG. 39.

FIG. 46 is a diagram for explaining an effect obtained from a resin which is to be a lens.

FIG. 47 is a diagram for explaining an effect obtained from a resin which is to be a lens.

FIG. 48 is a schematic diagram illustrating a lens array substrate as Comparative Structure Example 6.

FIG. 69 is a cross-sectional diagram for explaining another example of a wafer-level lens.

FIG. 74 is a diagram for explaining an example of a state of a manufactured lens-attached substrate.

FIG. 77 is a cross-sectional diagram illustrating an example of a configuration of a lens-attached substrate.

FIG. 78 is a cross-sectional diagram illustrating an example of a configuration of a lens-attached substrate.

FIG. 83 is a cross-sectional diagram for explaining an example of a state of a manufactured lens-attached substrate.

FIG. 87 is a cross-sectional diagram for explaining an example of a state of a manufactured lens-attached substrate.

DESCRIPTION OF EMBODIMENTS

Figure 1:
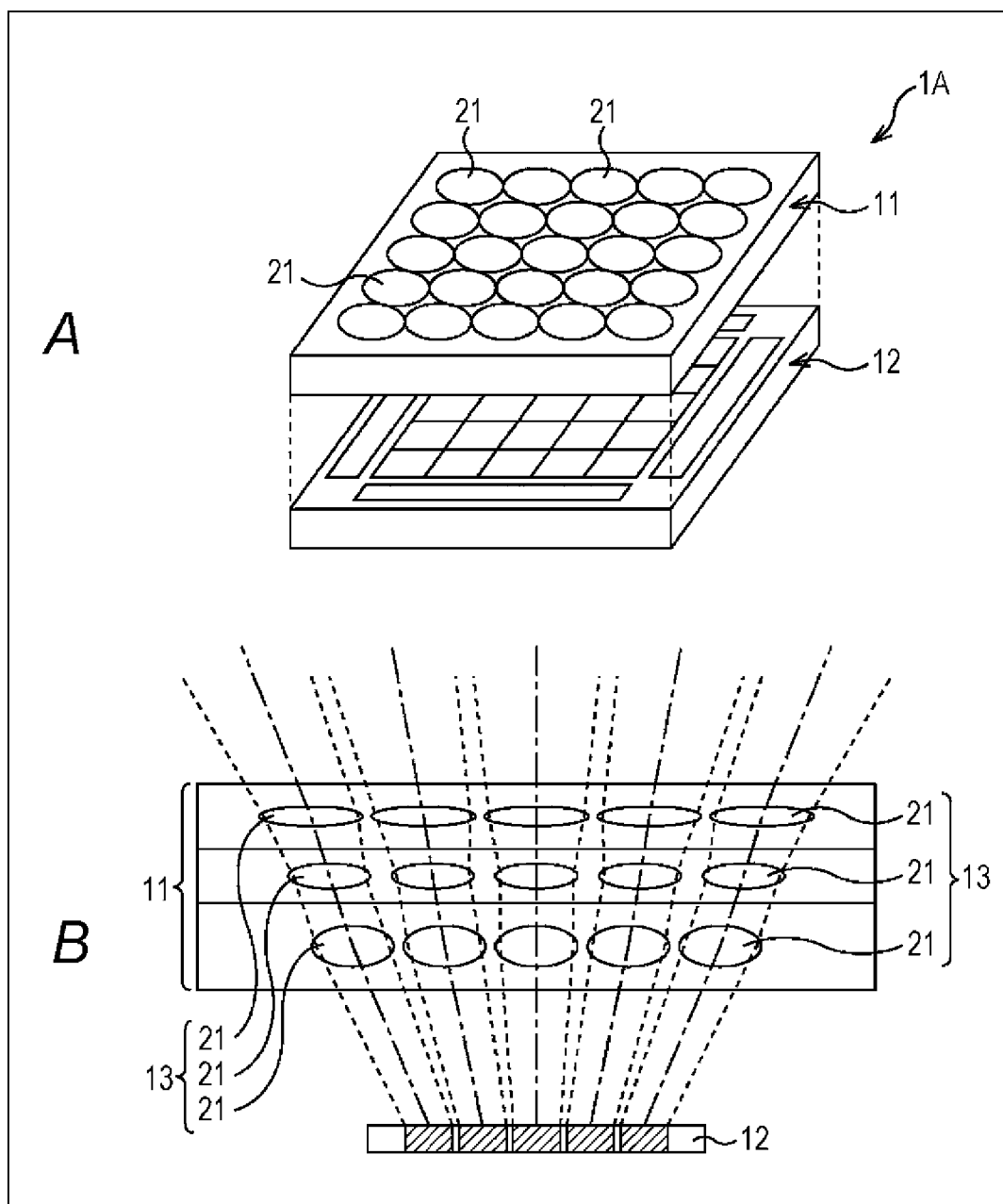
FIG. 1 is a diagram illustrating an embodiment of a camera module using a stacked lens structure employing the present technology.

Hereinafter, aspects (hereinafter, referred to embodiments) for embodying the present technology will be described. In addition, the description will be made in the following order.

1. First Embodiment of Camera Module
2. Second Embodiment of Camera Module
3. Third Embodiment of Camera Module
4. Fourth Embodiment of Camera Module
5. Fifth Embodiment of Camera Module
6. Detailed Configuration of Camera Module of Fourth Embodiment
7. Sixth Embodiment of Camera Module
8. Seventh Embodiment of Camera Module
9. Detailed Configuration of Lens-Attached Substrate
10. Manufacturing Method for Lens-Attached Substrate
11. Joining of Lens-Attached Substrates
12. Eighth and Ninth Embodiments of Camera Module
13. Tenth Embodiment of Camera Module
14. Eleventh Embodiment of Camera Module
15. Effects of Structure According to Embodiment of the Present Technology in Comparison with Other Structures
16. Other Embodiment 1
17. Other Embodiment 2
18. Other Embodiment 3
19. Other Embodiment 4
20. Example of Application to Electronic Apparatus
21. Example of Use of Image Sensor
22. Software
23. Others 1. First Embodiment of Camera Module FIGS. 1A and 1B are diagrams illustrating a first embodiment of a camera module using a stacked lens structure employing the present technology.

FIG. 1A is a schematic diagram illustrating a configuration of a camera module 1A as the first embodiment of a camera module 1. FIG. 1B is a schematic cross-sectional diagram of the camera module 1A.

The camera module 1A is configured to include a stacked lens structure 11 and a light-receiving device 12. The stacked lens structure 11 is configured to include five optical units in each of the horizontal and vertical directions, namely, to include a total of twenty-five optical units 13. The optical unit 13 is configured to a plurality of lenses 21 in one optical axis direction. The camera module 1A is a compound-eye camera module including a plurality of optical units 13.

As illustrated in FIG. 1B, optical axes of a plurality of the optical units 13 provided to the camera module 1A are disposed so as to spread toward the outside of the module, so that it is possible to capture a wide-angle image.

In addition, in FIG. 1B, for the simplification, the stacked lens structure 11 is configured as a structure where only three layers of the lenses 21 are stacked, but it is obvious that more layers of the lenses 21 are preferably stacked.

The camera module 1A of FIGS. 1A and 1B can produce one wide-angle image by joining a plurality of images captured through a plurality of optical units 13. In order to join a plurality of the images, high accuracy is preferred for formation and arrangement of each optical unit 13 capturing each image. In addition, particularly, with respect to the optical unit 13 of the wide angle side, since an incident angle of light on the lens 21 is small, high accuracy is preferred for position relationship and arrangement of each lens 21 in the optical unit 13.

Figure 2:
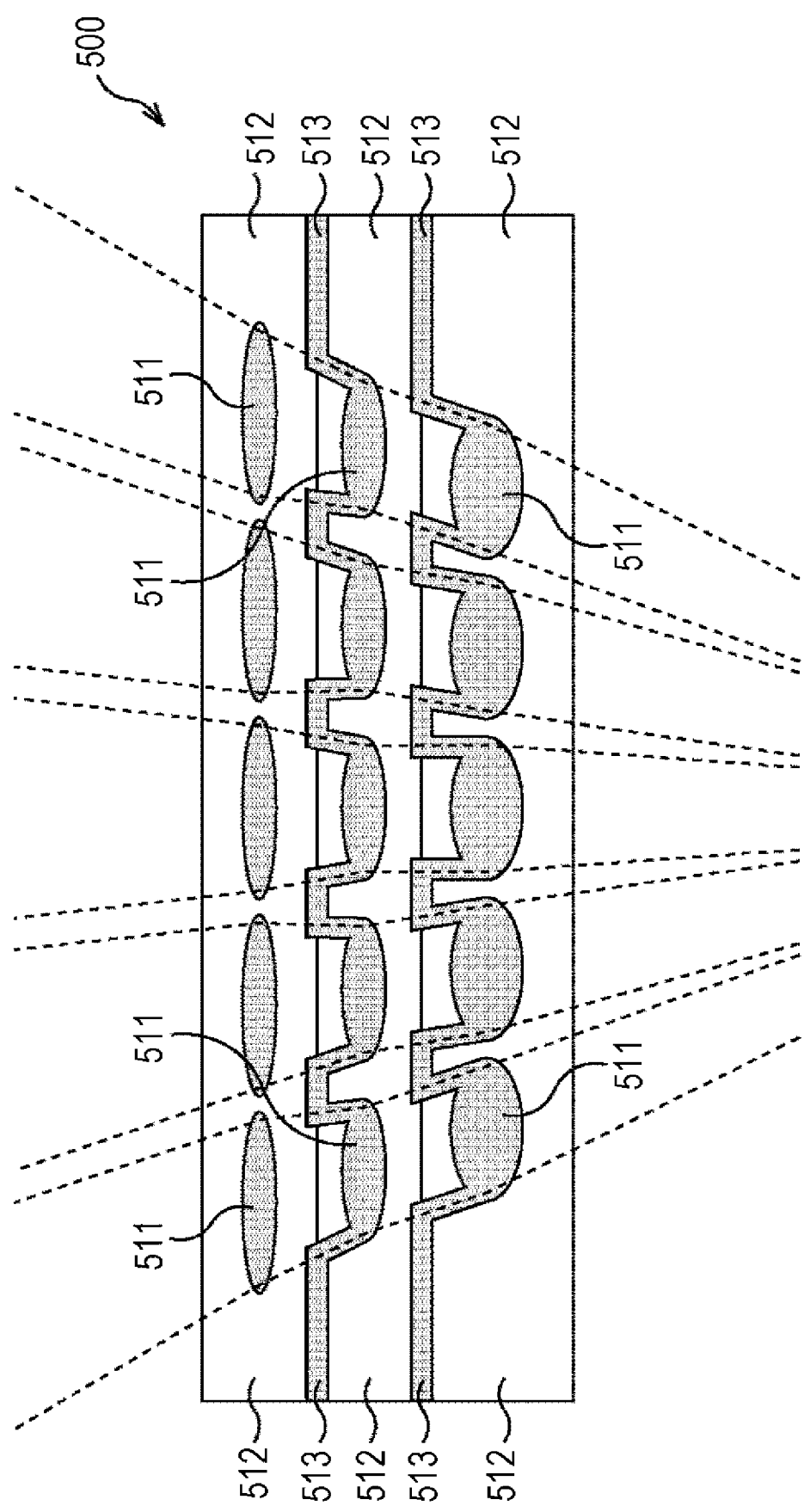
FIG. 2 is a cross-sectional structure diagram of a stacked lens structure disclosed in PTL 1.

FIG. 2 is a cross-sectional structure diagram of the stacked lens structure using a fixing technique by a resin disclosed in PTL 1.

In a stacked lens structure 500 illustrated in FIG. 2, as a means of fixing substrates 512 provided with lenses 511, a resin 513 is used. The resin 513 is an energy curable resin such as a UV curable resin.

Before the substrates 512 are adhered to each other, a layer of the resin 513 is formed on the entire front surface of each substrate 512. After that, the substrates 512 are adhered to each other, and next, the resin 513 is cured. Therefore, the adhered substrates 512 are fixed to each other.

However, when the resin 513 is cured, the resin 513 is curing-contracted. In case of the structure illustrated in FIG. 2, since the resin 513 is cured after the layer of the resin 513 is formed on the entire substrate 512, an amount of shift of the resin 513 becomes large.

In addition, even after the stacked lens structure 500 formed by adhering the substrates 512 is diced and the camera module is formed by combining imaging devices thereto, as illustrated in FIG. 2, in the stacked lens structure 500 included in the camera module, the resin 513 exists in the all portions between the substrates 512 provided with the lenses 511. For this reason, when the camera module is installed in the case of the camera and is actually used, there is a possibility that the resin between the substrates of the stacked lens structure 500 is thermally expanded due to an increase in temperature according to heat releasing of the apparatus.

Figure 3:
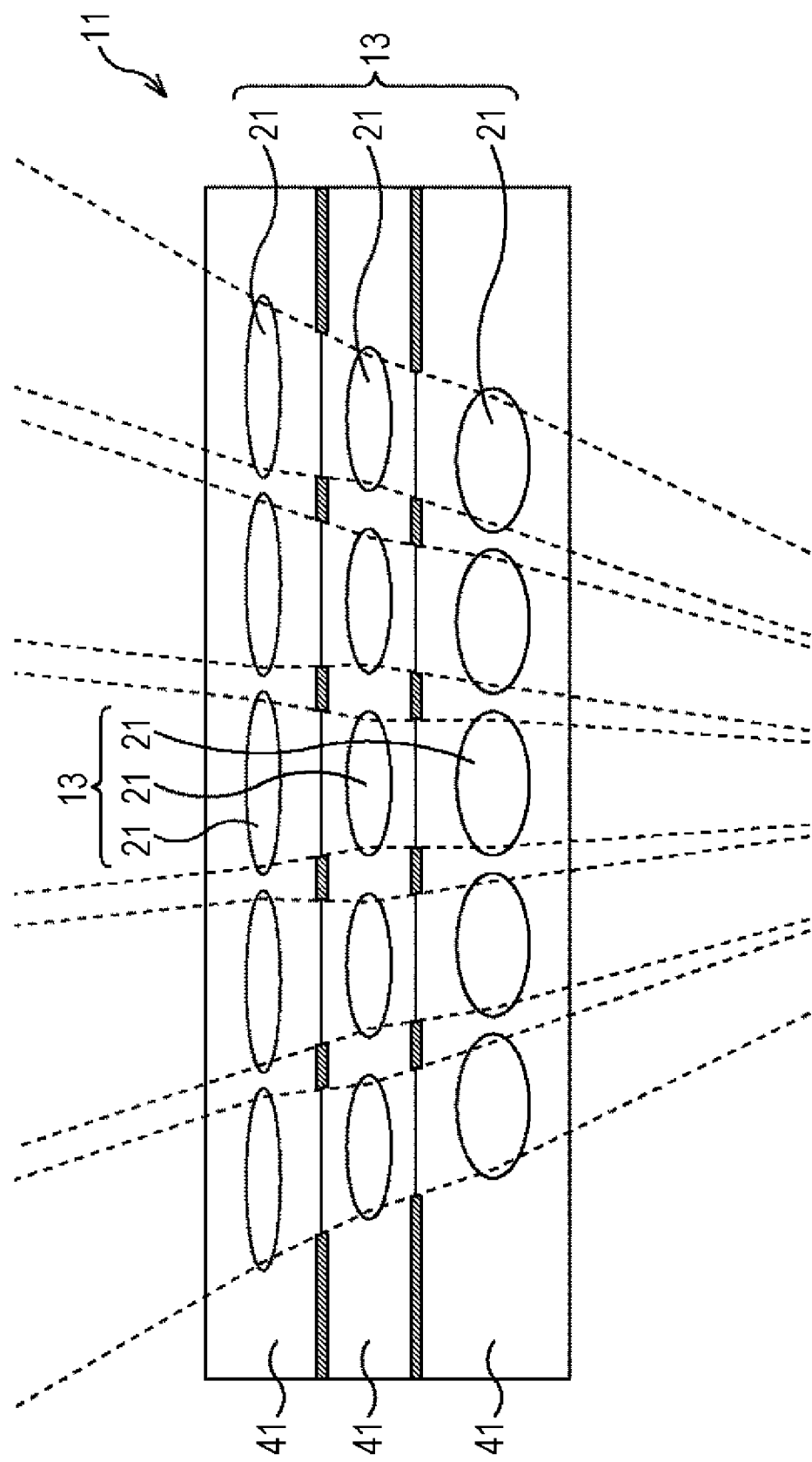
FIG. 3 is a cross-sectional structure diagram of the stacked lens structure of the camera module of FIG. 1.

FIG. 3 is a cross-sectional structure diagram illustrating only the stacked lens structure 11 of the camera module 1A of FIG. 1.

The stacked lens structure 11 of the camera module 1A is also formed by stacking a plurality of the lens-attached substrates 41 provided with the lenses 21.

In the stacked lens structure 11 of the camera module 1A, as a means for fixing the lens-attached substrates 41 provided with the lenses 21, used is a fixing unit entirely different from the stacked lens structure 500 of FIG. 2 or other stacked lens structures indicated in Citation List.

Figure 4:
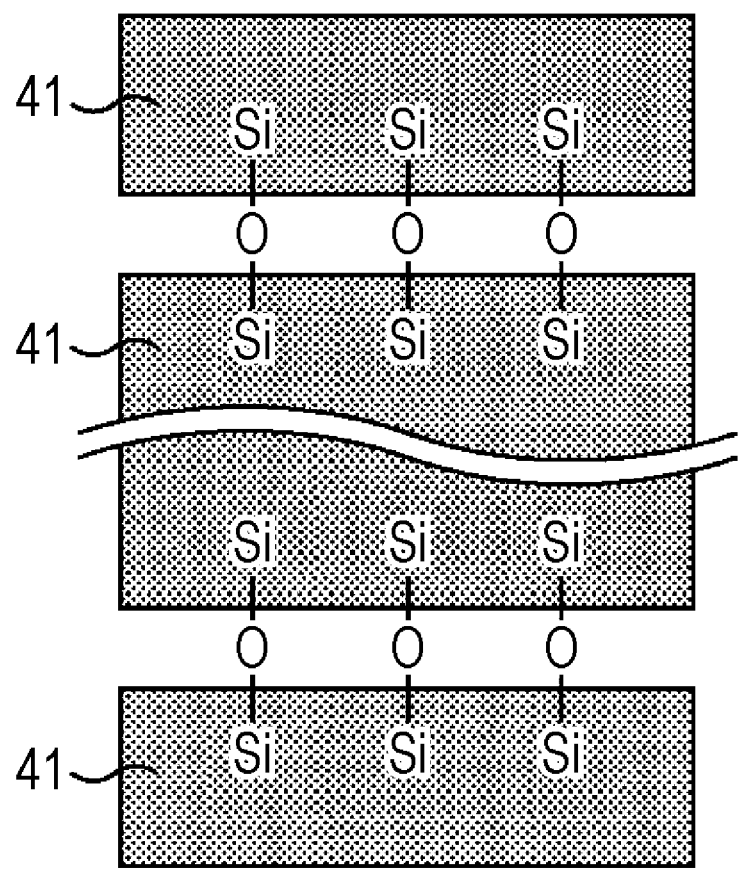
FIG. 4 is a diagram for explaining direct joining of lens-attached substrates.

Namely, the two lens-attached substrates 41 which are to be stacked are directly joined to each other by covalent bonds between a surface layer of an oxide or a nitride formed on a surface of the one substrate and a surface layer of an oxide or a nitride formed on a surface of the other substrate. As a specific example, as illustrated in FIG. 4, silicon oxide films or silicon nitride films as surface layers are formed on the surfaces of the two lens-attached substrates 41 which are to be stacked, and hydroxyl groups are bonded thereto. After that, the two lens-attached substrates 41 are adhered to each other, and dehydration condensation is performed by increasing temperature. As a result, silicon-oxygen covalent bonds are formed between the surface layers of the two lens-attached substrates 41. Therefore, the two lens-attached substrates 41 are directly joined to each other. In addition, as a result of the condensation, covalent bonds may be directly formed between elements included in the two surface layers.

In this specification, in this manner, fixing of the two lens-attached substrates 41 through an inorganic film disposed between the two lens-attached substrates 41, fixing of the two lens-attached substrates 41 by chemically bonding inorganic films disposed on the surfaces of the two lens-attached substrates 41, fixing of the two lens-attached substrates 41 by forming bonds according to dehydration condensation between inorganic films disposed on the surfaces of the two lens-attached substrates 41, fixing of the two lens-attached substrates 41 by forming covalent bonds through oxygen or covalent bonds between elements included in inorganic films between the inorganic films disposed on the surfaces of the two lens-attached substrates 41, or fixing of the two lens-attached substrates 41 forming silicon-oxygen covalent bonds or silicon-silicon covalent bonds between silicon oxide layers or silicon nitride layers disposed on the surfaces of the two lens-attached substrates 41 are referred to as direct joining.

In order to perform the adhesion and the dehydration condensation by increasing temperature, in the embodiment, substrates used for a semiconductor device or a flat display device are used, lenses in a substrate state are formed, adhesion and dehydration condensation by increasing temperature are performed in a substrate state, and joining by covalent bonds is performed in a substrate state. Due to the structure obtained by joining the inorganic films formed on the surfaces of the two lens-attached substrates 41 by the covalent bonds, it is possible to obtain a function or an effect that deformation of the resin 513 over the entire substrates by curing-contraction or deformation of the resin 513 by thermal expansion in actual use, which is are problems in case of using the technology described with reference to FIG. 2 disclosed in PTL 1, is suppressed.

Figure 6:
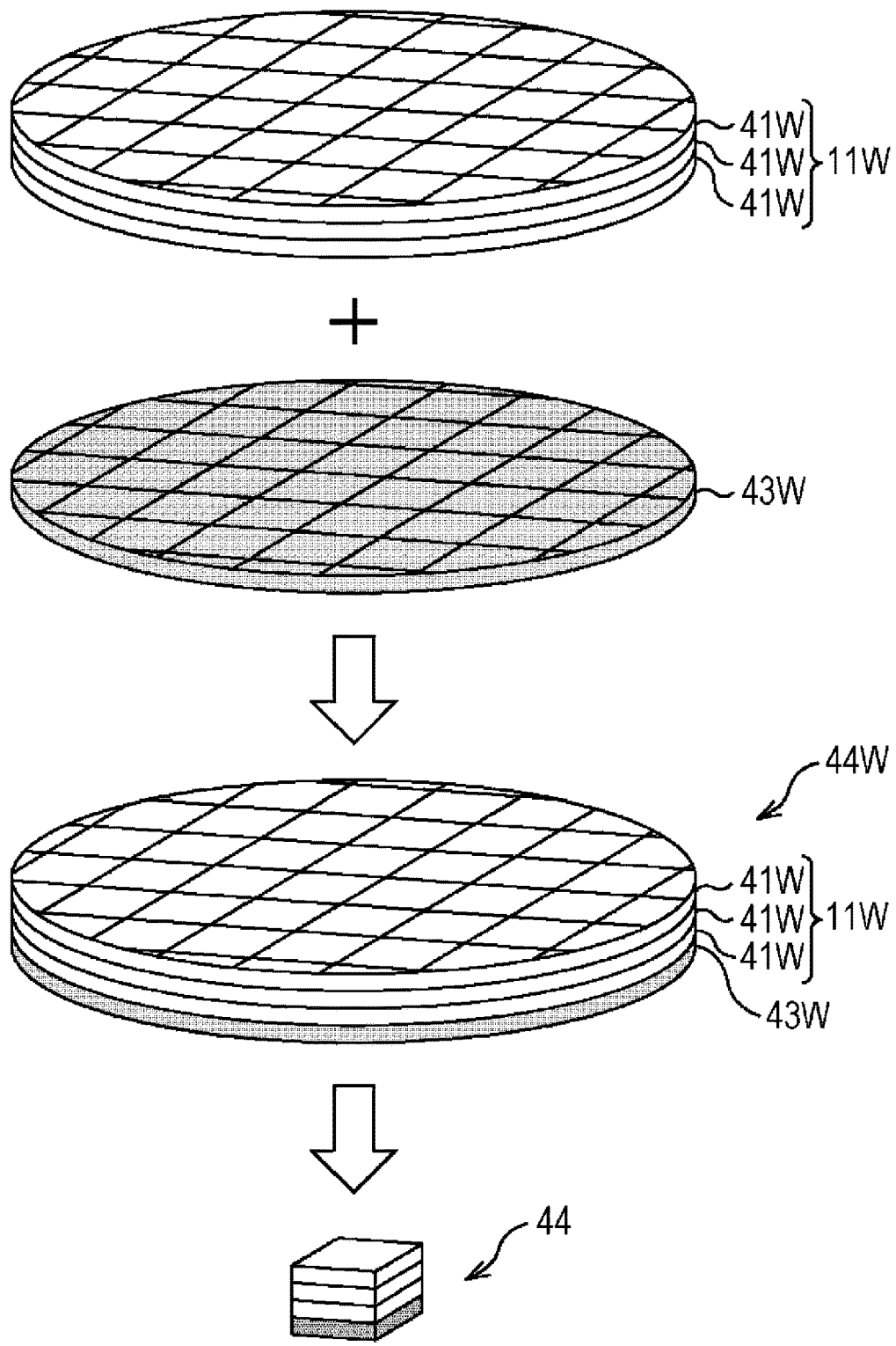
FIG. 6 is a diagram illustrating a process of forming the camera module of FIG. 1.

FIGS. 5 and 6 are diagrams illustrating a process of forming the camera module 1A of p FIGS. 1A and 1B by combining the stacked lens structure 11 and the light-receiving device 12.

First, as illustrated in FIG. 5, a plurality of lens-attached substrates 41W where a plurality of lenses 21 (not shown) are formed in planar directions are prepared, and the lens-attached substrates are stacked. Therefore, the substrate-state stacked lens structure 11W where a plurality of the substrate-state lens-attached substrates 41W are stacked is obtained.

Next, as illustrated in FIG. 6, a substrate-state sensor substrate 43W where a plurality of the light-receiving devices 12 is formed in planar directions are manufactured separately from the substrate-state stacked lens structure 11W illustrated in FIG. 5 and are prepared.

Next, the substrate-state sensor substrate 43W and the substrate-state stacked lens structure 11W are stacked, and an external terminal is connected to each module of the adhered substrates, so that the substrate-state camera module 44W is obtained.

Finally, the substrate-state camera module 44W is diced in units of a module or a chip. The diced camera module 44 is sealed in a case (not shown) which is separately prepared, so that the camera module 44 as a final product is obtained.

In addition, in this specification and drawings, components such as the lens-attached substrate 41W of which reference numerals are attached with "W" denote that the components are in the substrate state (wafer state), and components such as the lens-attached substrate 41 of which reference numerals are not attached with "W" denote that the components are in the state that the components are diced in units of a module or a chip. These notations are similarly applied to the sensor substrate 43W, the camera module 44W, and the like.

Figure 7:
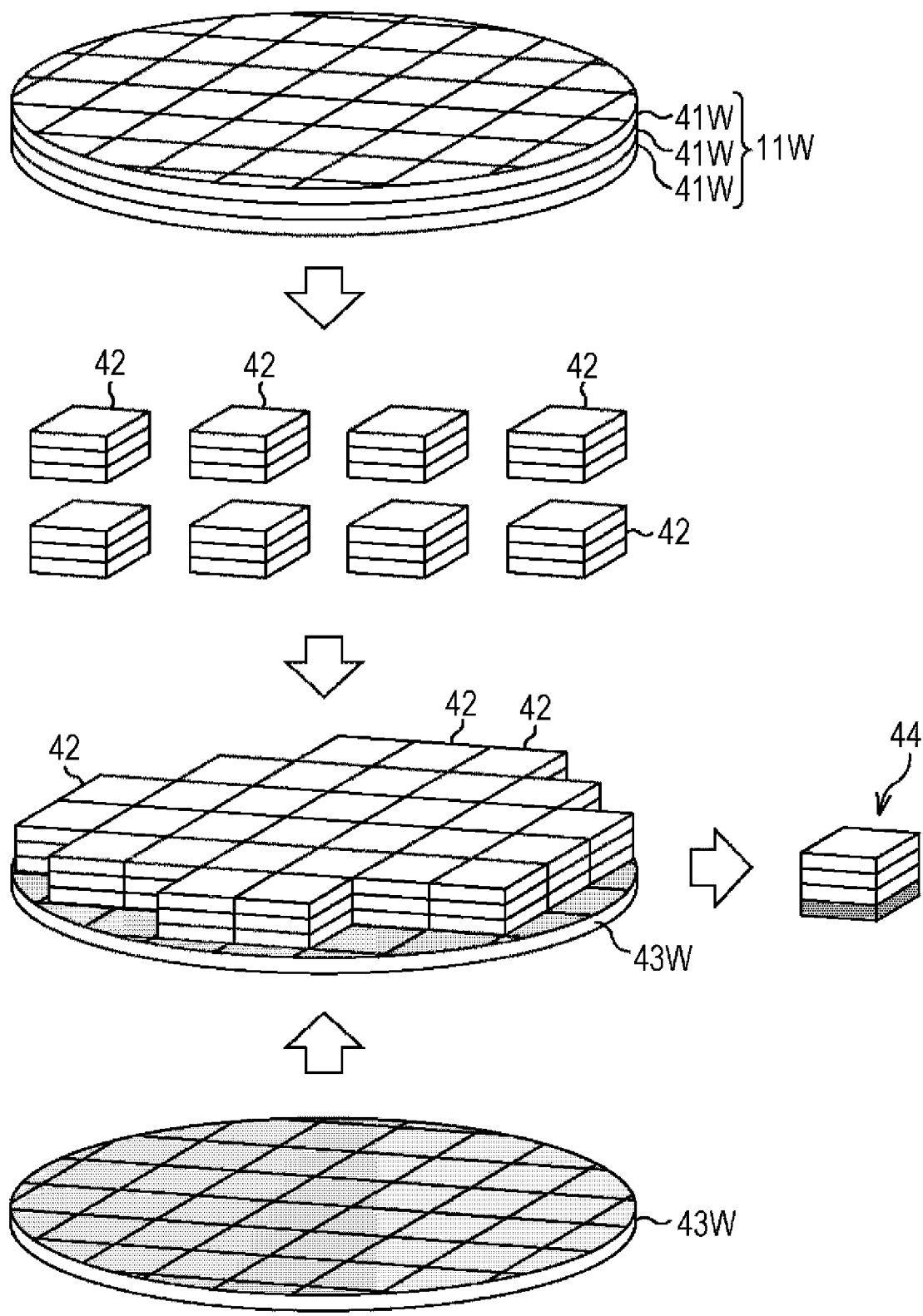
FIG. 7 is a diagram illustrating another process of forming the camera module of FIG. 1.

FIG. 7 is a diagram illustrating another process of forming camera module 1A of FIGS. 1A and 1B by combining the stacked lens structure 11 and the light-receiving device 12.

First, similarly to the above-described process, the substrate-state stacked lens structure 11W where a plurality of substrate-state lens-attached substrates 41W are stacked is manufactured.

Next, the substrate-state stacked lens structure 11W is diced.

In addition, separately from the substrate-state stacked lens structure 11W, the substrate-state sensor substrate 43W is manufactured and prepared.

Next, the diced stacked lens structure 11 is mounted one by one on each light-receiving device 12 of the substrate-state sensor substrate 43W.

Finally, the substrate-state sensor substrate 43W where the diced stacked lens structure 11 is mounted is diced in units of a module or a chip. The diced sensor substrate 43 where the stacked lens structure 11 is mounted is sealed in a case (not shown) which is separately prepared, and an external terminal is further connected thereto, so that the camera module 44 as a final product is obtained.

In addition, as an example of another process of forming the camera module 1A of FIGS. 1A and 1B by combining the stacked lens structure 11 and the light-receiving device 12, the substrate-state sensor substrate 43W illustrated in FIG. 7 is diced, the individual light-receiving devices 12 obtained as the result thereof are mounted on the diced stacked lens structures 11, so that the diced camera modules 44 may be obtained.

FIGS. 8A to 8H are diagrams for explaining a configuration of a lens-attached substrate 41 in the camera module 1A.

Figure 8:
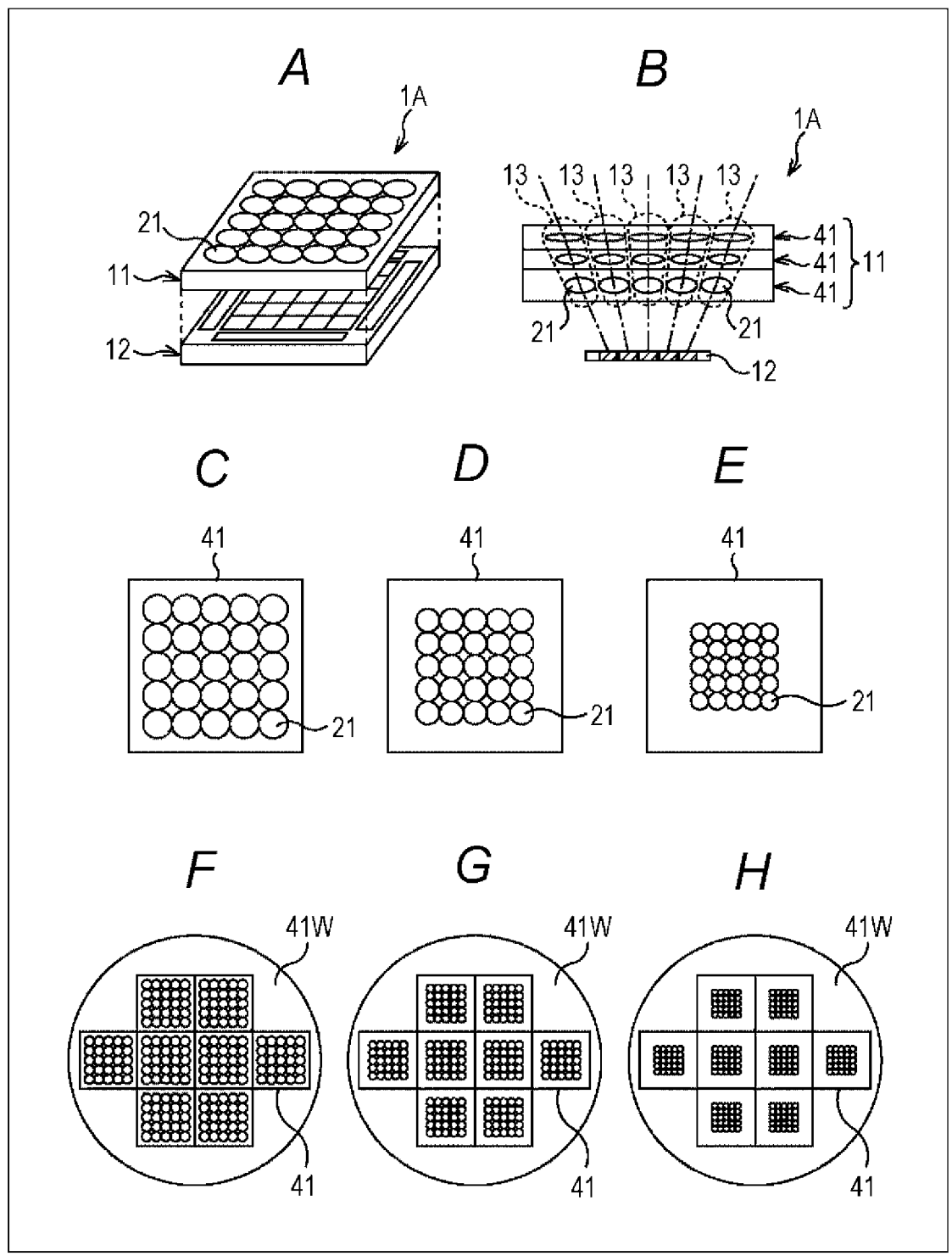
FIG. 8 is a diagram for explaining a configuration of a lens-attached substrate.

FIG. 8A is a schematic diagram illustrating the camera module 1A similarly to that of FIG. 1A.

FIG. 8B is a schematic cross-sectional diagram of the camera module 1A similarly to FIG. 1B.

As illustrated in FIG. 8B, the camera module 1A is a compound-eye camera module including a plurality of optical units 13 having one optical axis and being formed by combining a plurality of lenses 21. The stacked lens structure 11 is configured to include five optical units in each of the horizontal and vertical directions, namely, to include a total of twenty-five optical units 13.

In the camera module 1A, the optical axes of a plurality of the optical units 13 are disposed so as to spread toward the outside of the module, so that it is possible to capture a wide-angle image. In FIG. 8B, for the simplification, the stacked lens structure 11 is configured as a structure where only three layers of the lens-attached substrates 41 are stacked, but it is obvious that more layers of the lens-attached substrates 41 are preferably stacked.

FIGS. 8C to 8E are diagrams illustrating planar shapes of three layers of the lens-attached substrates 41 constituting the stacked lens structure 11.

FIG. 8C is a plan diagram of the lens-attached substrate 41 of the uppermost layer among the three layers, FIG. 8D is a plan diagram of the lens-attached substrate 41 of the middle layer, and FIG. 8E is a plan diagram of the lens-attached substrate 41 of the lowermost layer. Since the camera module 1 is a compound-eye wide-angle camera module, as it goes to the upper layer, the diameter of the lens 21 is increased, and the pitch between the lenses is spread.

FIGS. 8F to 8H are plan diagrams of the substrate-state lens-attached substrate 41W for obtaining the lens-attached substrates 41 illustrated in FIGS. 8C to 8E.

The lens-attached substrate 41W illustrated in FIG. 8F illustrates the substrate state corresponding to the lens-attached substrate 41 illustrated in FIG. 8C, the lens-attached substrate 41W illustrated in FIG. 8G illustrates the substrate state corresponding to the lens-attached substrate 41 illustrated in FIG. 8D, and the lens-attached substrate 41W illustrated in FIG. 8H illustrates the substrate state corresponding to the lens-attached substrate 41 illustrated in FIG. 8E.

The substrate-state lens-attached substrates 41W illustrated in FIGS. 8F to 8H are configured so that the eight camera modules 1A illustrated in FIG. 8A are obtained from one substrate.

It can be understood that, among the lens-attached substrates 41W illustrated in FIGS. 8F to 8H, the pitch between the lenses in the module-unit lens-attached substrate 41 is different between the upper-layer lens-attached substrate 41W and the lower-layer lens-attached substrate 41W, and on the other hand, in each of the lens-attached substrates 41W, the pitch of arranging the module-unit lens-attached substrates 41 is constant from the upper-layer lens-attached substrate 41W to the lower-layer lens-attached substrate 41W.

2. Second Embodiment of Camera Module

FIGS. 9A to 9H are diagrams illustrating a second embodiment of a camera module using a stacked lens structure employing the present technology.

FIG. 9A is a schematic diagram illustrating an outer appearance of a camera module 1B as the second embodiment of the camera module 1. FIG. 9B is a schematic cross-sectional diagram illustrating the camera module 1B.

The camera module 1B is configured to include two optical units 13. The two optical units 13 are provided with an aperture stop plate 51 on the uppermost layer of the stacked lens structure 11. Aperture portions 52 are installed in the aperture stop plate 51.

Although the camera module 1B includes the two optical units 13, the two optical units 13 have different optical parameters. Namely, the camera module 1B includes two types of optical units 13 having different optical performance. The two types of the optical units 13 may be, for example, a short-focal-length optical unit 13 for imaging a near view and a long-focal-length optical unit 13 for imaging a distant view.

In the camera module 1B, since the optical parameters of the two optical units 13 are different, for example, as illustrated in FIG. 9B, the number of lenses 21 is different between the two optical units 13. In addition, the lenses 21 of the same layer of the stacked lens structure 11 including the two optical units 13 may be configured so that one of a diameter, a thickness, a surface shape, a volume, and a distance to an adjacent lens is different. For this reason, for example, the planar shape of the lens 21 of the camera module 1B may have a structure as illustrated in FIG. 9C where the two optical units 13 have the lenses 21 having the same diameter, may have a structure as illustrated in FIG. 9D where the two optical units have the lenses 21 having different shapes, and may have a structure as illustrated in FIG. 9E where the one optical unit has no lens 21, that is, an empty cavity 21X.

FIGS. 9F to 9H are plan diagrams of the substrate-state lens-attached substrate 41W for obtaining the lens-attached substrates 41 illustrated in FIGS. 9C to 9E.

The lens-attached substrate 41W illustrated in FIG. 9F illustrates the substrate state corresponding to the lens-attached substrate 41 illustrated in FIG. 9C, the lens-attached substrate 41W illustrated in FIG. 9G illustrates the substrate state corresponding to the lens-attached substrate 41 illustrated in FIG. 9D, and the lens-attached substrate 41W illustrated in FIG. 9H illustrates the substrate state corresponding to the lens-attached substrate 41 illustrated in FIG. 9E.

The substrate-state lens-attached substrates 41W illustrated in FIGS. 9F to 9H are configured so that sixteen camera modules 1B illustrated in FIG. 9A are obtained from one substrate.

As illustrated in FIGS. 9F to 9H, in order to form the camera module 1B, on the entire substrate surface of the substrate-state lens-attached substrate 41W, the lenses having the same shape may be formed, the lenses having different shapes may be formed, or the lenses may or may not be formed.

3. Third Embodiment of Camera Module

FIGS. 10A to 10F are diagrams illustrating a third embodiment of a camera module using a stacked lens structure employing the present technology.

Figure 10:
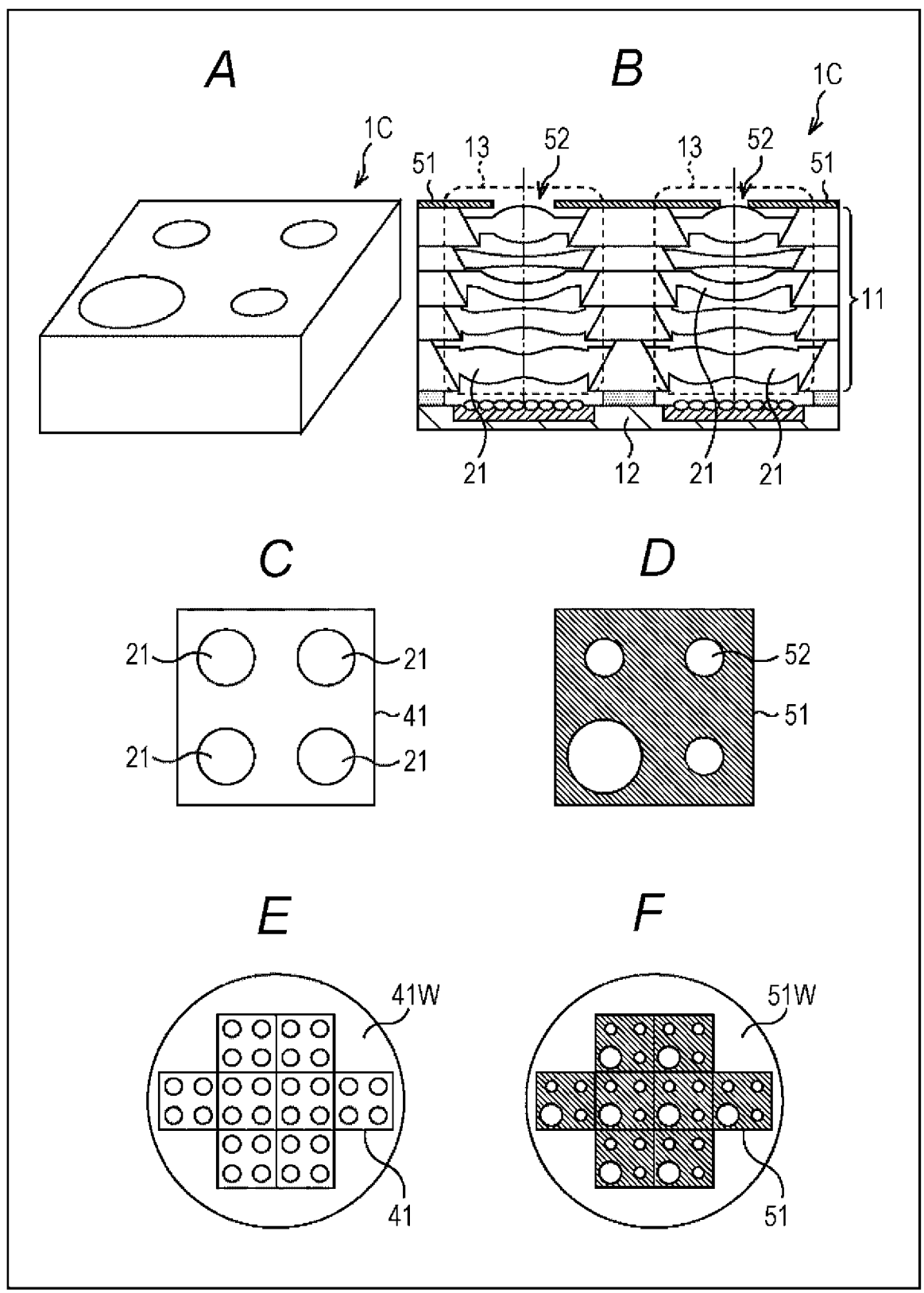
FIG. 10 is a diagram illustrating a third embodiment of a camera module using a stacked lens structure employing the present technology.

FIG. 10A is a schematic diagram illustrating an outer appearance of a camera module 1C as a third embodiment of the camera module 1. FIG. 10B is a schematic cross-sectional diagram of the camera module 1C.

The camera module 1C is configured to include two optical units 13 in each of the horizontal and vertical directions on a light incident surface, namely, to include a total of four optical units. Among the four optical units 13, the shapes of the lenses 21 are set to be the same.

Although the four optical units 13 have the aperture stop plates 51 on the uppermost layer of the stacked lens structure 11, the sizes of the aperture portions 52 of the aperture stop plates 51 are different among the four optical units 13. Therefore, with respect to the camera module 1C, it is possible to implement, for example, the following camera module 1C. Namely, for example, in a surveillance camera for crime prevention, in a camera module 1C using a light-receiving device 12 including light-receiving pixels for daytime color image surveillance which are provided with three types of R, G, and B color filters to receive three types of R, G, and B light beams and light-receiving pixels for nighttime black-and-white image surveillance which are not provided with R, G, and B color filters, with respect to only pixels capturing white-and-black images in the nighttime when illuminance is low, the size of the aperture of the aperture stop can be increased. For this reason, for example, the planar shape of the lenses 21 in the one camera module 1C is configured so that, as illustrated in FIG. 10C, the diameters of the lenses 21 provided to the four optical units 13 are the same, and as illustrated in FIG. 10D, the sizes of the aperture portions 52 of the aperture stop plates 51 are different among the optical units 13.

FIG. 10E is a plan diagram of the substrate-state lens-attached substrate 41W for obtaining the lens-attached substrate 41 illustrated in FIG. 10C. FIG. 10F is a plan diagram of the substrate-state aperture stop plates 51W for obtaining the aperture stop plate 51 illustrated in FIG. 10D.

The substrate-state lens-attached substrates 41W of FIG. 10E and the substrate-state aperture stop plates 51W of FIG. 10F are configured so that the eight camera modules 1C illustrated in FIG. 10A are obtained from one substrate.

As illustrated in FIG. 10F, in the substrate-state aperture stop plates 51W, in order to form the camera module 1C, the sizes of the aperture portions 52 are set to be different among the optical units 13 provided to the camera module 1C.

4. Fourth Embodiment of Camera Module

FIGS. 11A to 11D illustrate a fourth embodiment of a camera module using a stacked lens structure employing the present technology.

Figure 11:
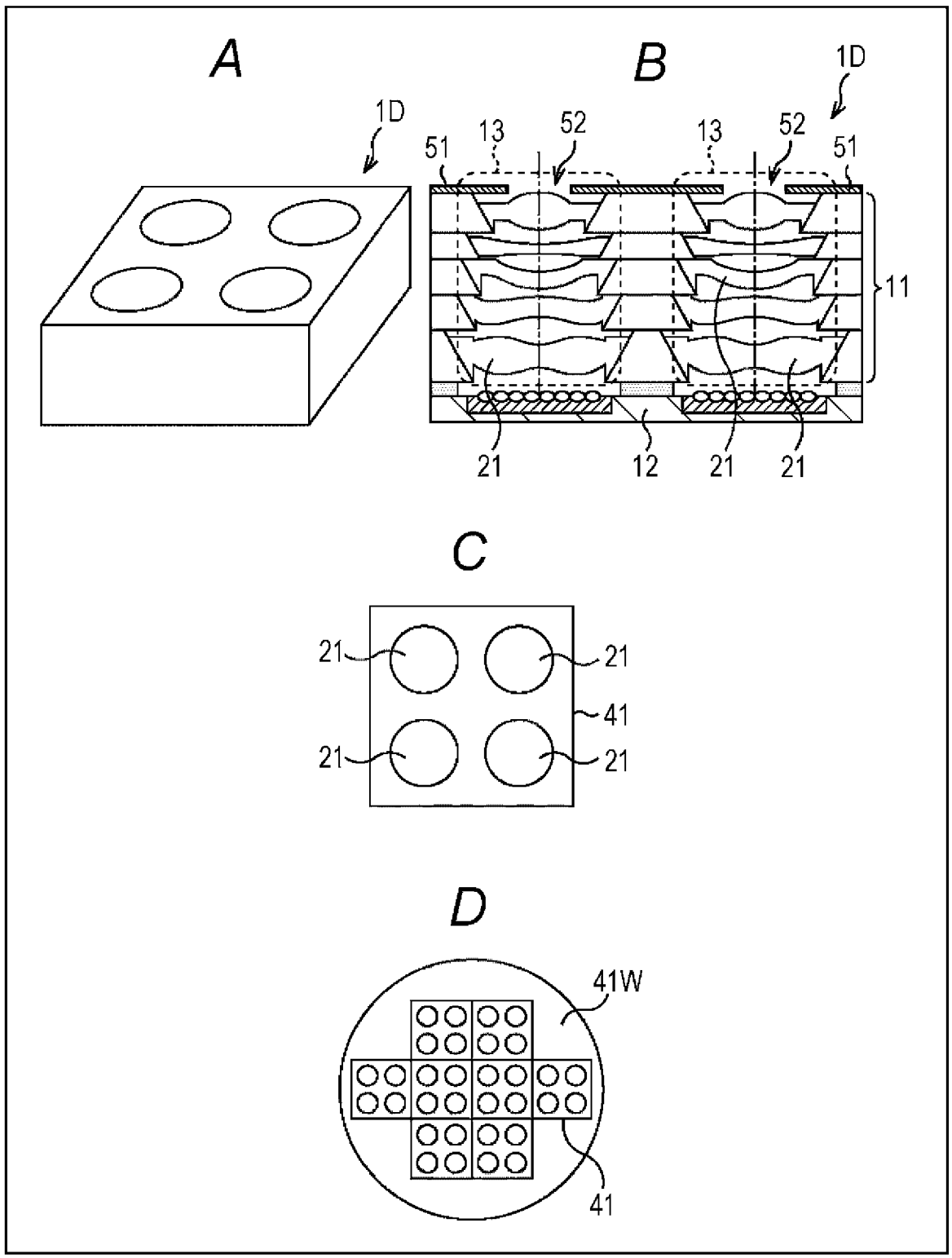
FIG. 11 is a diagram illustrating a fourth embodiment of a camera module using a stacked lens structure employing the present technology.

FIG. 11A is a schematic diagram illustrating an outer appearance of a camera module 1D as a fourth embodiment of the camera module 1. FIG. 11B is a schematic cross-sectional diagram of the camera module 1D.

Similarly to the camera module 1C, the camera module 1D is configured to include two optical units 13 in each of the horizontal and vertical directions on a light incident surface, namely, to include a total of four optical units. Among the four optical units 13, the shapes of the lenses 21 and the sizes of the aperture portions 52 of the aperture stop plates 51 are set to be the same.

The camera module 1D is configured so that the optical axes of the two optical units 13 disposed in each of the horizontal and vertical directions of the light incident surface extend in the same direction. The one-dotted dash lines illustrated in FIG. 11B indicate the optical axes of the optical units 13. The camera module 1D having such a configuration is appropriate for capturing a high-resolution image in comparison with capturing by one optical unit 13 using ultra-resolution technique.

In the camera module 1D, while the optical axes in each of the horizontal and vertical directions are directed toward the same direction, images can be captured by a plurality of the light-receiving devices 12 disposed at different positions, or images can be captured by light-receiving pixels of different regions in the one light-receiving device 12, so that it is possible to obtain a plurality of images which are not necessarily the same while the optical axes are directed toward the same direction. By matching image data at each of the positions of a plurality of images which are not the same, it is possible to obtain a high-resolution image. For this reason, it is preferable that the planar shapes of the lenses 21 in the one camera module 1D are the same among the four optical units 13 as illustrated in FIG. 11C.

FIG. 11D is a plan diagram of the substrate-state lens-attached substrate 41W for obtaining the lens-attached substrate 41 illustrated in FIG. 11C. The substrate-state lens-attached substrate 41W is configured so that the eight camera modules 1D illustrated in FIG. 11A are obtained from one substrate.

As illustrated in FIG. 11D, in the substrate-state lens-attached substrate 41W, in order form the camera module 1D, the camera module 1D is configured to include a plurality of lenses 21, and a plurality of lens groups for one module are disposed on the substrate with a certain pitch.

5. Fifth Embodiment of Camera Module

FIGS. 12A to 12D are diagrams illustrating a fifth embodiment of a camera module using a stacked lens structure employing the present technology.

Figure 12:
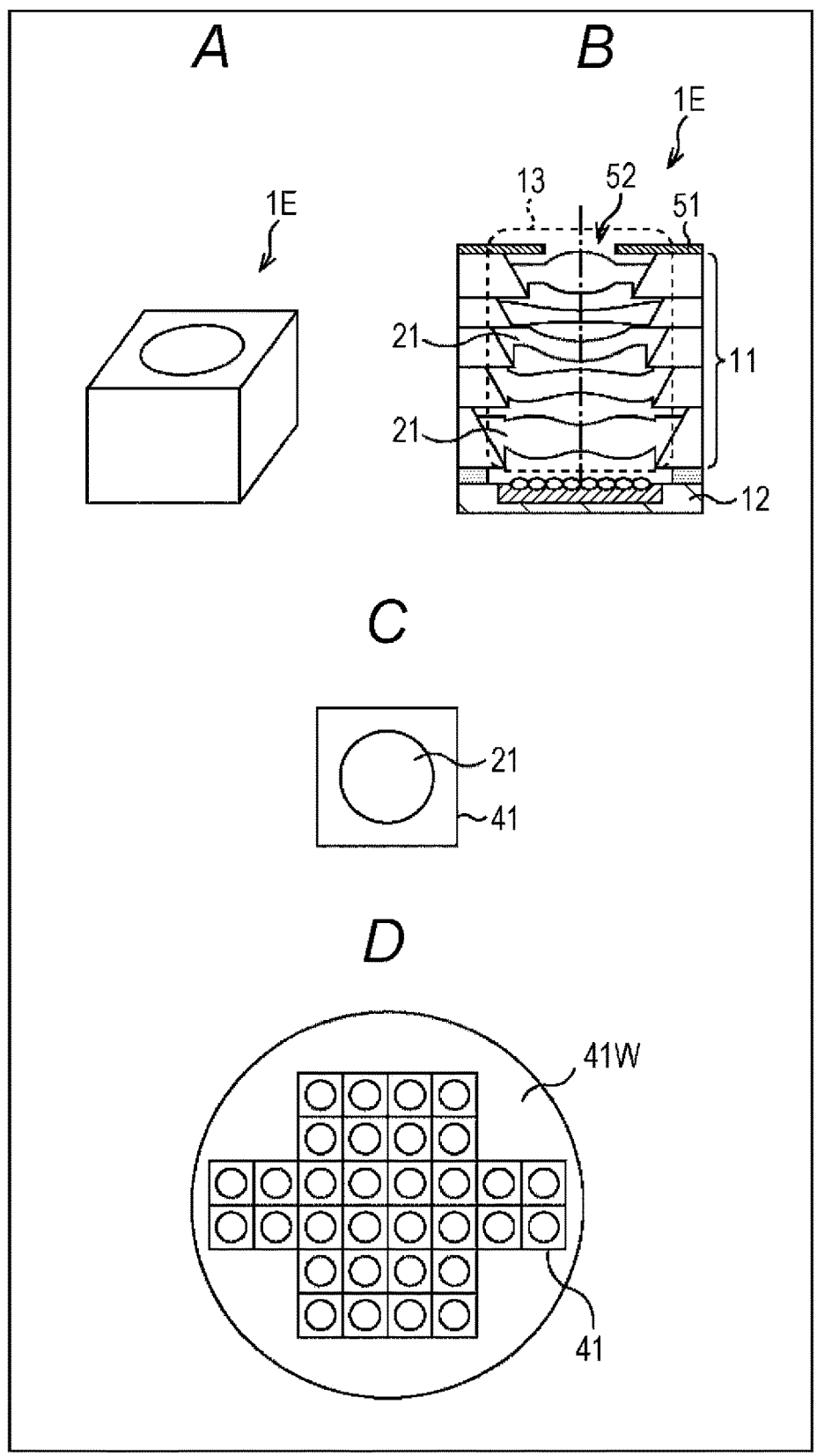
FIG. 12 is a diagram illustrating a fifth embodiment of a camera module using a stacked lens structure employing the present technology.

FIG. 12A is a schematic diagram illustrating an outer appearance of a camera module 1E as a fifth embodiment of the camera module 1. FIG. 12B is a schematic cross-sectional diagram of the camera module 1E.

The camera module 1E is a monoscopic camera module where an optical unit 13 having one optical axis is provided to one camera module 1E.

FIG. 12C is a plan diagram of a lens-attached substrate 41 illustrating a planar shape of a lens 21 in the camera module 1E. The camera module 1E is configured to include one optical unit 13.

FIG. 12D is a plan diagram of the substrate-state lens-attached substrate 41W for obtaining the lens-attached substrate 41 illustrated in FIG. 12C. The substrate-state lens-attached substrate 41W is configured so that the thirty-two camera modules 1E illustrated in FIG. 12A are obtained from one substrate.

As illustrated in FIG. 12D, in the substrate-state lens-attached substrate 41W, a plurality of the lenses 21 for the camera modules 1E are disposed on the substrate with a certain pitch.

6. Detailed Configuration of Camera Module According to Fourth Embodiment

Next, detailed configuration of the camera module 1D according to the fourth embodiment illustrated in FIGS. 11A to 11D will be described with reference to FIG. 13.

Figure 13:
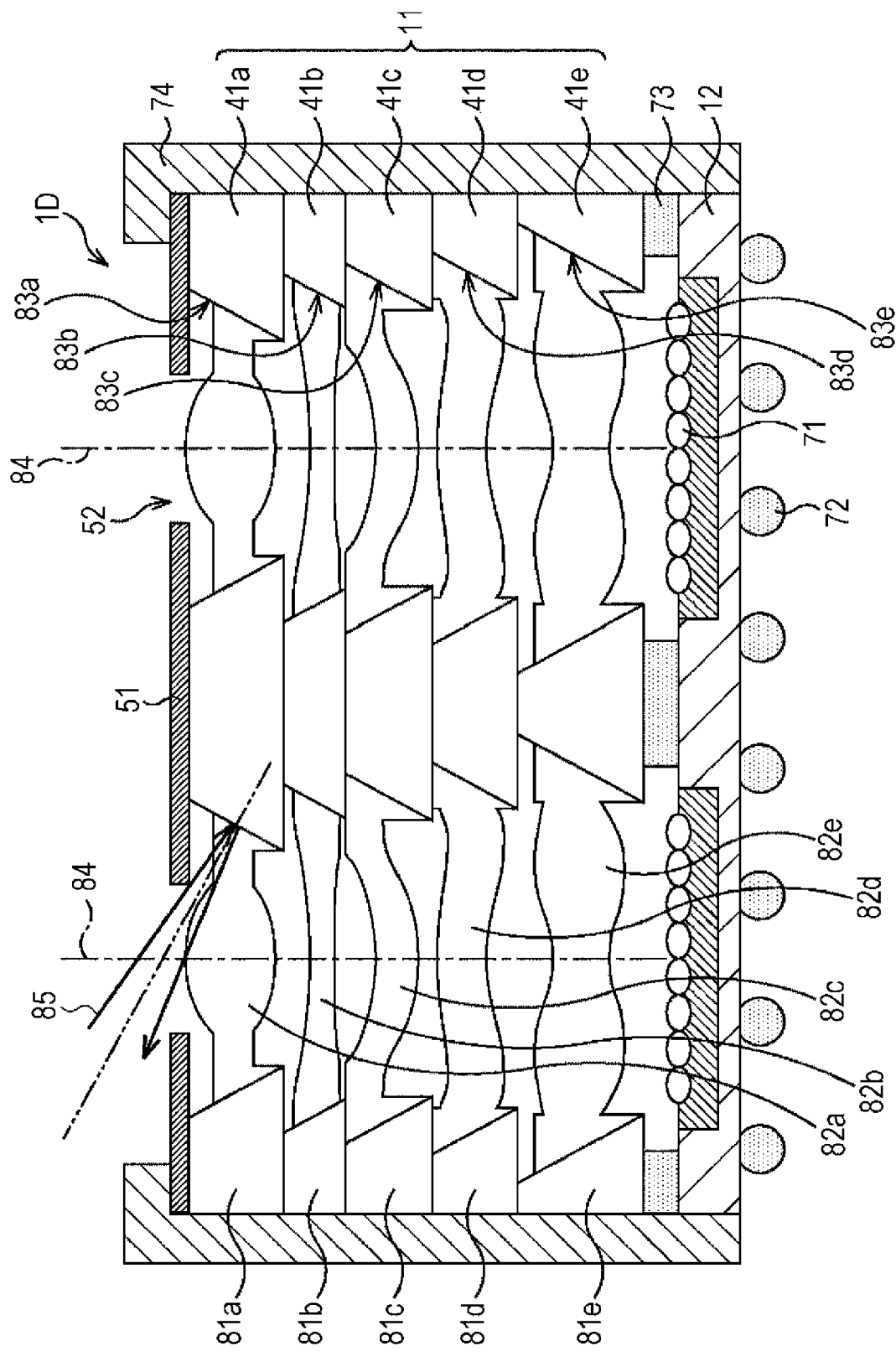
FIG. 13 is a diagram for explaining a detailed configuration of the camera module according to the fourth embodiment.

FIG. 13 is a cross-sectional diagram of the camera module 1D illustrated in FIG. 11B.

The camera module 1D is configured to include a stacked lens structure 11 where a plurality of the lens-attached substrates 41a to 41e are stacked and the light-receiving device 12. The stacked lens structure 11 includes a plurality of the optical units 13. The one-dotted dash lines 84 indicate the optical axes of the optical units 13. The light-receiving device 12 is disposed under the stacked lens structure 11. In the camera module 1D, light incident from the upper side into the camera module 1D transmits the stacked lens structure 11 and is received by the light-receiving device 12 disposed under the stacked lens structure 11.

The stacked lens structure 11 includes the five stacked lens-attached substrates 41a to 41e. If not particularly distinguished from each other, the five lens-attached substrates 41a to 41e is simply indicated as the lens-attached substrate 41 in the description.

The cross-section shape of the through-hole 83 of each of the lens-attached substrates 41 constituting the stacked lens structure 11 is the so-called tapered-down shape where the opening width is decreased toward the lower side (the side where the light-receiving device 12 is disposed).

The aperture stop plate 51 is disposed on the stacked lens structure 11. The aperture stop plate 51 is configured to include a layer formed with, for example, a material having light absorbing property or light-shielding property. The aperture portion 52 is installed in the aperture stop plate 51.

The light-receiving device 12 is configured with, for example, a front-side illumination type or back-side illumination type CMOS (Complementary Metal Oxide Semiconductor) image sensor. An on-chip lens 71 is formed on the upper surface of the light-receiving device 12 which is closer to the stacked lens structure 11, and external terminals 72 of inputting and outputting signals are formed on the lower surface of the light-receiving device 12.

The stacked lens structure 11, the light-receiving device 12, the aperture stop plate 51, and the like are accommodated in a lens barrel 74.

A structural material 73 is disposed on the upper side of the light-receiving device 12. The stacked lens structure 11 and the light-receiving device 12 are fixed to each other through the structural material 73. The structural material 73 is, for example, an epoxy-based resin.

In the embodiment, although the stacked lens structure 11 is configured to include the five stacked lens-attached substrates 41a to 41e, the number of stacked lens-attached substrates 41 is not particularly limited if the number is two or more.

Each lens-attached substrate 41 constituting the stacked lens structure 11 is configured so that a lens resin portion 82 is added to a carrier substrate 81. The carrier substrate 81 has a through-hole 83, and the lens resin portion 82 is formed inside the through-hole 83. The lens resin portion 82 includes the above-described lenses 21 and represents the portion extending to the carrier substrate 81 to support the lenses 21 and the portion integrated with the material constituting the lenses 21.

In addition, in case of distinguishing the carrier substrates 81, the lens resin portions 82, or the through-holes 83 of the lens-attached substrates 41a to 41e, as illustrated in FIG. 13, these are indicated as carrier substrates 81a to 81e, lens resin portions 82a to 82e, or through-holes 83a to 83e to correspond to the lens-attached substrates 41a to 41e in the description.

<Detailed Description of Lens Resin Portion>

Next, a shape of the lens resin portion 82 will be described by exemplifying the lens resin portion 82a of the lens-attached substrate 41a.

Figure 14:
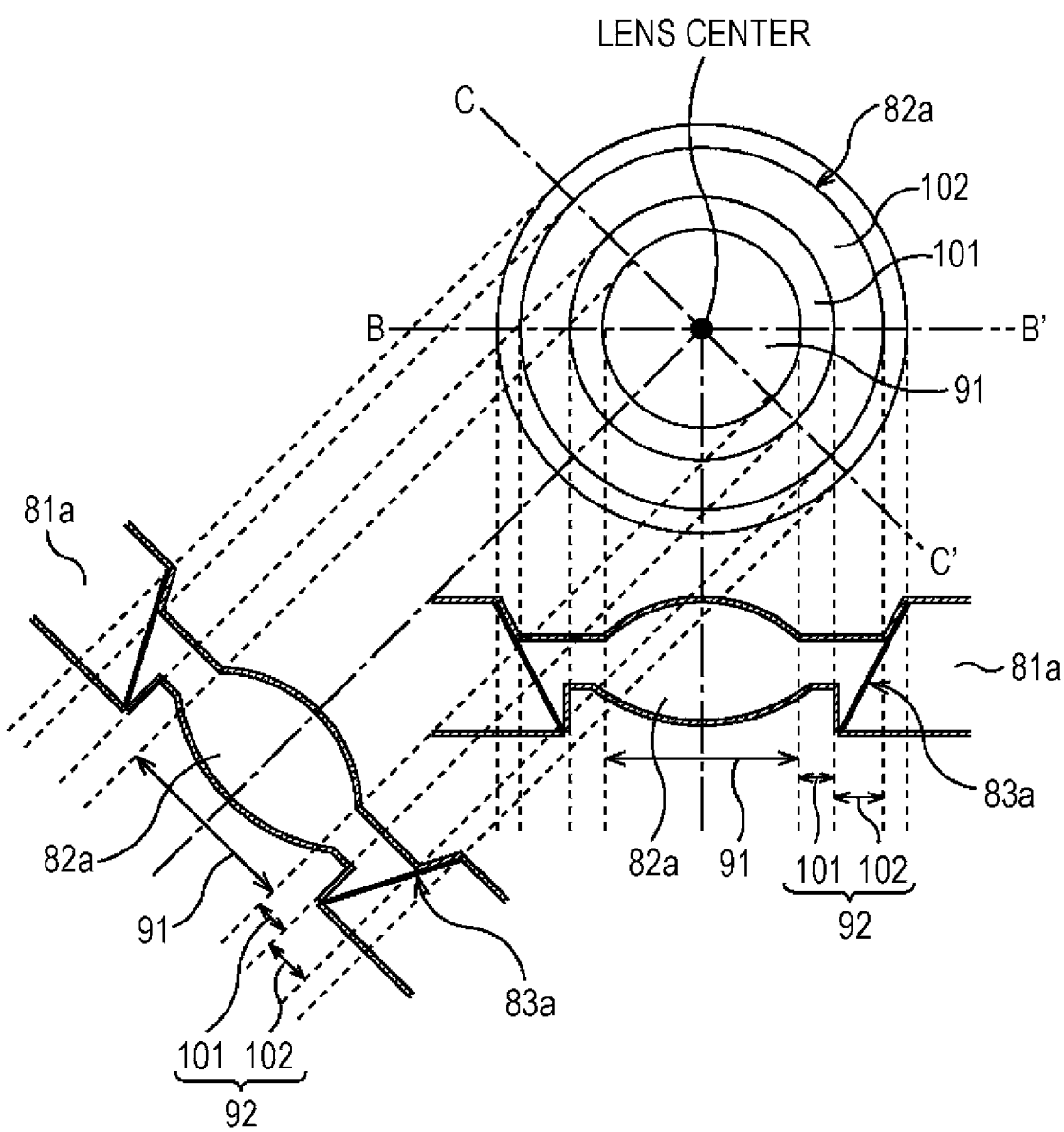
FIG. 14 illustrates a plan diagram and cross-sectional diagrams of a carrier substrate and a lens resin portion.

FIG. 14 illustrates a plan diagram and cross-sectional diagrams of the carrier substrate 81a and the lens resin portion 82a constituting the lens-attached substrate 41a.

The cross-sectional diagrams of the carrier substrate 81a and the lens resin portion 82a illustrated in FIG. 14 are cross-sectional diagrams taken along lines B-B' and C-C' illustrated in the plan diagram.

The lens resin portion 82a is a portion formed to be integrated with the material constituting the lens 21 and includes a lens portion 91 and a carrying portion 92. In the above description, the lens 21 corresponds to the lens portion 91 or the entire lens resin portion 82a.

The lens portion 91 is a portion having performance as a lens, in other words, a "portion of refracting light to converge or diverge" or a "portion having a curved surface such as a convex plane, a concave plane, or an aspherical plane or a portion formed by consecutively arranging a plurality of polygons used as lenses using a Fresnel screen or a diffraction grating".

The carrying portion 92 is a portion extending from the lens portion 91 to the carrier substrate 81a to support the lens portion 91. The carrying portion 92 is configured with an arm portion 101 and a leg portion 102 and is located in an outer circumference of the lens portion 91.

The arm portion 101 is disposed at the outer side of the lens portion 91 to be in contact with the lens portion 91 and extends from the lens portion 91 toward the outside with a certain thickness. The leg portion 102 is a portion of the carrying portion 92 other than the arm portion 101 and is a portion including the portion being in contact with the sidewall of the through-hole 83a. It is preferable that the leg portion 102 is thicker than the arm portion 101 in terms of the thickness of the resin.

The planar shape of the through-hole 83a formed in the carrier substrate 81a is a circle, and the cross-section shape is naturally the same irrespective of the direction of the diameter. The shape of the lens resin portion 82a which is a shape defined according to the forms of the upper and lower mold frames in the lens formation period is also formed so that the cross-section shape is the same irrespective of the direction of the diameter.

Figure 15:
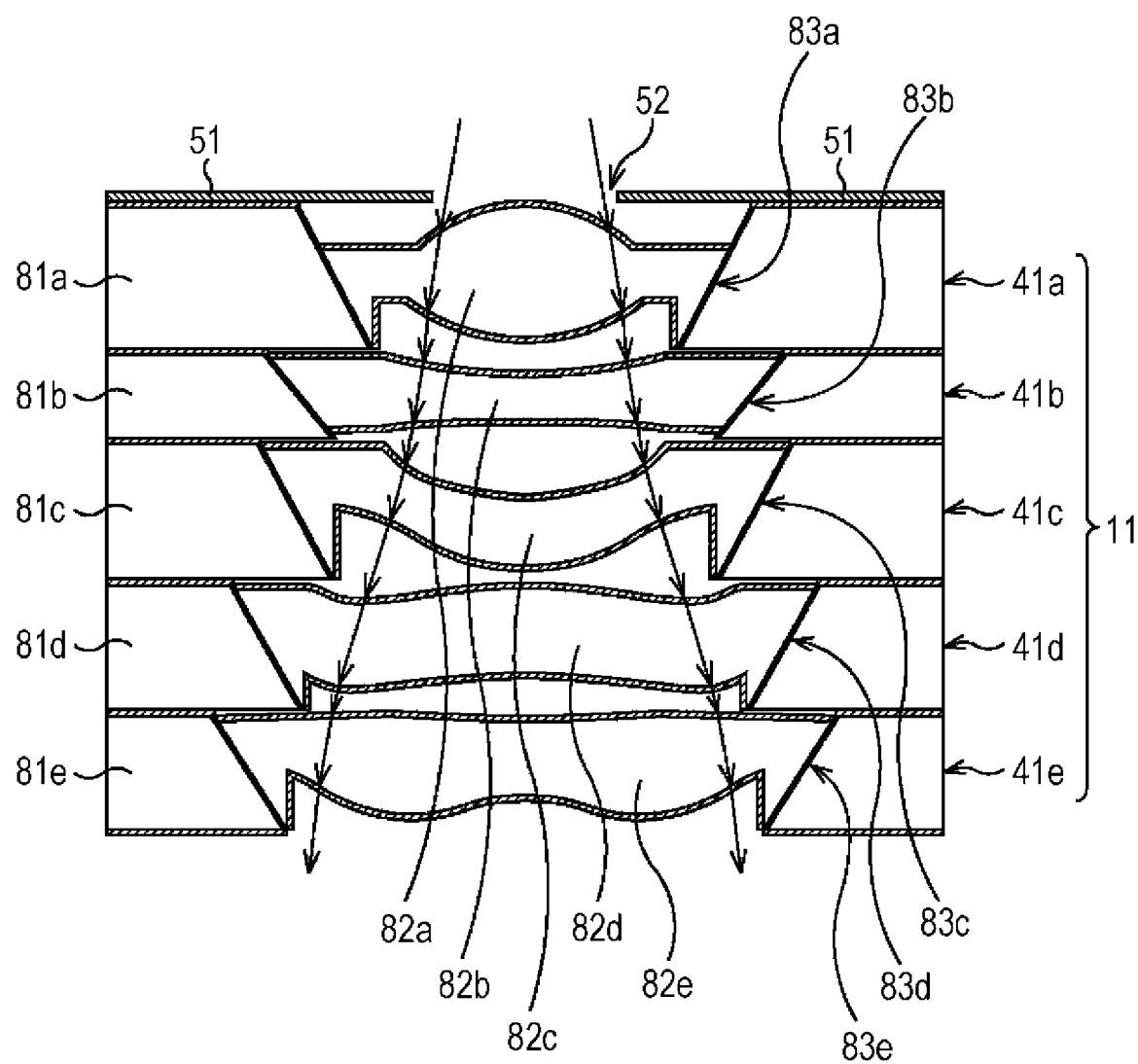
FIG. 15 is a cross-sectional diagram illustrating a stacked lens structure and an aperture stop plate.

FIG. 15 is a cross-sectional diagram illustrating the stacked lens structure 11 and the aperture stop plate 51 which are portions of the camera module 1D of FIG. 13.

In the camera module 1D, the light incident to the module is constricted by the aperture stop plate 51 and, after that, is spread in the inner portion of the stacked lens structure 11 to be incident on the light-receiving device 12 (not shown in FIG. 15) disposed under the stacked lens structure 11. Namely, in the overview of the entire stacked lens structure 11, the light incident to the module propagates to spread in a substantially fan shape from the aperture portion 52 of the aperture stop plate 51 toward the lower side. For this reason, as an example of the size of the lens resin portion 82 provided to the stacked lens structure 11, in the stacked lens structure 11 of the FIG. 15, the lens resin portion 82a provided to the lens-attached substrate 41a disposed just under the aperture stop plate 51 is smallest, and the lens resin portion 82e provided to the lens-attached substrate 41e disposed in the lowermost layer of the stacked lens structure 11 is largest.

If the thickness of the lens resin portion 82 of the lens-attached substrate 41 is set to be constant, the large-sized lens is more difficult to manufacture than the small-sized lens. This is because the lens is easily deformed by the weight added to the lens in the lens manufacturing period and the large-sized lens is hard to maintain the strength. For this reason, it is preferable that the large-sized lens is formed to be thicker than the small-sized lens. For this reason, in the stacked lens structure 11 of FIG. 15, with respect to the thickness of the lens resin portion 82, the lens resin portion 82e provided to the lens-attached substrate 41e disposed in the lowermost layer is thickest.

In order to increase the degree of lens design, the stacked lens structure 11 of FIG. 15 has at least one of the following features. (1) The thickness of the carrier substrate 81 is different among at least a plurality of the lens-attached substrates 41 constituting the stacked lens structure 11. For example, the thickness of the carrier substrate 81 is large in the lower-layer lens-attached substrate 41. (2) The opening width of the through-hole 83 provided to the lens-attached substrate 41 is different among at least a plurality of the lens-attached substrates 41 constituting the stacked lens structure 11. For example, the opening width of the through-hole 83 is large in the lower-layer lens-attached substrate 41. (3) The diameter of the lens portion 91 provided to the lens-attached substrate 41 is different among at least a plurality of the lens-attached substrates 41 constituting the stacked lens structure 11. For example, the diameter of the lens portion 91 is large in the lens portion 91 of the lower-layer lens-attached substrate 41. (4) The thickness of the lens portion 91 provided to the lens-attached substrate 41 is different among at least a plurality of the lens-attached substrates 41 constituting the stacked lens structure 11. For example, the thickness of the lens portion 91 is large in the lens portion 91 of the lower-layer lens-attached substrate 41. (5) The distance between the lenses provided to the lens-attached substrate 41 is different among at least a plurality of the lens-attached substrates 41 constituting the stacked lens structure 11. (6) The volume of the lens resin portion 82 provided to the lens-attached substrate 41 is different among at least a plurality of the lens-attached substrates 41 constituting the stacked lens structure 11. For example, the volume of the lens resin portion 82 is large in the lens resin portion 82 of the lower-layer lens-attached substrate 41. (7) The material of the lens resin portion 82 provided to the lens-attached substrate 41 is different among at least a plurality of the lens-attached substrates 41 constituting the stacked lens structure 11.

In general, incident light which is incident on a camera module includes vertical incident light and oblique incident light. A large amount of the oblique incident light collides with the aperture stop plate 51 to be absorbed by the aperture stop plate or to be reflected toward the outside of the camera module 1D. The oblique incident light which is not constricted by the aperture stop plate 51 is likely to collide with the sidewall of the through-hole 83 according to the incident angle to be reflected therefrom.

The direction of propagation of the reflected light of the oblique incident light is defined by the incident angle of the oblique incident light 85 and the angle to the sidewall of the through-hole 83 illustrated in FIG. 13. In case of the so-called fan shape where the opening width of the through-hole 83 is increased from the incident side toward the light-receiving device 12 side, when the oblique incident light 85 having a specific incident angle which is not constricted by the aperture stop plate 51 collides with the sidewall of the through-hole 83, the oblique incident light is reflected in the direction toward the light-receiving device 12, so that the oblique incident light is likely to be stray light or noise light.

However, in the stacked lens structure 11 illustrated in FIG. 13, as illustrated in FIG. 15, the through-hole 83 formed in a so-called tapered-down shape where the opening width is decreased toward the lower side (the side where the light-receiving device 12 is disposed). In case of this shape, the oblique incident light 85 colliding on the sidewall of the through-hole 83 is reflected not in the downward direction, so-called the "light-receiving device 12 direction" but in the upward direction, so-called the "incident side direction". Therefore, it is possible to obtain a function or an effect that the occurrence of stray light or noise light is suppressed.

In the through-hole 83 of the lens-attached substrate 41, in order to reduce the light colliding on the sidewall and being reflected, it is more preferable that a material having light absorbing property is disposed on the sidewall.

As an example, in case of using the camera module 1D as a camera, when light (for example, visible light) which is desired to be received is set as first light and light (for example, UV light) of which wavelength is different from that of the first light is set as second light, a material obtained by dispersing carbon particles as a first-light (visible light) absorbing material in the resin which is to be cured by the second light (UV light) is applied or sprayed on the surface of the carrier substrate 81, only the resin on the sidewall portion of the through-hole 83 is cured by irradiating with the second light (UV light), and a resin of the other areas is removed, so that a layer of a material having a light absorbing property with respect to the first light (visible light) may be formed on the sidewall of the through-hole 83.

The stacked lens structure 11 illustrated in FIG. 15 is an example of the structure where the aperture stop plate 51 is disposed on the top of a plurality of the stacked lens-attached substrates 41. The aperture stop plate 51 may be disposed to be inserted into any one of middle lens-attached substrates 41 instead of the top of a plurality of the stacked lens-attached substrates 41.

Furthermore, as another example, the flat-shaped aperture stop plate 51 is not provided separately from the lens-attached substrate 41, but a layer of a material having a light absorbing property may be formed on the surface of the lens-attached substrate 41, and the layer of the material may be allowed to function as an aperture stop. For example, the material obtained by dispersing carbon particles as a first-light (visible light) absorbing material in the resin which is to be cured by the second light (UV light) is applied or sprayed on the surface of the lens-attached substrate 41, a resin of other areas excluding the area which is desired to transmit light at the time of functioning as an aperture stop is irradiated with the second light (UV light) to cure the resin to remain, the resin of the area which is not cured, that is, the resin of the area where is desired to transmit light at the time of functioning as an aperture stop is removed, so that the aperture stop may be formed in the surface of the lens-attached substrate 41.

In addition, the lens-attached substrate 41 where the aperture stop is to be formed in the surface may be the lens-attached substrate 41 disposed in the uppermost layer of the stacked lens structure 11 or may be the lens-attached substrate 41 in the middle layer of the stacked lens structure 11.

The stacked lens structure 11 illustrated in FIG. 15 has a structure where the lens-attached substrates 41 are stacked.

As another embodiment, the stacked lens structure 11 may also be a structure including a plurality of the lens-attached substrates 41 and at least one carrier substrate 81 which is not provided with the lens resin portion 82. In this structure, the carrier substrate 81 which is not provided with the lens resin portion 82 may be disposed on the lowermost layer or the uppermost layer of the stacked lens structure 11 or may be disposed as a layer of the inner side of the stacked lens structure 11. Due to the structure, it is possible to obtain a function or an effect that for example, distances among a plurality of the lenses provided to the stacked lens structure 11 or a distance between the lens resin portion 82 of the lowermost layer of the stacked lens structure 11 and the light-receiving device 12 disposed at the lower side of the stacked lens structure 11 are arbitrarily set.

In addition, due to the structure, it is possible to obtain a function or an effect that the opening width of the carrier substrate 81 which is not provided with the lens resin portion 82 is appropriately set, and the material having light absorbing property is disposed in the area excluding the aperture portion, so that the structure is allowed to function as an aperture stop plate.

7. Sixth Embodiment of Camera Module

Figure 16:
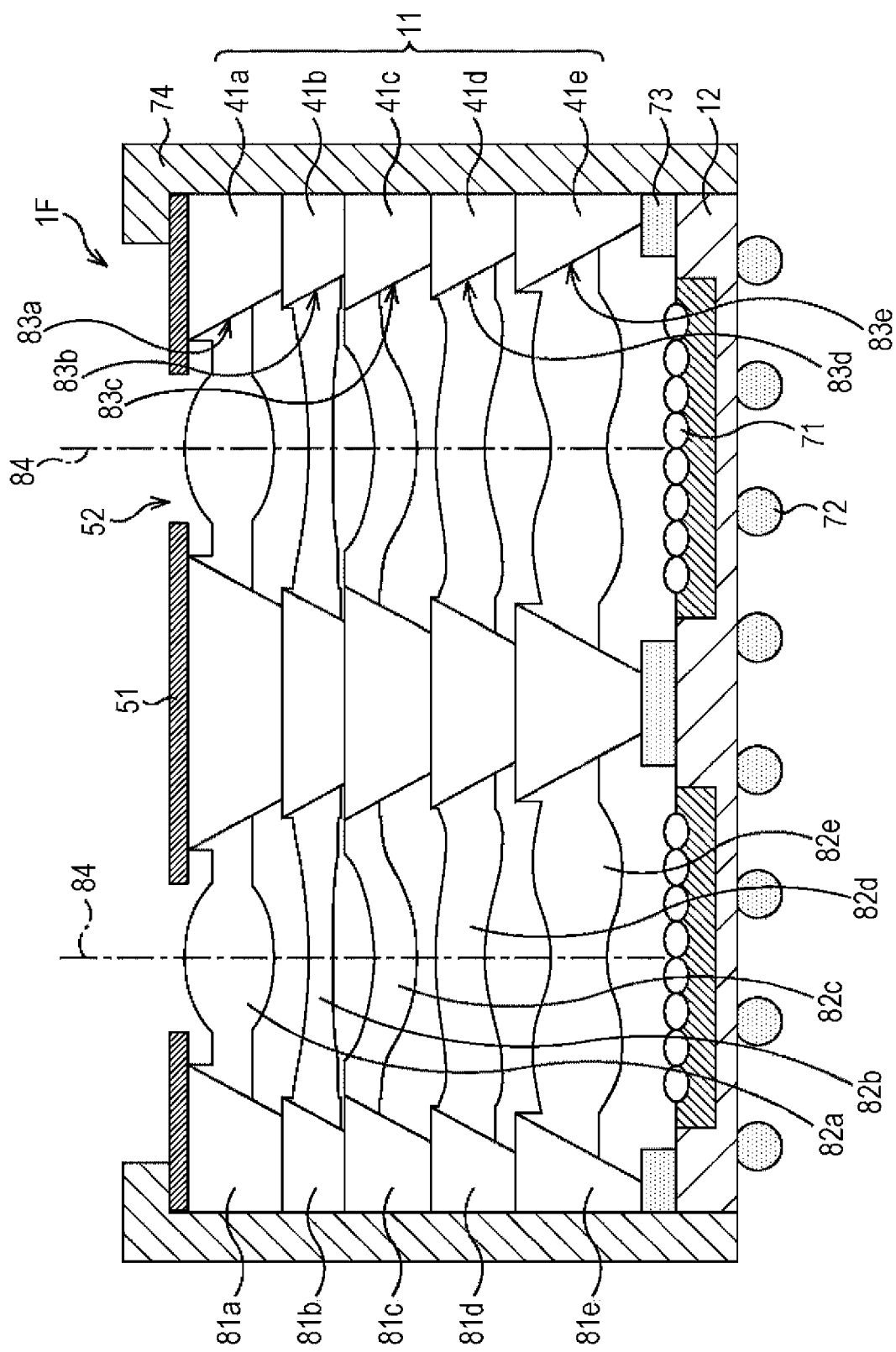
FIG. 16 is a diagram illustrating a sixth embodiment of a camera module using a stacked lens structure employing the present technology.

FIG. 16 is a diagram illustrating a sixth embodiment of a camera module using a stacked lens structure employing the present technology.

In FIG. 16, the components corresponding to those of the fourth embodiment illustrated in FIG. 13 are denoted by the same reference numerals, and description is mainly made about the components different from those of the camera module 1D of FIG. 13.

Similarly to the camera module 1D illustrated in FIG. 13, in the camera module 1F illustrated in FIG. 16, the incident light is constricted by the aperture stop plate 51 and, after that, is spread in the inner portion of the stacked lens structure 11 to be incident on the light-receiving device 12 disposed under the stacked lens structure 11. Namely, in the overview of the entire stacked lens structure 11, the light propagates to spread in a substantially fan shape from the aperture portion 52 of the aperture stop plate 51 toward the lower side.

The camera module 1F of FIG. 16 is different from the camera module 1D of FIG. 13 in terms that the cross-section shape of the through-hole 83 of each of the lens-attached substrates 41 constituting the stacked lens structure 11 is a so-called fan shape where the opening width is increased toward the lower side (the side where the light-receiving device 12 is disposed).

Since the stacked lens structure 11 of the camera module 1F has the structure where the incident light propagates to spread in a fan shape from the aperture portion 52 of the aperture stop plate 51 toward the lower side, in the fan shape where the opening width of the through-hole 83 is increased toward the lower side, for example, the carrier substrate 81 is less likely to interfere with the optical path than a tapered-down shape where the opening width of the through-hole 83 is decreased toward the lower side. Therefore, a function that a degree of lens design is high is obtained.

In addition, with respect to the cross section area of the lens resin portion 82 including the carrying portion 92 in the substrate planar directions, in case of the tapered-down shape where the opening width of the through-hole 83 is decreased toward the lower side, the cross section area in the lower surface of the lens resin portion 82 has a specific size in order to transmit the light beam incident on the lens 21, and the cross section area is increased from the lower surface of the lens resin portion 82 toward the upper surface thereof.

On the contrary, in case of the fan shape where the opening width of the through-hole 83 is increased toward the lower side, the cross section area in the lower surface of the lens resin portion 82 is substantially the same as that of the case of the tapered-down shape, but the cross section area is decreased from the lower surface of the lens resin portion 82 toward the upper surface thereof.

Therefore, due to the structure where the opening width of the through-hole 83 is increased toward the lower side, it is possible to obtain a function or an effect that it is possible to suppress the size of the lens resin portion 82 including the carrying portion 92 to be small. In addition, therefore, due to the structure, it is possible to obtain a function or an effect that it is possible to reduce the difficulty in lens formation occurring in the case where the above-described lenses are large.

8. Seventh Embodiment of Camera Module

Figure 17:
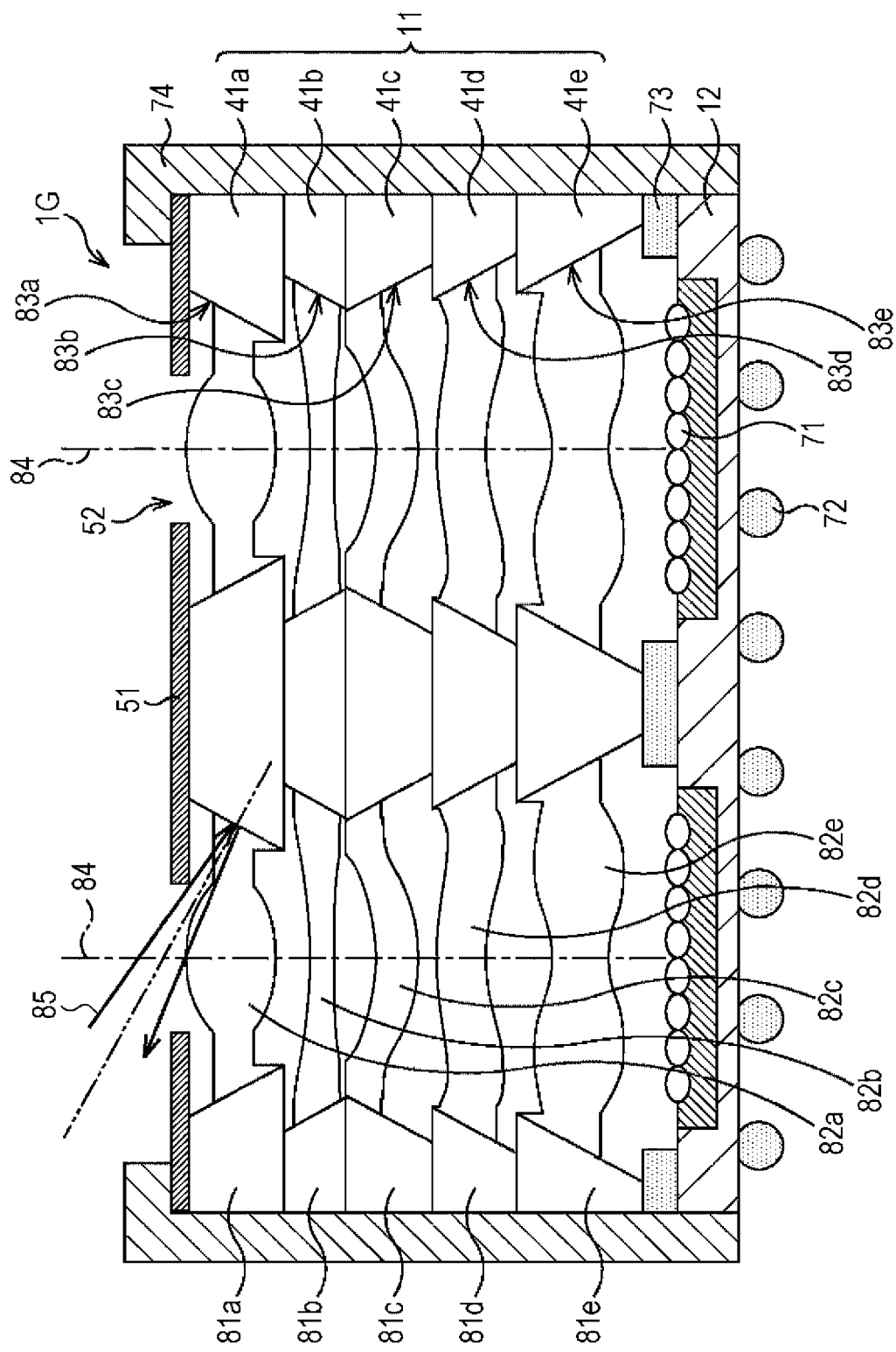
FIG. 17 is a diagram illustrating a seventh embodiment of a camera module using a stacked lens structure employing the present technology.

FIG. 17 is a diagram illustrating a seventh embodiment of a camera module using a stacked lens structure employing the present technology.

In FIG. 17, the components corresponding to those of FIG. 13 are denoted by the same reference numerals, and description is mainly made about the components different from those of the camera module 1D of FIG. 13.

The camera module 1G of FIG. 17 is also different from the camera module 1D illustrated in FIG. 13 in terms of the shapes of the lens resin portion 82 and the through-hole 83 of each of the lens-attached substrates 41 constituting the stacked lens structure 11.

The stacked lens structure 11 of the camera module 1G is configured to include a lens-attached substrate 41 where the shape of the through-hole 83 is a so-called tapered-down shape where the opening width is decreased toward the lower side (the side where the light-receiving device 12 is disposed) and a lens-attached substrate 41 where the shape of the through-hole 83 is a so-called fan shape where the opening width is increased toward the lower side.

In the lens-attached substrate 41 where the through-hole 83 has a so-called tapered-down shape where the opening width is decreased toward the lower side, as described above, the oblique incident light 85 colliding on the sidewall of the through-hole 83 is reflected in the upward direction, so-called the incident side direction, so that it is possible to obtain a function or an effect that the occurrence of stray light or noise light is suppressed.

Therefore, in the stacked lens structure 11 of FIG. 17, among a plurality of the lens-attached substrates 41 constituting the stacked lens structure 11, particularly for a plurality of the lens-attached substrates of the upper side (incident side), used are the lens-attached substrates 41 where the through-hole 83 has the so-called tapered-down shape where the opening width is decreased toward the lower side.

In the lens-attached substrate 41 where the through-hole 83 is formed in a so-called fan shape where the opening width is increased toward the lower side, as described above, the carrier substrate 81 provided to the lens-attached substrate 41 is less likely to interfere with the optical path, so that it is possible to obtain a function or an effect that a degree of lens design is increased and the size of the lens resin portion 82 including the carrying portion 92 provided to the lens-attached substrate 41 is suppressed to be small.

In the stacked lens structure 11 of FIG. 17, since light propagates to spread in a fan shape from the aperture stop to the lower side, among a plurality of the lens-attached substrates 41 constituting the stacked lens structure 11, the size of the lens resin portion 82 provided to some lens-attached substrates 41 disposed in the lower side is large. If the fan-shaped through-hole 83 is used for such a large lens resin portion 82, the function of suppressing the size of the lens resin portion 82 is exhibited to be large.

Therefore, in the stacked lens structure 11 of FIG. 17, among a plurality of the lens-attached substrates 41 constituting the stacked lens structure 11, particularly for a plurality of the lens-attached substrate of the lower side, used are the lens-attached substrate 41 where the through-hole 83 has the so-called fan shape where the opening width is increased toward the lower side.

9. Detailed Configuration of Lens-Attached Substrate

Next, the detailed configuration of the lens-attached substrate 41 will be described.

Figure 18:
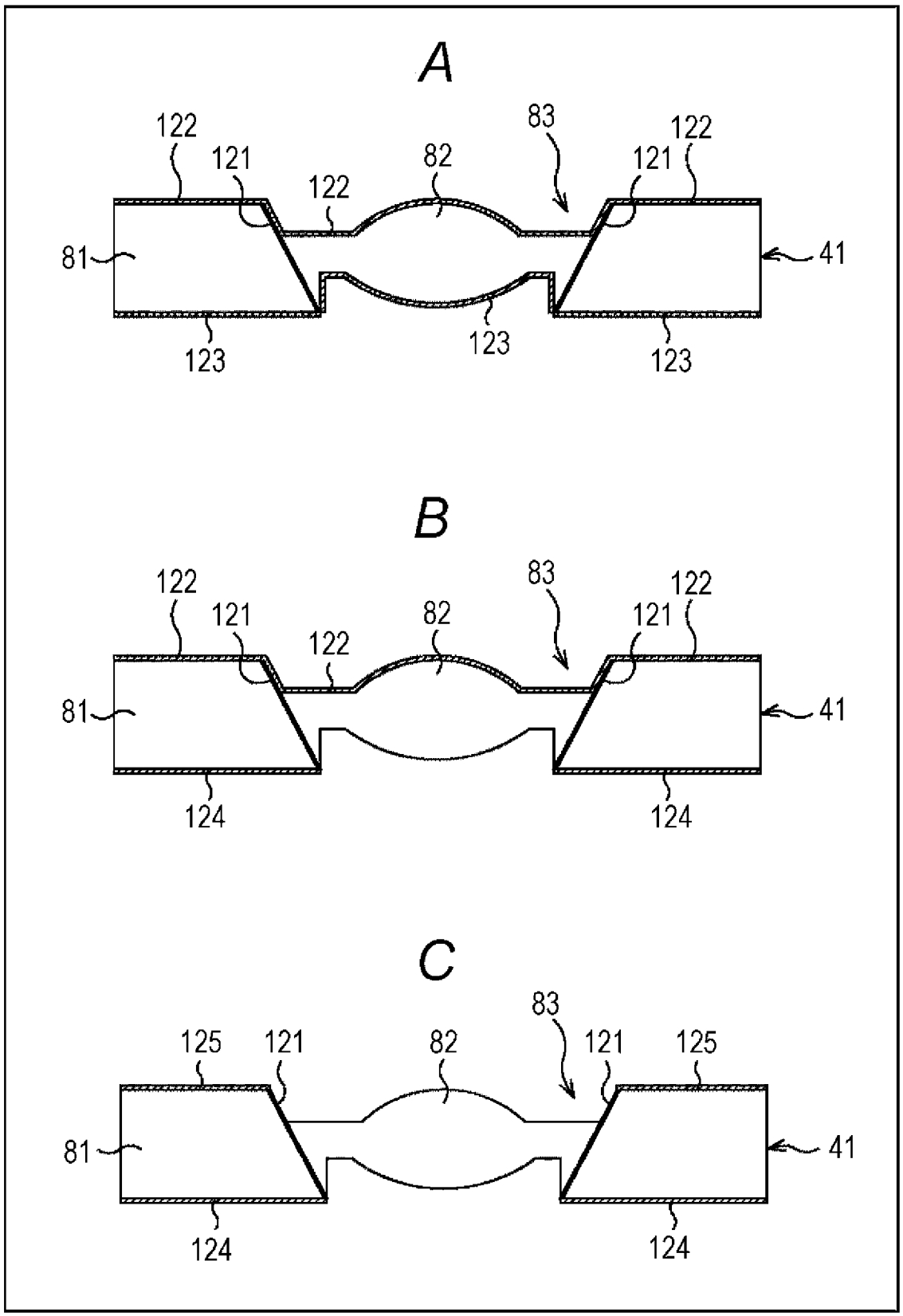
FIG. 18 is a cross-sectional diagram illustrating a detailed configuration of a lens-attached substrate.
Figure 19:
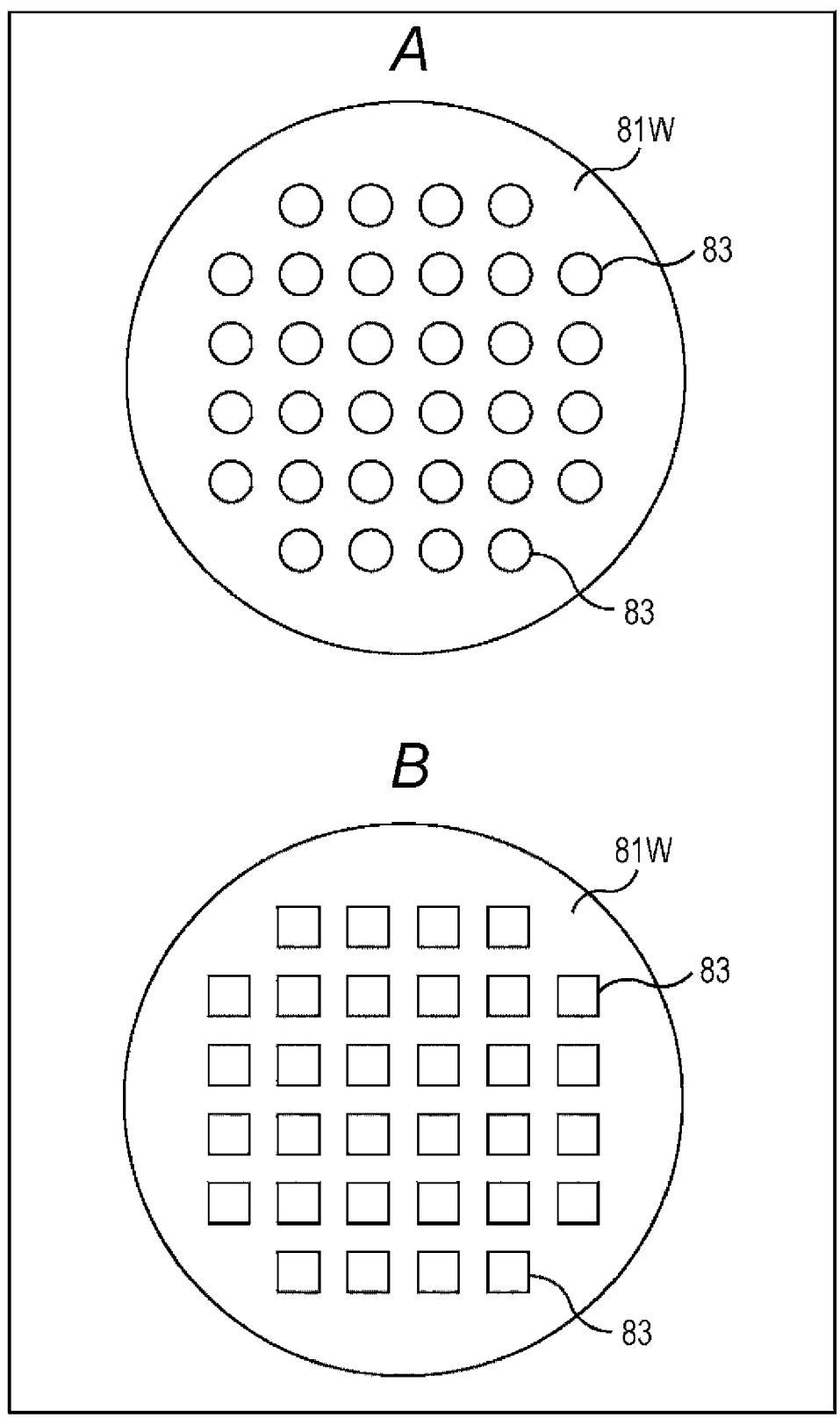
FIG. 19 is a diagram for explaining a manufacturing method for a lens-attached substrate.
Figure 21:
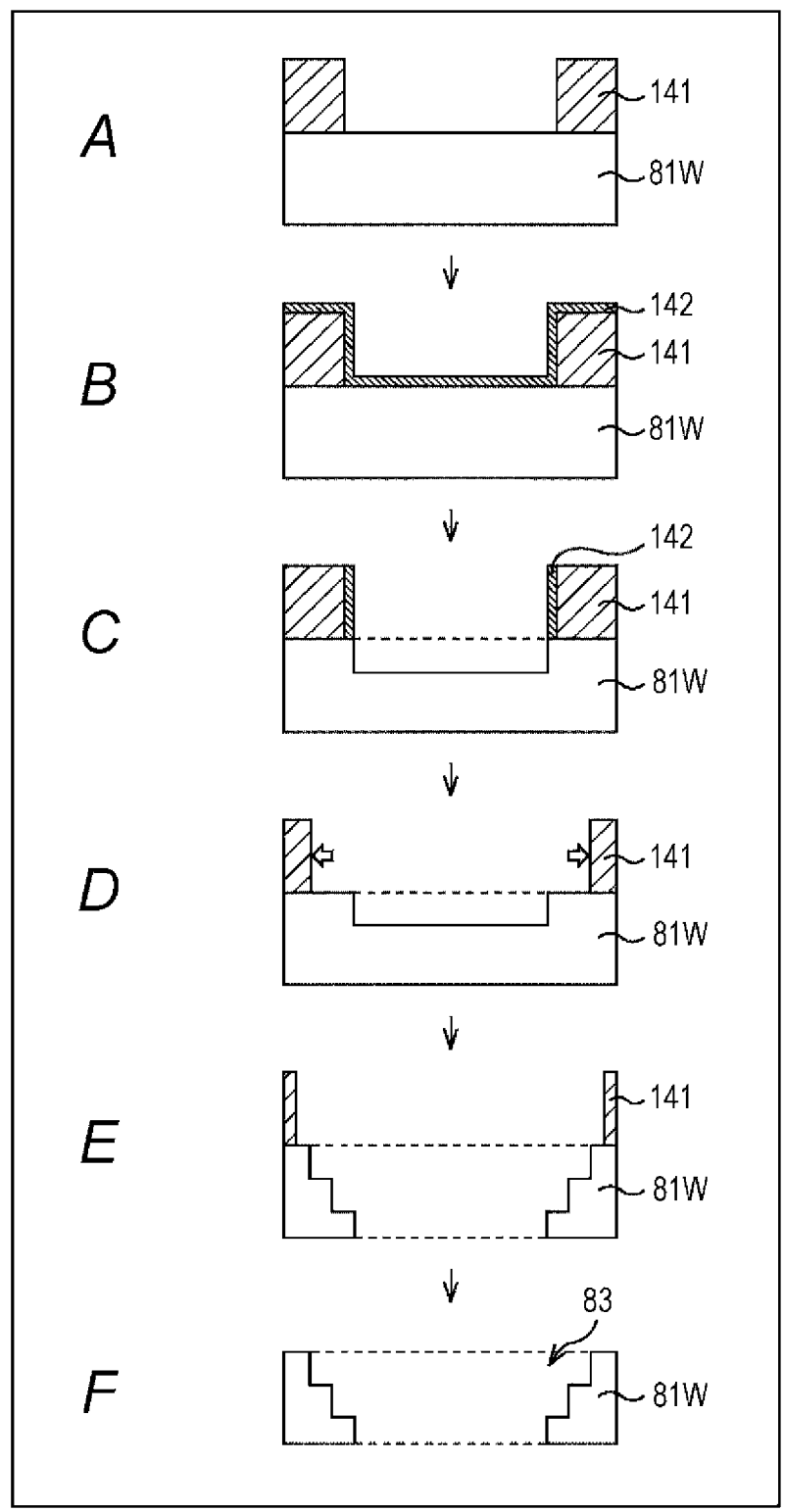
FIG. 21 is a diagram for explaining a manufacturing method for a lens-attached substrate.
Figure 22:
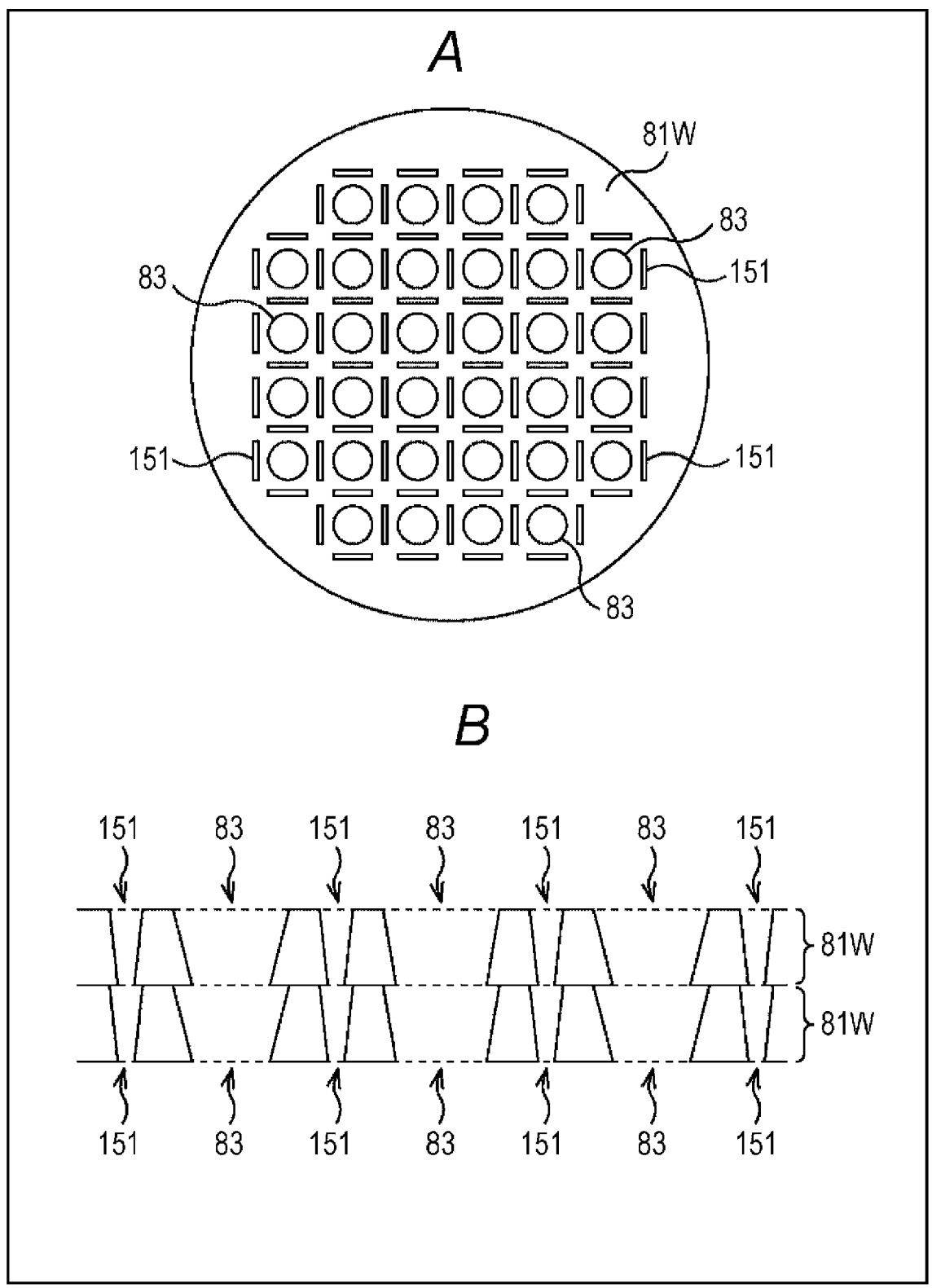
FIG. 22 is a diagram for explaining a manufacturing method for a lens-attached substrate.
Figure 23:
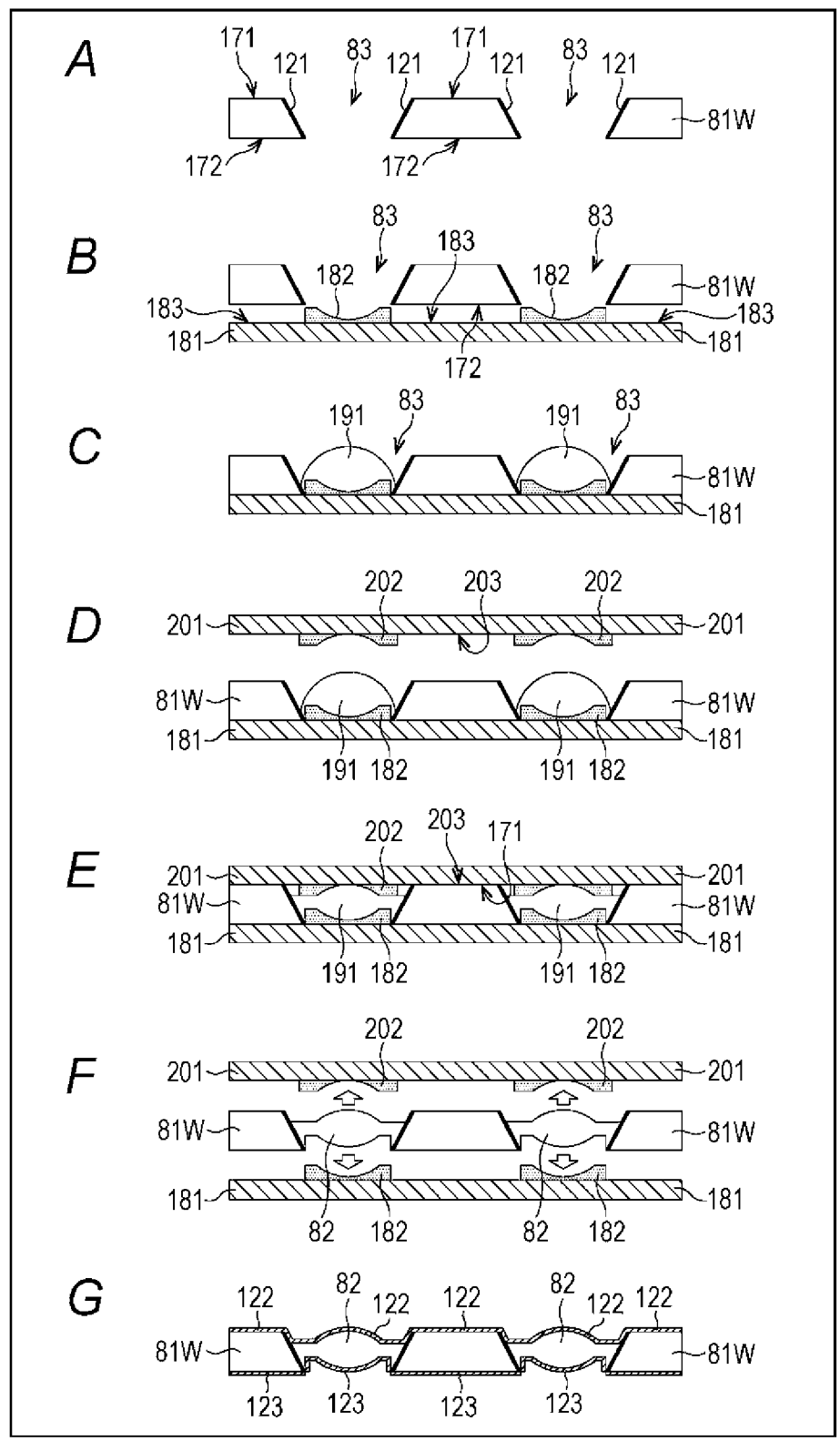
FIG. 23 is a diagram for explaining a manufacturing method for a lens-attached substrate.

FIGS. 18A to 18C are cross-sectional diagrams illustrating the detailed configuration of the lens-attached substrate 41.

In addition, in FIGS. 18A to 18C, among the five lens-attached substrates 41a to 41e, the uppermost-layer lens-attached substrate 41a is illustrated, but other lens-attached substrates 41 have the same configuration.

As the configuration of the lens-attached substrate 41, any one of the configurations of FIGS. 18A to 18C may be taken.

In the lens-attached substrate 41 illustrated in FIG. 18A, with respect to the through-hole 83 provided to the carrier substrate 81, the lens resin portion 82 is formed so as to block the through-hole 83 as viewed from the upper surface. As described above with reference to FIG. 14, the lens resin portion 82 is configured to include the lens portion 91 (not shown) in the central portion and the carrying portion 92 (not shown) in the peripheral portion.

In order to prevent ghost or flare caused by light reflection, a film 121 having light absorbing property or light-shielding property is formed on the sidewall of the through-hole 83 of the lens-attached substrate 41. For the convenience, the film 121 is called a light-shielding film 121.

An upper surface layer 122 including an oxide, a nitride, or other insulating materials is formed on the upper surface of the carrier substrate 81 and the lens resin portion 82, and a lower surface layer 123 including an oxide, a nitride, or other insulating materials is formed on the lower surface of the carrier substrate 81 and the lens resin portion 82.

As an example, the upper surface layer 122 is configured with an anti-reflection film obtained by alternately stacking a plurality of low refractive films and a plurality of high refractive films. The anti-reflection film may be configured, for example, by alternately stacking the low refractive films and the high refractive films as a total of four films. The low refractive film is configured with, for example, an oxide film of $SiO_x$ (1≤x≤2), SiOC, SiOF, or the like, and the high refractive film is configured with, for example, a metal oxide film of TiO, TaO, $Nb_2O_5$, or the like.

In addition, the configuration of the upper surface layer 122 may be designed, for example, so as to obtain desired anti-reflection performance using optical simulation, and material, thickness, the number of stacked films, and the like of the low refractive film and the high refractive film are not particularly limited. In the embodiment, the outermost surface of the upper surface layer 122 is configured with the low refractive film, and the thickness thereof is, for example, in a range of 20 to 1000 nm, the density thereof is, for example, in a range of 2.2 to 2.5 $g/cm^3$, the flatness thereof is, for example, about 1 nm or less of root mean square of roughness Rq (RMS). In addition, as described later in detail, the upper surface layer 122 is a joining film in the joining to other lens-attached substrate 41.

As an example, the upper surface layer 122 may be configured with an anti-reflection film obtained by alternately stacking a plurality of low refractive films and a plurality of high refractive films and may be preferably an inorganic anti-reflection film among the anti-reflection films. As another example, the upper surface layer 122 may be a single-layered film including an oxide, a nitride, or other insulating materials or may be an inorganic film among the single-layered films.

As an example, the lower surface layer 123 may also be configured with an anti-reflection film obtained by alternately stacking a plurality of low refractive films and a plurality of high refractive films and may be preferably an inorganic anti-reflection film among the anti-reflection films. As another example, the lower surface layer 123 may be a single-layered film including an oxide, a nitride, or other insulating materials or may be an inorganic film among the single-layered films.

With respect to the lens-attached substrates 41 of FIGS. 18B and 18C, only the portions different from those of the lens-attached substrate 41 illustrated in FIG. 18A will be described.

In the lens-attached substrate 41 illustrated in FIG. 18B, the film formed on the lower surface of the carrier substrate 81 and the lens resin portion 82 is different from that of the lens-attached substrate 41 illustrated in FIG. 18A.

In the lens-attached substrate 41 of FIG. 18B, a lower surface layer 124 including an oxide, a nitride, or other insulating materials is formed on the lower surface of the carrier substrate 81, and the lower surface layer 124 is not formed on the lower surface of the lens resin portion 82. The lower surface layer 124 may be configured with the same material as that of the upper surface layer 122 or may be configured with a material different from that of the upper surface layer.

This structure may be formed, for example, by a method of forming the lower surface layer 124 on the lower surface of the carrier substrate 81 before forming the lens resin portion 82, and after that, forming the lens resin portion 82. Alternatively, after the lens resin portion 82 is formed, a mask is formed on the lens resin portion 82, a film constituting the lower surface layer 124 is deposited on the lower surface of the carrier substrate 81, for example, by PVD in the state that no mask is formed on the carrier substrate 81.

In the lens-attached substrate 41 of FIG. 18C, an upper surface layer 125 including an oxide, a nitride, or other insulating materials is formed on the upper surface of the carrier substrate 81, and the upper surface layer 125 is not formed on the upper surface of the lens resin portion 82.

Similarly, in the lower surface of the lens-attached substrate 41, a lower surface layer 124 including an oxide, a nitride, or other insulating materials is formed on the lower surface of the carrier substrate 81, and the lower surface layer 124 is not formed on the lower surface of the lens resin portion 82.

This structure may be formed, for example, by a method of forming the upper surface layer 125 and the lower surface layer 124 on the carrier substrate 81 before forming the lens resin portion 82, and after that, forming the lens resin portion 82. Alternatively, after the lens resin portion 82 is formed, a mask is formed on the lens resin portion 82, a film constituting the upper surface layer 125 and a film constituting the lower surface layer 124 are deposited on the surfaces of the carrier substrate 81, for example, by PVD in the state that no mask is formed on the carrier substrate 81. The lower surface layer 124 and the upper surface layer 125 may be configured with the same material or may be configured with different materials.

The lens-attached substrate 41 may be configured as described heretofore.

10. Manufacturing Method for Lens-Attached Substrate

Next, a manufacturing method for the lens-attached substrate 41 will be described with reference to FIGS. 19 to 29.

First, a substrate-state carrier substrate 81W where a plurality of the through-holes 83 are formed is prepared. As the carrier substrate 81W, for example, a silicon substrate used for a typical semiconductor device may be used. The shape of the carrier substrate 81W is, for example, a circle as illustrated in FIG. 19A, and the diameter thereof is set to be, for example, 200 mm, 300 mm, or the like. The carrier substrate 81W may be not the silicon substrate but, for example, a glass substrate, a resin substrate, or a metal substrate.

In addition, in the embodiment, the planar shape of the through-hole 83 is a circle as illustrated in FIG. 19A, but the planar shape of the through-hole 83 may be, for example, a polygon such as a quadrangle as illustrated in FIG. 19B.

The opening width of the through-hole 83 may be taken in a range of, for example, from about 100 μm to about 20 mm. In this case, in the carrier substrate 81W, for example, about one hundred to five million through-holes may be disposed.

In this specification, the size of the through-hole 83 in the planar directions of the lens-attached substrate 41 is called the opening width. With respect to the opening width, if there no particularly specification, in the case where the planar shape of the through-hole 83 is a quadrangle, the opening width denotes a length of one side, and in the case where the planar shape of the through-hole 83 is a circle, the opening width denotes a diameter.

As illustrated in FIGS. 20A to 20C, the through-hole 83 is formed so that a second opening width 132 in a second surface facing a first surface of the carrier substrate 81W is smaller than a first opening width 131 in the first surface.

As an example of a three-dimensional shape of the through-hole 83 where the second opening width 132 is smaller than the first opening width 131, the through-hole 83 may have a truncated conical shape illustrated in FIG. 20A or may have a polygonal truncated pyramidal shape. The cross-section shape of the sidewall of the through-hole 83 may be a straight line as illustrated in FIG. 20A or may be a curved line as illustrated in FIG. 20B. Otherwise, the cross-section shape may have a step difference as illustrated in FIG. 20C.

With respect to the through-hole 83 where the second opening width 132 is smaller than the first opening width 131, a resin is supplied into the through-hole 83, when the lens resin portion 82 is formed by pressing the resin with mold frame members in the facing directions from the first and second surfaces, the resin which is to be the lens resin portion 82 is pressed on the sidewall of the through-hole 83 by being exerted on by forces from the two facing mold frame members. Therefore, a function can be obtained that the adhesion strength between the resin which is to be the lens resin portion 82 and the carrier substrate is increased.

In addition, as another embodiment of the through-hole 83, the first opening width 131 and the second opening width 132 may have the same shape, and in other words, may have the shape where the cross-section shape of the sidewall of the through-hole 83 is vertical.

<Method of Forming Through-Hole Using Wet Etching>

The through-hole 83 of the carrier substrate 81W can be formed by etching the carrier substrate 81W by wet etching. More specifically, before the etching of the carrier substrate 81W is performed, an etching mask for preventing non-opening regions of the carrier substrate 81W from being etched is formed on the surface of the carrier substrate 81W. As a material of the etching mask, for example, an insulating film such as a silicon oxide film or a silicon nitride film is used. The etching mask is formed by forming a layer of an etching mask material on the surface of the carrier substrate 81W and opening a pattern which is to be the planar shape of the through-hole 83 on the layer. After the etching mask is formed, the through-hole 83 is formed on the carrier substrate 81W by etching the carrier substrate 81W.

As the carrier substrate 81W, for example, in case of using monocrystalline silicon of which the substrate surface orientation is (100), in order to form the through-hole 83, crystal anisotropic wet etching using an alkaline solution such as KOH can be employed.

If the crystal anisotropic wet etching using an alkaline solution such as KOH performed on the carrier substrate 81W which is a monocrystalline silicon of which the substrate surface orientation is (100), the etching is performed so that the (111) plane appears on opening sidewall. As a result, in the case where the planar shape of the opening portion of the etching mask is any one of a circle and a quadrangle, the through-hole 83 is obtained so that the planar shape thereof is a quadrangle; with respect to the opening width of the through-hole 83, the second opening width 132 is smaller than the first opening width 131; and the three-dimensional shape of the through-hole 83 is a truncated pyramidal shape or a shape similar to the truncated pyramidal shape. The angle of the sidewall of the through-hole 83 which becomes the truncated pyramidal shape is about 55° with respect to the substrate plane.

As another example of the etching for forming the through-hole, wet etching using a chemical solution capable of etching silicon in an arbitrary shape without restriction to crystal orientation disclosed in WO 2011/010739 or the like may be performed. As the chemical solution, for example, a chemical solution obtained by adding at least one of polyoxyethylene alkyl phenyl ether, polyoxyalkylene alkyl ether, and polyethylene glycol to a TMAH (tetra-methyl ammonium hydroxide) aqueous solution, a chemical solution obtained by adding isopropyl alcohol to a KOH solution, or the like may be employed.

If the etching for forming the through-hole 83 is performed on the carrier substrate 81W which is a monocrystalline silicon of which the substrate surface orientation is (100) by using any one of the above-described chemical solutions, in the case where planar shape of the opening portion of the etching mask is a circle, the through-hole 83 is obtained so that the planar shape is a circle; the second opening width 132 is smaller than the first opening width 131; and the three-dimensional shape is a truncated cone or a shape similar to the truncated cone.

In the case where the planar shape of the opening portion of the etching mask is a quadrangle, the through-hole 83 is obtained so that the planar shape is a quadrangle; with respect to the opening width, the second opening width 132 is smaller than the first opening width 131; and the three-dimensional shape is a truncated pyramidal shape or a shape similar to the truncated pyramidal shape. The angle of the sidewall of the through-hole 83 which becomes the truncated cone or the truncated pyramidal shape is about 45° with respect to the substrate plane.

<Method of Forming Through-Hole Using Dry Etching>

In addition, in the etching for forming the through-hole 83, not the above-described wet etching but dry etching may be used.

The method of forming the through-hole 83 using the dry etching will be described with reference to FIGS. 21A to 21F.

As illustrated in FIG. 21A, an etching mask 141 is formed on one surface of the carrier substrate 81W. The etching mask 141 has a mask pattern where a portion where the through-holes 83 are to be formed is opened.

Next, as illustrated in FIG. 21B, a protective film 142 for protecting the sidewall of the etching mask 141 is formed, and after that, as illustrated in FIG. 21C, the carrier substrate 81W is etched by a predetermined depth by drying etching. By the dry etching process, the protective film 142 of the surface of the carrier substrate 81W and the surface of the etching mask 141 is removed, but the protective film 142 of the side surface of the etching mask 141 remains, so that the sidewall of the etching mask 141 is protected. After the etching, as illustrated in FIG. 21D, the protective film 142 of the sidewall is removed, the etching mask 141 is recessed in the direction that the pattern size of the opening pattern is increased.

Next, the protective film formation process, the dry etching process, and the etching mask recession process of FIGS. 21B to 21D are repeatedly performed again. Therefore, as illustrated in FIG. 21E, the carrier substrate 81W is etched so as to have a staircase shape (concave-convex shape) having periodic step differences.

Finally, if the etching mask 141 is removed, as illustrated in FIG. 21F, the through-hole 83 having a step-shaped sidewall is formed in the carrier substrate 81W. The width (width of one step) of the staircase shape of the through-hole 83 in the planar directions is set to be, for example, in a range of about 400 nm to 1 μm.

As described heretofore, in case of forming the through-hole 83 using the dry etching, the protective film formation process, the dry etching process, and the etching mask recession process are repeatedly performed.

Since the sidewall of the through-hole 83 has the periodic staircase shape (concave-convex shape), it is possible to suppress reflection of the incident light. In addition, in the case where the sidewall of the through-hole 83 has a concave-convex shape having a random size, voids are generated in the adhesion layer between the lens formed in the through-hole 83 and the sidewall, in some cases, the adhesiveness to the lens may be deteriorated due to the voids. However, according to the above-described forming method, since the sidewall of the through-hole 83 has the periodic concave-convex shape, the adhesiveness is improved, so that it is possible to suppress a change in optical characteristic according to a difference in lens position.

As examples of the materials used in the processes, for example, the carrier substrate 81W may be monocrystalline silicon, the etching mask 141 may be photoresist, the protective film 142 may be a fluorocarbon polymer formed by using gas plasma such as $C_4F_8$ or $CHF_3$, the etching process may be plasma etching using a gas containing F such as $SF_6/O_2$ or $C_4F_8/SF_6$, the mask recession process may be plasma etching including $O_2$ such as an $O_2$ gas or $CF_4/O_2$.

In addition, the carrier substrate 81W may be a monocrystalline silicon, the etching mask 141 may be $SiO_2$, the etching may be plasma containing $Cl_2$, the protective film 142 may be an oxide film obtained by oxidizing an etching target material by using $O_2$ plasma, the etching process may plasma etching using a gas containing $Cl_2$, and the mask recession process may be plasma etching using a gas containing F such as $CF_4/O_2$.

As described heretofore, although a plurality of the through-holes 83 are simultaneously formed in the carrier substrate 81W by wet etching or dry etching, as illustrated in FIG. 22A, through-grooves 151 may also be formed in areas of the carrier substrate 81W where the through-holes 83 are not formed.

FIG. 22A is a plan diagram illustrating the carrier substrate 81W where through-grooves 151 as well as the through-holes 83 are formed.

For example, as illustrated in FIG. 22A, the through-grooves 151 are disposed in only portions between the through-holes 83 in the row and column directions so as to avoid a plurality of the through-holes 83 disposed in a matrix shape.

In addition, the through-grooves 151 of the carrier substrate 81W may be disposed at the same positions among the lens-attached substrates 41 constituting the stacked lens structure 11. In this case, as illustrated in the cross-sectional diagram of FIG. 22B, in the state that a plurality of the carrier substrates 81W are stacked as the stacked lens structure 11, the structure is configured so that a plurality of the through-grooves 151 of the carrier substrates 81W penetrate a plurality of the carrier substrates 81W.

Due to the through-groove 151 of the carrier substrate 81W as a portion of the lens-attached substrate 41, it is possible to obtain a function or an effect that, for example, in the case where a stress of deforming the lens-attached substrate 41 is exerted from an outer portion of the lens-attached substrate 41, the deformation of the lens-attached substrate 41 caused by the stress is alleviated.

In addition, due to the through-groove 151, it is possible to obtain a function or an effect that, for example, in the case where the stress of deforming the lens-attached substrate 41 is generated from an inner portion of the lens-attached substrate 41, the deformation of the lens-attached substrate 41 caused by the stress is alleviated.

<Manufacturing Method for Lens-Attached Substrate>

Next, a manufacturing method for the substrate-state lens-attached substrate 41W will be described with reference to FIGS. 23A to 23G.

First, as illustrated in FIG. 23A, a carrier substrate 81W where a plurality of through-holes 83 are formed is prepared. A light-shielding film 121 is formed on the sidewall of the through-hole 83. In FIGS. 23A to 23G, although only the two through-holes 83 are illustrated for lack of space in the paper, actually as illustrated in FIGS. 19A and 19B, a plurality of the through-holes 83 are formed in the planar directions of the carrier substrate 81W. In addition, alignment marks (not shown) for position alignment are formed in the areas close to the outer circumference of the carrier substrate 81W.

A front-side flat portion 171 at the upper side of the carrier substrate 81W and a rear-side flat portion 172 at the lower side of the carrier substrate are flat planes which are formed to be so flat that plasma joining can be performed in the subsequent process. The thickness of the carrier substrate 81W functions as a spacer of determining a lens distance when the substrate is finally diced into lens-attached substrates 41 and the lens-attached substrate is superimposed on other lens-attached substrates 41.

It is preferable that a low-thermal-expansion coefficient substrate material of which the thermal expansion coefficient is 10 ppm/° C. or less is used for the carrier substrate 81W.

Next, as illustrated in FIG. 23B, the carrier substrate 81W is disposed on the lower mold frame 181 where a plurality of the concave-shaped optical transfer surfaces 182 are disposed at a certain interval. More specifically, the rear-side flat portion 172 of the carrier substrate 81W and the flat surface 183 of the lower mold frame 181 are superimposed so that the concave-shaped optical transfer surface 182 is located inside the through-hole 83 of the carrier substrate 81W. The optical transfer surface 182 of the lower mold frame 181 is formed so as to be in one-to-one correspondence with the through-hole 83 of the carrier substrate 81W, and the positions of the carrier substrate 81W and the lower mold frame 181 in the planar directions are adjusted so that the centers of the corresponding optical transfer surface 182 and the through-hole 83 are coincident with each other in the optical axis direction. The lower mold frame 181 is formed with a hard mold frame member and is made of, for example, metal, silicon, quartz, or glass.

Next, as illustrated in FIG. 23C, the energy curable resin 191 is dropped (filled) into the inner side of the superimposed lower mold frame 181 and the through-hole 83 of the carrier substrate 81W. The lens resin portion 82 is formed by using the energy curable resin 191. For this reason, it is preferable that the energy curable resin 191 is defoamed in advance so as not to include foam. As a defoaming process, a vacuum defoaming process or a defoaming process by a centrifugal force is preferred. In addition, it is preferable that the vacuum defoaming process is performed after the filling. By performing the defoaming process, the molding of the lens resin portion 82 can be performed without introducing the foam.

Next, as illustrated in FIG. 23D, the upper mold frame 201 is disposed on the superimposed lower mold frame 181 and carrier substrate 81W. A plurality of concave-shaped optical transfer surfaces 202 are disposed at a certain interval on the upper mold frame 201. Similarly to the time of disposing the lower mold frame 181, the optical transfer surfaces 202 are positioned at a high accuracy so that the centers of the through-holes 83 and the centers of the optical transfer surfaces 202 are coincident with each other in the optical axis direction, and after that, the upper mold frame 201 is disposed.

With respect to the height direction which is the vertical direction in the figure, the position of the upper mold frame 201 is fixed by a control device of controlling the distance between the upper mold frame 201 and the lower mold frame 181 so that the distance between the upper mold frame 201 and the lower mold frame 181 is a preset distance. At this time, the space interposed between the optical transfer surface 202 of the upper mold frame 201 and the optical transfer surface 182 of the lower mold frame 181 has a thickness equal to the thickness of the lens resin portion 82 (lens 21) calculated according to optical design.

In addition, as illustrated in FIG. 23E, similarly to the case where the lower mold frame 181 is disposed, the flat surface 203 of the upper mold frame 201 and the front-side flat portion 171 of the carrier substrate 81W may be superimposed. In this case, the distance between the upper mold frame 201 and the lower mold frame 181 and the thickness of the carrier substrate 81W have the same value, highly-accurate positioning in the planar directions and the height direction is available.

When the interval between the upper mold frame 201 and lower mold frame 181 is controlled so as to be a preset distance, in the above-described process of FIG. 23C, a filling amount of the energy curable resin 191 dropped into the inside of the through-hole 83 of the carrier substrate 81W becomes an amount controlled so as not to be leaked from the through-hole 83 of the carrier substrate 81W and the space surrounded by the upper mold frame 201 and the lower mold frame 181 above and under the through-hole. Therefore, the material of the energy curable resin 191 is not wasted, and thus, it is possible to reduce production cost.

Subsequently, in the state illustrated in FIG. 23E, a curing process is performed on the energy curable resin 191. The energy curable resin 191 is applied with, for example, heat or UV light as energy and is left for a predetermined time, so that the energy curable resin is cured. During the curing, by pushing the upper mold frame 201 downwards or by performing alignment, it is possible to suppress the deformation caused by the contraction of the energy curable resin 191 to the lowest limit.

Instead of the energy curable resin 191, a thermoplastic resin may be used. In this case, in the state illustrated in FIG. 23E, and the energy curable resin 191 is molded in a lens shape by increasing temperature of the upper mold frame 201 and the lower mold frame 181 and is cured by cooling.

Next, as illustrated in FIG. 23F, a control device controlling the positions of the upper mold frame 201 and the lower mold frame 181 moves the upper mold frame 201 upwards and moves the lower mold frame 181 downwards to demold the upper mold frame 201 and the lower mold frame 181 from the carrier substrate 81W. When the upper mold frame 201 and the lower mold frame 181 are demolded from the carrier substrate 81W, the lens resin portion 82 including the lens 21 is formed inside the through-hole 83 of the carrier substrate 81W.

In addition, the surfaces of the upper mold frame 201 and the lower mold frame 181 being in contact with the carrier substrate 81W may be coated with a fluorine-based or silicon-based mold-releasing agent, or the like. By doing so, it is possible to easily demold the upper mold frame 201 and the lower mold frame 181 from the carrier substrate 81W. In addition, as a method of easily demolding from the contact surface of the carrier substrate 81W, various types of coating such as fluorine containing DLC (diamond like carbon) may be performed.

Next, as illustrated in FIG. 23G, the upper surface layer 122 is formed on the front surfaces of the carrier substrate 81W and the lens resin portion 82, and the lower surface layer 123 is formed on the rear surfaces of the carrier substrate 81W and the lens resin portion 82. Before or after the layer formation of the upper surface layer 122 and the lower surface layer 123, if necessary, by performing CMP (chemical mechanical polishing) or the like, the front-side flat portion 171 and the rear-side flat portion 172 of the carrier substrate 81W may be planarized.

By compression-molding (imprinting) the energy curable resin 191 in the through-hole 83 formed in the carrier substrate 81W by using the upper mold frame 201 and the lower mold frame 181, the lens resin portion 82 is formed, and thus, the lens-attached substrate 41 can be manufactured.

The shapes of the optical transfer surface 182 and the optical transfer surface 202 are not limited to the above-described concave shape, but the shapes may be appropriately determined according to the shape of the lens resin portion 82. As illustrated in FIG. 15, the lens shape of the lens-attached substrates 41a to 41e may take various protrusion shapes according to design of the optical system, and for example, a bi-convex shape, a bi-concave shape, a plano-convex shape, a plano-concave shape, a convex meniscus shape, a concave meniscus shape, a high-order a spherical shape, or the like may be taken.

In addition, the shape of the optical transfer surface 182 and the shape of the optical transfer surface 202 may be a shape where the lens shape after the formation becomes a moth-eye structure.

According to the above-described manufacturing method, since a change in distance between the lens resin portions 82 in the planar directions caused by the curing-contraction of the energy curable resin 191 can be prevented by using the carrier substrate 81W, it is possible to control the lens distance at a high accuracy. In addition, it is possible to obtain an effect that the energy curable resin 191 having weak strength is reinforced by the carrier substrate 81W having strong strength. Therefore, it is possible to obtain effects that it is possible to provide a lens array substrate where a plurality of the lenses having a good handling property are disposed and it is possible to suppress a bent state of the lens array substrate.

<Example of Polygon of Through-Hole Shape>

As illustrated in FIG. 19B, the planar shape of the through-hole 83 may be, for example, a polygon such as a quadrangle.

Figure 24:
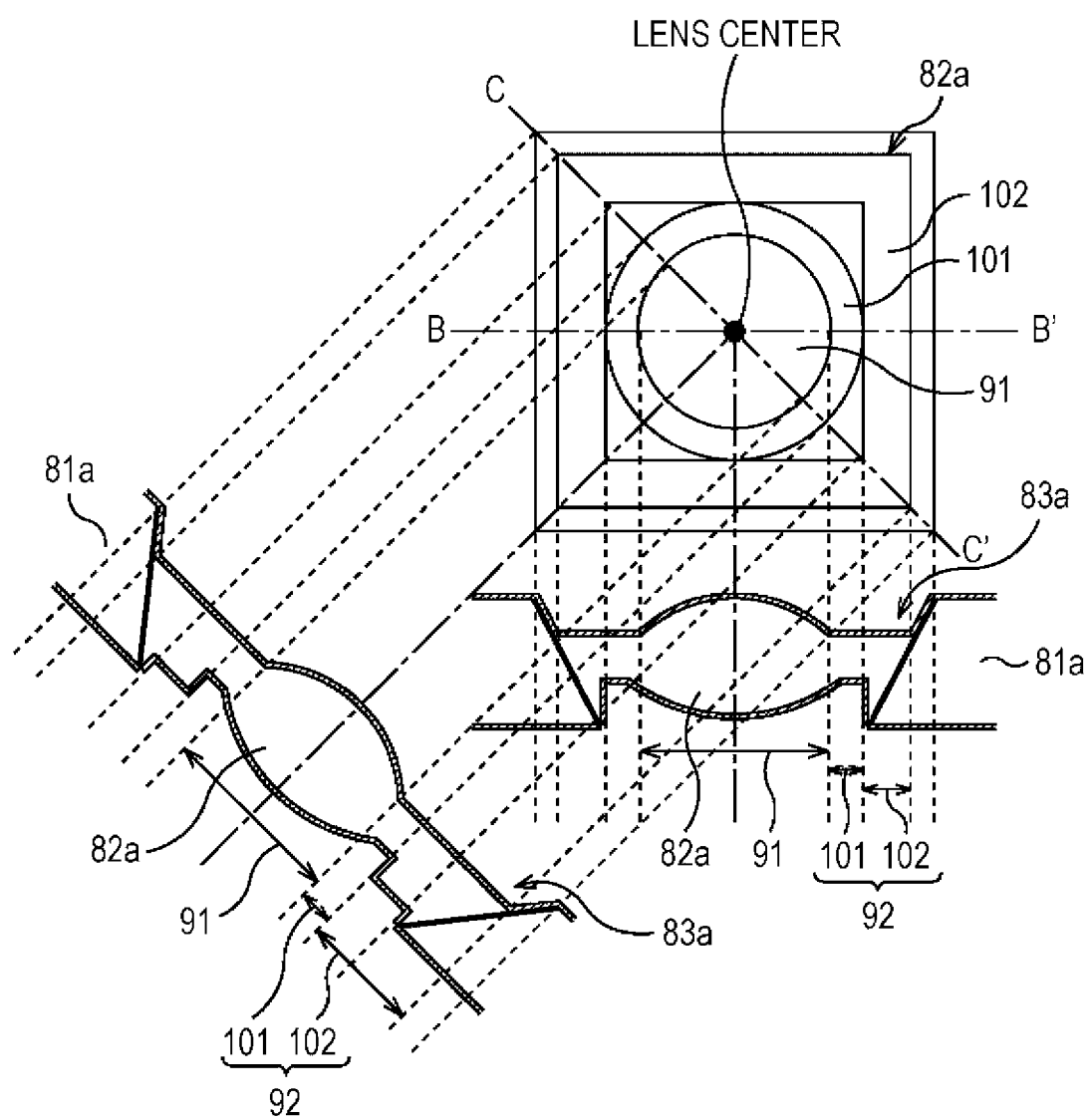
FIG. 24 is a diagram for explaining a manufacturing method for a lens-attached substrate.

FIG. 24 illustrates a plan diagram and cross-sectional diagrams of the carrier substrate 81a and the lens resin portion 82a of the lens-attached substrate 41a in the case where the planar shape of the through-hole 83 is a quadrangle.

The cross-sectional diagrams of the lens-attached substrate 41a of FIG. 24 illustrate cross-sectional diagrams taken along lines B-B' and C-C' of the plan diagram.

As understood by comparing the cross-sectional diagram of B-B' line and the cross-sectional diagram of C-C' line, in the case where the through-hole 83a is a quadrangle, the distance from the center of the through-hole 83a to the upper outer edge of the through-hole 83a and the distance from the center of the through-hole 83a to the lower outer edge of the through-hole 83a are different in the side direction and the diagonal direction of the through-hole 83a which is a quadrangle, and the distances are large in the diagonal direction. For this reason, in the case where the planar shape of the through-hole 83a is a quadrangle, if the lens portion 91 is set to be a circle, there is a need that the distance from the outer circumference of the lens portion 91 to the sidewall of the through-hole 83a sidewall, in other words, the length of the carrying portion 92 is set to be different between the side direction and the diagonal direction of the quadrangle.

Therefore, the lens resin portion 82a illustrated in FIG. 24 has the following structure. (1) The lengths of the arm portion 101 which is disposed in the outer circumference of the lens portion 91 are the same in the side direction and the diagonal direction of the quadrangle. (2) The lengths of the leg portion 102 which is disposed outside the arm portion 101 and extends to the sidewall of the through-hole 83a are set so that the length of the leg portion 102 in the diagonal direction of the quadrangle is larger than the length of the leg portion 102 in the side direction of the quadrangle.

As illustrated in FIG. 24, the leg portion 102 is not in direct contact with the lens portion 91, and the arm portion 101 is in direct contact with the lens portion 91.

In the lens resin portion 82a of FIG. 24, the length and thickness of the arm portion 101 being in direct contact with the lens portion 91 are set to be constant over the entire outer circumference of the lens portion 91, so that it is possible to obtain an effect that the entire lens portion 91 is supported evenly by a constant force.

In addition, since the entire lens portion 91 is supported evenly by a constant force, for example, in the case where a stress is applied to the entire outer circumference of the through-hole 83a by the carrier substrate 81a surrounding the through-hole 83a, the stress is exerted on the entire lens portion 91 evenly, so that it is possible to obtain a function or an effect that unevenly transferring of the stress to a specific portion of the lens portion 91 is suppressed.

Figure 25:
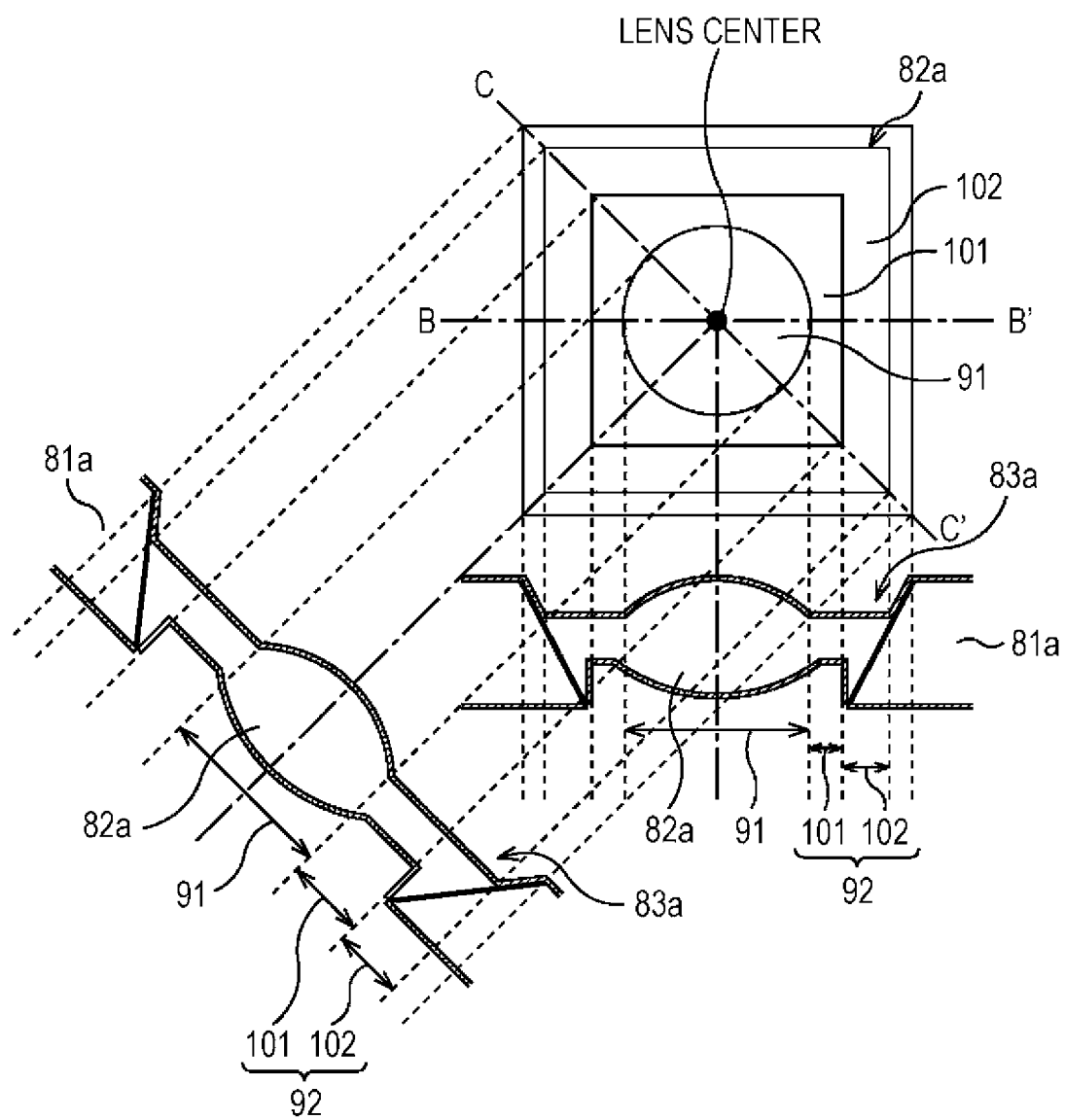
FIG. 25 is a diagram for explaining a manufacturing method for a lens-attached substrate.

FIG. 25 illustrates a plan diagram and cross-sectional diagrams of the carrier substrate 81a and the lens resin portion 82a of the lens-attached substrate 41a and indicates another example of the through-hole 83 of which the planar shape is a quadrangle.

The cross-sectional diagrams of the lens-attached substrate 41a of FIG. 25 illustrate cross-sectional diagrams taken along lines B-B' and C-C' of the plan diagram.

In FIG. 25, similarly to FIGS. 22A and 22B, the distance from the center of the through-hole 83a to the upper outer edge of the through-hole 83a and the distance from the center of the through-hole 83a to the lower outer edge of the through-hole 83a are different in the side direction and the diagonal direction of the through-hole 83a which is a quadrangle, and the distances are large in the diagonal direction. For this reason, in the case where the planar shape of the through-hole 83a is a quadrangle, if the lens portion 91 is set to a circle, there is a need that the distance from the outer circumference of the lens portion 91 to the sidewall of the through-hole 83a sidewall, in other words, the length of the carrying portion 92 is set to be different between the side direction and the diagonal direction of the quadrangle.

Therefore, the lens resin portion 82a illustrated in FIG. 25 have the following structure. (1) The lengths of the leg portion 102 disposed in the outer circumference of the lens portion 91 are set to be constant along the four sides of the quadrangle of the through-hole 83a. (2) In order to implement the structure of (1) described above, the lengths of the arm portion 101 are set so that the length of the arm portion in the diagonal direction of the quadrangle is larger than the length of the arm portion in the side direction of the quadrangle.

As illustrated in FIG. 25, the thickness of the resin of the leg portion 102 is larger than that of the arm portion 101. For this reason, in terms of the volume per unit area of the lens-attached substrate 41a in the planar directions, the leg portion 102 is larger than the arm portion 101.

In the embodiment of FIG. 25, the volume of the leg portion 102 is set to be as small as possible and is set to be constant along the four sides of the quadrangle of the through-hole 83a, so that it is possible to obtain a function or an effect that, for example, in the case where deformation such as swelling of the resin occurs, a change in volume is suppressed as much as possible, and the change in volume is not uneven over the entire outer circumference of the lens portion 91 as much as possible.

Figure 26:
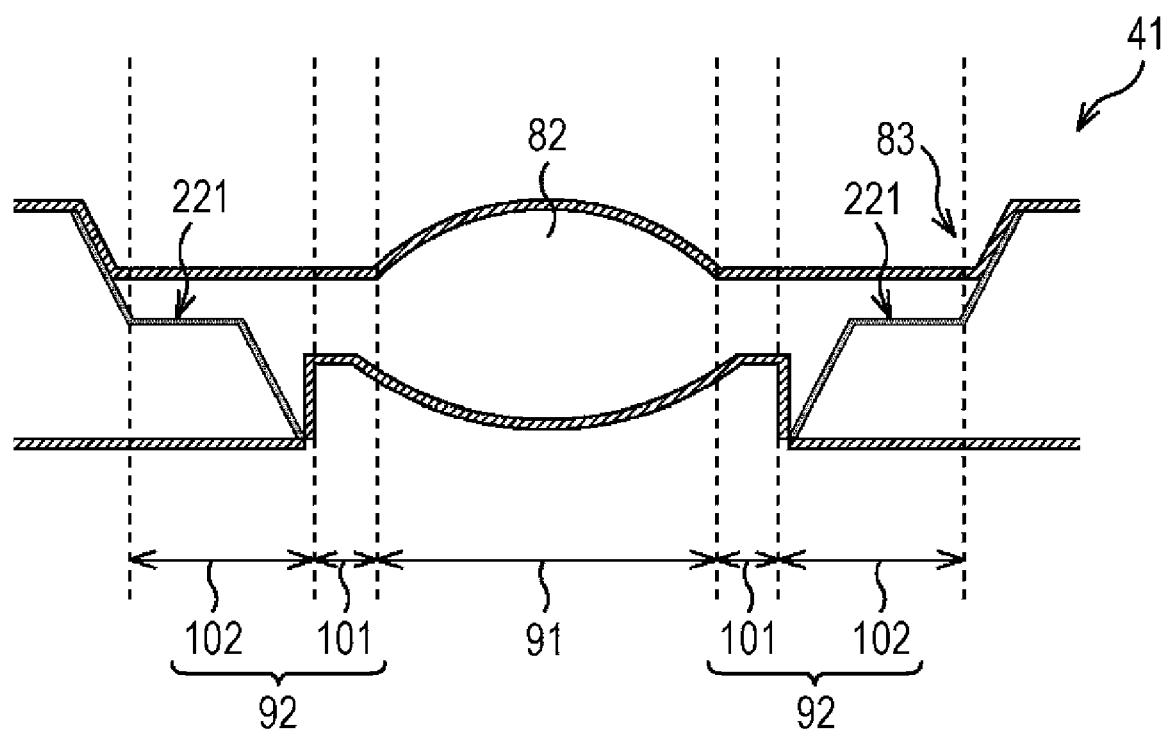
FIG. 26 is a diagram for explaining a manufacturing method for a lens-attached substrate.
Figure 27:
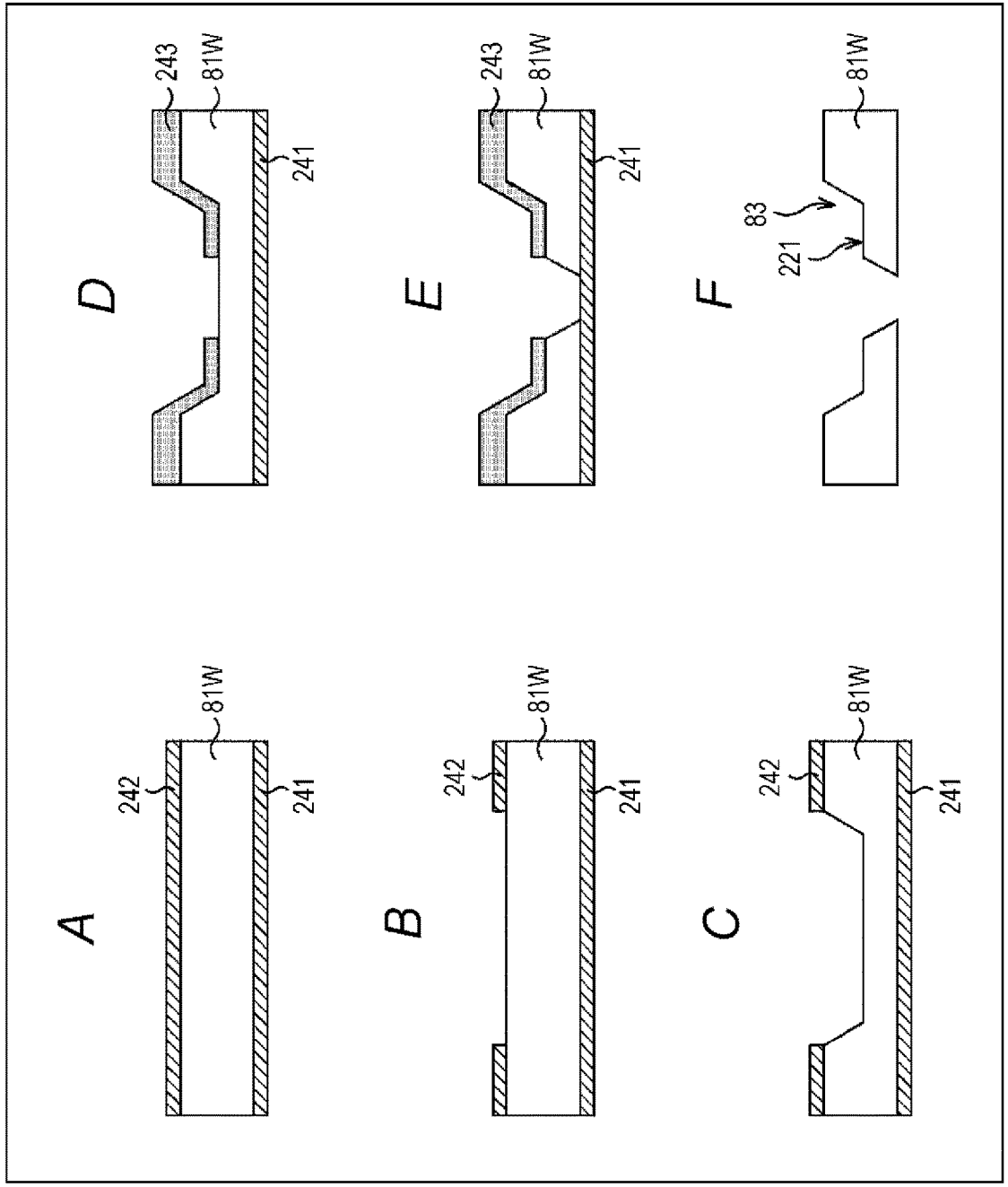
FIG. 27 is a diagram for explaining a manufacturing method for a lens-attached substrate.

FIG. 26 is a cross-sectional diagram illustrating another embodiment of the lens resin portion 82 and the through-hole 83 of the lens-attached substrate 41.

The lens resin portion 82 and the through-hole 83 illustrated in FIG. 26 have the following structure. (1) The sidewall of the through-hole 83 has a staircase shape having a staircase-type portion 221. (2) The leg portion 102 of the carrying portion 92 of the lens resin portion 82 is disposed above the sidewall of the through-hole 83 and extends on the staircase-type portion 221 provided to the through-hole 83 in the planar directions of the lens-attached substrate 41.

A method of forming the step-shaped through-hole 83 illustrated in FIG. 26 will be described with reference to FIGS. 27A to 27F.

First, as illustrated in FIG. 27A, an etching stop film 241 having resistance to the wet etching at the time of opening the through-hole is formed on one surface of the carrier substrate 81W. The etching stop film 241 may be made of, for example, a silicon nitride film.

Next, a hard mask 242 having resistance to the wet etching at the time of opening the through-hole is formed on the other surface of the carrier substrate 81W. The hard mask 242 may also be made of, for example, a silicon nitride film.

Next, as illustrated in FIG. 27B, a predetermined region of the hard mask 242 is opened for the first etching. In the first etching, a portion where is to be an upper end of the staircase-type portion 221 of the through-hole 83 is etched. For this reason, the opening portion of the hard mask 242 for the first etching becomes a region corresponding to the opening in the upper-side substrate surface of the lens-attached substrate 41 illustrated in FIG. 26.

Next, as illustrated in FIG. 27C, the carrier substrate 81W is etched by a predetermined depth according to the opening portion of the hard mask 242 by wet etching.

Next, as illustrated in FIG. 27D, the hard mask 243 is formed again on the surface of the after-etching carrier substrate 81W, and the hard mask 243 is opened corresponding to the portion which is to be the lower side of the staircase-type portion 221 of the through-hole 83. The hard mask 243 for the second etching may also be made of, for example, a silicon nitride film.

Next, as illustrated in FIG. 27E, the carrier substrate 81W is etched according to the opening portion of the hard mask 243 by wet etching until the etching stop film 241 is exposed.

Finally, as illustrated in FIG. 27F, the hard mask 243 of the upper surface of the carrier substrate 81W and the etching stop film 241 of the lower surface are removed.

As described heretofore, the etching of the carrier substrate 81W for forming the through-hole by wet etching is performed as two times of divided etchings, so that the step-shaped through-hole 83 illustrated in FIG. 26 is obtained.

Figure 28:
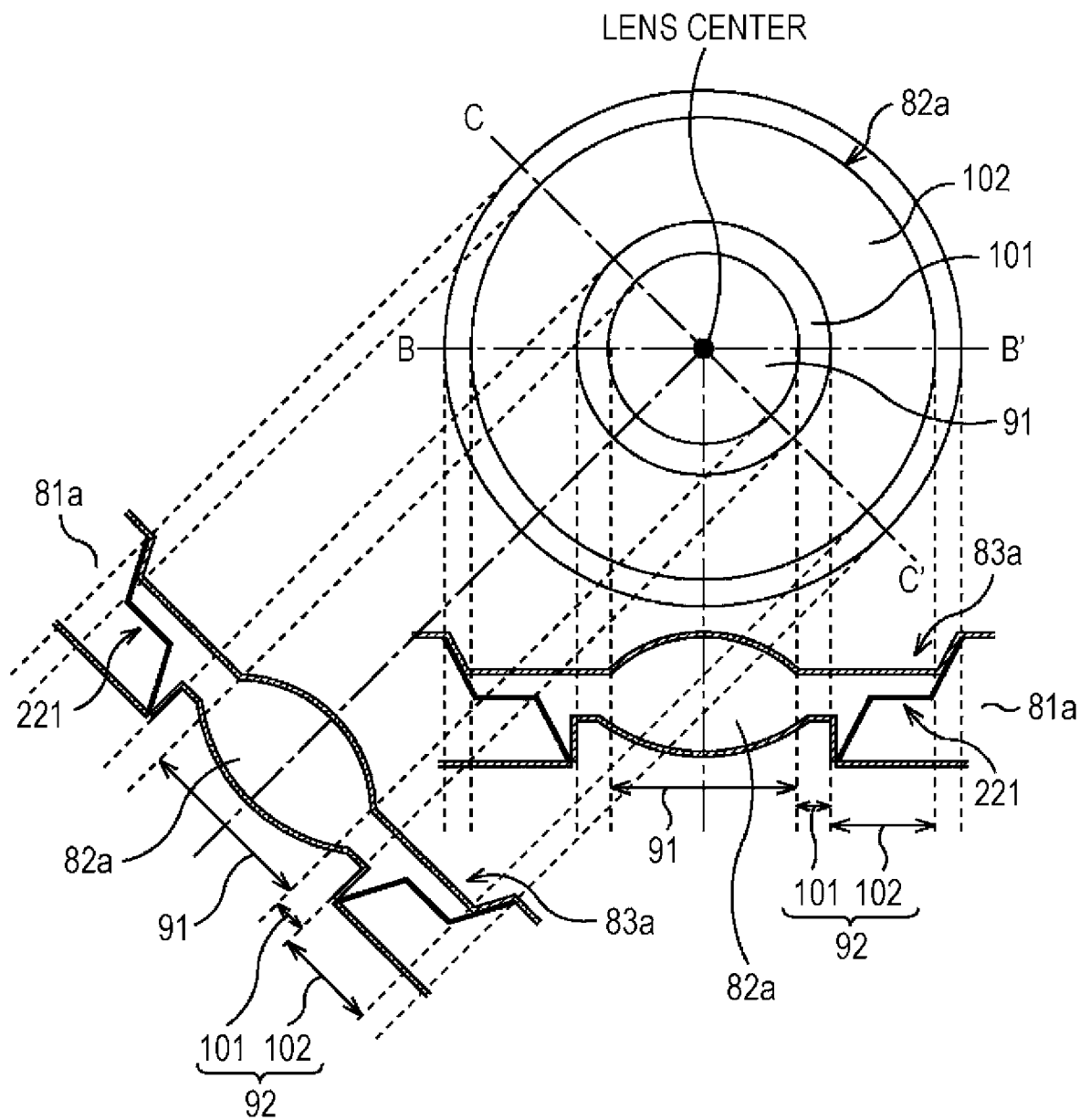
FIG. 28 is a diagram for explaining a manufacturing method for a lens-attached substrate.

FIG. 28 illustrates a plan diagram and cross-sectional diagrams of the carrier substrate 81a and the lens resin portion 82a of the lens-attached substrate 41a in the case where the through-hole 83a has a staircase-type portion 221 and the planar shape of the through-hole 83a is a circle.

The cross-sectional diagrams of the lens-attached substrate 41a of FIG. 28 illustrate cross-sectional diagrams taken along lines B-B' and C-C' of the plan diagram.

In the case where the planar shape of the through-hole 83a is a circle, the cross-section shape of the through-hole 83a is naturally the same irrespective of the direction of the diameter. In addition, the cross-section shapes of the outer edge of the lens resin portion 82a, the arm portion 101, and the leg portion 102 are formed as to be the same irrespective of the direction of the diameter.

In comparison with the through-hole 83a of FIG. 14 having no staircase-type portion 221 in the through-hole 83a, due to the through-hole 83a having the staircase shape of FIG. 28, it is possible to obtain a function or an effect that the contact area between the leg portion 102 of the carrying portion 92 the lens resin portion 82 and the sidewall of the through-hole 83a can be increased. In addition, therefore, it is possible to obtain a function or an effect that the adhesion strength between the lens resin portion 82 and the sidewall of the through-hole 83a, in other words, the adhesion strength between the lens resin portion 82a and the carrier substrate 81W is increased.

Figure 29:
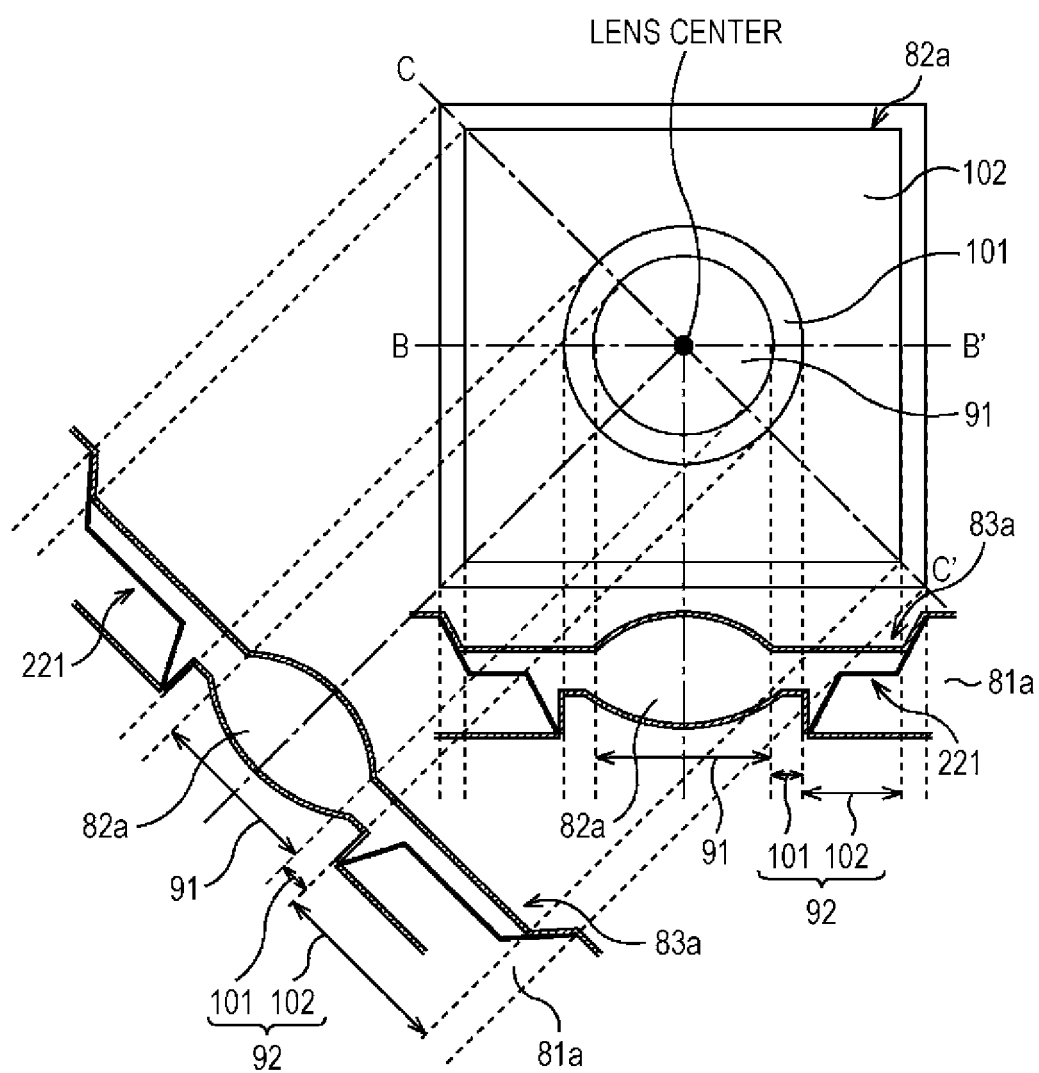
FIG. 29 is a diagram for explaining a manufacturing method for a lens-attached substrate.

FIG. 29 illustrates a plan diagram and cross-sectional diagrams of the carrier substrate 81a and the lens resin portion 82a of the lens-attached substrate 41a in the case where the through-hole 83a has a staircase-type portion 221 and the planar shape of the through-hole 83a is a quadrangle.

The cross-sectional diagrams of the lens-attached substrate 41a of FIG. 29 illustrate cross-sectional diagrams taken along lines B-B' and C-C' of the plan diagram.

The lens resin portion 82 and the through-hole 83 illustrated in FIG. 29 have the following structure. (1) The lengths of the arm portion 101 disposed in the outer circumference of the lens portion 91 are the same in the side direction and the diagonal direction of a quadrangle. (2) The lengths of the leg portion 102 which is disposed outside the arm portion 101 and extends to the sidewall of the through-hole 83a are set so that the length of the leg portion 102 in the diagonal direction of the quadrangle is larger than the length of the leg portion 102 in the side direction of the quadrangle.

As illustrated in FIG. 29, the leg portion 102 is not in direct contact with the lens portion 91, and the arm portion 101 is in direct contact with the lens portion 91.

In the lens resin portion 82a of FIG. 29, similarly to the lens resin portion 82a disclosed in FIG. 24, the length and thickness of the arm portion 101 being in direct contact with the lens portion 91 are set to be constant over the entire outer circumference of the lens portion 91, so that it is possible to obtain an effect that the entire lens portion 91 is supported evenly by a constant force.

In addition, since the entire lens portion 91 is supported evenly by a constant force, for example, in the case where a stress is applied to the entire outer circumference of the through-hole 83a by the carrier substrate 81a surrounding the through-hole 83a, the stress is exerted on the entire lens portion 91 evenly, so that it is possible to obtain a function or an effect that unevenly transferring of the stress to a specific portion of the lens portion 91 is suppressed.

In addition, in comparison with the through-hole 83a of FIG. 24 or the like having no staircase-type portion 221 in the through-hole 83a, due to the structure of the through-hole 83a of FIG. 29, it is possible to obtain a function or an effect that the contact area between the leg portion 102 of the carrying portion 92 the lens resin portion 82a and the sidewall of the through-hole 83a can be increased. Therefore, it is possible to obtain a function or an effect that the adhesion strength between the lens resin portion 82a and the sidewall portion of the through-hole 83a, in other words, the adhesion strength between the lens resin portion 82a and the carrier substrate 81a is increased.

11. Directing Joining of Lens-Attached Substrates

Next, direct joining of the substrate-state lens-attached substrates 41W where a plurality of the lens-attached substrates 41 are formed will be described.

Figure 30:
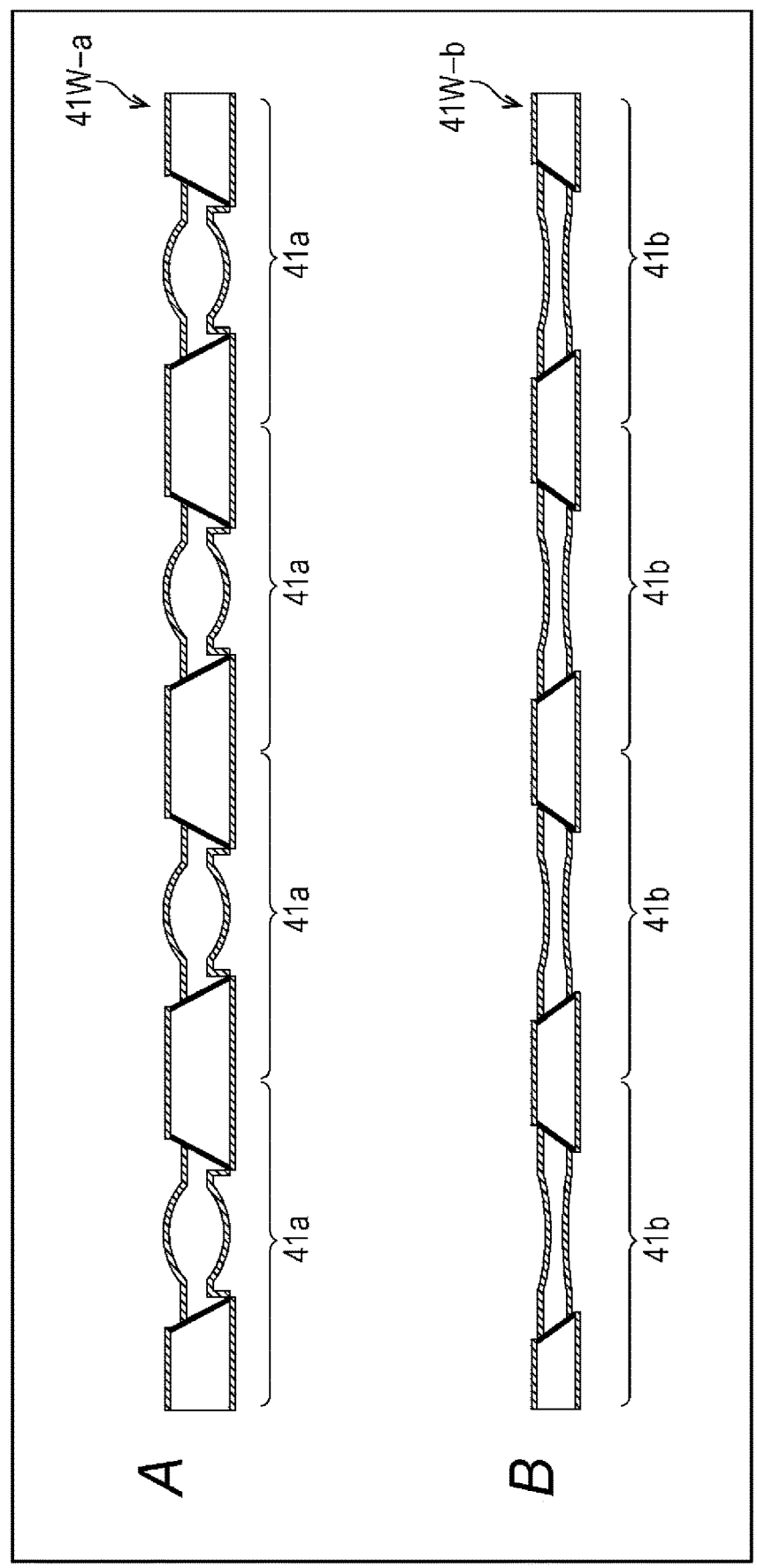
FIG. 30 is a diagram for explaining joining of substrate-state lens-attached substrates.

In the description hereinafter, as illustrated in FIGS. 30A and 30B, the substrate-state lens-attached substrate 41W where a plurality of the lens-attached substrates 41a are formed is referred to as a lens-attached substrate 41W-a, and the substrate-state lens-attached substrate 41W where a plurality of the lens-attached substrates 41b are formed is referred to as a lens-attached substrate 41W-b. With respect to the lens-attached substrates 41c to 41e, the same notation is applied.

Direct joining of the substrate-state lens-attached substrate 41W-a and the substrate-state lens-attached substrate 41W-b will be described with reference to FIGS. 31A and 31B.

In addition, in FIGS. 31A and 31B, the components of the lens-attached substrate 41W-b corresponding to those of the lens-attached substrate 41W-a are denoted by the same reference numerals as those of the lens-attached substrate 41W-a.

An upper surface layer 122 or 125 is formed on the upper surfaces of the lens-attached substrate 41W-a and the lens-attached substrate 41W-b. A lower surface layer 123 or 124 is formed on the lower surfaces of the lens-attached substrate 41W-a and the lens-attached substrate 41W-b. Next, as illustrated in FIG. 31A, a plasma activation process is performed on the entire lower surface including the rear-side flat portion 172 of the lens-attached substrate 41W-a and the entire upper surface including the front-side flat portion 171 of the lens-attached substrate 41W-b which are to be a joined surface of the lens-attached substrates 41W-a and 41W-b. The gas used for the plasma activation process may be any gas which can be treated as plasma such as $O_2$, $N_2$, He, Ar, or $H_2$. However, if the gas of the same elements as constituent elements of the upper surface layer 122 and the lower surface layer 123 is used, a change in film qualities of the upper surface layer 122 and the lower surface layer 123 can be suppressed, and thus, the gas of the same elements as constituent elements thereof is preferred as the gas used for the plasma activation process.

Next, as illustrated in FIG. 31B, the rear-side flat portion 172 of the lens-attached substrate 41W-a and the front-side flat portion 171 of the lens-attached substrate 41W-b of which surface state is activated are adhered to each other.

By the process of adhering the lens-attached substrates, hydrogen bonding occurs between hydrogen of OH group of the surface of the lower surface layer 123 or 124 of the lens-attached substrate 41W-a and hydrogen of OH group of the surface of the upper surface layer 122 or 125 of the lens-attached substrate 41W-b. Therefore, the lens-attached substrate 41W-a and the lens-attached substrate 41W-b are fixed to each other. The process of adhering the lens-attached substrates can be performed under the condition of atmospheric pressure.

An annealing process is applied to the lens-attached substrate 41W-a and the lens-attached substrate 41W-b which are subject to the above-described adhering process. Therefore, dehydration condensation occurs from the state that the OH groups are hydrogen-bonded, a covalent bond through oxygen is formed between the lower surface layer 123 or 124 of the lens-attached substrate 41W-a and the upper surface layer 122 or 125 of the lens-attached substrate 41W-b. Alternatively, elements included in the lower surface layer 123 or 124 of the lens-attached substrate 41W-a and elements included in the upper surface layer 122 or 125 of the lens-attached substrate 41W-b are covalent-bonded. By this bonding, the two lens-attached substrates are firmly fixed to each other. In this manner, the covalent bond is formed between the lower surface layer 123 or 124 of the lens-attached substrate 41W disposed at the upper side and the upper surface layer 122 or 125 of the lens-attached substrate 41W disposed at the lower side, and thus, the two lens-attached substrates 41W are fixed to each other, which is called "direct joining" in this specification. The method of fixing a plurality of the lens-attached substrates over the entire substrate surface by using a resin disclosed in PTL 1 has a problem of the curing contraction or thermal expansion of the resin and the deformation of lens caused by the curing contraction or thermal expansion of the resin. On the contrary, in the direct joining according to an embodiment of the present technology, since any resin is not used at the time of fixing a plurality of the lens-attached substrates 41W, it is possible to obtain a function or an effect that, without occurrence of the curing-contraction or the thermal expansion, it is possible to fix a plurality of the lens-attached substrates 41W.

The annealing process may also be performed under the condition of atmospheric pressure. In order to perform the dehydration condensation, the temperature of the annealing process may be set to be 100° C. or more, 150° C. or more, or 200° C. On the other hand, in terms of protecting the energy curable resin 191 for forming the lens resin portion 82 from heat or suppressing degassing from the energy curable resin 191, the temperature of the annealing process may be set to be 400° C. or less, 350° C. or less, or 300° C. or less.

If the process of adhering the lens-attached substrates 41W or the process of directly joining the lens-attached substrates 41W is performed under the condition other than the atmospheric pressure, when the joined lens-attached substrate 41W-a and lens-attached substrate 41W-b are returned to the environment of atmospheric pressure, there occurs a difference in pressure between the space between the joined lens resin portion 82 and the lens resin portion 82 and the outside of the lens resin portion 82. Due to the difference in pressure, pressure is exerted on the lens resin portion 82, there is a problem in that the lens resin portion 82 is deformed.

Due to the performing of the process of adhering the lens-attached substrates 41W and the process of directly joining the lens-attached substrates under the condition of atmospheric pressure, it is possible to obtain a function or an effect that the deformation of the lens resin portion 82 which may occur in case of performing the joining under the condition other than the atmospheric pressure can be avoided.

Since the direct joining of the substrate by performing the plasma activation process, in other words, the plasma joining can suppress fluid flowing and thermal expansion, for example, in case of using a resin as the adhesive, it is possible to improve position accuracy at the time of joining the lens-attached substrate 41W-a and the lens-attached substrate 41W-b.

As described above, the upper surface layer 122 or the lower surface layer 123 are formed on the rear-side flat portion 172 of the lens-attached substrate 41W-a and the front-side flat portion 171 of the lens-attached substrate 41W-b. In the upper surface layer 122 and the lower surface layer 123, dangling bonds are easily formed by the previously-performed plasma activation process. Namely, the lower surface layer 123 formed on the rear-side flat portion 172 of the lens-attached substrate 41W-a and the upper surface layer 122 formed on the front-side flat portion 171 of the lens-attached substrate 41W-b have a function of increasing the joining strength.

In addition, in the case where the upper surface layer 122 or the lower surface layer 123 is configured with an oxide film, since the oxide film is not influenced by a change in film quality caused by plasma ($O_2$), it is also possible to obtain an effect that corrosion by plasma for the lens resin portion 82 is suppressed.

As described heretofore, the substrate-state lens-attached substrate 41W-a where a plurality of the lens-attached substrates 41a are formed and the substrate-state lens-attached substrate 41W-b where a plurality of the lens-attached substrates 41b are formed are subject to the surface activation process using plasma and, after that, are directly joined, in other words, are joined by using plasma joining.

FIGS. 32A to 32F illustrate a first stacking method of stacking the five lens-attached substrates 41a to 41e corresponding to the stacked lens structure 11 of FIG. 13 in the substrate state by using a method of joining the substrate-state lens-attached substrates 41W described with reference to FIGS. 31A and 31B.

Figure 32:
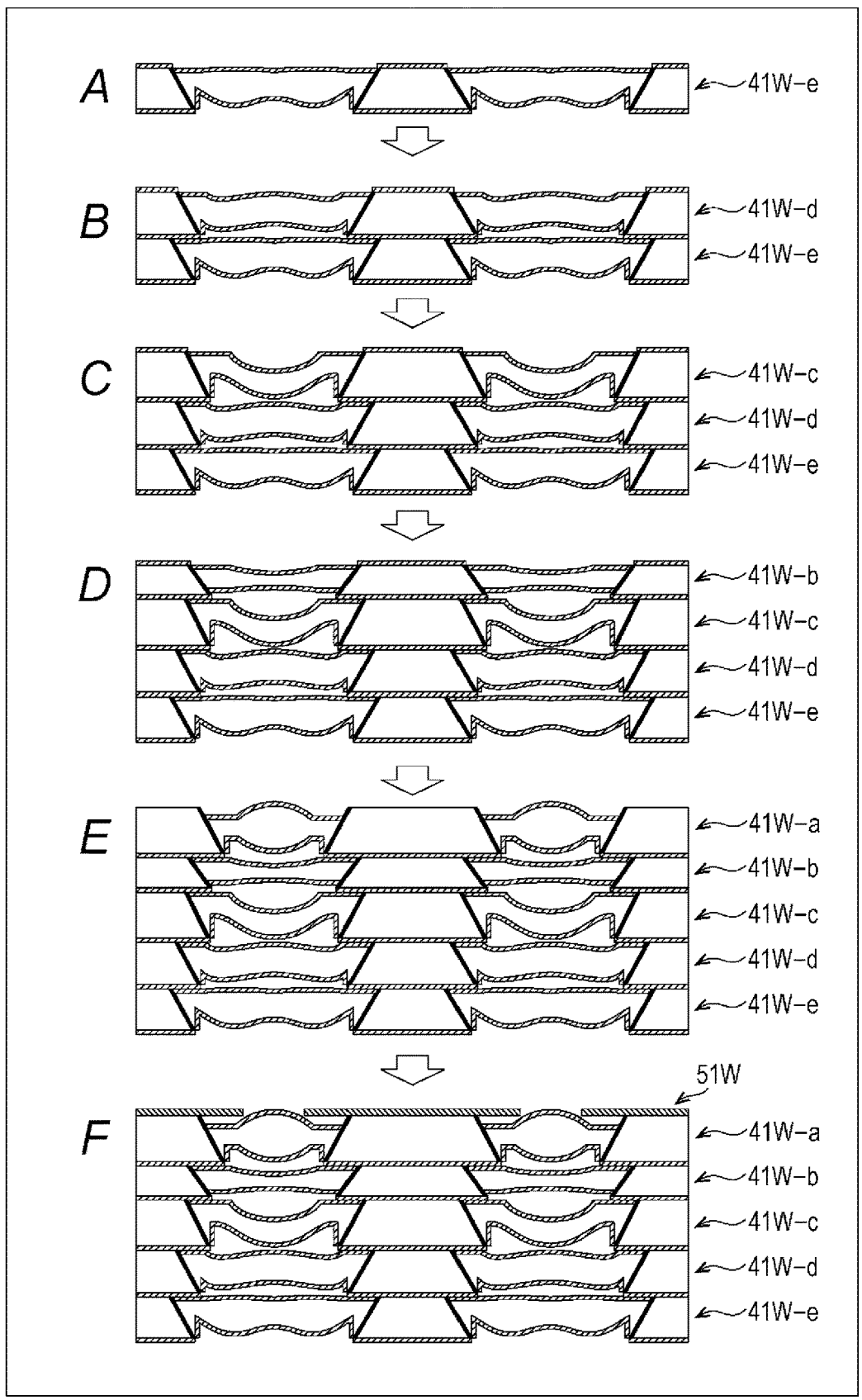
FIG. 32 is a diagram for explaining a first stacking method of stacking five lens-attached substrates in a substrate state.

First, as illustrated in FIG. 32A, the substrate-state lens-attached substrate 41W-e located in the lowermost layer in the stacked lens structure 11 is prepared.

Next, as illustrated in FIG. 32B, the substrate-state lens-attached substrate 41W-d located as the second layer from the bottom of the stacked lens structure 11 is jointed on the substrate-state lens-attached substrate 41W-e.

Next, as illustrated in FIG. 32C, the substrate-state lens-attached substrate 41W-c located as the third layer from the bottom of the stacked lens structure 11 is joined on the substrate-state lens-attached substrate 41W-d.

Next, as illustrated in FIG. 32D, the substrate-state lens-attached substrate 41W-b located as the fourth layer from the bottom of the stacked lens structure 11 is joined on the substrate-state lens-attached substrate 41W-c.

Next, as illustrated in FIG. 32E, the substrate-state lens-attached substrate 41W-a located as the fifth layer from the bottom of the stacked lens structure 11 is joined on the substrate-state lens-attached substrate 41W-b.

Finally, as illustrated in FIG. 32F, the aperture stop plate 51W located in the uppermost layer of the lens-attached substrate 41a in the stacked lens structure 11 is joined on the substrate-state lens-attached substrate 41W-a.

In this manner, the five substrate-state lens-attached substrates 41W-a to 41W-e are sequentially stacked one by one from the lower-layer lens-attached substrate 41W to the upper-layer lens-attached substrate 41W in the stacked lens structure 11, so that the substrate-state stacked lens structure 11W is obtained.

FIGS. 33A to 33F illustrate a second stacking method of stacking the five lens-attached substrates 41a to 41e corresponding to the stacked lens structure 11 of FIG. 13 in the substrate state by using a method of joining the substrate-state lens-attached substrates 41W described with reference to FIGS. 31A and 31B.

Figure 33:
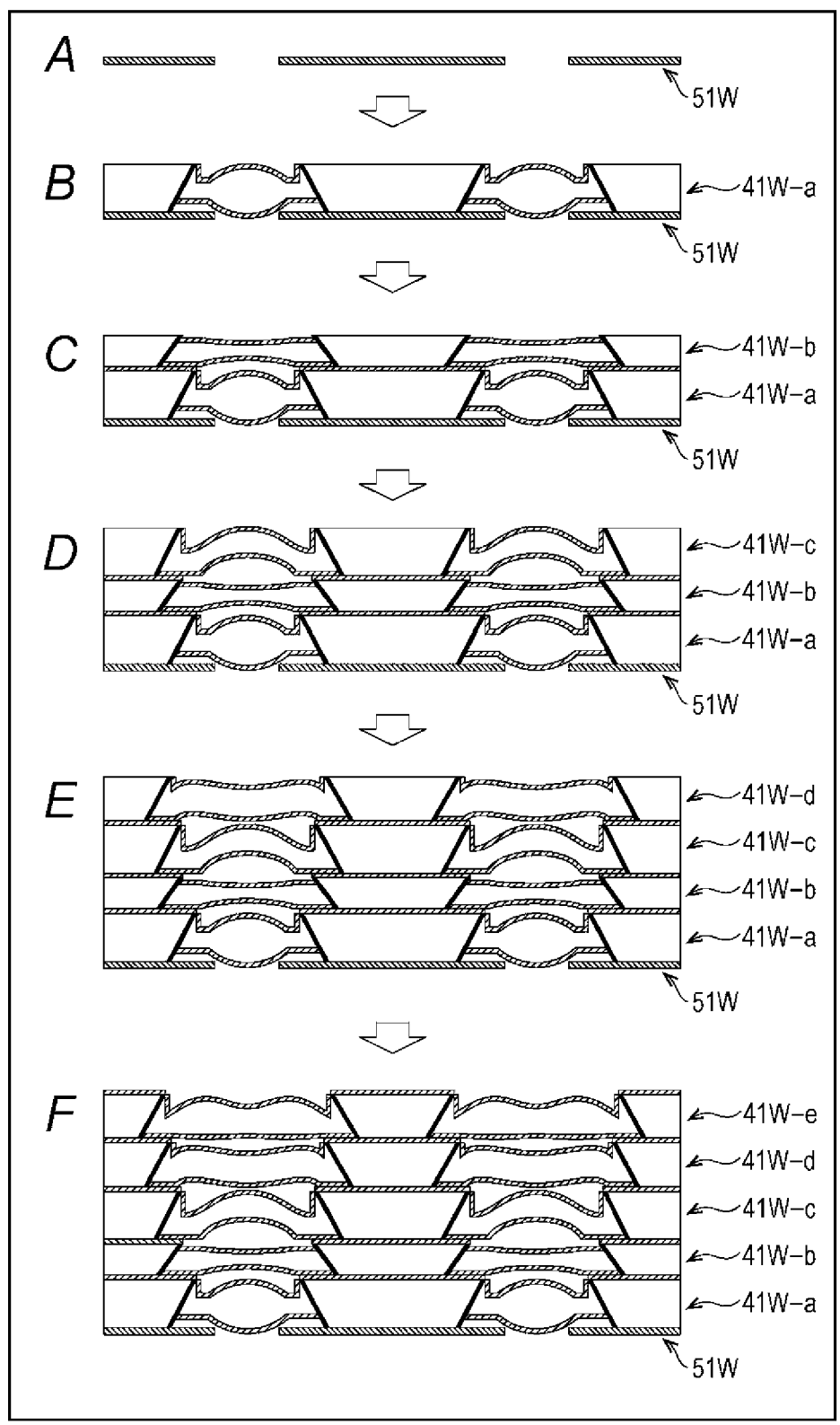
FIG. 33 is a diagram for explaining a second stacking method of stacking five lens-attached substrates in a substrate state.

First, as illustrated in FIG. 33A, the aperture stop plate 51W located in the upper layer of the lens-attached substrate 41a in the stacked lens structure 11 is prepared.

Next, as illustrated in FIG. 33B, the substrate-state lens-attached substrate 41W-a located in the uppermost layer in the stacked lens structure 11 is turned upside down and is joined on the aperture stop plate 51W.

Next, as illustrated in FIG. 33C, the substrate-state lens-attached substrate 41W-b lactated as the second layer from the top of the stacked lens structure 11 is turned upside down and is joined on the substrate-state lens-attached substrate 41W-a.

Next, as illustrated in FIG. 33D, the substrate-state lens-attached substrate 41W-c lactated as the third layer from the top of the stacked lens structure 11 is turned upside down and is joined on the substrate-state lens-attached substrate 41W-b.

Next, as illustrated in FIG. 33E, the substrate-state lens-attached substrate 41W-d lactated as the fourth layer from the top of the stacked lens structure 11 is turned upside down and is joined on the substrate-state lens-attached substrate 41W-c.

Finally, as illustrated in FIG. 33F, the substrate-state lens-attached substrate 41W-e lactated as the fifth layer from the top of the stacked lens structure 11 is turned upside down and is joined on the substrate-state lens-attached substrate 41W-d.

In this manner, the five substrate-state lens-attached substrates 41W-a to 41W-e are sequentially stacked one by one from the upper-layer lens-attached substrate 41W to the lower-layer lens-attached substrate 41W in the stacked lens structure 11, so that the substrate-state stacked lens structure 11W is obtained.

The five substrate-state lens-attached substrates 41W-a to 41W-e which are stacked by the stacking method described with reference to FIGS. 32A to 32F or 33A to 33F are diced in units of a module or a chip by using a blade, a laser, or the like, so that the stacked lens structure 11 where the five lens-attached substrates 41a to 41e are stacked is obtained.

12. Eighth and Ninth Embodiments of Camera Module

Figure 34:
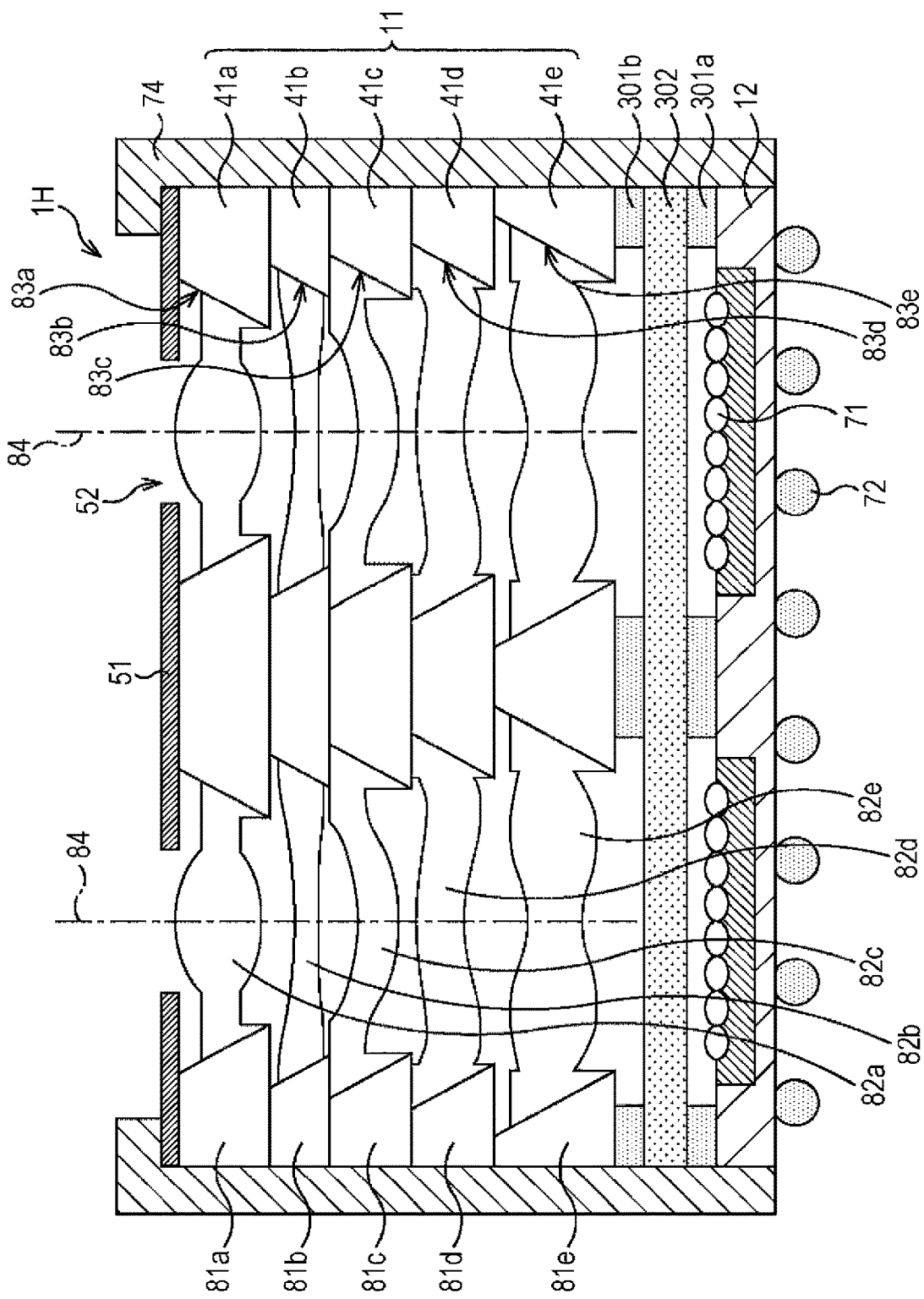
FIG. 34 is a diagram illustrating an eighth embodiment of a camera module using a stacked lens structure employing the present technology.

FIG. 34 is a diagram illustrating an eighth embodiment of a camera module using a stacked lens structure employing the present technology.

Figure 35:
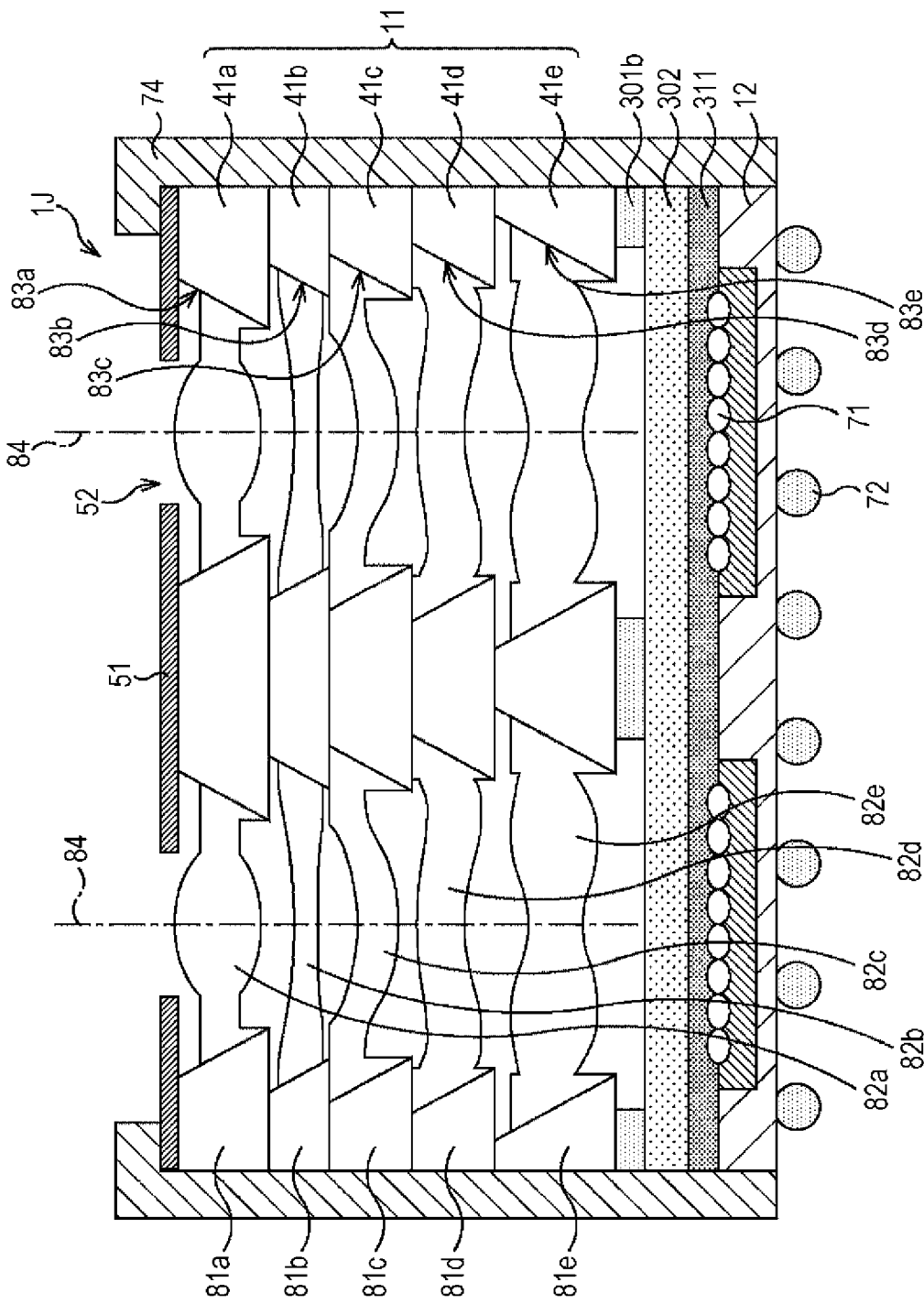
FIG. 35 is a diagram illustrating a ninth embodiment of a camera module using a stacked lens structure employing the present technology.

FIG. 35 is a diagram illustrating a ninth embodiment of a camera module using a stacked lens structure employing the present technology.

In the description of FIGS. 34 and 35, only the portions different from those of the camera module E illustrated in FIG. 13 will be described.

In the camera module 1H of FIG. 34 and the camera module 1J of FIG. 35, the portion of the structural material 73 of the camera module E illustrated in FIG. 13 is replaced by a different structure.

In the camera module 1H of FIG. 34, the portion of the structural material 73 in the camera module 1J is replaced by structural materials 301a and 301b and a light-transmitting substrate 302.

More specifically, the structural material 301a is disposed at a portion of the upper side of the light-receiving device 12. The light-receiving device 12 and the light-transmitting substrate 302 are fixed to each other through the structural material 301a. The structural material 301a is, for example, an epoxy-based resin.

The structural material 301b is disposed at the upper side of the light-transmitting substrate 302. The light-transmitting substrate 302 and the stacked lens structure 11 are fixed to each other through the structural material 301b. The structural material 301b is, for example, an epoxy-based resin.

On the contrary, in the camera module 1J of FIG. 35, the portion of the structural material 301a of the camera module 1H of FIG. 34 is replaced by a resin layer 311 having a light-transmitting property.

The resin layer 311 is disposed on the entire upper-side surface of the light-receiving device 12. The light-receiving device 12 and the light-transmitting substrate 302 are fixed to each other through the resin layer 311. Due to the resin layer 311 disposed on the entire upper-side surface of the light-receiving device 12, it is possible to obtain a function or an effect that, in the case where stress is applied from the upper side of the light-transmitting substrate 302 to the light-transmitting substrate 302, the stress is prevented from being concentrated on some portion of the light-receiving device 12 and, and thus, the stress is distributively received by the entire surface of the light-receiving device 12.

A structural material 301b is disposed at the upper side of the light-transmitting substrate 302. The light-transmitting substrate 302 and the stacked lens structure 11 are fixed through the structural material 301b.

The camera module 1H of FIG. 34 and the camera module 1J of FIG. 35 are configured to include the light-transmitting substrate 302 at the upper side of the light-receiving device 12. Due to the light-transmitting substrate 302, it is possible to obtain a function or an effect that, for example, during the manufacturing of the camera module 1H or 1J, the light-receiving device 12 is prevented from being scratched.

13. Tenth Embodiment of Camera Module

Figure 36:
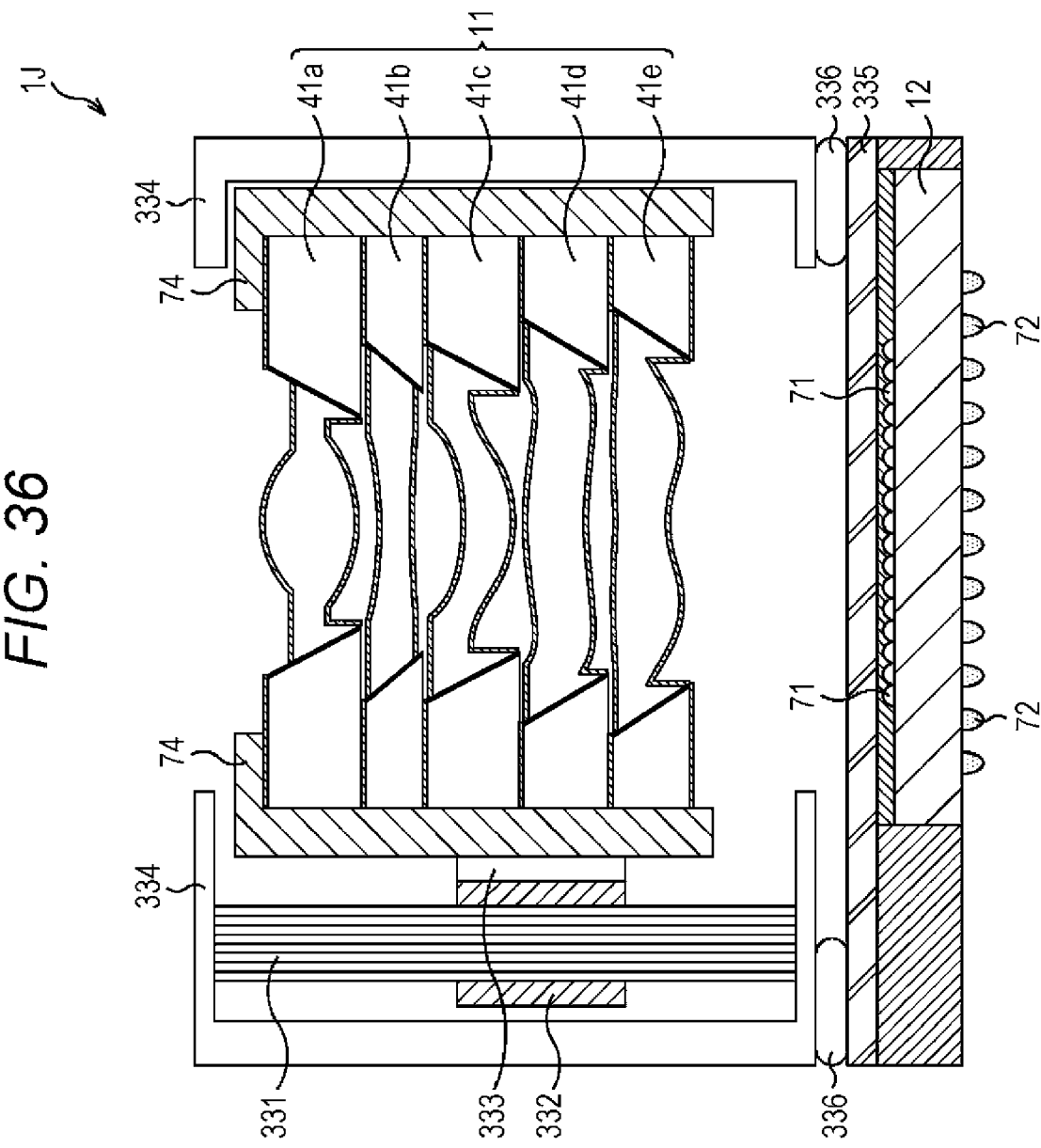
FIG. 36 is a diagram illustrating a tenth embodiment of a camera module using a stacked lens structure employing the present technology.

FIG. 36 is a diagram illustrating a tenth embodiment of a camera module using a stacked lens structure employing the present technology.

In a camera module 1J illustrated in FIG. 36, a stacked lens structure 11 is accommodated in a lens barrel 74. The lens barrel 74 is fixed to a moving member 332 moving along a shaft 331 by a fixing member 333. The lens barrel 74 is moved in the axis direction of the shaft 331 by a driving motor (not shown), so that the distance from the stacked lens structure 11 to the imaging plane of the light-receiving device 12 is adjusted.

The lens barrel 74, the shaft 331, the moving member 332, and the fixing member 333 are accommodated in a housing 334. A protective substrate 335 is disposed in the upper portion of the light-receiving device 12, and the protective substrate 335 and the housing 334 are connected to each other by an adhesive 336.

Due to the above-described mechanism of moving the stacked lens structure 11, it is possible to obtain a function or an effect that, when a camera using the camera module 1J captures an image, autofocus operation can be allowed to be performed.

14. Eleventh Embodiment of Camera Module

Figure 37:
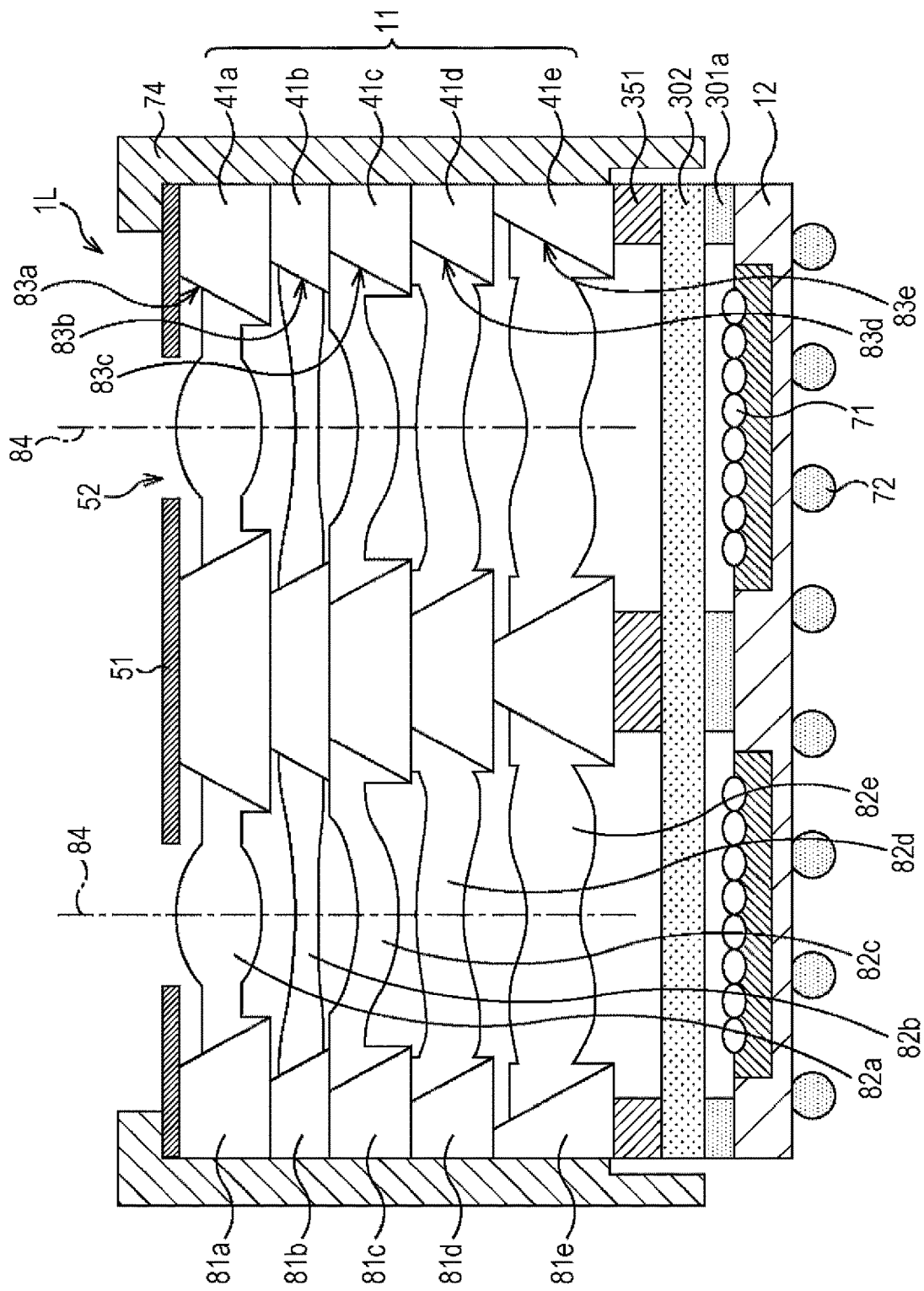
FIG. 37 is a diagram illustrating an eleventh embodiment of a camera module using a stacked lens structure employing the present technology.

FIG. 37 is a diagram illustrating an eleventh embodiment of a camera module using a stacked lens structure employing the present technology.

A camera module 1L of FIG. 37 is a camera module with a focus adjustment mechanism using a piezoelectric device.

Namely, in the camera module 1L, similarly to the camera module 1H of FIG. 34, a structural material 301a is disposed in a portion of the upper side of the light-receiving device 12. The light-receiving device 12 and the light-transmitting substrate 302 are fixed to each other through the structural material 301a. The structural material 301a is, for example, an epoxy-based resin.

A piezoelectric device 351 is disposed at the upper side of the light-transmitting substrate 302. The light-transmitting substrate 302 and the stacked lens structure 11 are fixed to each other through the piezoelectric device 351.

In the camera module 1L, by applying a voltage to the piezoelectric device 351 disposed at the lower side of the stacked lens structure 11 or by cutting off the voltage, the stacked lens structure 11 can be moved in the upward and downward directions. The means for moving the stacked lens structure 11 is not limited to the piezoelectric device 351, but other devices of which shape is changed according to applying or cutting-off of the voltage may be used. For example, a MEMS device may be used.

Due to the above-described mechanism of moving the stacked lens structure 11, it is possible to obtain a function or an effect that, when a camera using the camera module 1L captures an image, autofocus operation can be allowed to be performed.

15. Effects of Structure According to Embodiment of the Present Technology in Comparison with Other Structures The stacked lens structure 11 is a structure (hereinafter, referred to as the structure according to an embodiment of the present technology) where the lens-attached substrates 41 are directly joined. The functions and effects of the structure according to an embodiment of the present technology will be described in comparison with other structures of lens-attached substrates where lenses are formed.

Comparative Structure Example 1

Figure 38:
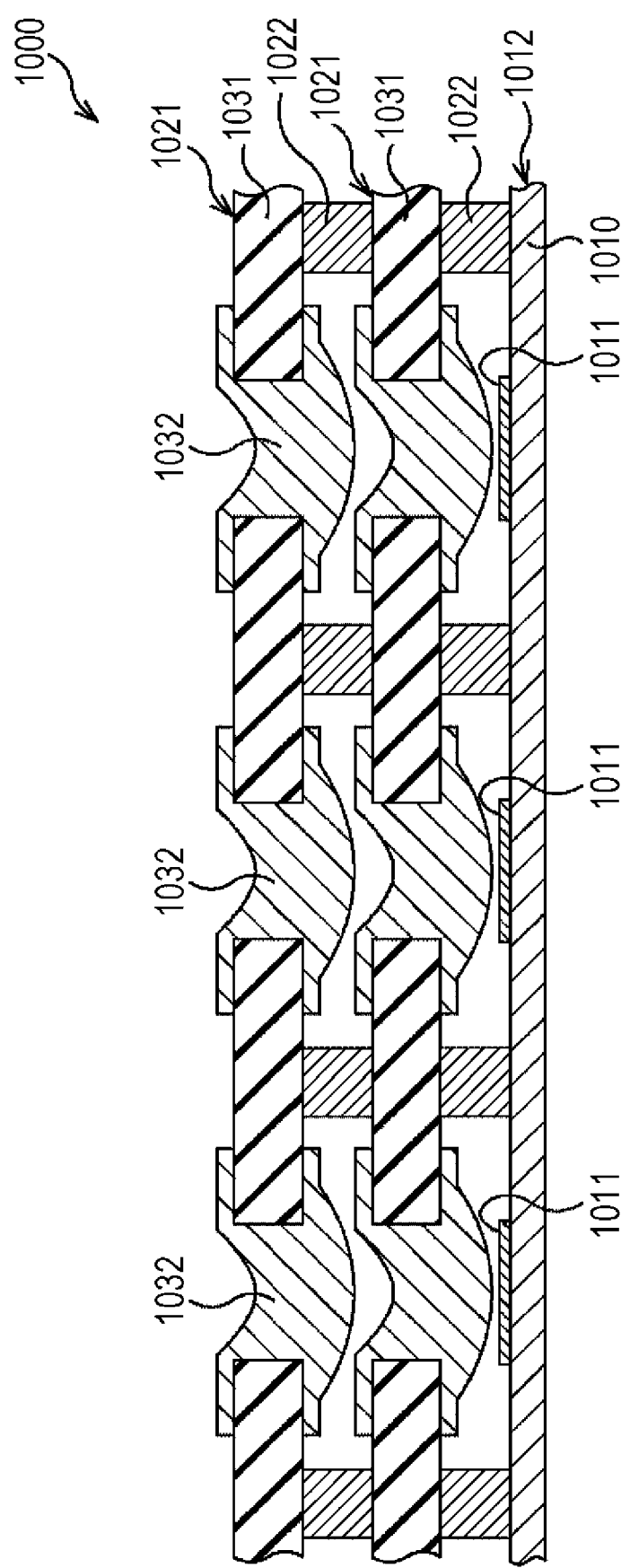
FIG. 38 is cross-sectional diagram illustrating a wafer-level stacked structure as Comparative Structure Example 1.

FIG. 38 is a cross-sectional diagram of a first substrate structure (hereinafter, referred to as Comparative Structure Example 1) for comparing with the structure according to an embodiment of the present technology which is a wafer-level stacked structure disclosed in FIG. 14(b) of JP 2011-138089 A (hereinafter, referred to as Comparative Literature 1).

A wafer-level stacked structure 1000 illustrated in FIG. 38 has a structure where two lens array substrates 1021 are stacked on a sensor array substrate 1012 where a plurality of the image sensors 1011 are disposed on the wafer substrate 1010 through a columnar spacer 1022. Each lens array substrate 1021 is configured to include a lens-attached substrate 1031 and lenses 1032 formed in a plurality of through-hole portions formed in the lens-attached substrate 1031.

Comparative Structure Example 2

Figure 39:
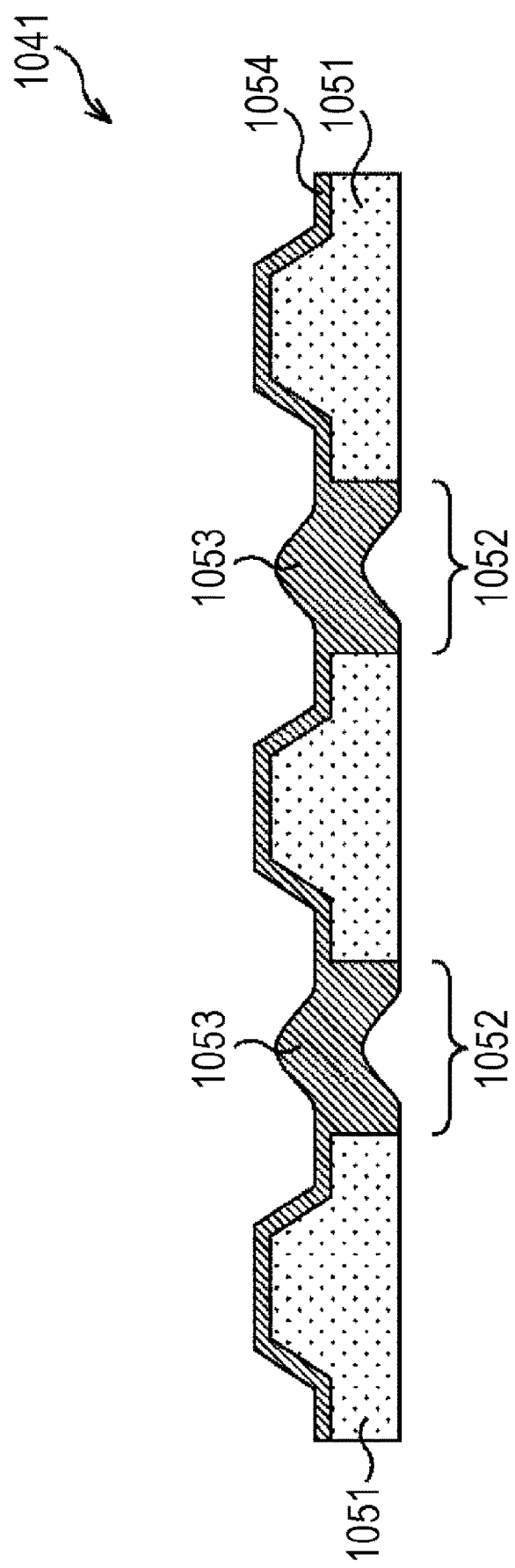
FIG. 39 is a cross-sectional diagram illustrating a lens array substrate as Comparative Structure Example 2.

FIG. 39 is a cross-sectional diagram of a second substrate structure (hereinafter, referred to as Comparative Structure Example 2) for comparing with the structure according to an embodiment of the present technology which is a lens array structure disclosed in FIG. 5(a) of JP 2009-279790 A (hereinafter, referred to as Comparative Literature 2).

In a lens array substrate 1041 illustrated in FIG. 39, a lens 1053 is provided to each of through-holes 1052 provided to a flat-shaped substrate 1051. Each lens 1053 is made of a resin (energy curable resin) 1054, and the resin 1054 is also formed on the upper surface of the substrate 1051.

A manufacturing method for the lens array substrate 1041 of FIG. 39 will be described in brief with reference to FIGS. 40A to 40C.

FIG. 40A illustrates a state that the substrate 1051 where a plurality of the through-holes 1052 are formed is disposed on a lower mold frame 1061. The lower mold frame 1061 is a mold frame of pressing the resin 1054 from the lower side thereof upwards in the subsequent process.

FIG. 40B illustrates a state that, after inner portions of a plurality of the through-holes 1052 and the upper surface of the substrate 1051 are applied with the resin 1054, an upper mold frame 1062 is disposed on the substrate 1051, and press-molding is performed by using the upper mold frame 1062 and the lower mold frame 1061. The upper mold frame 1062 is a mold frame of pressing the resin 1054 from the upper side thereof downwards. In the state illustrated in FIG. 40B, the curing of the resin 1054 is performed.

FIG. 40C illustrates a state that, after the resin 1054 is cured, the upper mold frame 1062 and the lower mold frame 1061 are demolded, so that the lens array substrate 1041 is completely formed.

The lens array substrate 1041 has the following features. (1) The resin 1054 formed at the positions of the through-holes 1052 of the substrate 1051 becomes the lenses 1053, and a plurality of the lenses 1053 are formed in the substrate 1051. In addition, (2) a thin layer of the resin 1054 is formed on the entire upper surface of the substrate 1051 disposed between a plurality of the lenses 1053.

In case of forming the structure where a plurality of the lens array substrates 1041 are stacked, it is possible to obtain a function or an effect that the thin layer of the resin 1054 formed on the entire upper surface of the substrate 1051 functions as an adhesive of adhering the substrates.

In addition, in case of forming the structure where a plurality of the lens array substrates 1041 are stacked, in comparison with the wafer-level stacked structure 1000 of FIG. 38 indicated as Comparative Structure Example 1, the adhering area between the substrates can be increased, the substrates can be adhered by a stronger force.

<Functions Obtained from Resin in Comparative Structure Example 2>

In Comparative Literature 2 disclosing the lens array substrate 1041 of FIG. 39 which is Comparative Structure Example 2, a function of the resin 1054 which is to be the lens 1053 is disclosed as follows.

In Comparative Structure Example 2, as the resin 1054, an energy curable resin is used. In addition, as an example of the energy curable resin, a photocurable resin is used. In the case where the photocurable resin is used as the energy curable resin, if the resin 1054 is irradiated with UV light, the resin 1054 is cured. By the curing, the resin 1054 is curing-contacted.

However, according to the structure of the lens array substrate 1041 of FIG. 39, even though the curing-contraction of the resin 1054 occurs, since the substrate 1051 is interposed among a plurality of the lenses 1053, the change of the distance between the lenses 1053 caused by the curing-contraction of the resin 1054 can be prevented, so that it is possible to suppress the bent state of the lens array substrate 1041 where a plurality of the lenses 1053 are disposed.

Comparative Structure Example 3

Figure 41:
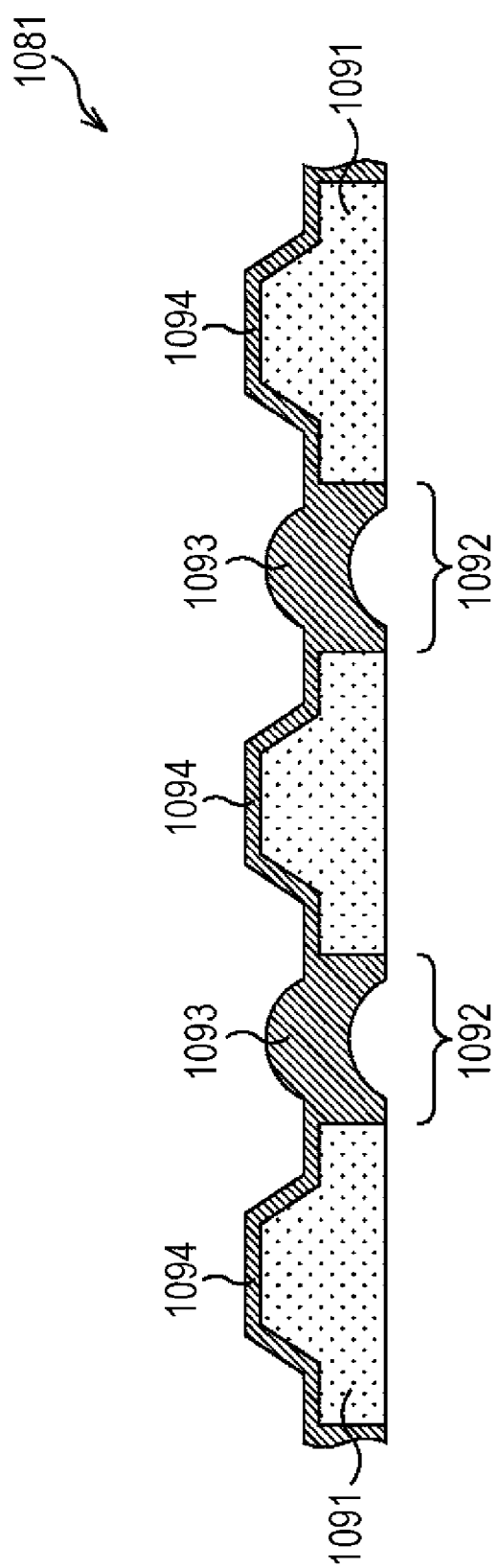
FIG. 41 is a cross-sectional diagram illustrating a lens array substrate as Comparative Structure Example 3.

FIG. 41 is a cross-sectional diagram of a third substrate structure (hereinafter, referred to as Comparative Structure Example 3) for comparing with the structure according to an embodiment of the present technology which is a lens array substrate disclosed in FIG. 1 of JP 2010-256563 A (hereinafter, referred to as Comparative Literature 3).

In a lens array substrate 1081 illustrated in FIG. 41, a lens 1093 is provided to each of through-holes 1092 provided to a flat-shaped substrate 1091. Each lens 1093 is made of a resin (energy curable resin) 1094, and the resin 1094 is also formed on the upper surface of the substrate 1091 where the through-holes 1092 are not provided.

A manufacturing method for the lens array substrate 1081 of FIG. 41 will be described in brief with reference to FIGS. 42A to 42C.

Figure 42:
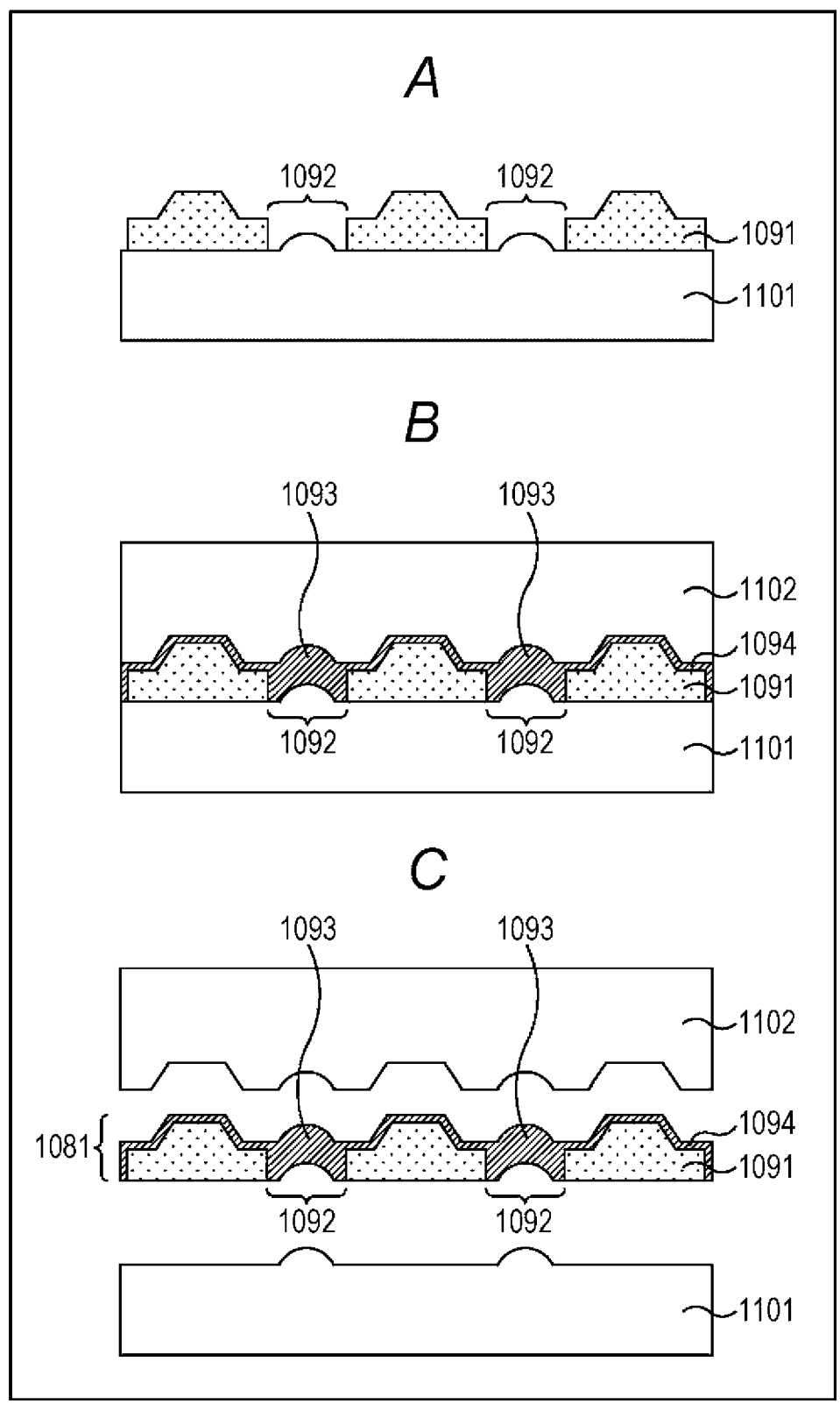
FIG. 42 is a diagram for explaining a manufacturing method for the lens array substrate of FIG. 41.

FIG. 42A illustrates a state that the substrate 1091 where a plurality of the through-holes 1092 are formed is disposed on a lower mold frame 1101. The lower mold frame 1101 is a mold frame of pressing the resin 1094 from the lower side thereof upwards in the subsequent process.

FIG. 42B illustrates a state that, after inner portions of a plurality of the through-holes 1092 and the upper surface of the substrate 1091 are applied with the resin 1094, an upper mold frame 1102 is disposed on the substrate 1091, and press-molding is performed by using the upper mold frame 1102 and the lower mold frame 1101. The upper mold frame 1102 is a mold frame of pressing the resin 1094 from the upper side thereof downwards. In the state illustrated in FIG. 42B, the curing of the resin 1094 is performed.

FIG. 42C illustrates a state that, after the resin 1094 is cured, the upper mold frame 1102 and the lower mold frame 1101 are demolded, so that the lens array substrate 1081 is completely formed.

The lens array substrate 1081 has the following features. (1) The resin 1094 formed at the positions of the through-holes 1092 of the substrate 1091 becomes the lenses 1093, and a plurality of the lenses 1093 are formed in the substrate 1091. In addition, (2) a thin layer of the resin 1094 is formed on the entire upper surface of the substrate 1091 disposed between a plurality of lenses 1093.

<Functions Obtained from Resin in Comparative Structure Example 3>

In Comparative Literature 3 disclosing the lens array substrate 1081 of FIG. 41 which is Comparative Structure Example 3, a function of the resin 1094 which is to be the lens 1093 is disclosed as follows.

In the Comparative Structure Example 3, as the resin 1094, an energy curable resin is used. In addition, an example of the energy curable resin, a photocurable resin is used. In the case where the photocurable resin is used as the energy curable resin, if the resin 1094 is irradiated with UV light, the resin 1094 is cured. By the curing, the resin 1094 is curing-contracted.

However, according to the structure of the lens array substrate 1081 of FIG. 41, even though the curing-contraction of the resin 1094 occurs, since the substrate 1091 is interposed among a plurality of the lenses 1093, the change of the distance between the lenses 1093 caused by the curing-contraction of the resin 1094 can be prevented, so that it is possible to suppress the bent state of the lens array substrate 1081 where a plurality of the lenses 1093 are disposed.

As described heretofore, Comparative Literature 2 and 3 disclose that, when a photocurable resin is cured, curing-contraction occurs. In addition, the fact that, when a photocurable resin is cured, curing-contraction occurs is also disclosed in, for example, JP 2013-1091 A or the like besides Comparative Literature 2 and 3.

In addition, if a resin is molded in a lens shape and the molded resin is cured, there is a problem in that the curing-contraction occurs in the resin. However, this problem is not limited to the photocurable resin. For example, similarly to the photocurable resin, in a thermosetting resin as a kind of an energy curable resin, there is a problem in that the curing-contraction occurs in the curing period. This is disclosed in, for example, Comparative Literature 1 and 3, JP 2010-204631 A, and the like.

Comparative Structure Example 4

Figure 43:
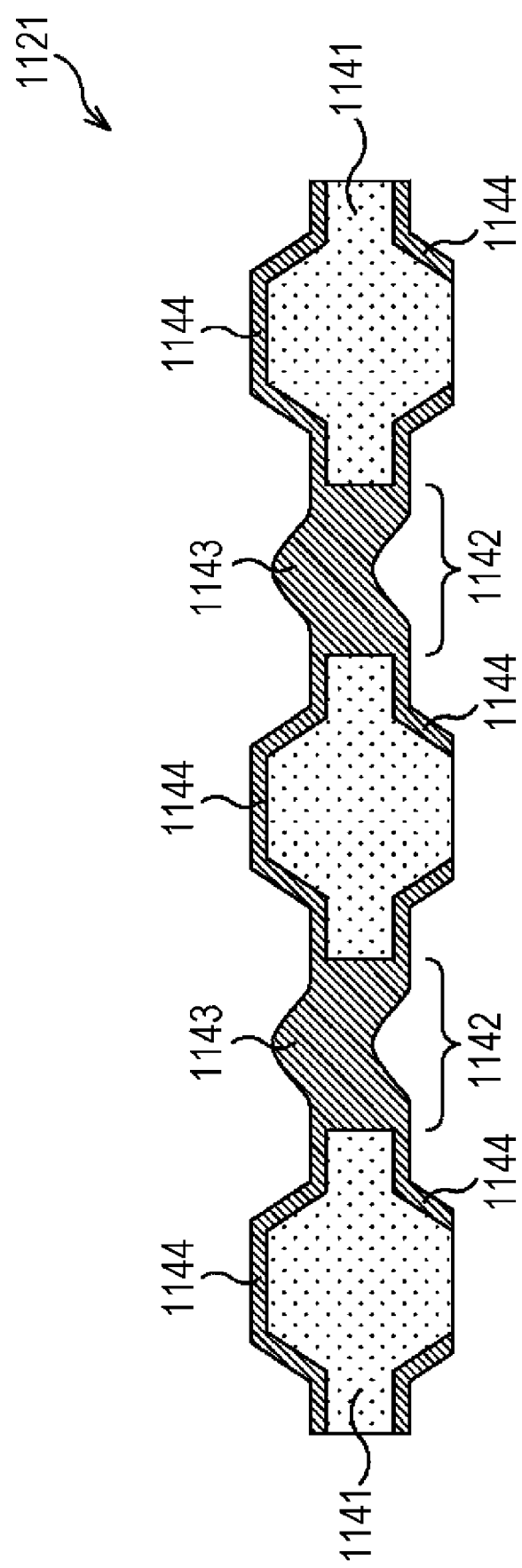
FIG. 43 is a cross-sectional diagram illustrating a lens array substrate as Comparative Structure Example 4.

FIG. 43 is a cross-sectional diagram of a fourth substrate structure (hereinafter, referred to as Comparative Structure Example 4) for comparing with the structure according to an embodiment of the present technology which is a lens array substrate disclosed in FIG. 6 of the above-described Comparative Literature 2.

The lens array substrate 1121 of FIG. 43 is different from the lens array substrate 1041 illustrated in FIG. 39 in terms that the shape of the substrate 1141 other than the portions of the through-holes 1042 is a shape protruding in the lower side as well as the upper side and in terms that the resin 1144 is also formed in a portion of the lower surface of the substrate 1141. The other configurations of the lens array substrate 1121 are the same as those of the lens array substrate 1041 illustrated in FIG. 39.

Figure 44:
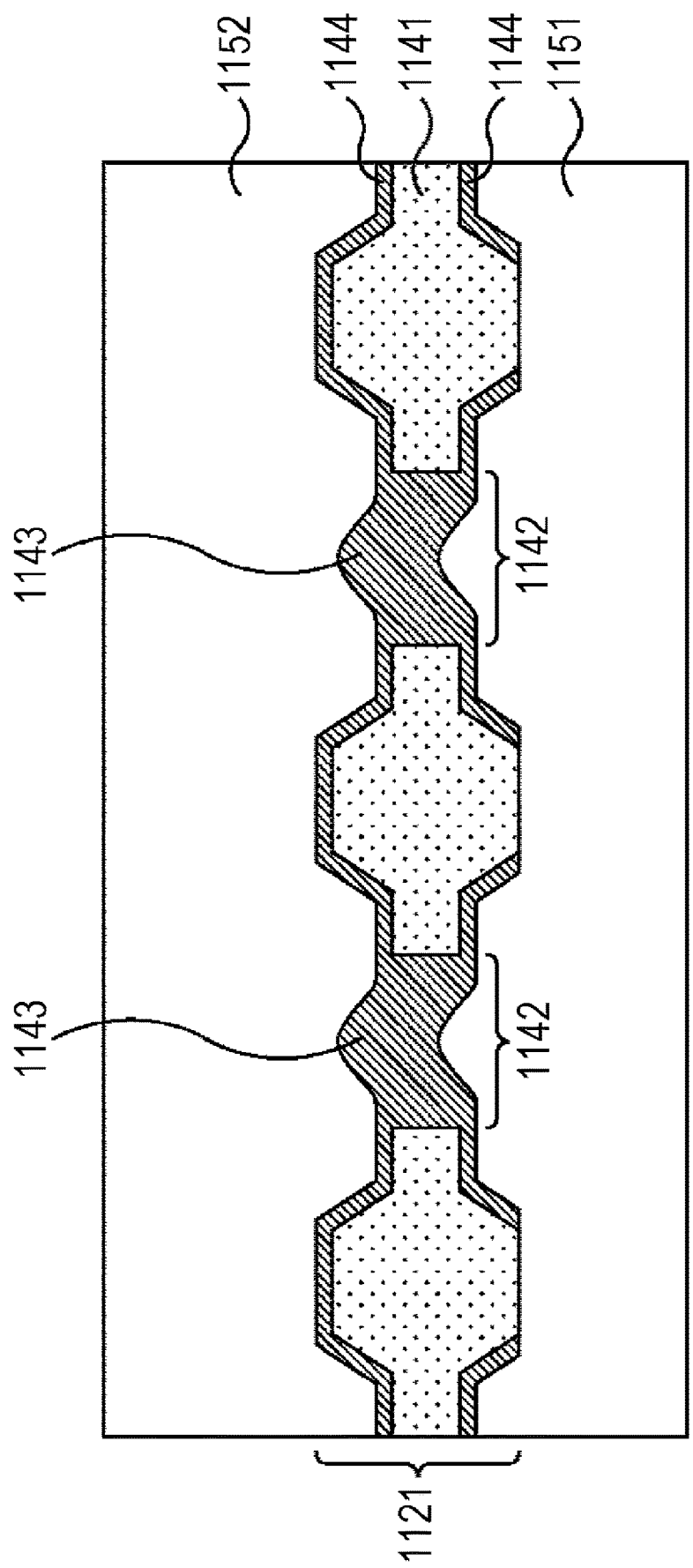
FIG. 44 is diagram for explaining a manufacturing method for the lens array substrate of FIG. 43.

FIG. 44 is a diagram for explaining a manufacturing method for the lens array substrate 1121 of FIG. 43 and is a diagram corresponding to FIG. 40B.

FIG. 44 illustrates a state that, after inner portions of a plurality of the through-holes 1142 and the upper surface of the substrate 1141 are applied with the resin 1144, press-molding is performed by using an upper mold frame 1152 and a lower mold frame 1151. The resin 1144 is also injected between the lower surface of the substrate 1141 and the lower mold frame 1151. In the state illustrated in FIG. 44, the curing of the resin 1144 is performed.

The lens array substrate 1121 has the following features. (1) The resin 1144 formed at the positions of the through-holes 1142 of the substrate 1141 becomes the lenses 1143, and a plurality of the lenses 1143 are formed in the substrate 1141. In addition, (2) a thin layer of the resin 1144 is formed on the entire upper surface of the substrate 1141 disposed between a plurality of lenses 1143, and a thin layer of the resin 1144 is also formed in a portion of the lower surface of the substrate 1141.

<Functions Obtained from Resin in Comparative Structure Example 4>

In Comparative Literature 2 disclosing the lens array substrate 1121 of FIG. 43 which is Comparative Structure Example 4, a function of the resin 1144 which is to be the lens 1143 is disclosed as follows.

In the lens array substrate 1121 of FIG. 43 which is Comparative Structure Example 4, as the resin 1144, a photocurable resin which is an example of the energy curable resin is used. Next, if the resin 1144 is irradiated with UV light, the resin 1144 is cured. By the curing, similarly to Comparative Structure Examples 2 and 3, the resin 1144 is curing-contracted.

However, in the lens array substrate 1121 of Comparative Structure Example 4, in a certain area of the lower surface of the substrate 1141 as well as the entire upper surface of the substrate 1141 located between a plurality of lenses 1143, a thin layer of the resin 1144 is formed.

In this manner, in the structure, the resin 1144 is formed on both of the upper surface and the lower surface of the substrate 1141, so that the directions of the bent state of the entire lens array substrate 1121 can be canceled out.

On the contrary, in the lens array substrate 1041 illustrated in FIG. 39 as Comparative Structure Example 2, the thin layer of the resin 1054 is formed on the entire upper surface of the substrate 1051 disposed between a plurality of the lenses 1053, but the thin layer of the resin 1054 is not formed on the lower surface of the substrate 1051.

Therefore, in the lens array substrate 1121 of FIG. 43, in comparison with the lens array substrate 1041 of FIG. 39, it is possible to provide a lens array substrate where the amount of the bent state can be allowed to be small.

Comparative Structure Example 5

Figure 9:
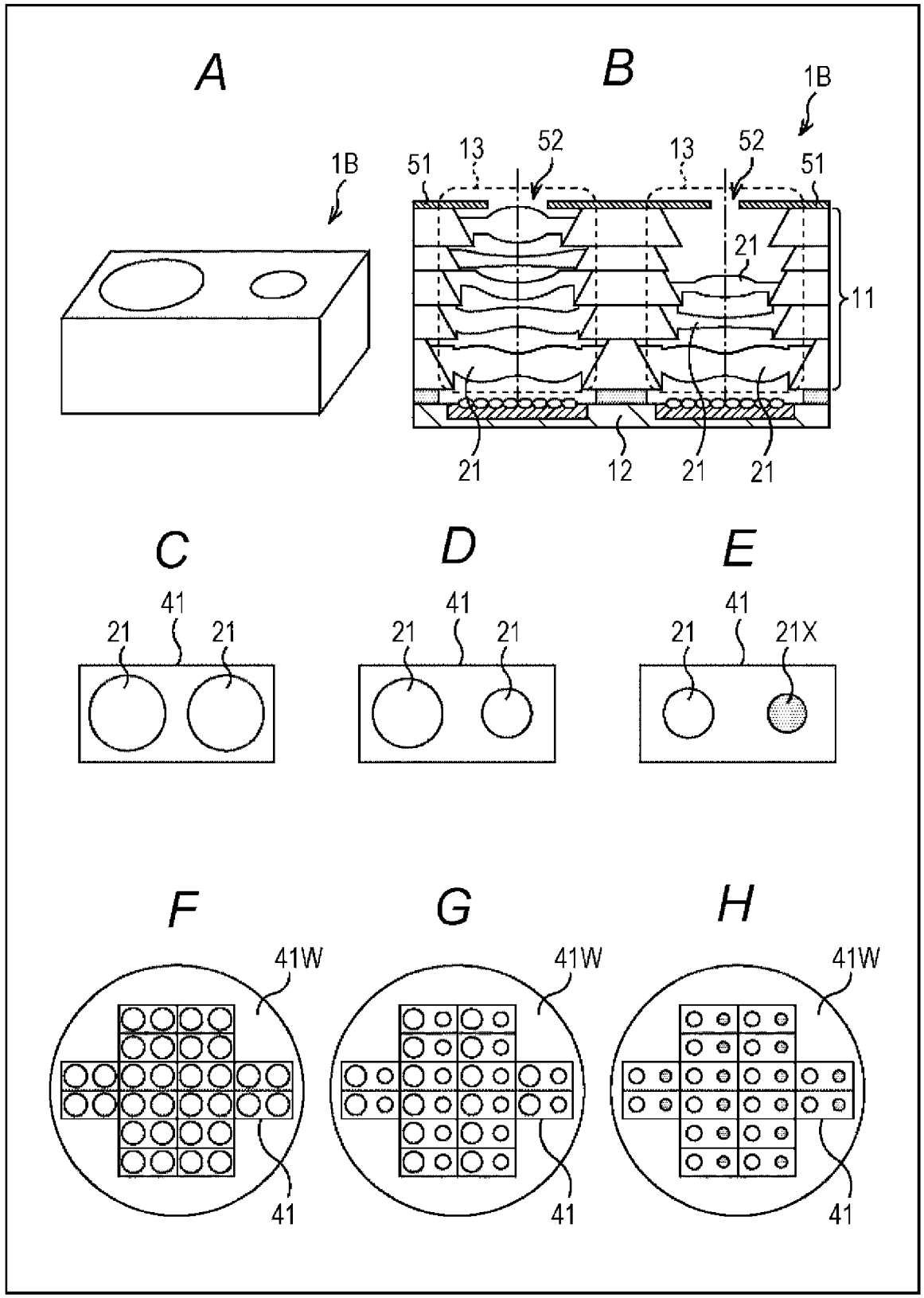
FIG. 9 is a diagram illustrating a second embodiment of a camera module using a stacked lens structure employing the present technology.
Figure 45:
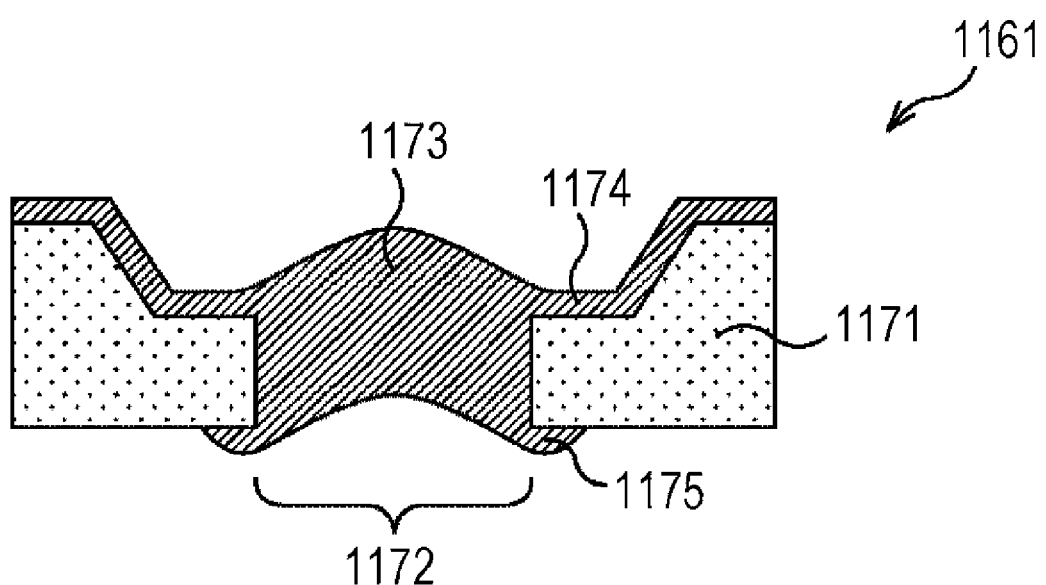
FIG. 45 is cross-sectional diagram illustrating a lens array substrate as Comparative Structure Example 5.

FIG. 45 is a cross-sectional diagram of a fifth substrate structure (hereinafter, referred to as Comparative Structure Example 5) for comparing with the structure according to an embodiment of the present technology which is a lens array substrate disclosed in FIG. 9 of the above-described Comparative Literature 2.

The lens array substrate 1161 of FIG. 45 is different from the lens array substrate 1041 illustrated in FIG. 39 in terms that a resin protruding region 1175 is formed on the rear surface of the substrate in the vicinity of the through-hole 1172 formed in the substrate 1171. The other configurations of the lens array substrate 1161 are the same as those of the lens array substrate 1041 illustrated in FIG. 39.

In addition, FIG. 45 illustrates a state after the dicing of the lens array substrate 1161.

The lens array substrate 1161 has the following features. (1) The resin 1174 formed at the positions of the through-holes 1172 of the substrate 1171 becomes the lenses 1173, and a plurality of the lenses 1173 are formed in the substrate 1171. In addition, (2) a thin layer of the resin 1174 is formed on the entire upper surface of the substrate 1171 disposed between a plurality of the lenses 1173, and a thin layer of the resin 1174 is also formed in a portion of the lower surface of the substrate 1171.

<Functions Obtained from Resin in Comparative Structure Example 5>

In Comparative Literature 2 disclosing the lens array substrate 1161 of FIG. 45 which is Comparative Structure Example 5, a function of the resin 1174 which is to be the lens 1173 is disclosed as follows.

In the lens array substrate 1161 of FIG. 45 which is Comparative Structure Example 5, as the resin 1174, a photocurable resin which is an example of the energy curable resin is used. Next, if the resin 1174 is irradiated with UV light, the resin 1174 is cured. By the curing, similarly to Comparative Structure Examples 2 and 3, the resin 1174 is curing-contracted.

However, in the lens array substrate 1171 of Comparative Structure Example 5, in a certain area of the lower surface of the substrate 1171 as well as the entire upper surface of the substrate 1171 located between a plurality of the lenses 1173, a thin layer (resin protruding region 1175) of the resin 1174 is formed. Therefore, the directions of the bent state of the entire lens array substrate 1171 are canceled out, so that it is possible to provide a lens array substrate where the amount of the bent state can be allowed to be small.

<Comparison of Functions Obtained from Resin of Comparative Structure Examples 2 to 5>

The functions obtained from the resin of Comparative Structure Examples 2 to 5 are summarized as follows.

(1) Like Comparative Structure Examples 2 and 3, in case of the structure where the layer of resin is disposed on the entire upper surface of the lens array substrate, the bent state occurs in the substrate where a plurality of the lenses are disposed.

FIGS. 46A to 46C are schematic diagrams illustrating a structure where a layer of a resin is disposed over the entire upper surface of the lens array substrate similarly to Comparative Structure Examples 2 and 3 and is a diagram for explaining an effect obtained from a resin which is to be a lens.

As illustrated in FIGS. 46A and 46B, the curing-contraction occurs in the layer of the photocurable resin 1212 disposed on the upper surface of the lens array substrate 1211 (lenses and through-holes are omitted in illustration) due to the irradiation with UV light for curing. Therefore, in the layer of the photocurable resin 1212, a force caused by the photocurable resin 1212 is generated in the contraction direction.

On the other hand, the lens array substrate 1211 itself is neither contracted nor expanded even through the lens array substrate is irradiated with UV light. Namely, in the lens array substrate 1211 itself, no force caused by the substrate is generated. As a result, as illustrated in FIG. 46C, the lens array substrate 1211 is bent in a downward convex shape.

(2) However, like Comparative Structure Examples 4 and 5, in case of the structure where the layer of the resin is disposed on both of the upper surface and the lower surface of the lens array substrate, since the directions of the bent state of the lens array substrate are canceled out, the amount of the bent state of the lens array substrate can be allowed to be smaller than that of Comparative Structure Examples 2 and 3.

FIGS. 47A to 47C are schematic diagrams illustrating a structure where a layer of a resin is disposed on both of the upper surface and the lower surface of the lens array substrate similarly to Comparative Structure Examples 4 and 5 and is a diagram for explaining an effect obtained from a resin which is to be a lens.

As illustrated in FIGS. 47A and 47B, the curing contraction occurs in the layer of the photocurable resin 1212 disposed on the upper surface of the lens array substrate 1211 due to the irradiation with UV light for curing. Therefore, in the layer of the photocurable resin 1212 disposed on the upper surface of the lens array substrate 1211, a force caused by the photocurable resin 1212 is generated in the contraction direction. For this reason, a force of bending the lens array substrate 1211 in a downward convex shape is exerted on the upper surface side of the lens array substrate 1211.

On the contrary, the lens array substrate 1211 itself is neither contracted nor expanded even though the lens array substrate is irradiated with UV light. Namely, in the lens array substrate 1211 itself, no force caused by the substrate is generated.

On the other hand, the layer of the photocurable resin 1212 disposed on the lower surface of the lens array substrate 1211 is curing-contracted by UV light irradiation for curing. Therefore, in the layer of the photocurable resin 1212 disposed on the lower surface of the lens array substrate 1211, a force caused by the photocurable resin 1212 is generated in the contraction direction. For this reason, a force of bending the lens array substrate 1211 in an upward convex shape is exerted on the lower surface side of the lens array substrate 1211.

A force of bending the lens array substrate 1211 in a downward convex shape exerted on the upper surface side of the lens array substrate 1211 and a force of bending the lens array substrate 1211 in an upward convex shape exerted on the lower surface side of the lens array substrate 1211 cancel each other out.

As a result, as illustrated in FIG. 47C, the amount of the bent state of the lens array substrate 1211 in Comparative Structure Examples 4 and 5 is smaller than the amount of the bent state in Comparative Structure Examples 2 and 3 illustrated in FIG. 46C.

In this manner, the force of bending the lens array substrate and the amount of the bent state of the lens array substrate are influenced by a relationship between (1) the direction and magnitude of the force exerted on the lens array substrate in the upper surface of the lens array substrate and (2) the direction and magnitude of the force exerted on the lens array substrate in the lower surface of the lens array substrate.

Comparative Structure Example 6

Therefore, for example, as illustrated in FIG. 48A, a lens array substrate structure is considered where the layer and area of the photocurable resin 1212 disposed on the upper surface of the lens array substrate 1211 are the same as the layer and area of the photocurable resin 1212 disposed on the lower surface of the lens array substrate 1211. The lens array substrate structure is referred to as a sixth substrate structure (hereinafter, referred to as Comparative Structure Example 6) for comparing with the structure according to an embodiment of the present technology.

In Comparative Structure Example 6, in the layer of the photocurable resin 1212 disposed on the upper surface of the lens array substrate 1211, a force caused by the photocurable resin 1212 is generated in the contraction direction. In the lens array substrate 1211 itself, no force caused by the substrate is generated. For this reason, a force of bending the lens array substrate 1211 in a downward convex shape is exerted on the upper surface side of the lens array substrate 1211.

On the other hand, in the layer of the photocurable resin 1212 disposed on the lower surface of the lens array substrate 1211, a force caused by the photocurable resin 1212 is generated in the contraction direction. In the lens array substrate 1211 itself, no force caused by the substrate is generated. For this reason, a force of bending the lens array substrate 1211 in an upward convex shape is exerted on the lower surface side of the lens array substrate 1211.

The two forces of bending the lens array substrate 1211 are exerted in the directions to cancel each other out further in comparison with the structure illustrated in FIG. 47A. As a result, the force of bending the lens array substrate 1211 and an amount of the bent state of the lens array substrate 1211 are further decreased in comparison with Comparative Structure Examples 4 and 5.

Comparative Structure Example 7

However, actually, all shapes of the lens-attached substrates constituting the stacked lens structure incorporated into the camera module are not the same. More specifically, in some cases, a plurality of the lens-attached substrates constituting the stacked lens structure may be different, for example, in terms of thickness of the lens-attached substrate or size of the through-hole or may be different in terms of thickness, shape, volume, or the like of the lens formed in the through-hole. In addition, in some cases, the lens-attached substrates may be different in terms of thickness or the like of the photocurable resin formed in the upper surface and the lower surface of the lens-attached substrate.

Figure 49:
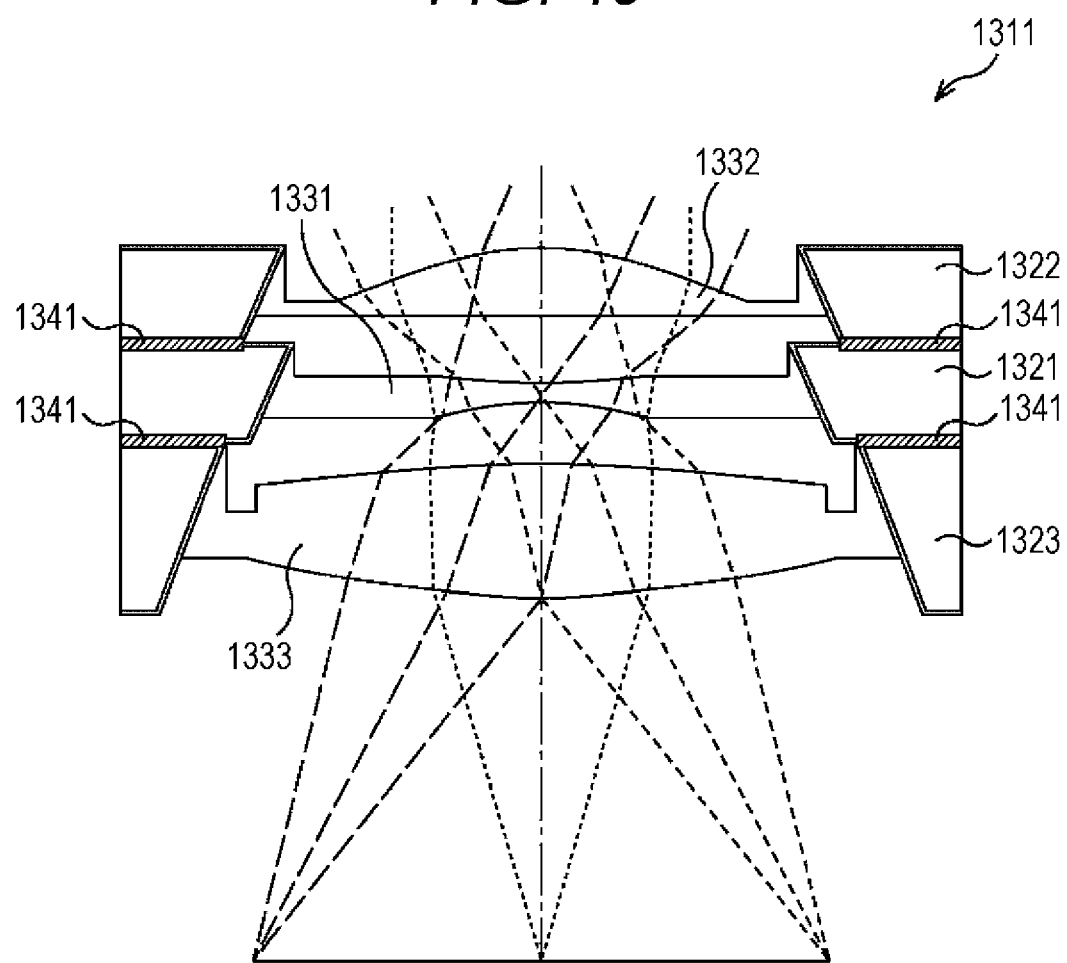
FIG. 49 is a cross-sectional diagram illustrating a stacked lens structure as Comparative Structure Example 7.

FIG. 49 is a cross-sectional diagram of a stacked lens structure as a seventh substrate structure (hereinafter, Comparative Structure Example 7) which is configured by stacking three lens-attached substrates. Similarly to Comparative Structure Example 6 illustrated in FIGS. 48A to 48C, in the stacked lens structure, the layer and area of the photocurable resin disposed on the upper surface and the lower surface of each lens-attached substrate are set to be formed so as to be the same.

The stacked lens structure 1311 illustrated in FIG. 49 is configured to include three lens-attached substrates 1321 to 1323.

Hereinafter, among the three lens-attached substrates 1321 to 1323, the middle-layered lens-attached substrate 1321 is referred to as a first lens-attached substrate 1321, the uppermost-layer lens-attached substrate 1322 is referred to as a second lens-attached substrate 1322, and the lowermost-layer lens-attached substrate 1323 is referred to as a third lens-attached substrate 1323.

The second lens-attached substrate 1322 disposed in the uppermost layer and the third lens-attached substrate 1323 disposed on the lowermost layer are different from each other in terms of a substrate thickness and a lens thickness.

More specifically, the lens thickness in the third lens-attached substrate 1323 is formed to be larger than that of the second lens-attached substrate 1322, and thus, the substrate thickness in the third lens-attached substrate 1323 is also formed to be larger than that of the second lens-attached substrate 1322.

A resin 1341 is formed over the entire contact surface between the first lens-attached substrate 1321 and the second lens-attached substrate 1322 and over the entire contact surface between the first lens-attached substrate 1321 and the third lens-attached substrate 1323.

The cross-section shape of the through-hole of the three lens-attached substrates 1321 to 1323 is the so-called fan shape where the lower surface of the substrate is larger than the upper surface of the substrate.

A function obtained from the three lens-attached substrates 1321 to 1323 having different shapes will be described with reference to FIGS. 50A to 50D.

Figure 50:
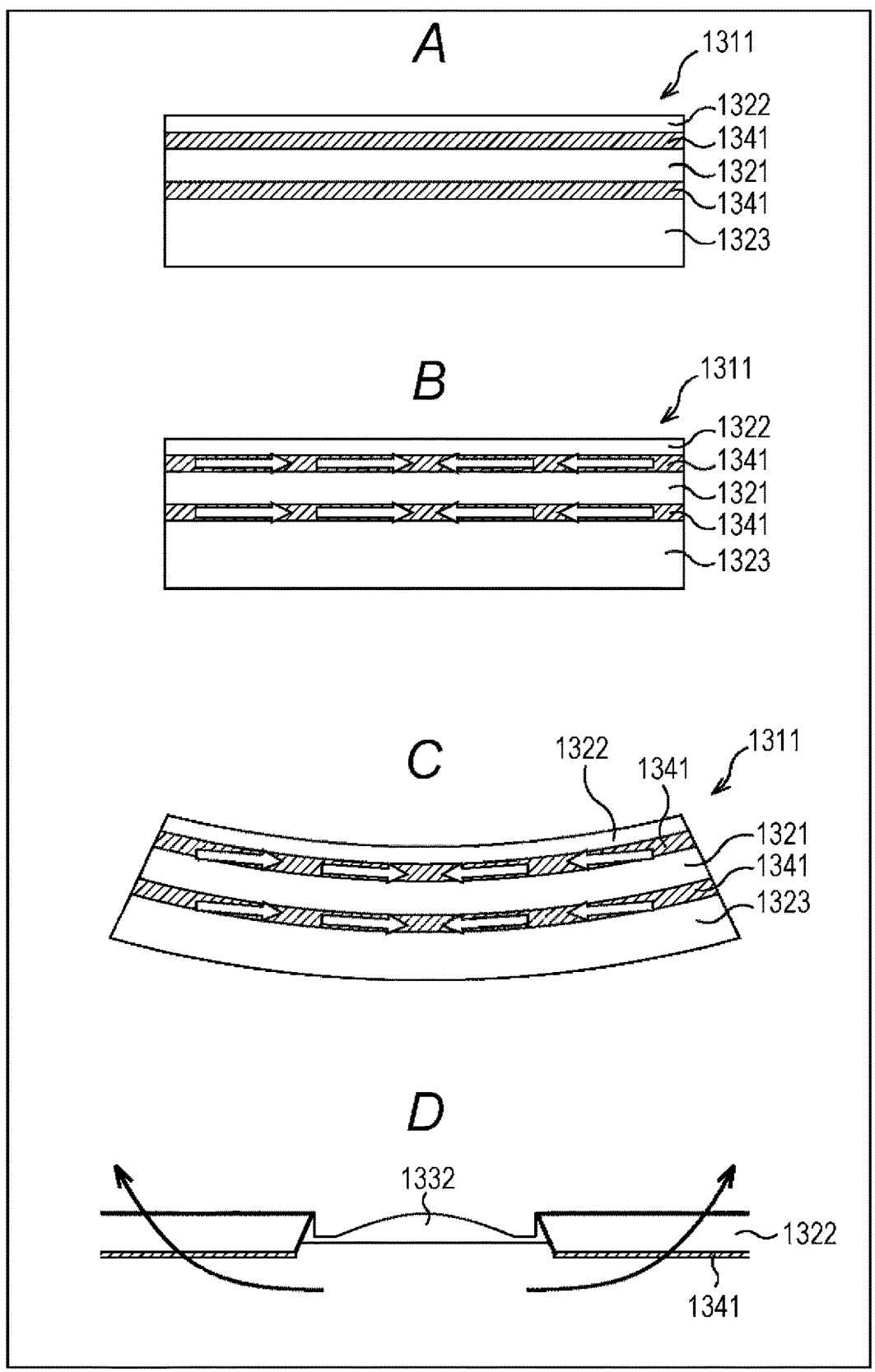
FIG. 50 is a diagram for explaining an effect obtained from the stacked lens structure of FIG. 49.

FIGS. 50A to 50C are schematic diagrams illustrating the stacked lens structure 1311 illustrated in FIG. 49.

Like the stacked lens structure 1311, in the case where the second lens-attached substrate 1322 and the third lens-attached substrate 1323 which are different in substrate thickness are disposed on the upper surface and the lower surface of the first lens-attached substrate 1321, the force of bending the stacked lens structure 1311 and the amount of the bent state of the stacked lens structure 1311 are changed according to which positions of the stacked lens structure 1311 in the thickness direction the layers of the resin 1341 existing over the entire surfaces of the contact surfaces among the three lens-attached substrates 1321 to 1323 exist.

If the layers of the resin 1341 existing over the entire surfaces of the contact surfaces among the three lens-attached substrates 1321 to 1323 are not disposed symmetrically with respect to the center line of the stacked lens structure 1311, that is, the line passing through the thickness-direction center of the stacked lens structure 1311 along the substrate planar directions, functions of the forces generated by the curing-contraction of the resin 1341 disposed on the upper surface and the lower surface of the first lens-attached substrate 1321 are not completely canceled out as illustrated in FIG. 48C. As a result, the stacked lens structure 1311 is bent in any one of the directions.

For example, in the case where the two layers of the resin 1341 on the upper surface and the lower surface of the first lens-attached substrate 1321 are disposed so as to be deviated upwards from the center line of the stacked lens structure 1311 in the thickness direction, if the two layers of resin 1341 are curing-contracted, the stacked lens structure 1311 is bent in a downward convex shape as illustrated in FIG. 50C.

In addition, in the case where the cross-section shape of the through-hole of the thinner substrate between the second lens-attached substrate 1322 and the third lens-attached substrate 1323 is a shape which is increased toward the direction of the first lens-attached substrate 1321, the problem in that the lens is lost or damaged is increased.

In the example illustrated in FIG. 49, between the second lens-attached substrate 1322 and the third lens-attached substrate 1323, the cross-section shape of the through-hole of the second lens-attached substrate 1322 of which thickness is small is the fan shape where the size of the through-hole is increased toward the first lens-attached substrate 1321. In such a shape, when the two layers of the resin 1341 on the upper surface and the lower surface of the first lens-attached substrate 1321 are curing-contracted, as illustrated in FIG. 50C, the force of bending in a downward convex shape is exerted on the stacked lens structure 1311, and as illustrated in FIG. 50D, the force is exerted on the second lens-attached substrate 1322 as a force in a direction of separating the lens and the substrate. Due to the exertion of the force, the problem in that the lens 1332 of the second lens-attached substrate 1322 is lost or damaged is increased.

Next, the case where the resin is thermally expanded is considered.

Comparative Structure Example 8

Figure 51:
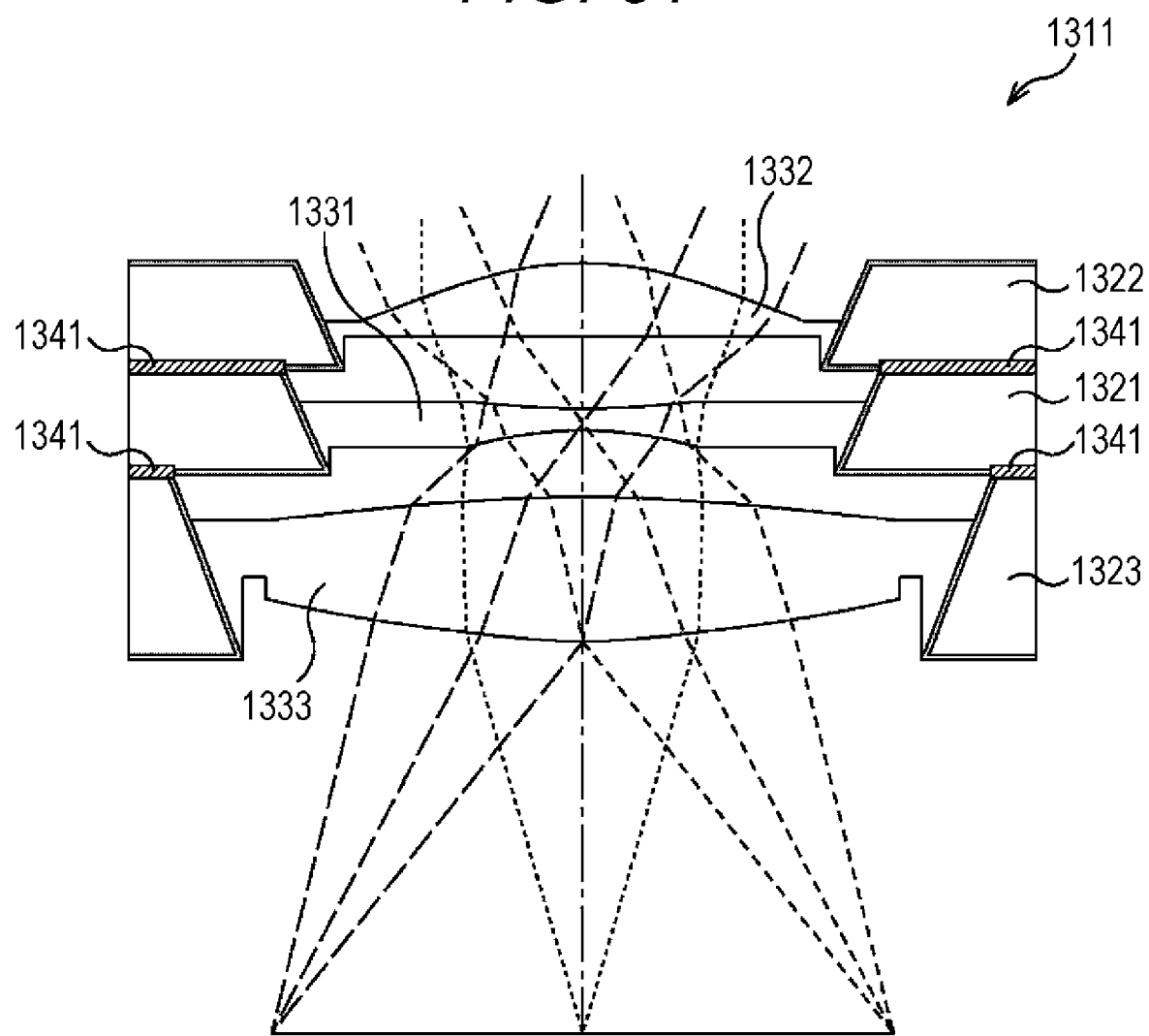
FIG. 51 is a cross-sectional diagram illustrating a stacked lens structure as Comparative Structure Example 8.

FIG. 51 is a cross-sectional diagram of a stacked lens structure as an eighth substrate structure (hereinafter, Comparative Structure Example 8) which is configured by stacking three lens-attached substrates. Similarly to Comparative Structure Example 6 illustrated in FIGS. 48A to 48C, in the stacked lens structure, the layer and area of the photocurable resin disposed on the upper surface and the lower surface of each lens-attached substrate are set to be formed so as to be the same.

Comparative Structure Example 8 of FIG. 51 is different from Comparative Structure Example 7 of FIG. 49 only in terms that the cross-section shape of the through-hole of the three lens-attached substrates 1321 to 1323 has the so-called tapered-down shape where the lower surface of the substrate is smaller than the upper surface of the substrate.

Figure 52:
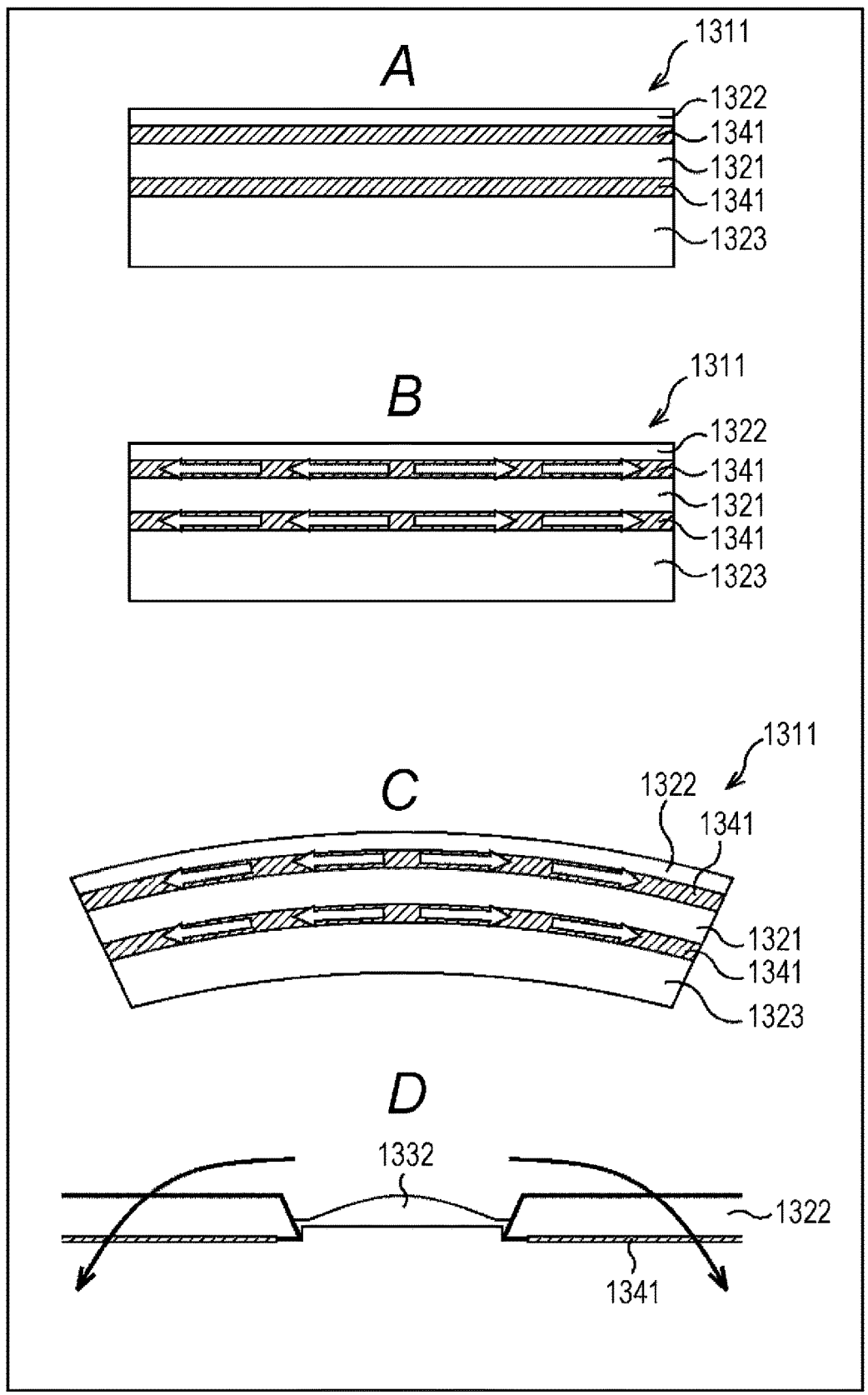
FIG. 52 is a diagram for explaining an effect obtained from the stacked lens structure of FIG. 51.

FIGS. 52A to 52C are schematic diagrams illustrating the stacked lens structure 1311 illustrated in FIG. 51.

When a user actually uses a camera module, due to an increase in power consumption according to the operation, a temperature of the housing of the camera is increased, and thus, a temperature of the camera module is also increased. Due to the increase in temperature, in the stacked lens structure 1311 of FIG. 51, the resin 1341 disposed in the upper surface and the lower surface of the first lens-attached substrate 1321 is thermally expanded.

Although the area and thickness of the resin 1341 disposed on the upper surface and the lower surface of the first lens-attached substrate 1321 are set to be the same as illustrated in FIG. 48A, if the layers of the resin 1341 existing over the entire surfaces of the contact surfaces among the three lens-attached substrates 1321 to 1323 are not disposed symmetrically with respect to the center line of the stacked lens structure 1311, that is, the line passing through the thickness-direction center of the stacked lens structure 1311 along the substrate planar directions, functions of the forces generated by the thermal expansion of the resin 1341 disposed on the upper surface and the lower surface of the first lens-attached substrate 1321 are not completely canceled out as illustrated in FIG. 48C. As a result, the stacked lens structure 1311 is bent in any one of the directions.

For example, in the case where the two layers of the resin 1341 on the upper surface and the lower surface of the first lens-attached substrate 1321 are disposed so as to be deviated upwards from the center line of the stacked lens structure 1311 in the thickness direction, if the two layers of the resin 1341 are thermally expand, the stacked lens structure 1311 is bent in an upward convex shape as illustrated in FIG. 52C.

In addition, in the example illustrated in FIG. 51, between the second lens-attached substrate 1322 and the third lens-attached substrate 1323, the cross-section shape of the through-hole of the second lens-attached substrate 1322 of which thickness is small is the tapered-down shape where the size of the through-hole is decreased toward the first lens-attached substrate 1321. In such a shape, when the two layers of the resin 1341 on the upper surface and the lower surface of the first lens-attached substrate 1321 are thermally expand, the force of bending in an upward convex shape is exerted on the stacked lens structure 1311, and as illustrated in FIG. 52D, the force is exerted on the second lens-attached substrate 1322 as a force in a direction of separating the lens and the substrate. Due to the exertion of the force, the problem in that the lens 1332 of the second lens-attached substrate 1322 is lost or damaged is increased.

<Structure According to Embodiment of the Present Technology>

Figure 53:
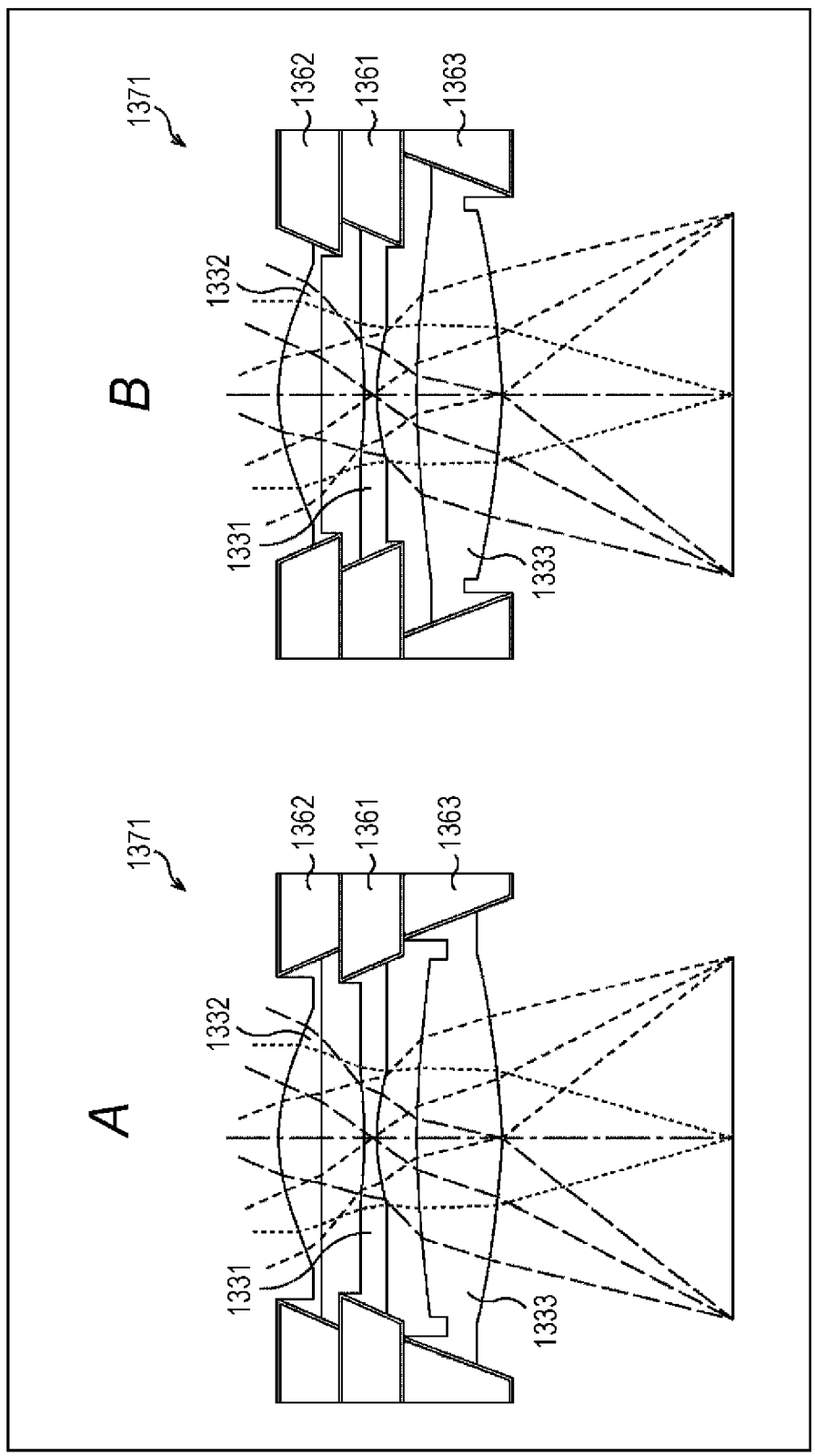
FIG. 53 is a cross-sectional diagram illustrating a stacked lens structure employing the structure according to an embodiment of the present technology.

FIGS. 53A and 53B are diagrams illustrating a stacked lens structure 1371 configured to include three lens-attached substrates 1361 to 1363 employing the structure according to an embodiment of the present technology.

FIG. 53A illustrates the structure corresponding to the stacked lens structure 1311 of FIG. 49, which is the structure where the cross-section shape of the through-hole is the so-called fan shape. On the other hand, FIG. 53B illustrates the structure corresponding to the stacked lens structure 1311 of FIG. 51, which is the structure where the cross-section shape of the through-hole is the so-called tapered-down shape.

Figure 54:
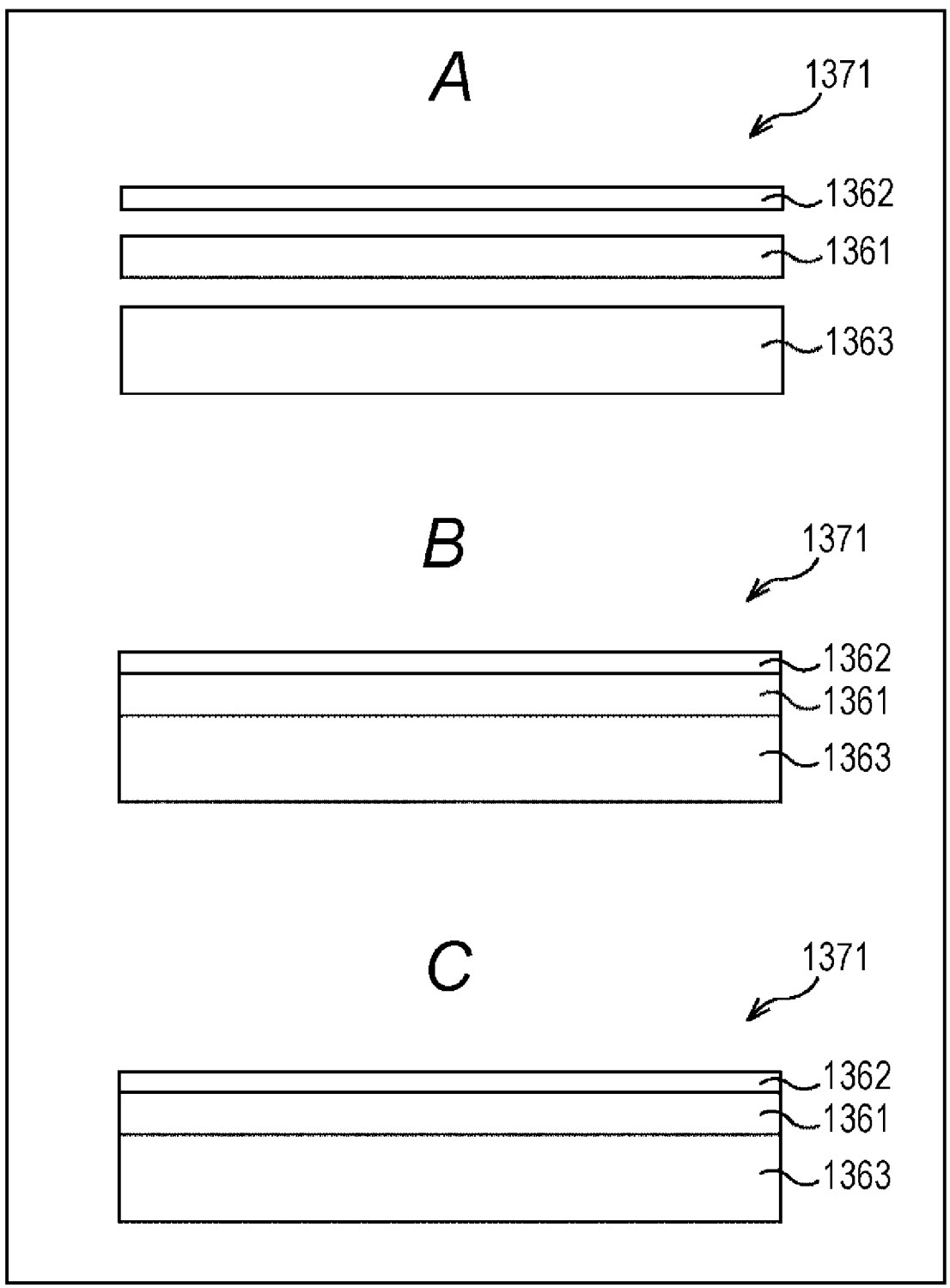
FIG. 54 is a schematic diagram illustrating the stacked lens structure of FIG. 53.

FIGS. 54A to 54C are schematic diagrams illustrating the stacked lens structure 1371 illustrated in FIGS. 53A and 53B in order to explain a function obtained from the structure according to an embodiment of the present technology.

The stacked lens structure 1371 is a structure where a second lens-attached substrate 1362 is disposed above a first lens-attached substrate 1361 as the middle lens-attached substrate and a third lens-attached substrate 1363 is disposed under the first lens-attached substrate 1361.

The second lens-attached substrate 1362 disposed in the uppermost layer and the third lens-attached substrate 1363 disposed in the lowermost layer are different from each other in terms of a substrate thickness and a lens thickness. More specifically, the lens thickness in the third lens-attached substrate 1363 is formed to be larger than that of the second lens-attached substrate 1362, and thus, the substrate thickness in the third lens-attached substrate 1363 is also formed to be larger than that of the second lens-attached substrate 1362.

In the stacked lens structure 1371 of the structure according to an embodiment of the present technology, as a means for fixing the lens-attached substrates, direct joining of the substrates is used. In other words, a plasma activation process is performed on the to-be-fixed lens-attached substrates, so that the two to-be-fixed lens-attached substrates are plasma-joined. Furthermore, in other words, silicon oxide films are formed on the surfaces of the to-be-stacked two lens-attached substrates, hydroxyl groups are bonded thereto, after that, the two lens-attached substrates are adhered to each other, and dehydration condensation is performed by increasing the temperature of the substrates. By doing so, the two lens-attached substrates are directly joined by silicon-oxygen covalent bonds.

Therefore, in the stacked lens structure 1371 of the structure according to an embodiment of the present technology, as a means for fixing the lens-attached substrates, adhesion using a resin is not used. For this reason, a resin for lens formation and a resin for substrate adhesion are not disposed between the lens-attached substrate and the lens-attached substrate. In addition, since a resin is not disposed on the upper surface and the lower surface of the lens-attached substrate, in the upper surface and the lower surface of the lens-attached substrate, a resin is neither thermally expanded nor curing-contracted.

Therefore, in the stacked lens structure 1371, even though the second lens-attached substrate 1362 and the third lens-attached substrate 1363 which are different in terms of lens thickness and substrate thickness are disposed on the upper layer and the lower layer of the first lens-attached substrate 1351, unlike the above-described Comparative Structure Examples 1 to 8, the bent state of the substrate caused by the curing-contraction and the bent state of the substrate caused by the thermal expansion do not occur.

Namely, due to the structure according to an embodiment of the present technology where the lens-attached substrates are fixed to each other by direct joining, it is possible to obtain a function or an effect that, even in the case where the lens-attached substrates which are different in terms of lens thickness and substrate thickness are stacked on the upper layer and the lower layer thereof, the bent state of the substrate can be more greatly suppressed than those of the above-described Comparative Structure Examples 1 to 8.

16. Other Embodiment 1

<Wafer-Level Lens>

As a wafer-level lens in the related art, there exist a hybrid type wafer-level lens which is formed on a glass substrate, a monolithic type wafer-level lens formed with only a resin material, and the like. With respect to this, PTL 1 discloses a method of forming a lens in a through-hole of a silicon substrate.

However, in case of the method, there is a possibility that a lens protrudes from the substrate (through-hole) according to a shape of the lens. In this case, at the time of transporting the substrate or in a following-stage manufacturing process such as thin film formation, the lens may be in contact with a manufacturing apparatus, a mounting stage, or the like, and thus, there is a possibility of causing contamination or damage to the lens.

Therefore, at the time of manufacturing the lens-attached substrate where the lens resin portion is formed in the through-hole of the substrate, the spacer which is thicker than the protruding height of the lens resin portion protruded from the substrate is configured to be adhered to the substrate.

<Spacer Substrate>

Figure 55:
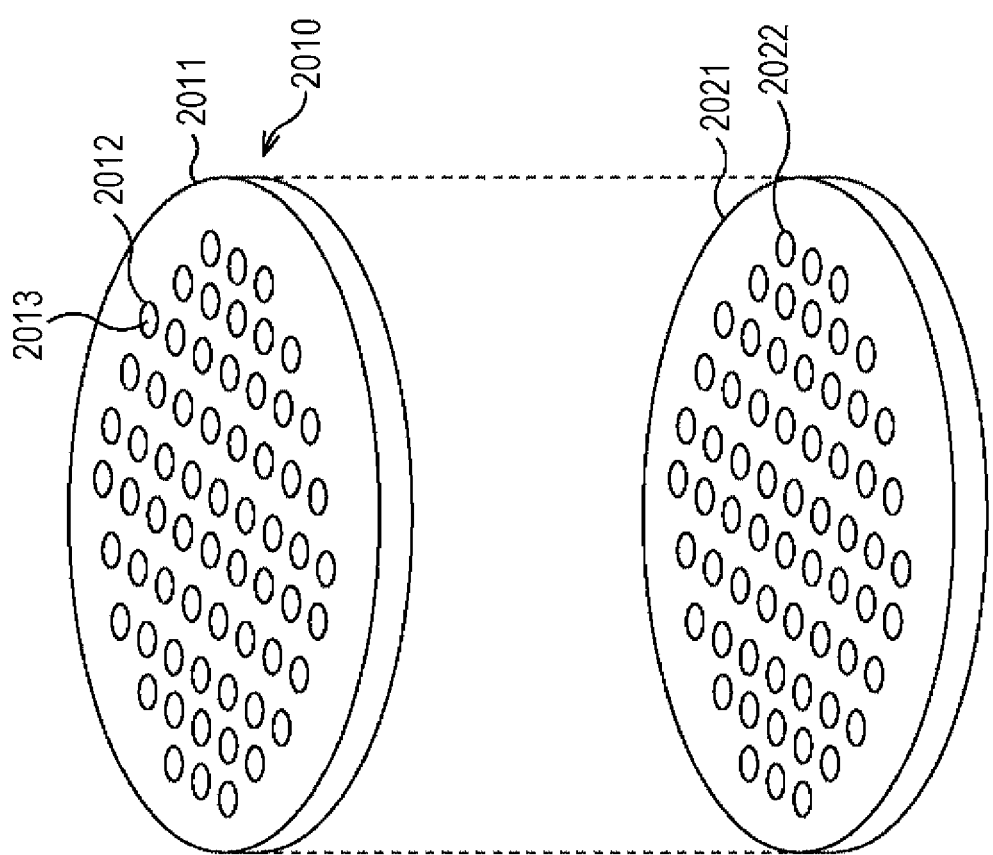
FIG. 55 is a perspective diagram illustrating an example of a non-diced lens-attached substrate and a spacer.

FIG. 55 illustrates an example thereof. The non-diced lens-attached substrate 2010 illustrated in FIG. 55 corresponds to the lens-attached substrate 41W described above in other embodiments. Namely, the lens-attached substrate 2010 is a device similar to the lens-attached substrate 41W, and thus, the description of the above-described lens-attached substrate 41W can also be basically applied to the lens-attached substrate 2010. Therefore, as illustrated in FIG. 55, a plurality of through-holes 2012 are formed in the lens-attached substrate 2010. The through-hole 2012 corresponds to the through-hole 83 described above in other embodiments. A lens resin portion 2013 is formed inside the through-hole 2012. The lens resin portion 2013 corresponds to the lens resin portion 82 described above in other embodiments.

In the lens-attached substrate 2010, a spacer substrate 2021 is stacked and adhered to the lens-attached substrate 2010 so that contamination or damage does not occur in the lens resin portion 2013 due to contact with a manufacturing apparatus or the like. The material of the spacer substrate 2021 is arbitrary. For example, a silicon substrate or a glass substrate may be used, and other materials may be used.

In the case where the lens resin portion 2013 protrudes from the through-hole 2012, the spacer substrate 2021 may be adhered to a surface of the lens-attached substrate 2010 where the lens resin portion 2013 protrudes.

The spacer substrate 2021 has substantially the same size as that of the lens-attached substrate 2010, and thus, the two substrates can be adhered to each other with the outer shapes thereof being aligned with each other. In addition, a hole 2022 is formed at the position corresponding to the through-hole 2012 of the lens-attached substrate 2010. Namely, in the state that the spacer substrate 2021 and the lens-attached substrate 2010 are adhered to each other with the outer shapes thereof being aligned with each other, the hole 2022 is installed at the position of the spacer substrate 2021 which overlaps with the through-hole 2012. The hole 2022 may penetrate the spacer substrate 2021 or may not penetrate the spacer substrate (may not be a through-hole). At least, the hole 2022 is formed to be larger than the through-hole 2012 and is formed to be deeper than the height of a portion of the lens resin portion 2013 which protrudes from the through-hole 2012. Namely, the hole 2022 is formed in such a shape that the lens resin portion 2013 is not in contact with the spacer substrate 2021. In addition, in other words, the spacer substrate 2021 is also formed to be thicker than the height of the portion of the lens resin portion 2013 which protrudes from the through-hole 2012.

Since the spacer substrate 2021 is used during the manufacturing of the lens-attached substrate 2010, the spacer substrate is not included in the completely-manufactured state of the lens-attached substrate 2010. Namely, until the lens-attached substrate 2010 is completely manufactured (or if the lens-attached substrate is completely manufactured, at least before the stacked lens structure is formed), the spacer substrate 2021 is peeled off from the lens-attached substrate 2010.

By adhering the spacer substrate 2021 to the lens-attached substrate 2010, the exposure of the lens resin portion 2013 is suppressed (the lens resin portion is not protruded at least), so that, in the manufacturing process, the transporting period, or the like, it is possible to prevent the lens resin portion 2013 from being in contact with others. Therefore, it is possible to suppress occurrence of contamination or damage to the lens resin portion 2013. In addition, as described above, since the lens resin portion 2013 is not in contact with the spacer substrate 2021, when the spacer substrate 2021 is peeled off from the lens-attached substrate 2010, it is possible to suppress contamination or damage to the lens resin portion 2013.

As a result, it is possible to improve quality of the lens-attached substrate 2010 (the stacked lens structure 11 or the camera module 1 using the lens-attached substrate 2010). In other words, it is possible to suppress a decrease in yield of the lens-attached substrate 2010 (the stacked lens structure 11 or the camera module 1 using the lens-attached substrate 2010).

<Manufacturing of Lens-Attached Substrate>

Figure 56:
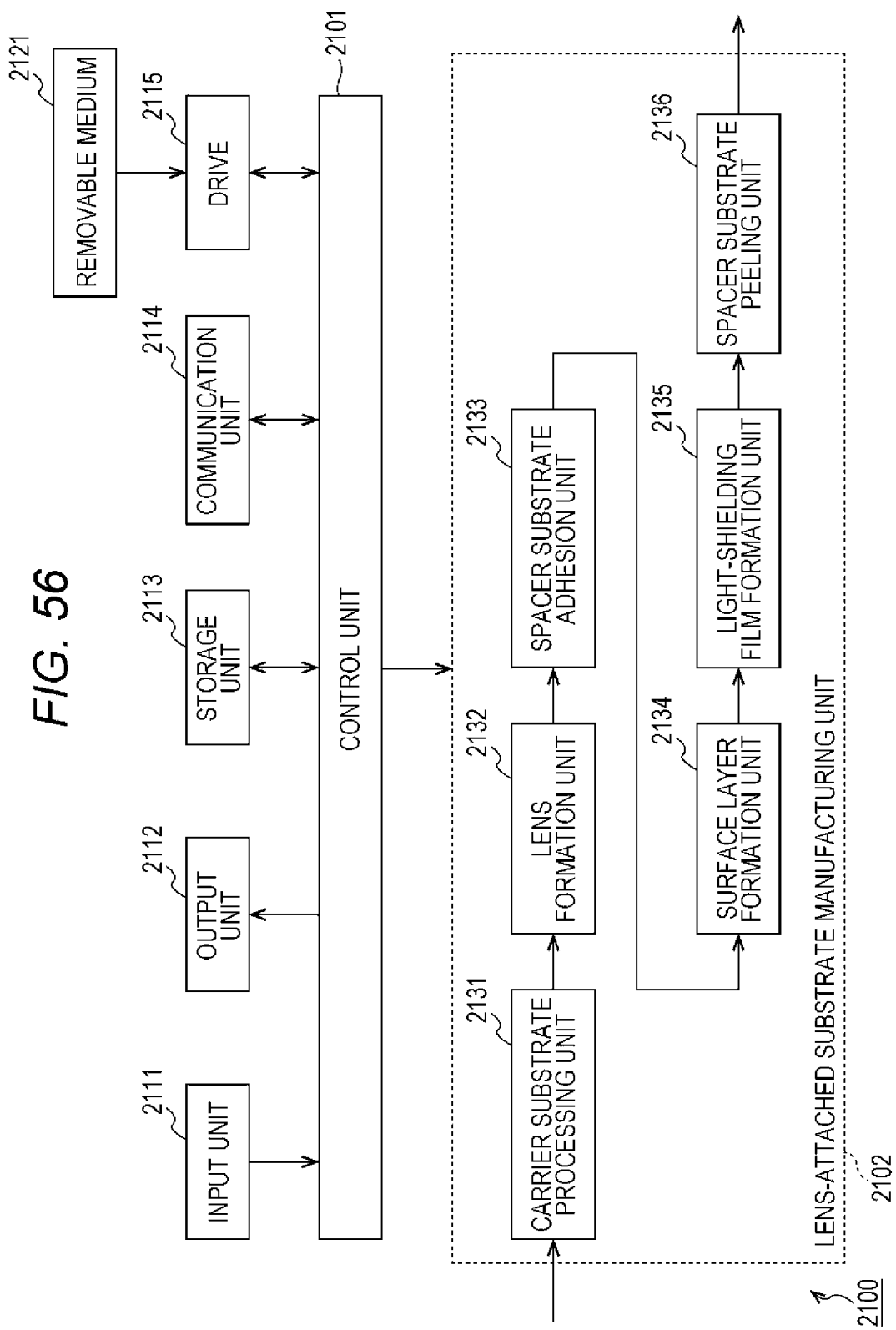
FIG. 56 is a block diagram illustrating an example of a main configuration of a manufacturing apparatus.

Next, the manufacturing of the lens-attached substrate 2010 will be described. FIG. 56 is a block diagram illustrating an example of a main configuration of a manufacturing apparatus manufacturing a lens-attached substrate as an embodiment of a manufacturing apparatus employing the present technology. The manufacturing apparatus 2100 illustrated in FIG. 56 is configured to include a control unit 2101 and a lens-attached substrate manufacturing unit 2102.

The control unit 2101 is configured to include, for example, a CPU (central processing unit), a ROM (read only memory), a RAM (random access memory), and the like to control components of the lens-attached substrate manufacturing unit 2102 to perform a control process relating to the manufacturing of the lens-attached substrate. For example, the CPU of the control unit 2101 executes various processes according to programs stored in the ROM. In addition, the CPU executes various processes according to programs loaded on the RAM from the storage unit 2113. The RAM appropriately stores data or the like used by the CPU in execution of various processes.

The lens-attached substrate manufacturing unit 2102 is controlled by the control unit 2101 to perform a process relating to the manufacturing of the lens-attached substrate. The lens-attached substrate manufacturing unit 2102 is configured to include a carrier substrate processing unit 2131, a lens formation unit 2132, a spacer substrate adhesion unit 2133, a surface layer formation unit 2134, a light-shielding film formation unit 2135, and a spacer substrate peeling unit 2136.

The carrier substrate processing unit 2131 performs a process relating to the processing of the carrier substrate 2040. The lens formation unit 2132 performs a process relating to the formation of the lens resin portion 2042. The spacer substrate adhesion unit 2133 performs a process relating to the adhesion between the lens-attached substrate 2010 and the spacer substrate 2021. The surface layer formation unit 2134 performs a process relating to the layer formation of the upper surface layer 122 or the lower surface layer 123 (or the lower surface layer 124). The light-shielding film formation unit 2135 performs a process relating to the film formation of the light-shielding film 121. Theses processing units are controlled by the control unit 2101 to perform the respective processes.

In addition, the manufacturing apparatus 2100 is configured to include an input unit 2111, an output unit 2112, a storage unit 2113, a communication unit 2114, and a drive 2115.

The input unit 2111 is configured with, for example, a keyboard, a mouse, a touch panel, an external input terminal, or the like to receive user's instruction or an input of information from the outside and to supply the instruction or the input to the control unit 2101. The output unit 2112 is configured with, for example, a display such as a CRT (cathode ray tube) display or an LCD (liquid crystal display), a speaker, or an external output terminal, or the like to output various types of information supplied from the control unit 2101 as image, sound, an analog signal, or digital data.

The storage unit 2113 is configured to include an arbitrary storage medium such as a flash memory, an SSD (solid state drive), or a hard disk to store information supplied from the control unit 2101 or to read or supply the stored information according to a request from the control unit 2101. The communication unit 2114 is configured with, for example, an interface, a modem, or the like for a wired LAN (local area network) or a wireless LAN to perform communication with external apparatuses via a network including the Internet. For example, the communication unit 2114 transmits information supplied from the control unit 2101 to a communication counter party or supplies information received from the communication counter party to the control unit 2101.

The drive 2115 is connected to the control unit 401 if necessary. In addition, for example, the removable medium 2121 such as a magnetic disk, an optical disk, an opto-magnetic disk, or a semiconductor memory is appropriately mounted in the drive 2115. In addition, a computer program read from the removable medium 2121 through the drive 2115 is installed in the storage unit 2113 if necessary.

The manufacturing apparatus 2100 having the above-described configuration performs the lens-attached substrate manufacturing process to manufacture the lens-attached substrate. An example of a flow of the lens-attached substrate manufacturing process will be described with reference to the flowchart of FIG. 57. If necessary, the flow will be described with reference to FIGS. 58A to 58D.

When the lens-attached substrate manufacturing process is started, in step S2001, the carrier substrate processing unit 2131 forms the through-hole 2012 in the non-diced carrier substrate 2011.

The processes of steps S2002 to S2006 for lens formation are performed by a method basically similar to the method described above with reference to FIGS. 23A to 23G in "10. Manufacturing Method of Lens-Attached Substrate".

In step S2002, the lens formation unit 2132 arranges the carrier substrate 2011 on the lower mold frame 181. In step S2003, the lens formation unit 2132 fills the through-hole 2012 formed in the carrier substrate 2011 with, for example, energy curable resin 191 as the material of the lens resin portion 2013. In step S2004, the lens formation unit 2132 arranges the upper mold frame 201 on the carrier substrate 2011. In step S2005, the lens formation unit 2132 performs the curing process on the energy curable resin 191. In step S2006, the lens formation unit 2132 demolds the upper mold frame 201 and the lower mold frame 181 from the carrier substrate 2011.

Figure 58:
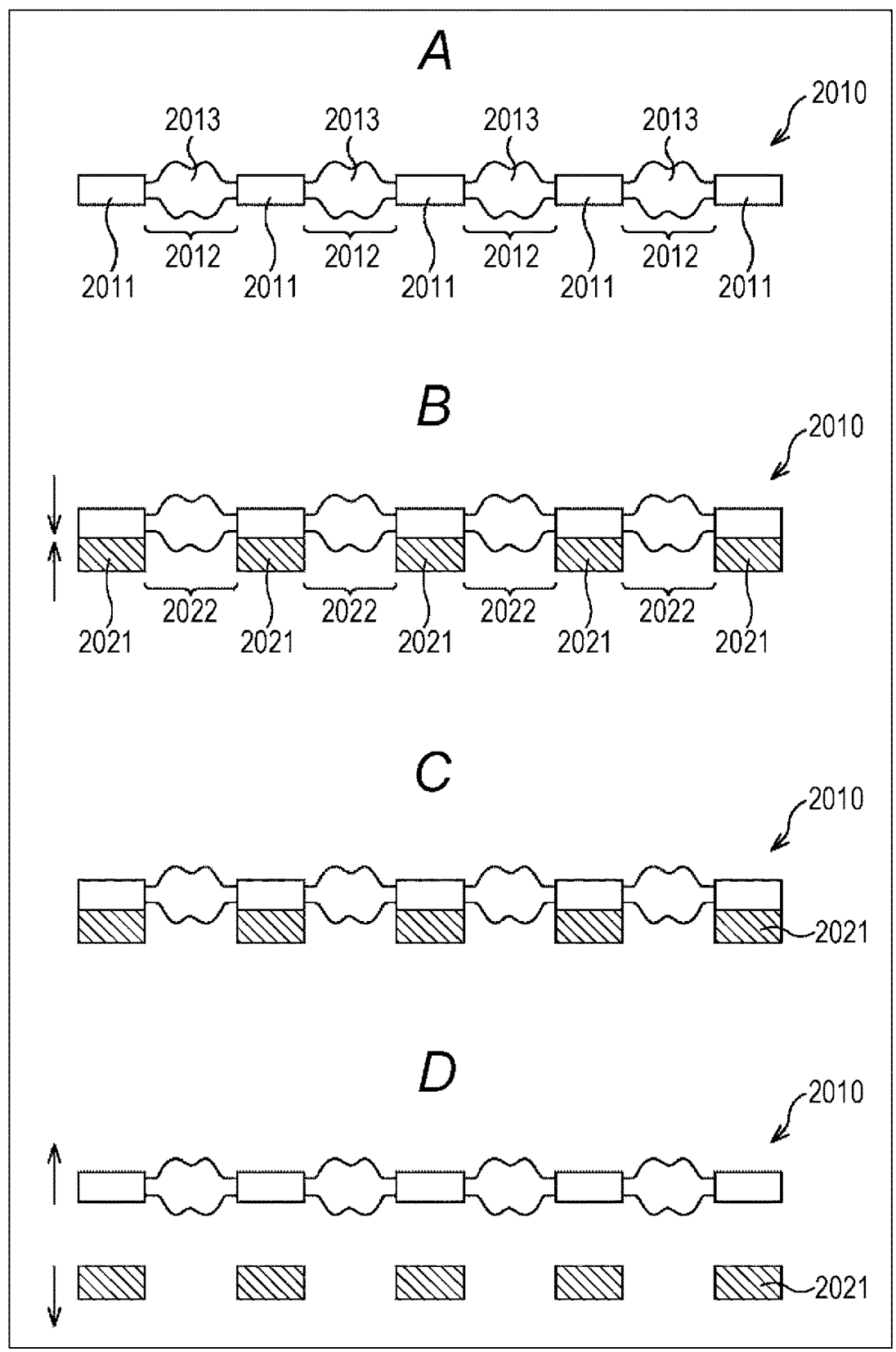
FIG. 58 is a cross-sectional diagram for explaining an example of a state of a manufactured lens-attached substrate.

By doing so, as illustrated in FIG. 58A, the lens resin portion 2013 is formed inside the through-hole 2012 of the carrier substrate 2011.

In step S2007, as illustrated in FIG. 58B, the spacer substrate adhesion unit 2133 adheres the spacer substrate 2021 to the carrier substrate 2011 (lens-attached substrate 2010) where the through-hole 2012 and the lens resin portion 2013 are formed as described above. As illustrated in FIG. 58B, the hole 2022 is formed at the position of the spacer substrate 2021 corresponding to the through-hole 2012 of the carrier substrate 2011. Therefore, even in the case where the lens resin portion 2013 protrudes from the carrier substrate 2011, the spacer substrate 2021 can be adhered to the carrier substrate 2011 without being in contact with the lens resin portion 2013.

The spacer substrate adhesion unit 2133 can adhere the carrier substrate 2011 and the spacer substrate 2021 so that the carrier substrate and the spacer substrate are not deviated from the stated state as illustrated in FIG. 58C.

The adhering method for the spacer substrate 2021 is arbitrary. For example, the carrier substrate 2011 and the spacer substrate 2021 may be joined by using plasma joining. By doing so as described heretofore, it is possible to suppress deviation of the carrier substrate 2011 and the spacer substrate 2021 in the transporting period or the like. In addition, it is possible to easily perform the peeling of the spacer substrate 2021 which is to be subsequently performed.

In addition, the carrier substrate 2011 and the spacer substrate 2021 may be adhered to each other, for example, by using an adhesive. By doing so as described heretofore, it is possible to suppress deviation of the carrier substrate 2011 and the spacer substrate 2021 in the transporting period or the like. However, it is preferable that the adhesive is used so as not to remain in the carrier substrate 2011 after the peeling of the spacer substrate 2021. For example, by using an adhesive of which adhesive force is decreased by UV light, heat, or the like, it is possible to more easily perform the peeling of the spacer substrate 2021.

In addition, other methods may be used. For example, the carrier substrate 2011 may be merely mounted on the spacer substrate 2021. In the case where a degree of smoothness of the joined plane between the carrier substrate 2011 and the spacer substrate 2021 is sufficiently good, only by mounting (without using plasma joining or an adhesive), in some cases, it is possible to sufficiently suppress deviation of the carrier substrate 2011 and the spacer substrate 2021 in the transporting period or the like.

The following processes are performed in the state that the spacer substrate 2021 are adhered to the carrier substrate 2011 (state of FIG. 58C).

In step S2008, the surface layer formation unit 2134 forms an upper surface layer 122 (or upper surface layer 125) on the light-incidence-side surfaces of the carrier substrate 2011 and the lens resin portion 2013 and forms a lower surface layer 123 (or lower surface layer 124) on the light-emitting-side surfaces.

In step S2009, in case of manufacturing the lens-attached substrate 2010 which is to be stacked closest to the light incidence side in the stacked lens structure 11, the light-shielding film formation unit 2135 forms the light-shielding film 121 on the light-incidence-side surface of the carrying portion 92 of the lens resin portion 2013. In case of manufacturing the lens-attached substrate 2010 used as other layers of the stacked lens structure 11, the light-shielding film formation unit 2135 omits this process.

If the lens-attached substrate 2010 is manufactured in this manner, in step S2010, as illustrated in FIG. 58D, the spacer substrate peeling unit 2136 peels off the spacer substrate 2021 from the carrier substrate 2011.

If the process of step S2010 is ended, the lens-attached substrate manufacturing process is ended. By dicing the lens-attached substrate manufactured in this manner, the diced lens-attached substrates are manufactured.

In this manner, the lens-attached substrate 2010 is manufactured by using the spacer substrate 2021, so that, as described above, it is possible to improve quality of the lens-attached substrate 2010, and it is possible to suppress a decrease in yield of the lens-attached substrate 2010.

In addition, heretofore, although the example where the spacer substrate 2021 is adhered to the carrier substrate 2011 after the formation of the lens resin portion 2013 is described, the timing of adhesion between the spacer substrate 2021 and the carrier substrate 2011 is arbitrary, and the timing is not limited to this example. For example, the spacer substrate 2021 may be adhered to the carrier substrate 2011 before the lens resin portion 2013 is formed. Namely, in the flowchart of FIG. 57, the process of step S2007 may be performed at an arbitrary timing before the process of step S2006. For example, the adhering may be performed before the process of step S2002 or may be performed before the process of step S2001.

In addition, the shape of the spacer substrate 2021 is arbitrary. The shape may be substantially the same as that of the carrier substrate 2011 or may be different from that of the carrier substrate 2011.

Figure 59:
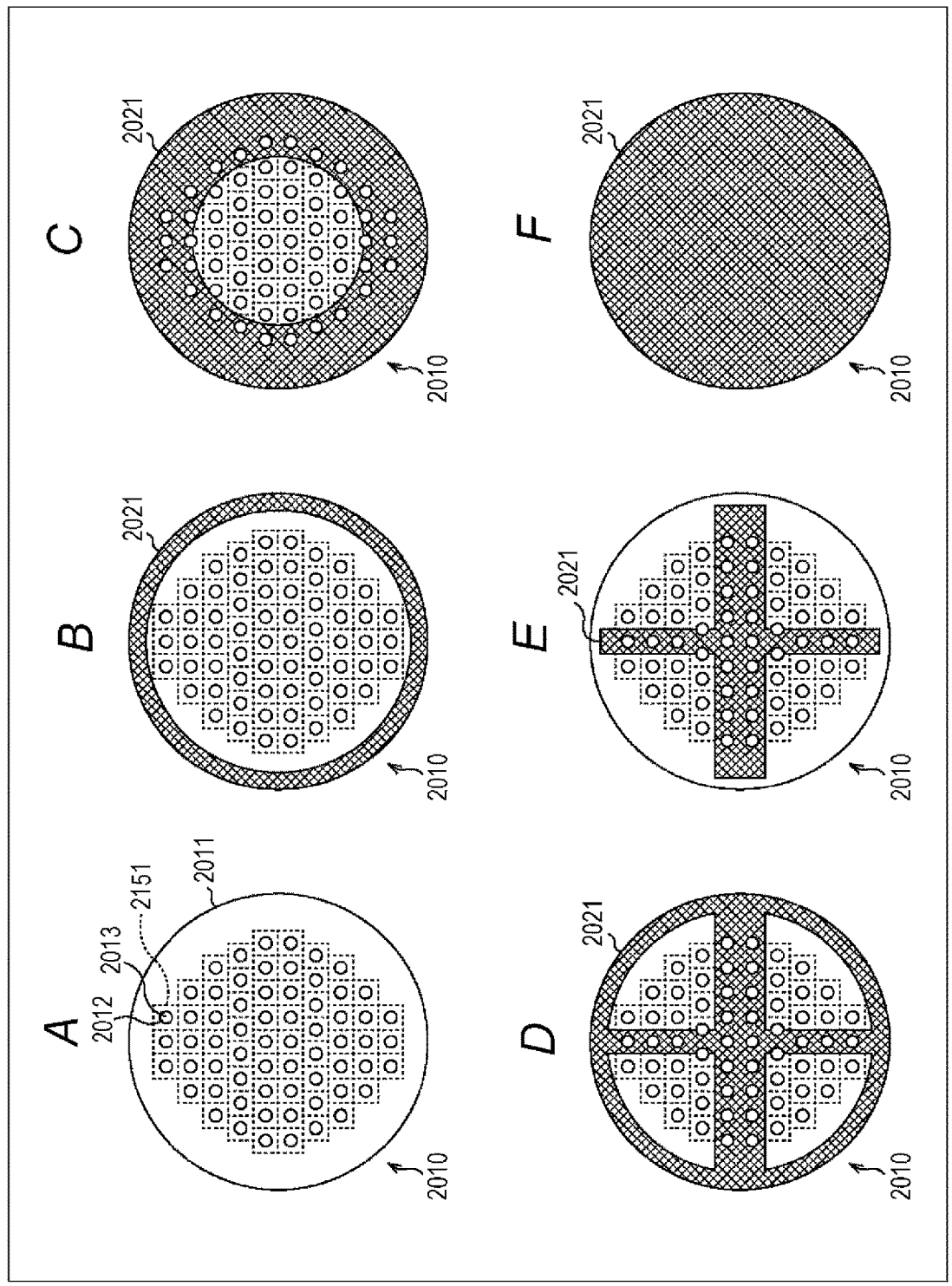
FIG. 59 is a diagram for explaining an example of a spacer.

For example, the shape of the lens-attached substrate 2010 (carrier substrate 2011) is assumed to be a shape illustrated in FIG. 59A. In the carrier substrate 2011, a plurality of the through-holes 2012 are formed, and the lens resin portions 2013 are formed in the respective through-holes. Namely, a plurality of diced lens-attached substrates 2151 are obtained from the lens-attached substrate 2010.

The spacer substrate 2021 may or may not be stacked on the lens-attached substrate 2151.

For example, as illustrated in FIG. 59B, the spacer substrate 2021 may have a shape so as to be stacked on the peripheral portion of the carrier substrate 2011 where the diced lens-attached substrate 2151 is not formed. In addition, for example, the spacer substrate 2021 may be stacked on some portion of the lens-attached substrate 2151. For example, as illustrated in FIG. 59C, the spacer substrate 2021 may be stacked on only some portion of the outer side of the lens-attached substrate 2151 formed in the carrier substrate 2011. In addition, for example, as illustrated in FIG. 59D, like the example of FIG. 59B, the spacer substrate 2021 may be stacked on the peripheral portion of the carrier substrate 2011 and the cross-shaped area passing through the central portion of the carrier substrate 2011. In addition, for example, as illustrated in FIG. 59E, the spacer substrate may not be stacked in the peripheral portion of the carrier substrate 2011.

In addition, like the example of FIG. 59F, the hole 2022 of the spacer substrate 2021 may not penetrate the substrate. By doing so as described heretofore, since a degree of exposure of the lens resin portion 2013 can be further decreased, it is possible to further suppress the occurrence of contamination or damage to the lens resin portion 2013.

In addition, the spacer substrate 2021 may also be larger than the carrier substrate 2011. For example, a plurality of the carrier substrate 2011 may be adhered to one spacer substrate 2021. In this manner, in the case where the spacer substrate 2021 is larger than the carrier substrate 2011, the position where the carrier substrate 2011 is to be adhered to the spacer substrate 2021 may be set in advance.

In addition, heretofore, although the case where one spacer substrate 2021 is adhered to the lens-attached substrate 2010 (carrier substrate 2011) is described, a plurality of the spacer substrates 2021 may be adhered to one lens-attached substrate 2010 (carrier substrate 2011).

Figure 60:
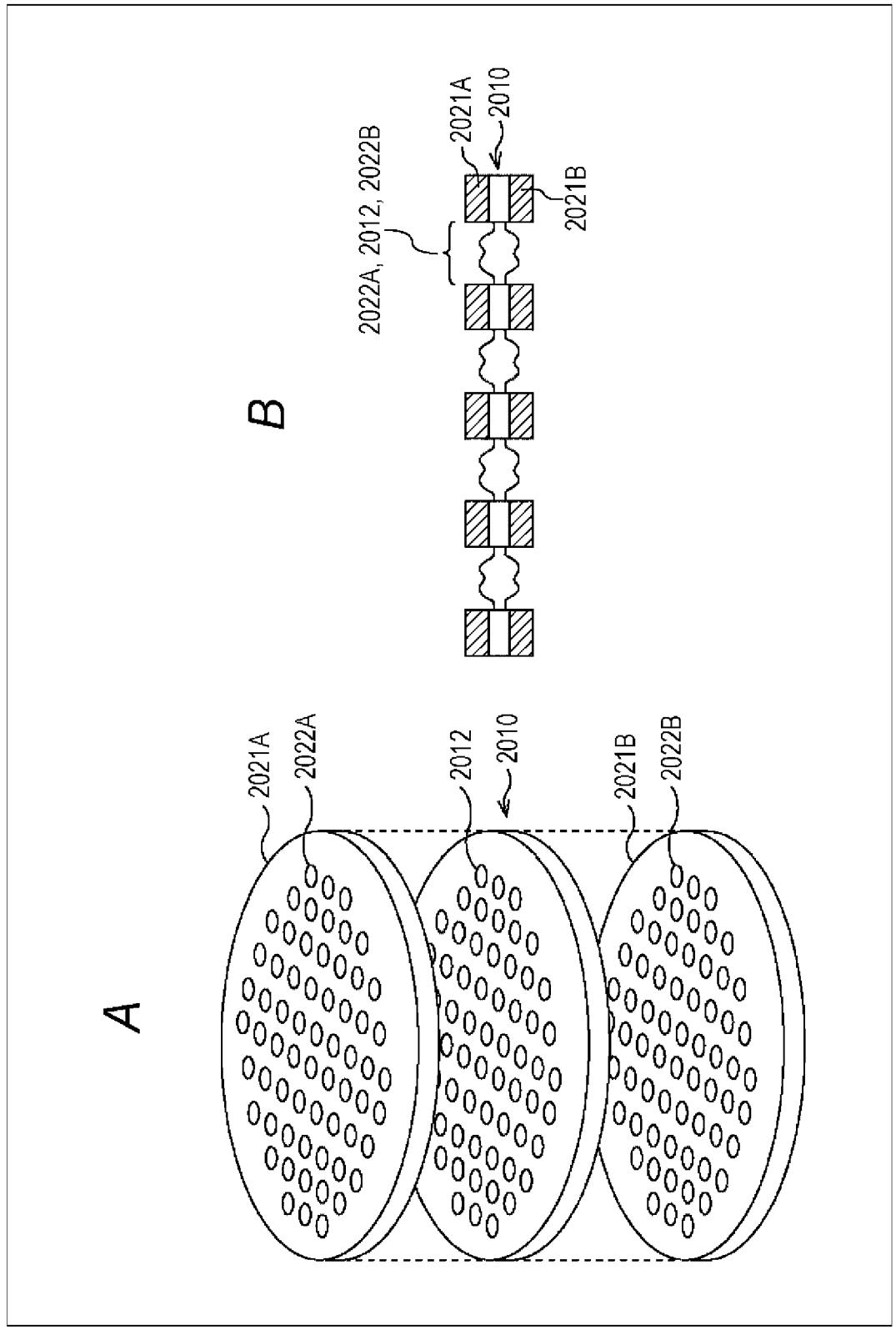
FIG. 60 is a diagram for explaining an example of a spacer.

For example, like the example of FIGS. 60A and 60B, the spacer substrates 2021 may be adhered to the two surfaces of the lens-attached substrate 2010 (carrier substrate 2011) (spacer substrate 2021A and the spacer substrate 2021B). FIG. 60A is a perspective diagram illustrating an example of main configurations of each substrate, and FIG. 60B is a cross-sectional diagram. As illustrated in FIGS. 60A and 60B, in this case, similarly to the above-described example, the holes 2022 (hole 2022A and hole 2022B) may be formed at the positions corresponding to the through-holes 2012 of the spacer substrate 2021A and the spacer substrate 2021B.

In this manner, by adhering the spacer substrates 2021 to the two surfaces of the lens-attached substrate 2010 (carrier substrate 2011), a degree of exposure of the lens resin portion 2013 is decreased, so that it is possible to further suppress the occurrence of contamination or damage to the lens resin portion 2013. Particularly, in the case where the lens resin portions 2013 are protruded from the two surfaces of the carrier substrate 2011, in this manner, by adhering the spacer substrates 2021 to the two surfaces of the lens-attached substrate 2010 (carrier substrate 2011), the exposure of the lens resin portions 2013 of the two surfaces is suppressed, so that it is possible to further suppress the occurrence of contamination or damage to the lens resin portion 2013.

<Manufacturing of Stacked Lens Structure>

Figure 61:
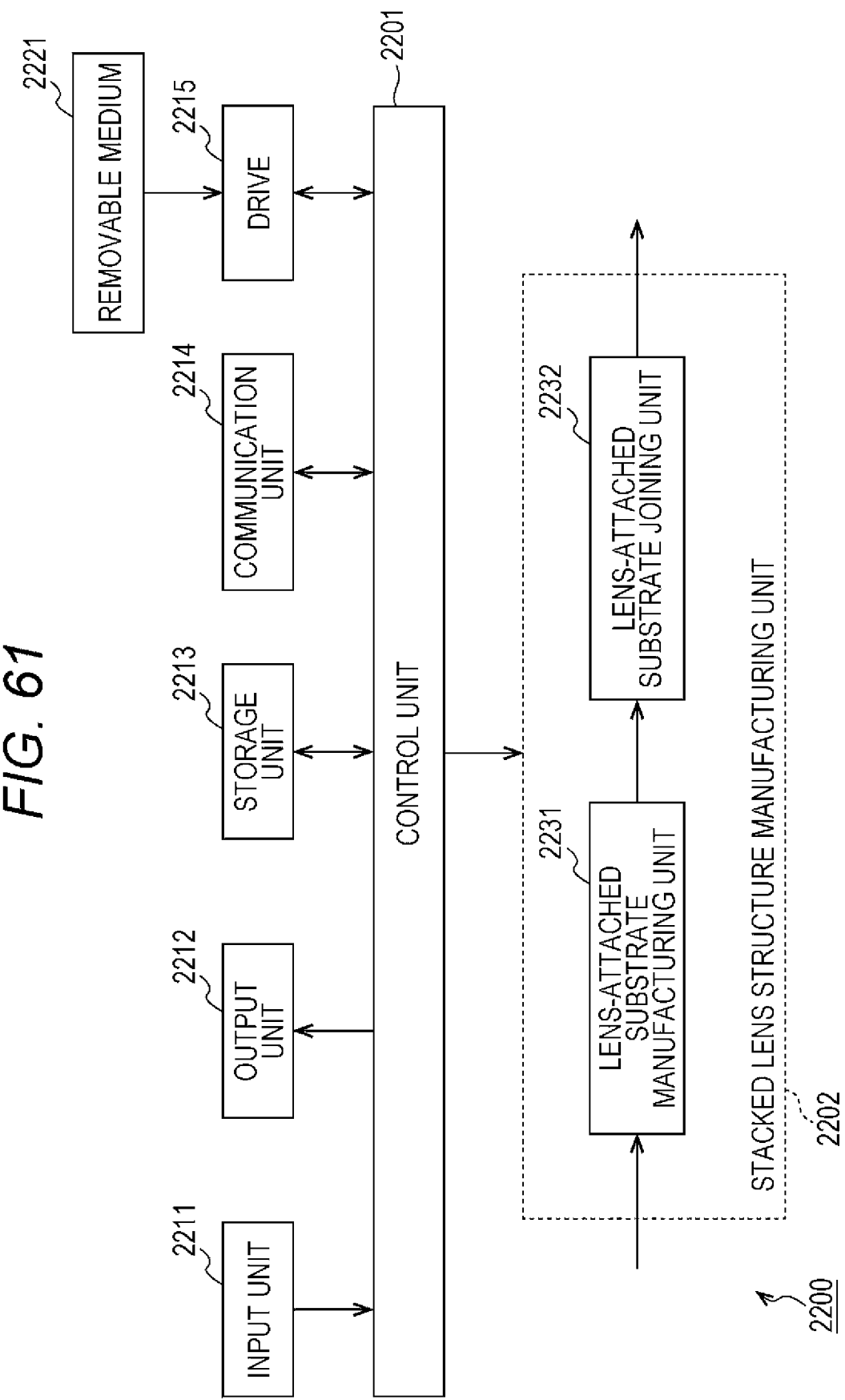
FIG. 61 is a block diagram illustrating an example of a main configuration of a manufacturing apparatus.

Next, the manufacturing of the stacked lens structure 11W configured with a plurality of the lens-attached substrates 2010 including the above-described lens-attached substrates 2010 will be described. FIG. 61 is a block diagram illustrating an example of a main configuration of a manufacturing apparatus manufacturing a stacked lens structure as an embodiment of a manufacturing apparatus employing the present technology. The manufacturing apparatus 2200 illustrated in FIG. 61 is configured to include a control unit 2201 and a stacked lens structure manufacturing unit 2202.

The control unit 2201 is configured to include, for example, a CPU, a ROM, a RAM, and the like to control components of the stacked lens structure manufacturing unit 2202 to perform a control process relating to the manufacturing of the stacked lens structure. For example, the CPU of the control unit 2201 executes various processes according to programs stored in the ROM. In addition, the CPU executes various processes according to programs loaded on the RAM from the storage unit 2213. The RAM appropriately stores data or the like used by the CPU in execution of various processes.

The stacked lens structure manufacturing unit 2202 is controlled by the control unit 2201 to perform the process relating to the manufacturing of the stacked lens structure 11W. The stacked lens structure manufacturing unit 2202 is configured to include a lens-attached substrate manufacturing unit 2231 and a lens-attached substrate joining unit 2232.

The lens-attached substrate manufacturing unit 2231 performs a process relating to the manufacturing of the lens-attached substrate. The lens-attached substrate manufacturing unit 2231 has the same function as that of the lens-attached substrate manufacturing unit 2102 (FIG. 56) of the manufacturing apparatus 2100. Namely, the lens-attached substrate manufacturing unit 2231 is configured to include the processing units of the carrier substrate processing unit 2131 to the spacer substrate peeling unit 2136 to perform the same processes as those of the lens-attached substrate manufacturing unit 2102.

The lens-attached substrate joining unit 2232 performs a process relating to the adhesion of the lens-attached substrates. The lens-attached substrate manufacturing unit 2231 and the lens-attached substrate joining unit 2232 are controlled by the control unit 2201 to perform the respective processes.

In addition, the manufacturing apparatus 2200 is configured to include an input unit 2211, an output unit 2212, a storage unit 2213, a communication unit 2214, and a drive 2215. A removable medium 2221 is appropriately mounted on the drive 2215. The input units 2211 to the drive 2215 are the same processing units as the input unit 2111 to the drive 2115 in the manufacturing apparatus 2100 of FIG. 63 and have the same functions as those thereof. In addition, the removable medium 2221 is the same recording medium as the removable medium 2121 and a computer program or the like is recorded.

Figure 62:
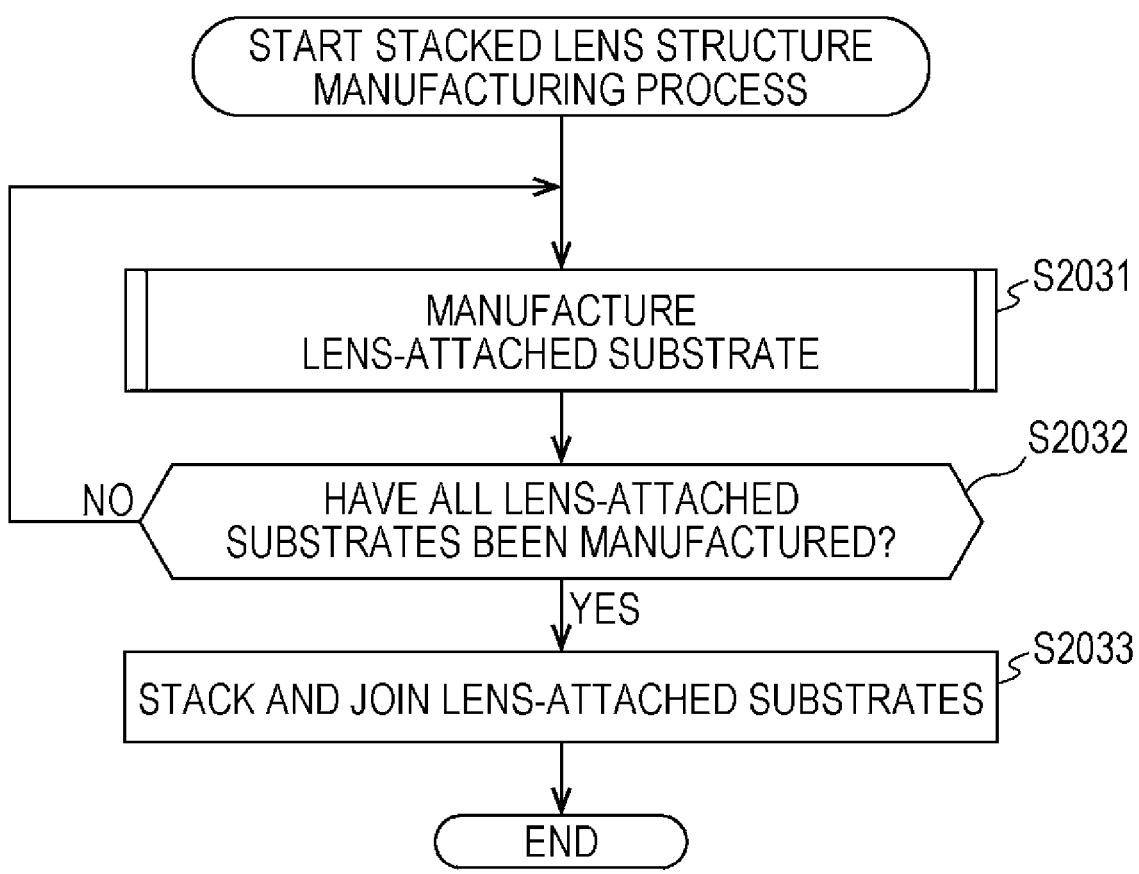
FIG. 62 is a flowchart illustrating an example of a procedure of a stacked lens structure manufacturing process.

The manufacturing apparatus 2200 having the above-described configuration performs the stacked lens structure manufacturing process to manufacture the stacked lens structure 11W. An example of a flow of the stacked lens structure manufacturing process will be described with reference to the flowchart of FIG. 62.

Figure 57:
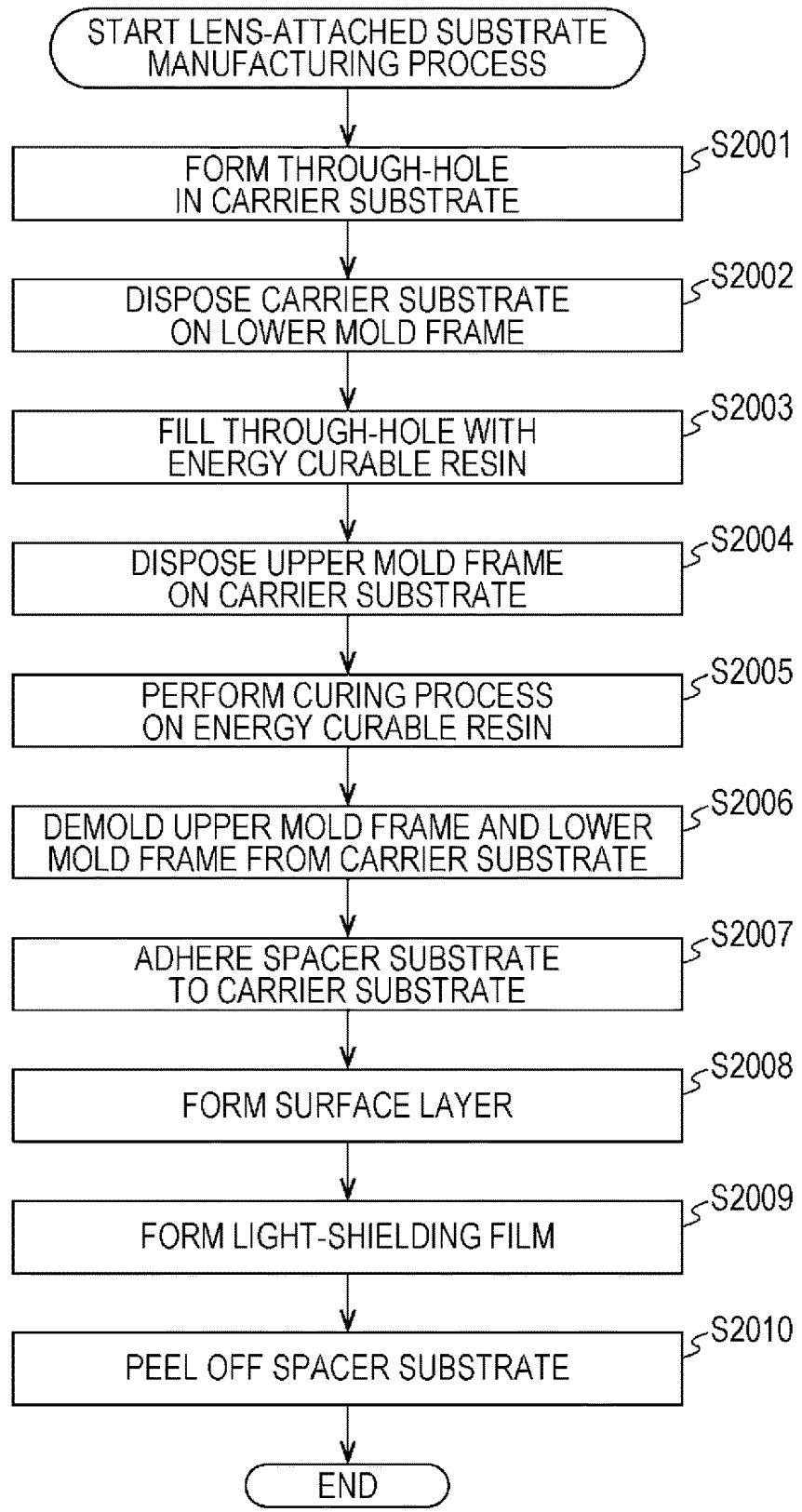
FIG. 57 is a flowchart illustrating an example of a procedure of a lens-attached substrate manufacturing process.

When the stacked lens structure manufacturing process is started, in step S2031, the lens-attached substrate manufacturing unit 2231 manufactures the lens-attached substrate 2010 as described above. In the step S2032, the lens-attached substrate manufacturing unit 2231 determines whether or not all the lens-attached substrates 2010 constituting the stacked lens structure 11W are manufactured and repeatedly performs the process of step S2031 until all the lens-attached substrates 2010 are manufactured. Namely, the lens-attached substrate manufacturing unit 2231 manufactures all the lens-attached substrate 2010 constituting the stacked lens structure 11W by repeatedly performing the lens-attached substrate manufacturing process (FIG. 57).

If all the lens-attached substrates 2010 are manufactured, the process proceeds to step S2033. In step S2033, the lens-attached substrate joining unit 2232 stacks and adheres the lens-attached substrates 2010 manufactured by the lens-attached substrate manufacturing unit 2231. The adhering method is arbitrary. For example, the lens-attached substrate joining unit 2232 may be allowed to join the lens-attached substrates 2010 by plasma join or may be allowed to adhere the lens-attached substrates 2010 by using an adhesive.

In addition, the manufacturing apparatus 2100 may be allowed not to peel off the spacer substrate 2021 from the lens-attached substrate 2010, and at the time of stacking the lens-attached substrate 2010, the manufacturing apparatus 2200 may be allowed to peel off the spacer substrate 2021 from the lens-attached substrate 2010.

If the process of step S2033 is ended, the stacked lens structure manufacturing process is ended. By dicing the stacked lens structure manufactured described heretofore, the stacked lens structure 11 is manufactured.

By manufacturing the stacked lens structure 11W as described heretofore, it is possible to manufacture the stacked lens structure 11 capable of obtaining the same effects as those of the above-described lens-attached substrate 2010.

<Manufacturing of Camera Module>

Figure 63:
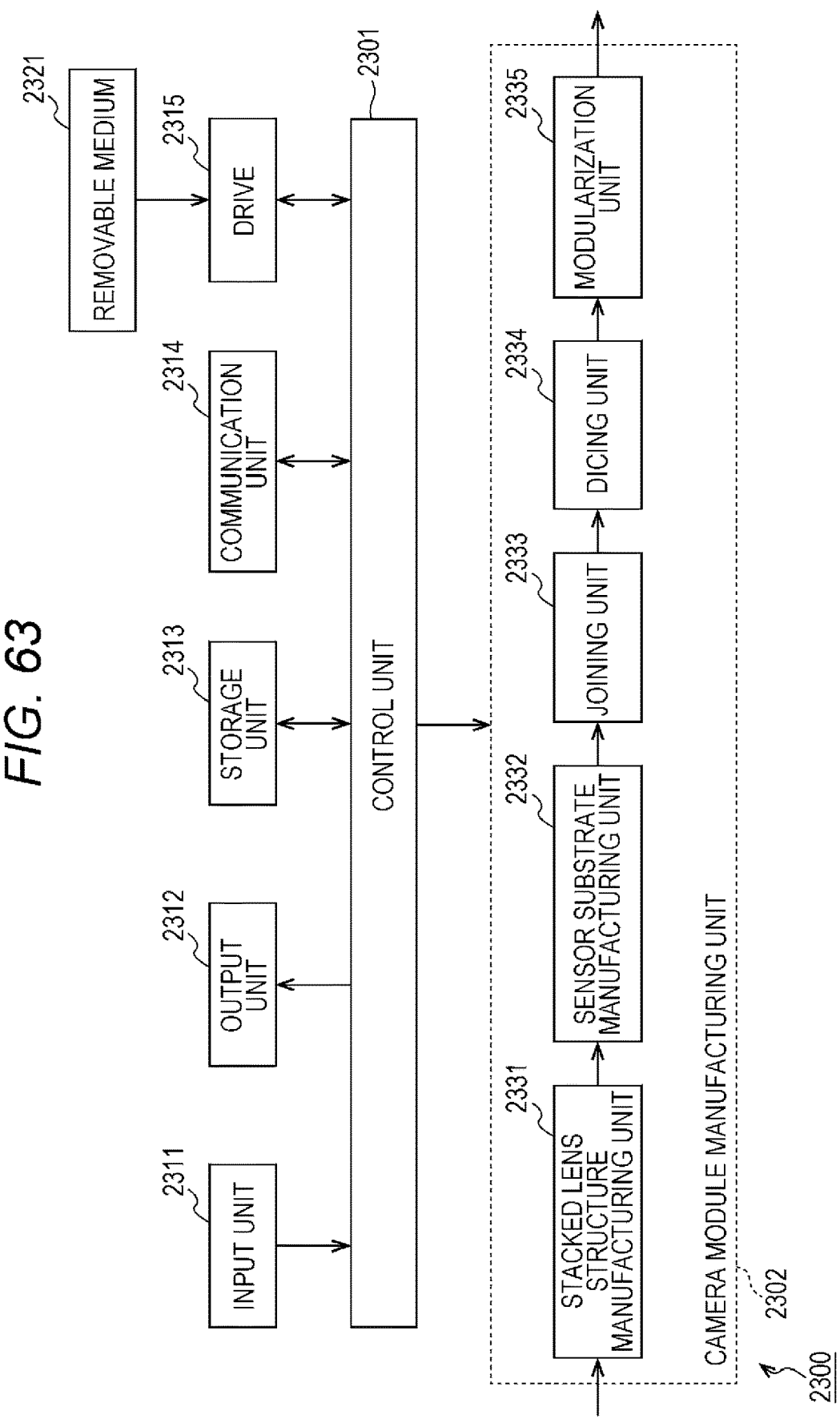
FIG. 63 is a block diagram illustrating an example of a main configuration of a manufacturing apparatus.

Next, the manufacturing of the above-described camera module 1 will be described. FIG. 63 is a block diagram illustrating an example of a main configuration of a manufacturing apparatus manufacturing a camera module 1 as an embodiment of a manufacturing apparatus employing the present technology. The manufacturing apparatus 2300 illustrated in FIG. 63 is configured to include a control unit 2301 and a camera module manufacturing unit 2302.

The control unit 2301 is configured to include, for example, a CPU, a ROM, a RAM, and the like to control components of the camera module manufacturing unit 2302 to perform a control process relating to the manufacturing of the camera module 1. For example, the CPU of the control unit 2301 executes various processes according to programs stored in the ROM. In addition, the CPU executes various processes according to programs loaded on the RAM from the storage unit 2313. The RAM appropriately stores data or the like used by the CPU in execution of various processes.

The camera module manufacturing unit 2302 is controlled by the control unit 2301 to perform a process relating to the manufacturing of the camera module 1. The camera module manufacturing unit 2302 is configured to include a stacked lens structure manufacturing unit 2331, a sensor substrate manufacturing unit 2332, a joining unit 2333, a dicing unit 2334, and a modularization unit 2335.

The stacked lens structure manufacturing unit 2331 performs a process relating to the manufacturing of the stacked lens structure. The stacked lens structure manufacturing unit 2331 has the same function as that of the stacked lens structure manufacturing unit 2202 (FIG. 61) of the manufacturing apparatus 2200. Namely, the stacked lens structure manufacturing unit 2331 is configured to include the lens-attached substrate manufacturing unit 2231 and the lens-attached substrate joining unit 2232 to perform the same processes as those of the stacked lens structure manufacturing unit 2202.

The sensor substrate manufacturing unit 2332 performs a process relating to the manufacturing of the sensor substrate 43W. The joining unit 2333 performs a process relating to the adhesion of the stacked lens structure 11W and the sensor substrate 43W. The dicing unit 2334 performs a process relating to dicing of the stacked substrates obtained by adhering the stacked lens structure 11W and the sensor substrate 43W. The modularization unit 2335 performs a process relating to the modularization of the diced stacked substrate. These processing units are controlled by the control unit 2301 to perform the respective processes.

In addition, the manufacturing apparatus 2300 is configured to include an input unit 2311, an output unit 2312, a storage unit 2313, a communication unit 2314, and a drive 2315. A removable medium 2321 is appropriately mounted on the drive 2315. The input units 2311 to the drive 2315 are the same processing units as the input unit 2111 to the drive 2115 in the manufacturing apparatus 2100 of FIG. 63 and have the same functions as those thereof. In addition, the removable medium 2321 is the same recording medium as the removable medium 2121 and a computer program or the like is recorded.

Figure 64:
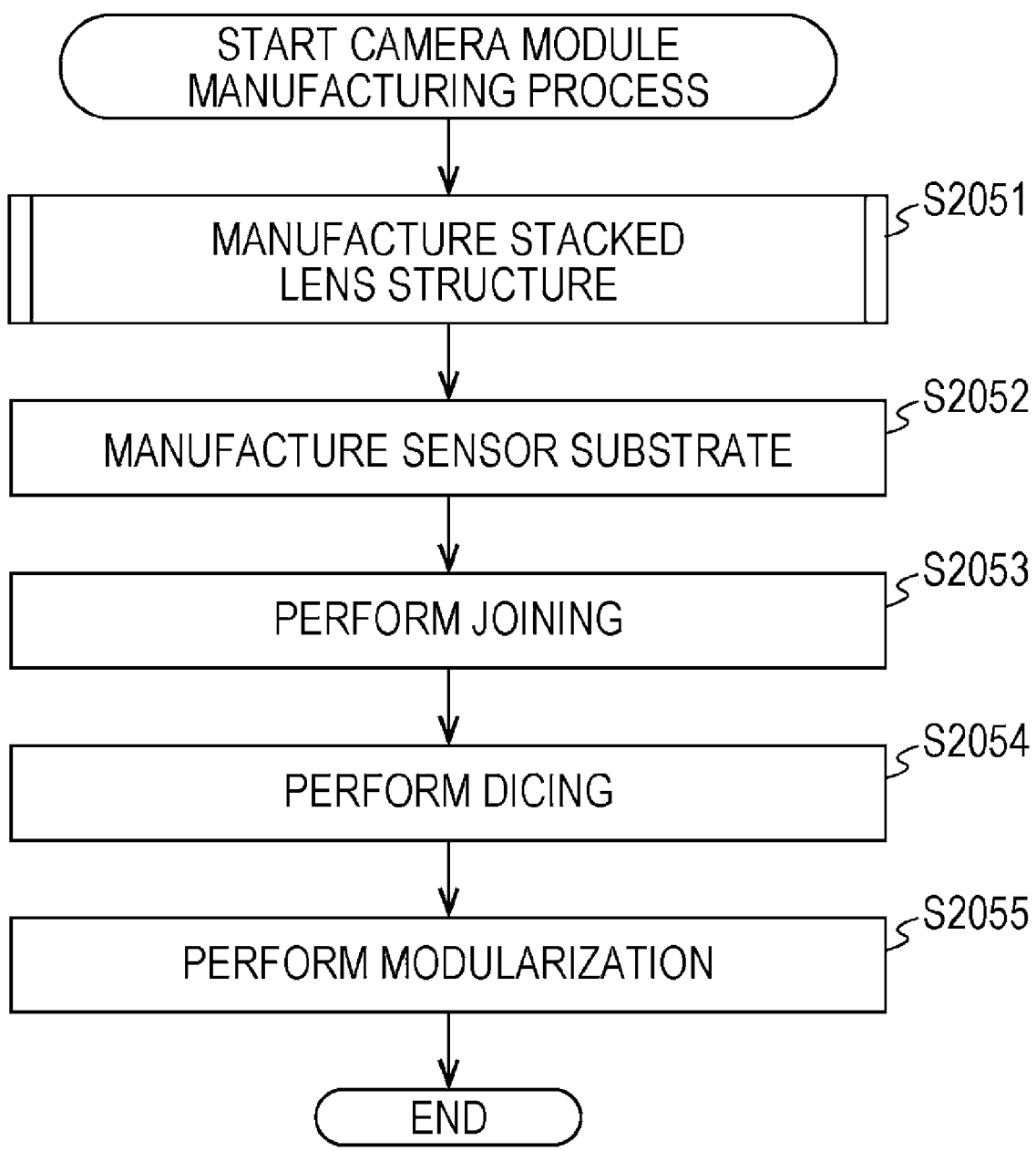
FIG. 64 is a flowchart illustrating an example of a procedure of a camera module manufacturing process.

The manufacturing apparatus 2300 having the above-described configuration performs the camera module manufacturing process to manufacture the camera module 1. An example of a flow of the camera module manufacturing process will be described with reference to the flowchart of FIG. 64.

When the camera module manufacturing process is started, in step S2051, the stacked lens structure manufacturing unit 2331 manufactures the stacked lens structure 11W as described above. In step S2052, the sensor substrate manufacturing unit 2332 manufactures the sensor substrate 43W where a sensor such as a light-receiving device or the like is to be formed. For example, the configuration of the sensor substrate 43W such as an optical sensor formed in the sensor substrate 43W is arbitrary. In addition, the manufacturing method for the sensor substrate 43W is also arbitrary.

In step S2053, the joining unit 2333 adheres the manufactured stacked lens structure and the manufactured sensor substrate 43W. The adhering method is arbitrary. For example, the joining unit 2333 may join the stacked lens structure and the sensor substrate 43W by plasma joining or may adhere the stacked lens structure and the sensor substrate 43W by using an adhesive.

In step S2054, the dicing unit 2334 dices the stacked substrate where the stacked lens structure and the sensor substrate 43W are stacked and adhered to each other.

In step S2055, the modularization unit 2335 modulates the diced stacked substrate, for example, by providing the aperture stop plate 51, the lens barrel 74, or the like to the diced stacked substrate, so that the camera module 1 is generated. The processes performed in the modularization are arbitrary.

If the process of step S2055 is ended, the camera module manufacturing process is ended.

By manufacturing the camera module 1 as described heretofore, it is possible to manufacture the camera module capable of obtaining the effects of the above-described lens-attached substrate 2010.

17. Other Embodiment 2

<Wafer-Level Lens>

Therefore, the molding of the lens resin portion 2013 will be described. As described above, the lens formation unit 2132 (FIG. 56) molds the lens resin portion 2013 by using the upper mold frame or the lower mold frame. However, in this case, in the demolding period, load is exerted on the interface between the carrier substrate 2011 and the lens resin portion 2013, there has been a problem in that the lens is peeled off.

Figure 65:
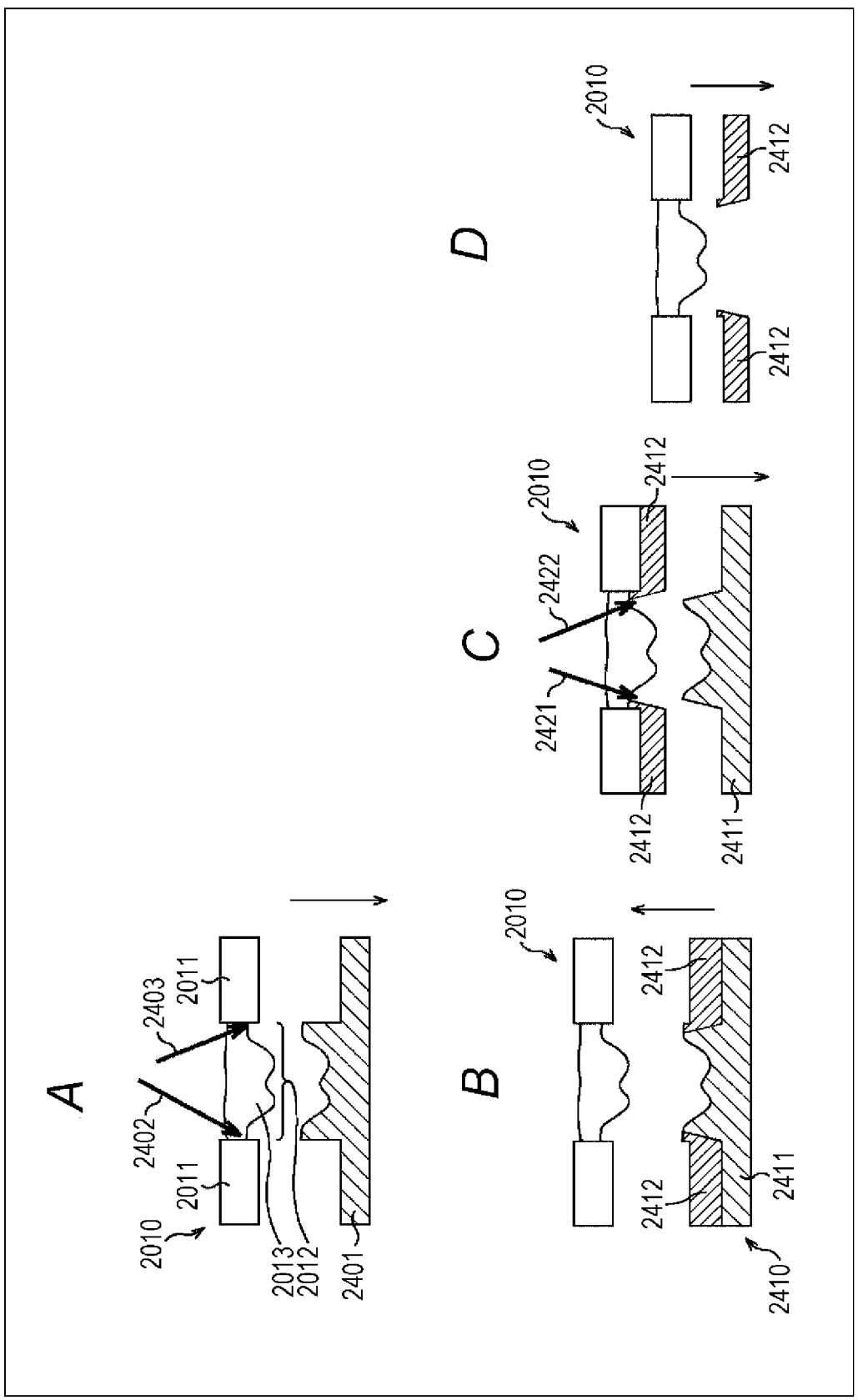
FIG. 65 is a cross-sectional diagram for explaining an example of a state of lens formation.

For example, as illustrated in FIG. 65A, in case of molding the lens resin portion 2013 by using the lower mold frame 2401, since the contact area between the lower mold frame 2401 and the lens resin portion 2013 is large, when the lower mold frame 2401 is demolded, a stress may be concentrated on the portions indicated by the arrow 2402 and the arrow 2403, that is, the interface between the carrier substrate 2011 and the lens resin portion 2013, so that there has been a problem in that excessive load may be exerted on the interface between the carrier substrate 2011 and the lens resin portion 2013. Therefore, as described above, there has been a problem in that the lens is peeled off. Namely, as a result, there has been a problem in that the quality of the lens-attached substrate 2010 is deteriorated or the yield of the lens-attached substrate 2010 is decreased.

Therefore, as illustrated in FIG. 65B, inside the through-hole formed in the substrate, the lens resin portion may be molded by using a mold frame configured with two layer molds, and after the lens resin portion is molded, in the state that one mold is adhered to the substrate, the other mold may be configured to be demolded from the substrate.

The lower mold frame 2410 illustrated in FIG. 65B is configured with stacked molds 2411 and 2412. As illustrated in FIG. 65B, although the mold 2411 and the mold 2412 are stacked to each other, the mold 2411 of the lower side is also configured to be in contact with the lens resin portion 2013, and thus, a large portion of the lower side of the lens resin portion 2013 in the figure is configured to be molded by the mold 2411.

On the contrary, the mold 2412 of the upper side is configured to be mainly in contact with the entire surface of the lower side of the carrier substrate 2011 in the figure. In addition, the mold 2412 is configured to be adhered to the vicinity of the interface between the carrier substrate 2011 and the lens resin portion 2013.

If the molding of the lens resin portion 2013 is finished, the lower mold frame 2410 is demolded. However, in this case, as illustrated in FIG. 65C, only the mold 2411 of the lower side of the lower mold frame 2410 is demolded. As illustrated in FIG. 65C, the mold 2412 remains adhered to the lens-attached substrate 2010. Similarly to the above-described spacer substrate 2021 or the like, the mold 2412 functions as a spacer. Namely, due to the mold 2412, the exposure of the lens resin portion 2013 is suppressed (the lens resin portion is not protruded at least), so that, in the manufacturing process, the transporting period, or the like, it is possible to prevent the lens resin portion 2013 from being in contact with others. Therefore, it is possible to suppress the occurrence of contamination or damage to the lens resin portion 2013.

As a result, it is possible to improve quality of the lens-attached substrate 2010 (the stacked lens structure 11 or the camera module 1 using the lens-attached substrate 2010). In other words, it is possible to suppress a decrease in yield of the lens-attached substrate 2010 (the stacked lens structure 11 or the camera module 1 using the lens-attached substrate 2010).

In addition, as illustrated in FIG. 65C, the mold 2412 is configured to be in contact with the vicinity of the interface between the carrier substrate 2011 and the lens resin portion 2013, and thus, when the mold 2411 is peeled off, the portion is configured so as to be protected. Namely, although the mold 2411 is peeled off, since the mold 2412 presses the vicinity of the interface between the carrier substrate 2011 and the lens resin portion 2013, stress is not concentrated on the portion. In addition, since the mold 2412 is not almost in contact with the lens resin portion 2013, as illustrated in FIG. 65D, when the mold 2412 is peeled off, large force is not exerted on the lens resin portion 2013. In this manner, since load exerted on the interface between the carrier substrate 2011 and the lens resin portion 2013 is distributed, it is possible to suppress the occurrence of peeling of the lens resin portion 2013.

As a result, it is possible to improve quality of the lens-attached substrate 2010 (the stacked lens structure 11 or the camera module 1 using the lens-attached substrate 2010). In other words, it is possible to suppress a decrease in yield of the lens-attached substrate 2010 (the stacked lens structure 11 or the camera module 1 using the lens-attached substrate 2010).

<Manufacturing of Lens-Attached Substrate>

Figure 66:
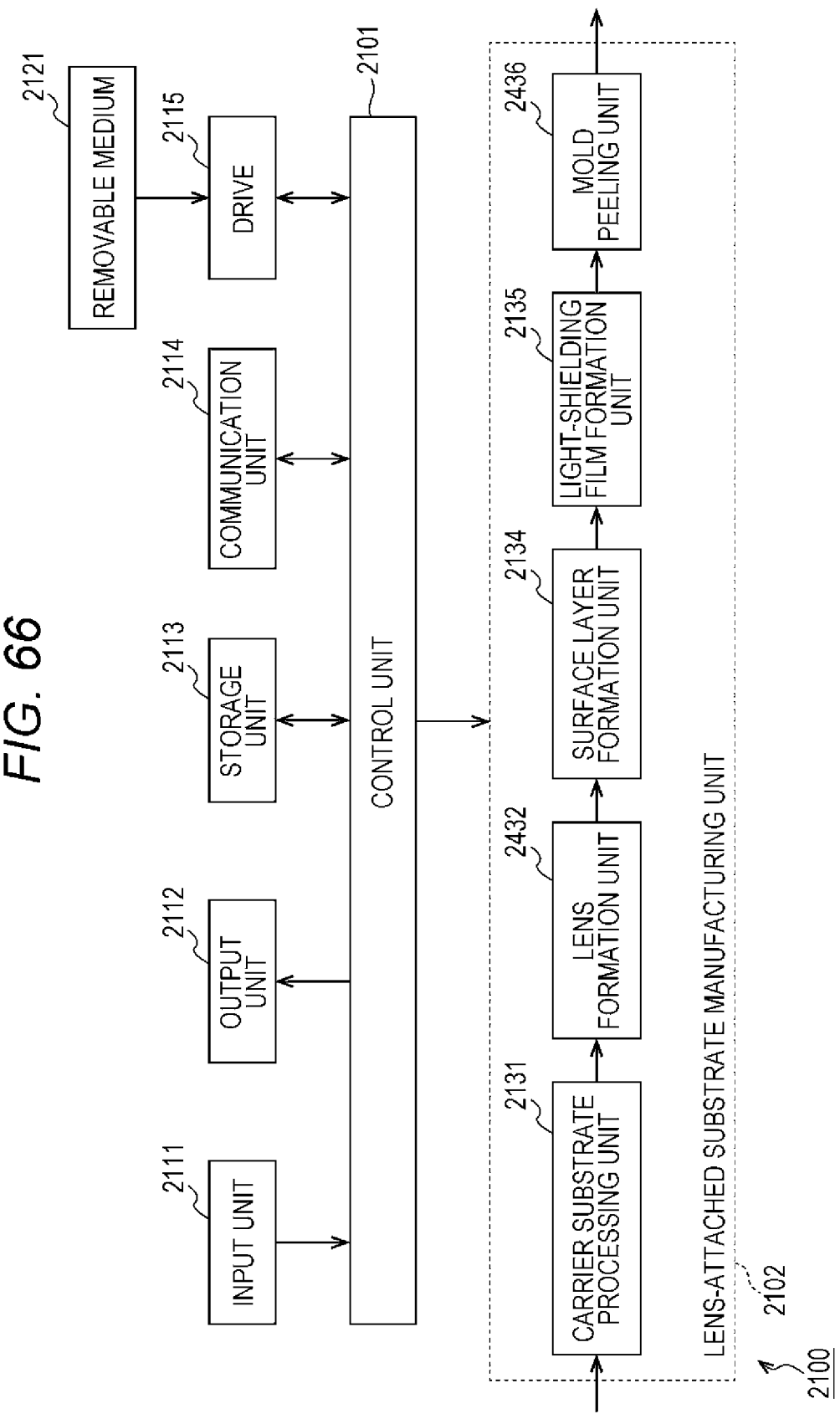
FIG. 66 is a block diagram illustrating an example of a main configuration of a manufacturing apparatus.

An example of main configurations of the manufacturing apparatus 2100 of this case is illustrated in FIG. 66. In this case, the lens-attached substrate manufacturing unit 2102 is configured to include a carrier substrate processing unit 2131, a lens formation unit 2432, a surface layer formation unit 2134, a light-shielding film formation unit 2135, and a mold peeling unit 2436.

Similarly to the lens formation unit 2132, the lens formation unit 2432 performs a process relating to the formation of the lens resin portion 2013. However, the lens formation unit 2432 molds the lens resin portion 2013 by using the lower mold frame 2410 having the configuration (mold 2411 and mold 2412) as illustrated in FIG. 65B.

In addition, as illustrated in FIG. 65D, the mold peeling unit 2436 peels off the mold 2412 from the lens-attached substrate 2010. The method of peeling is arbitrary.

Figure 67:
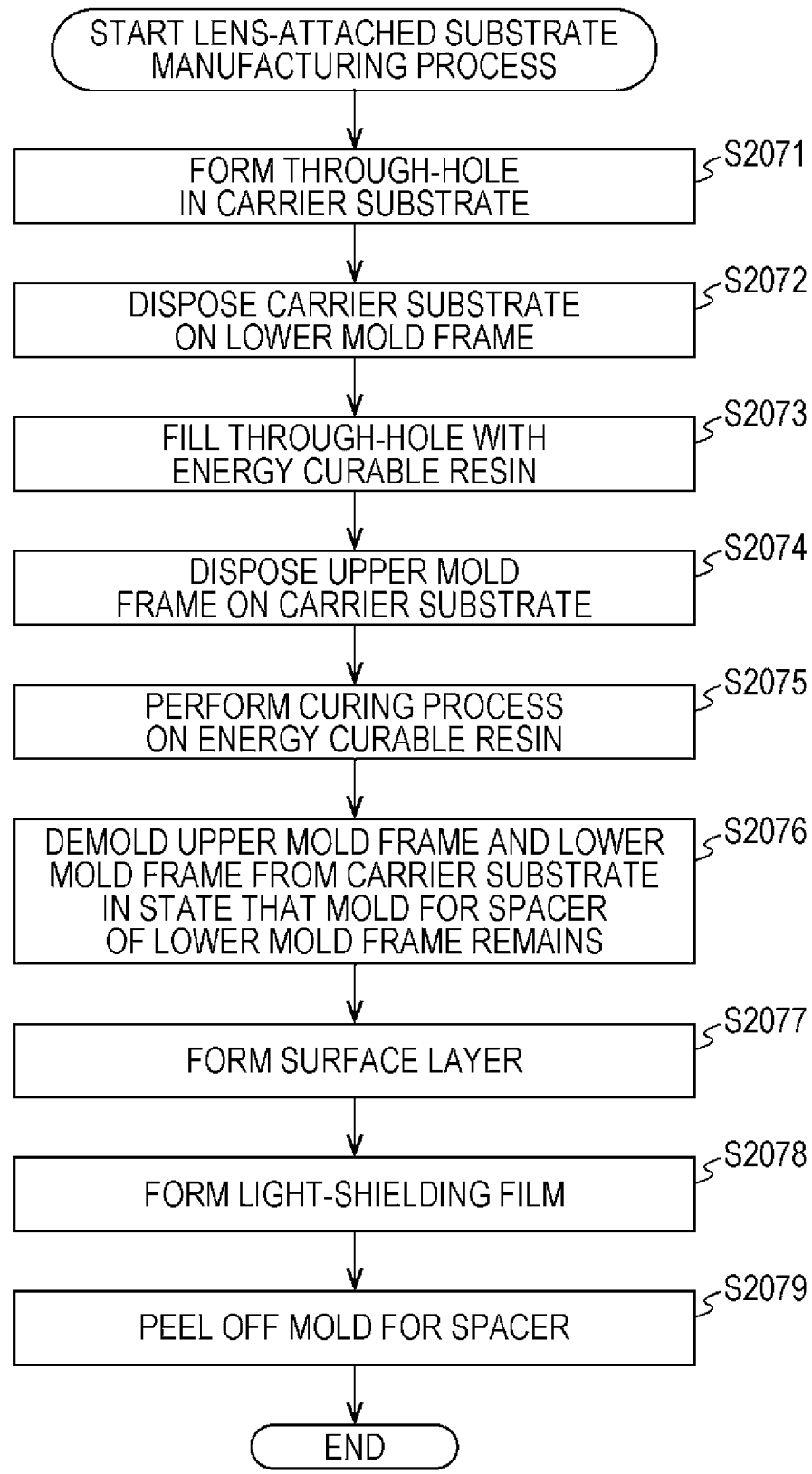
FIG. 67 is a flowchart illustrating an example of a procedure of a lens-attached substrate manufacturing process.

An example of a flow of the lens-attached substrate manufacturing process will be described with reference to the flowchart of FIG. 67. If necessary, the flow will be described with reference to FIGS. 68A to 68D.

Figure 68:
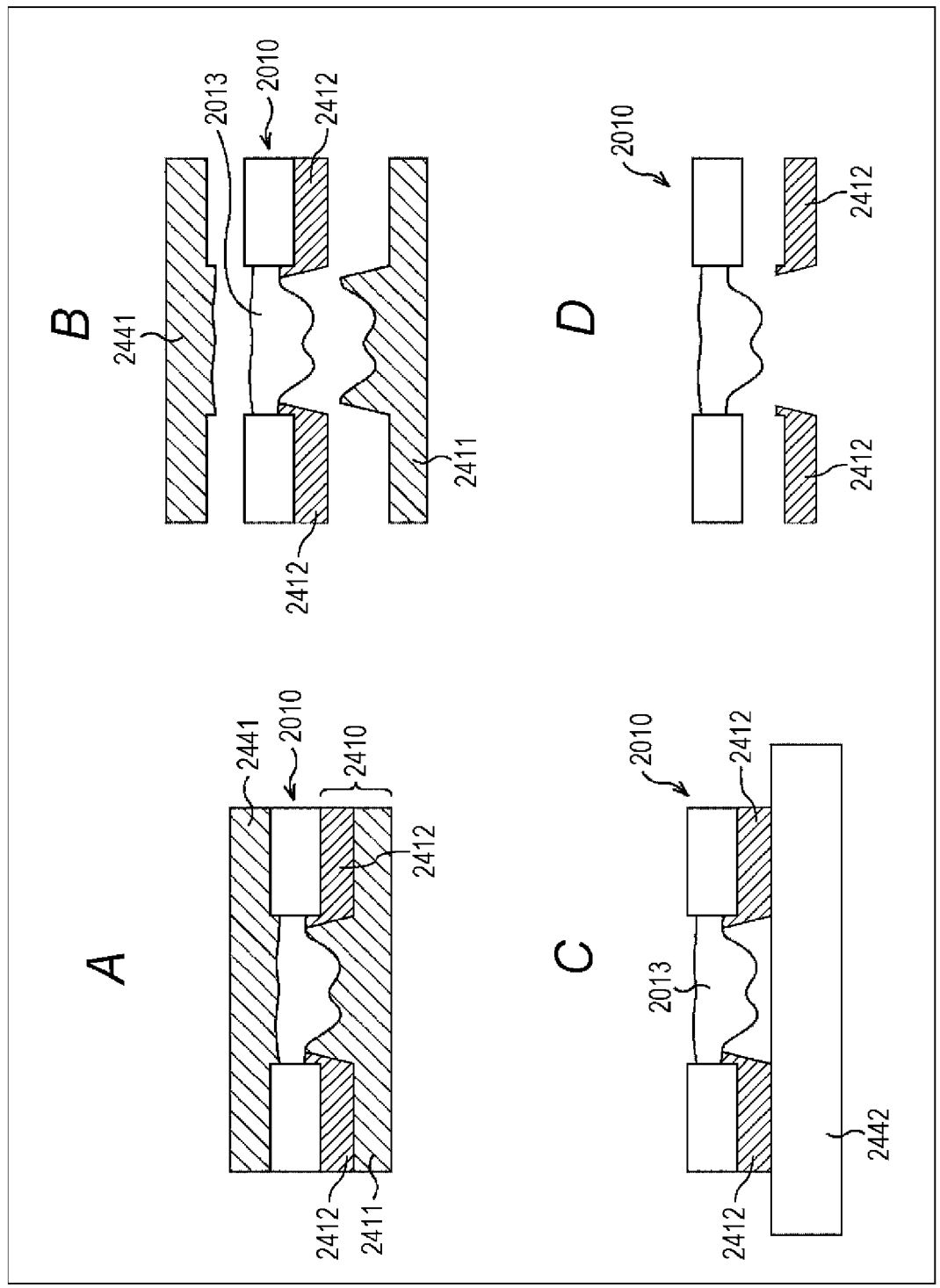
FIG. 68 is a cross-sectional diagram for explaining an example of a state of a manufactured lens-attached substrate.

In step S2071, the carrier substrate processing unit 2131 forms the through-hole in the carrier substrate 2011. In step S2072, the lens formation unit 2432 arranges the carrier substrate 2011 on the lower mold frame 2410. As illustrated in FIG. 68A, the lower mold frame 2410 is configured with two-layers of molds (mold 2411 and mold 2412). In step S2073, the lens formation unit 2432 fills the through-hole 2012 with an energy curable resin.

In step S2074, as illustrated in FIG. 68A, the lens formation unit 2432 disposes the upper mold frame 2441 on the carrier substrate 2011. In step S2075, a process of curing the energy curable resin is performed. If the energy curable resin is cured, in step S2076, as illustrated in FIG. 68B, the lens formation unit 2432 demolds the upper mold frame 2441 and the lower mold frame 2410 from the carrier substrate 2011 in the state that the mold 2412 for spacer of the lower mold frame 2410 remains.

In step S2077, the surface layer formation unit 2134 forms a surface layer on the lens-attached substrate 2010. In addition, in step S2088, the light-shielding film formation unit 2135 forms a light-shielding film on the lens-attached substrate 2010.

This process is performed in the state that the lens-attached substrate 2010 is mounted on a chuck table 2442 or the like. At this time, as illustrated in FIG. 68C, the lens resin portion 2013 is protected by the mold 2412. Although the lens resin portion 2013 is protruded at the lower side of the carrier substrate 2011 in the figure, the mold 2412 becomes a spacer, so that the lens resin portion 2013 is not in contact with the chuck table 2442.

In step S2079, as illustrated in FIG. 68D, the mold peeling unit 2436 peels off the mold 2412 for spacer from the lens-attached substrate 2010.

If the process of step S2079 is ended, the lens-attached substrate manufacturing process is ended. By doing so as described heretofore, it is possible to manufacture the lens-attached substrate capable of obtaining the above-described effects.

<Application Example>

In addition, the lens formation using the mold as described heretofore may be applied to the cases of manufacturing wafer-level lenses having other configurations. Namely, for example, as illustrated in FIG. 69A, the lower mold frame 2410 configured with two layer molds as described above may also be used for lens formation of a monolithic-type wafer lens 2450 or the like which is formed by using only the resin material 2451. In addition, for example, as illustrated in FIG. 69B, the lower mold frame may be also be used for lens formation of a hybrid-type wafer lens 2460 where a lens resin portion 2462 is formed on a glass substrate 2461. In addition, as illustrated in FIG. 69C, the lower mold frame may be also be used for lens formation of a one-side hybrid-type wafer lens 2470 where the lens resin portion 2462 is formed on only one side of the glass substrate 2461.

In addition, heretofore, although the case of the lower mold frame is described, similarly to the lower mold frame 2410, the upper mold frame may be configured with two layer molds. In addition, both of the upper mold frame and the lower mold frame may have such a configuration.

Figure 70:
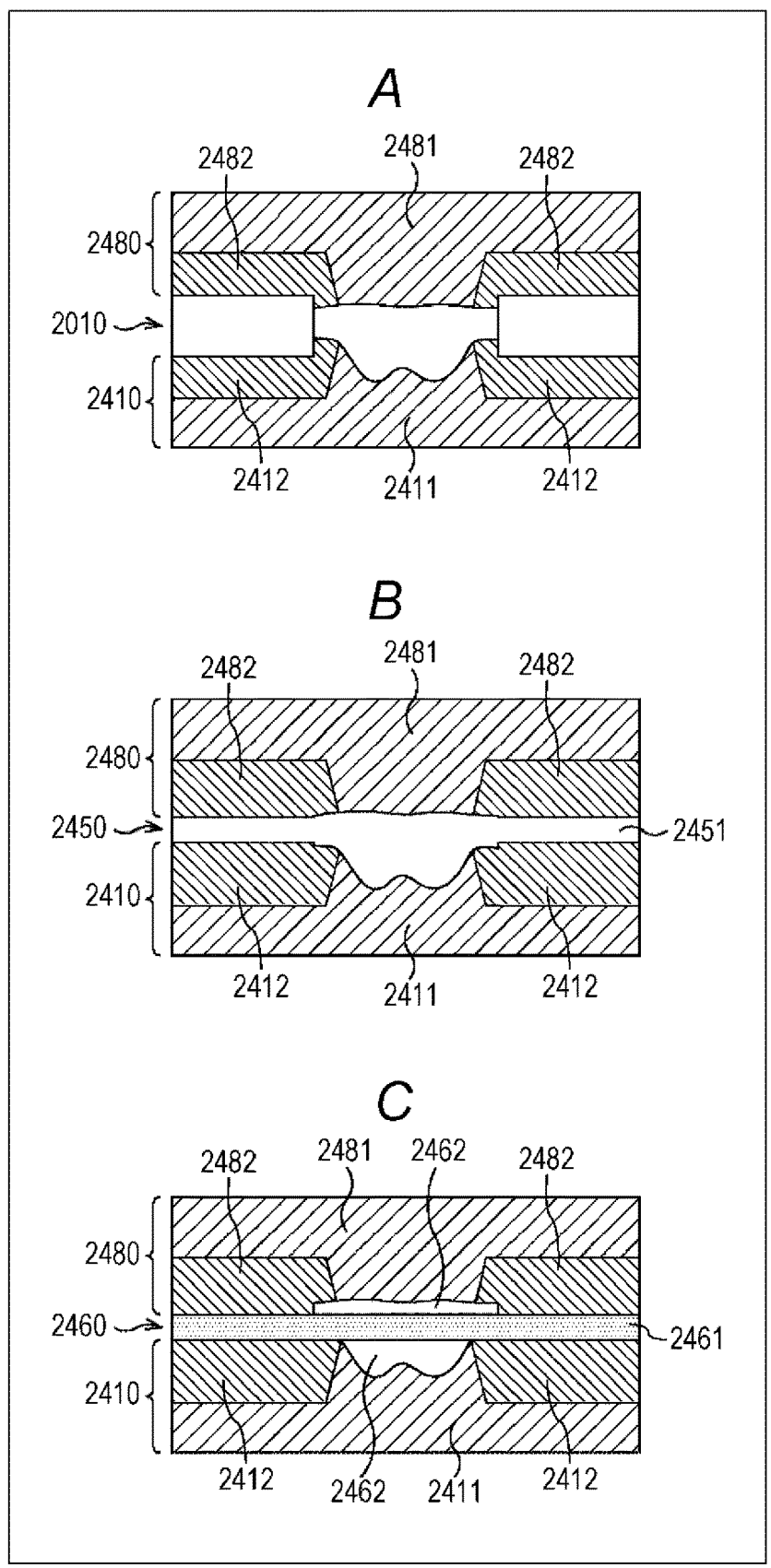
FIG. 70 is a cross-sectional diagram for explaining another example of a mold.

For example, as illustrated in FIG. 70A, the lens formation may be performed on the lens-attached substrate 2010 by using a lower mold frame 2410 configured with a mold 2411 and a mold 2412 and an upper mold frame 2480 configured with a mold 2481 and a mold 2482.

The mold 2481 of the upper mold frame 2480 is the same as the mold 2411 of the lower mold frame 2410. In addition, the mold 2482 of the upper mold frame 2480 is the same as the mold 2412 of the lower mold frame 2410. By doing so as described heretofore, since the interface between the carrier substrate 2011 and the lens resin portion 2013 of the lens-attached substrate 2010 is protected from both of the upper and lower sides of the figure, it is possible to reduce the load to these portions in the demolding period.

In addition, as illustrated in FIG. 70B, similarly to the monolithic-type wafer lens 2450 or the like, the lens formation may be performed by using the upper mold frame 2480 and the lower mold frame 2410. In addition, as illustrated in FIG. 70C, similarly to the hybrid-type wafer lens 2460, the lens formation may be performed by using the upper mold frame 2480 and the lower mold frame 2410.

<Stacked Lens Structure>

By manufacturing the lens-attached substrate constituting the stacked lens structure by using the manufacturing method described heretofore, the stacked lens structure can also obtain the same effects as those of the lens-attached substrate. In addition, only some lens-attached substrates among a plurality of the lens-attached substrates constituting the stacked lens structure may be manufactured by using the manufacturing method described heretofore.

<Camera Module>

In addition, by manufacturing the lens-attached substrate constituting the stacked lens structure included in the camera module by using the manufacturing method described heretofore, the camera module can also obtain the same effects as those of the lens-attached substrate. In addition, only some lens-attached substrates among a plurality of the lens-attached substrates constituting the camera module may be manufactured by using the manufacturing method described heretofore.

18. Other Embodiment 3

<Convex Shape of Carrier Substrate>

The spacer for protecting the lens may be implemented as a configuration of the carrier substrate 2011. Namely, a convex portion (protrusion shape) protruded from the periphery of the carrier substrate 2011 may be formed, and the convex portion may be allowed to function as a spacer.

Figure 71:
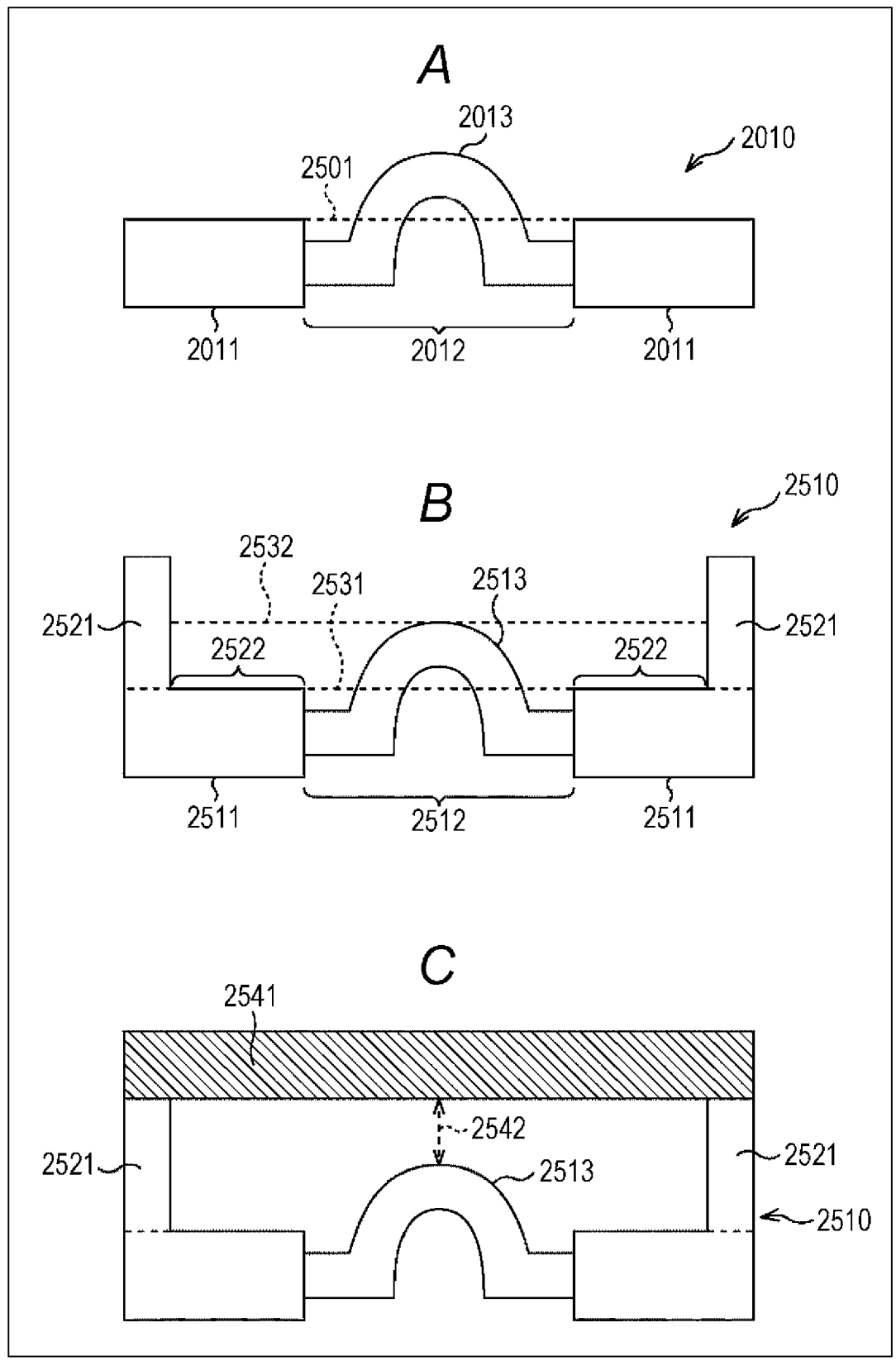
FIG. 71 is a cross-sectional diagram illustrating an example of a configuration of a lens-attached substrate.

For example, as illustrated in FIG. 71A, in the case where the lens resin portion 2013 is protruded from the upward direction of the carrier substrate 2011 in the figure (lens resin portion 2013 is protruded above a dotted line 2501), the possibility that, in the manufacturing process or the transporting period, the protruded portion of the lens resin portion 2013 is in contact with others and, thus, contamination or damage occurs is increased, so that there has been a problem in that the quality of the lens-attached substrate 2010 is deteriorated or the yield is decreased.

Therefore, as illustrated in FIG. 71B, a convex portion which is higher than the protruding height of the lens resin portion 2013 protruded from the carrier substrate 2011 may be formed in the carrier substrate 2011. In a lens-attached substrate 2510 illustrated in FIG. 71B, a lens resin portion 2513 is formed in a through-hole 2512 formed in a carrier substrate 2511. In addition, a convex portion 2521 which is further protruded than other portion 2522 is formed on the upper surface of the carrier substrate 2511 in the figure. The lens resin portion 2513 is formed so as to be higher than the height of the other portion 2522 (dotted line 2531) and so as to be lower than the convex portion 2521 (dotted line 2532). Namely, the lens resin portion 2513 is protruded from the through-hole 2512 to have a height lower than the height of the convex portion 2521.

By such a configuration, as illustrated in FIG. 71C, for example, even in the case where a transporting substrate 2541 is provided on the lens-attached substrate 2510, the convex portions 2521 function as spacers, and thus, as indicated by a double-headed arrow 2542, the lens resin portion 2513 and the transporting substrate 2541 can be allowed not to be in contact with each other. Therefore, it is possible to suppress the occurrence of contamination or damage to the lens resin portion 2513.

As a result, it is possible to improve quality of the lens-attached substrate 2510 (the stacked lens structure 11 or the camera module 1 using the lens-attached substrate 2510). In other words, it is possible to suppress a decrease in yield of the lens-attached substrate 2510 (the stacked lens structure 11 or the camera module 1 using the lens-attached substrate 2510).

<Manufacturing of Lens-Attached Substrate>

Figure 72:
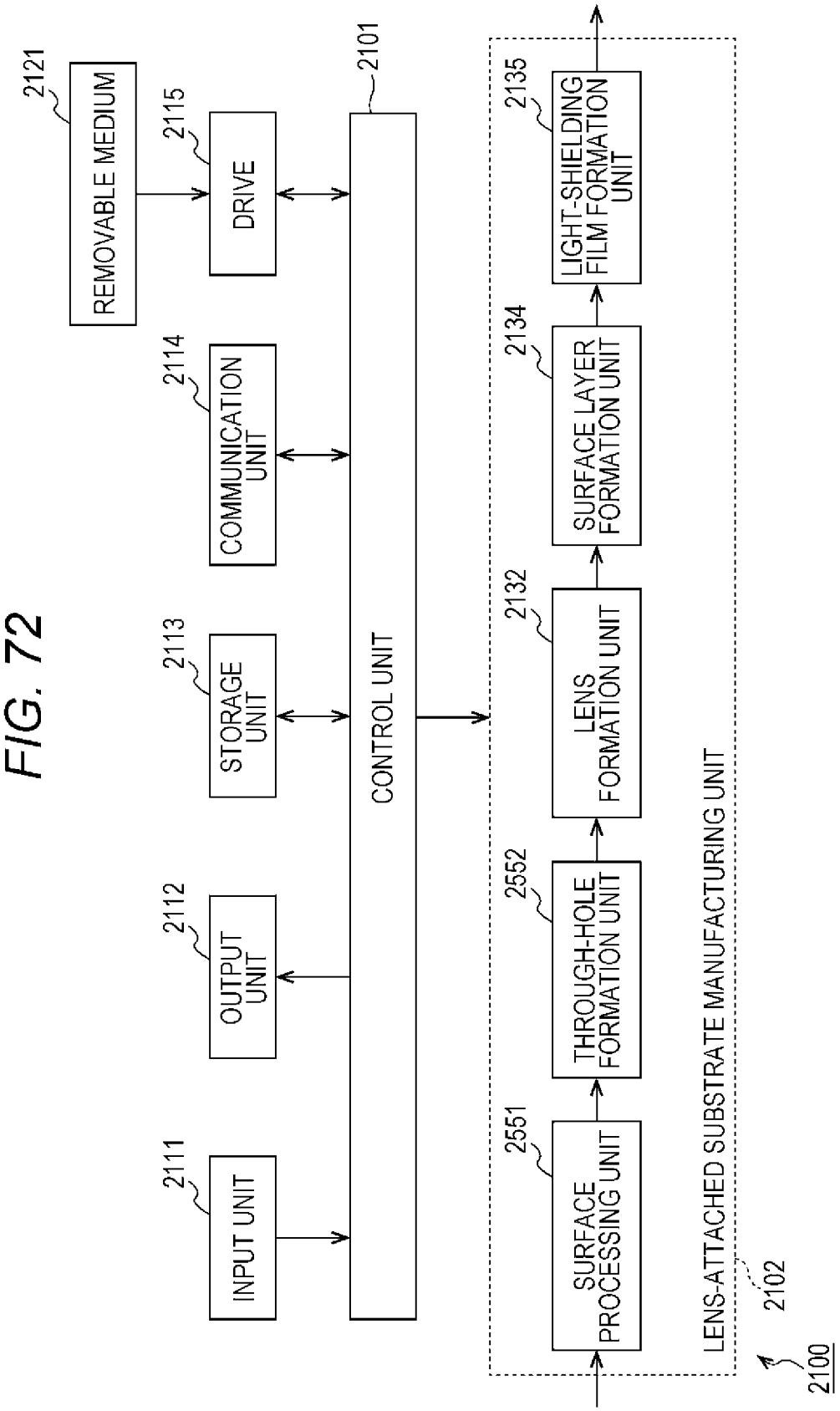
FIG. 72 is a block diagram illustrating an example of a main configuration of a manufacturing apparatus.

An example of main configurations of the manufacturing apparatus 2100 of this case is illustrated in FIG. 72. In this case, the lens-attached substrate manufacturing unit 2102 is configured to include a surface processing unit 2551, a through-hole formation unit 2552, a lens formation unit 2132, a surface layer formation unit 2134, and a light-shielding film formation unit 2135.

The surface processing unit 2551 performs a process relating to the formation of the convex portion. The through-hole formation unit 2552 performs a process relating to the formation of the through-hole.

Figure 75:
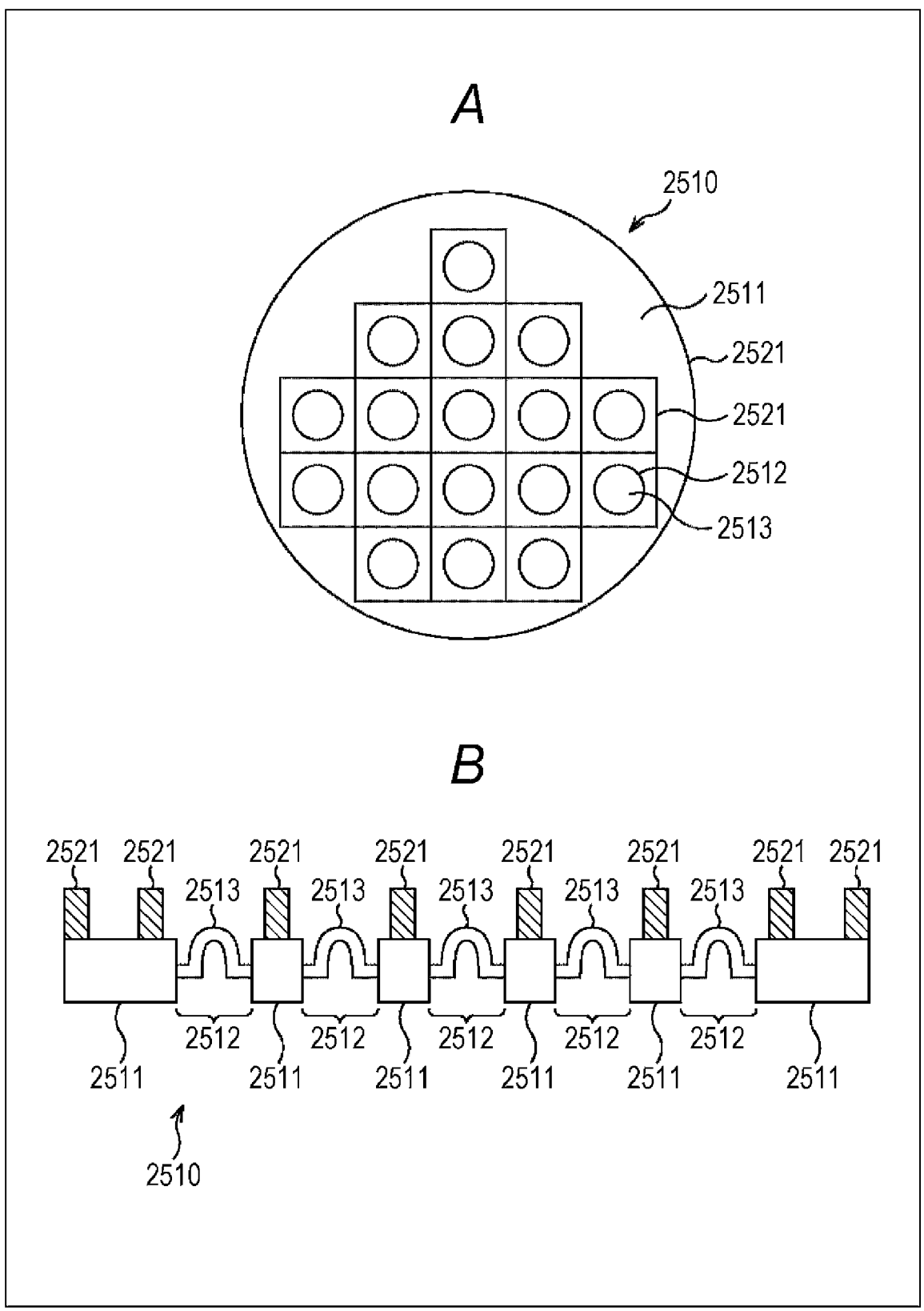
FIG. 75 is a diagram for explaining an example of a state of a manufactured lens-attached substrate.
Figure 76:
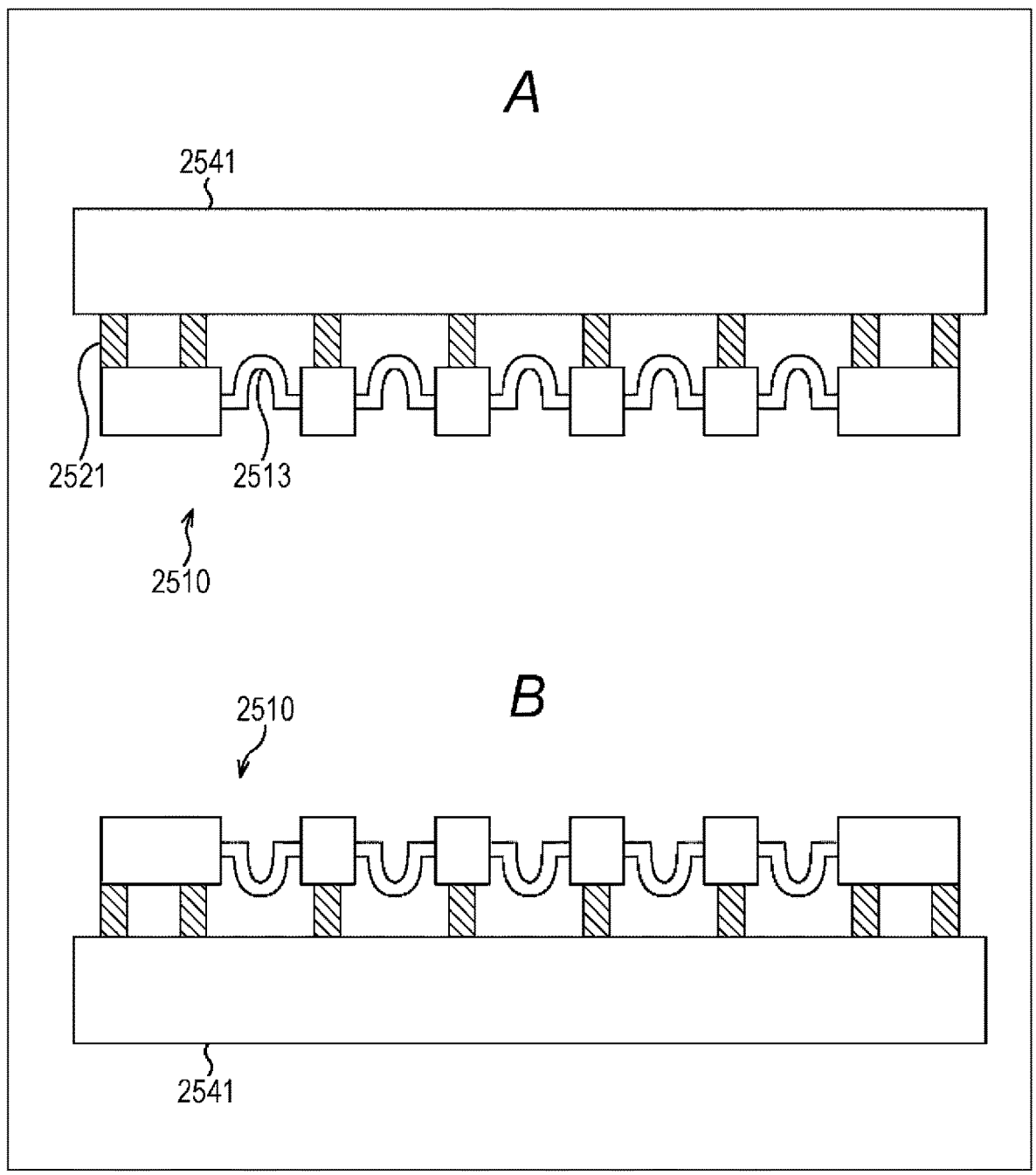
FIG. 76 is a diagram for explaining an example of a state of a manufactured lens-attached substrate.

An example of a flow of the lens-attached substrate manufacturing process of this case will be described with reference to the flowchart of FIG. 73. If necessary, the flow will be described with reference to FIGS. 74 to 76.

In step S2101, the surface processing unit 2551 forms the protrusion shape (convex portion 2521) in the carrier substrate 2511.

FIG. 74A illustrates a diagram of the carrier substrate 2511 as viewed from the upper side. FIG. 74B is a cross-sectional diagram of the carrier substrate 2511. In FIG. 74A, the convex portions 2521 are formed in the portions indicated by straight lines and curved lines. As illustrated in FIG. 74A, the convex portions 2521 are formed at positions where the through-holes 2512 are not formed, for example, at the end portions of the carrier substrates 2511, the end portions of the diced-state lens-attached substrate, or the like. In this manner, the convex portions 2521 may be formed at any positions if the positions do not interfere with the manufacturing processes of the lens-attached substrate.

In addition, the method of forming the convex portion 2521 is arbitrary. For example, the surface processing unit 2551 may form the convex portions 2521 by applying some material to the carrier substrate 2511. For example, the surface processing unit 2551 may form the convex portions 2521 by building up and fixing some material on the surface of the carrier substrate 2511. In addition, for example, the surface processing unit 2551 may form step differences between the convex portions 2521 and other portions 2522 other than the convex portions 2521 by performing etching or the like on the other portions 2522, so that the convex portions 2521 may be relatively formed.

The processes of steps S2102 to S2107 are performed, for example, similarly to the respective processes of steps S2001 to S2006 of FIG. 57. By these processes, the through-hole 2512 and the lens resin portion 2513 are formed.

FIG. 75A illustrates a diagram of the carrier substrate 2511 as viewed from the upper side. FIG. 75B is a cross-sectional diagram of the carrier substrate 2511. In FIG. 75A, the convex portions 2521 are formed in the portions indicated by straight lines and curved lines. As illustrated in FIG. 75A, the through-holes 2512 and the lens resin portions 2513 are formed in the other portions 2522 (portion other than the convex portions 2521). In addition, as illustrated in FIG. 75B, the lens resin portions 2513 are formed so as to be lower than the convex portions 2521.

The processes of steps S2108 and S2109 are performed, for example, similarly to the respective steps S2008 and S2009 of FIG. 57. By these processes, thin films such as the upper surface layer, the lower surface layer, the light-shielding film, and the like are formed.

In the film forming process or the transporting period, as illustrated in FIG. 76A, a transporting substrate 2541 is appropriately adhered to the lens-attached substrate 2510. In addition, for example, in case of changing the surface where thin film is to be formed, as illustrated in FIG. 76B, the lens-attached substrate 2510 is inverted together with the transporting substrate 2541. Due to the adhesion of the transporting substrate 2541, it is possible to stably perform such rotation or movement without large load being exerted on the lens-attached substrate 2510. In addition, as illustrated in FIGS. 76A and 76B, due to the convex portions 2521, it is possible to allow the transporting substrate 2541 not to be in contact with the lens resin portion 2513. Therefore, it is possible to suppress the occurrence of contamination or damage to the lens resin portion 2513.

<Other Configuration of Lens-Attached Substrate>

Concave portions into which the above-described convex portions 2521 can be inserted may be formed on the carrier substrate 2511 of the lens-attached substrate 2510 which is stacked on the lens-attached substrate 2510 having the convex portions 2521 as described above.

For example, as illustrated in FIG. 77A, the concave portions 2561 may be formed on the lens-attached substrate 2510B which is to be stacked at the side of the lens-attached substrate 2510A having the convex portions 2521 where the convex portions 2521 are formed. The concave portions 2561 are formed on the surface of the side of the lens-attached substrate 2510B facing the convex portions 2521 of the carrier substrate 2511. Next, the positions, shapes, sizes, depths, and the like of the concave portions 2561 are formed so as to correspond to those of the convex portions 2521. Namely, the concave portions 2561 are formed so that, as illustrated in FIG. 77B in the state that the lens-attached substrate 2510A and the lens-attached substrate 2510B are stacked, the convex portions 2521 can be inserted in to the concave portions 2561.

The concave portions 2561 are formed, so that, as illustrated in FIG. 77B, it is possible to suppress an increase in distance between the lens-attached substrates 2510 caused by the convex portions 2521 in the state that the lens-attached substrates 2510 are stacked. Therefore, it is possible to suppress a deviation of the optical axis or to suppress the occurrence of ghost or flare, and it is possible to suppress deterioration in image quality.

In addition, in the case where a plurality of the lens-attached substrates 2510 having the convex portions 2521 are stacked, similarly to the lens-attached substrate 2510C illustrated in FIG. 78A, both of the convex portions 2521 and the concave portions 2561 may be formed in one lens-attached substrate 2510.

In this case, the positions, shapes, sizes, depths, and the like of the convex portions 2521 and the concave portions 2561 are formed so as to correspond to each other. An example of the case where the lens-attached substrates 2510A to 2510C are stacked is illustrated in FIG. 78B. In this manner, the convex portions 2521 are inserted into the respective concave portions 2561. Therefore, it is possible to suppress an increase in distance between the lens-attached substrates 2510 caused by the convex portion 2521 in the state that the lens-attached substrates 2510 are stacked. Therefore, it is possible to suppress a deviation of the optical axis or to suppress the occurrence of ghost or flare, and it is possible to suppress deterioration in image quality.

Namely, whether or not to form the convex portions 2521 on the light-incidence-side surface or the light-emitting-side surface of the lens-attached substrate 2510 and whether or not to form the concave portions 2561 are determined according to a shape or the like of itself or the lens resin portion 2513 of the lens-attached substrate 2510 which is to be stacked.

Figure 79:
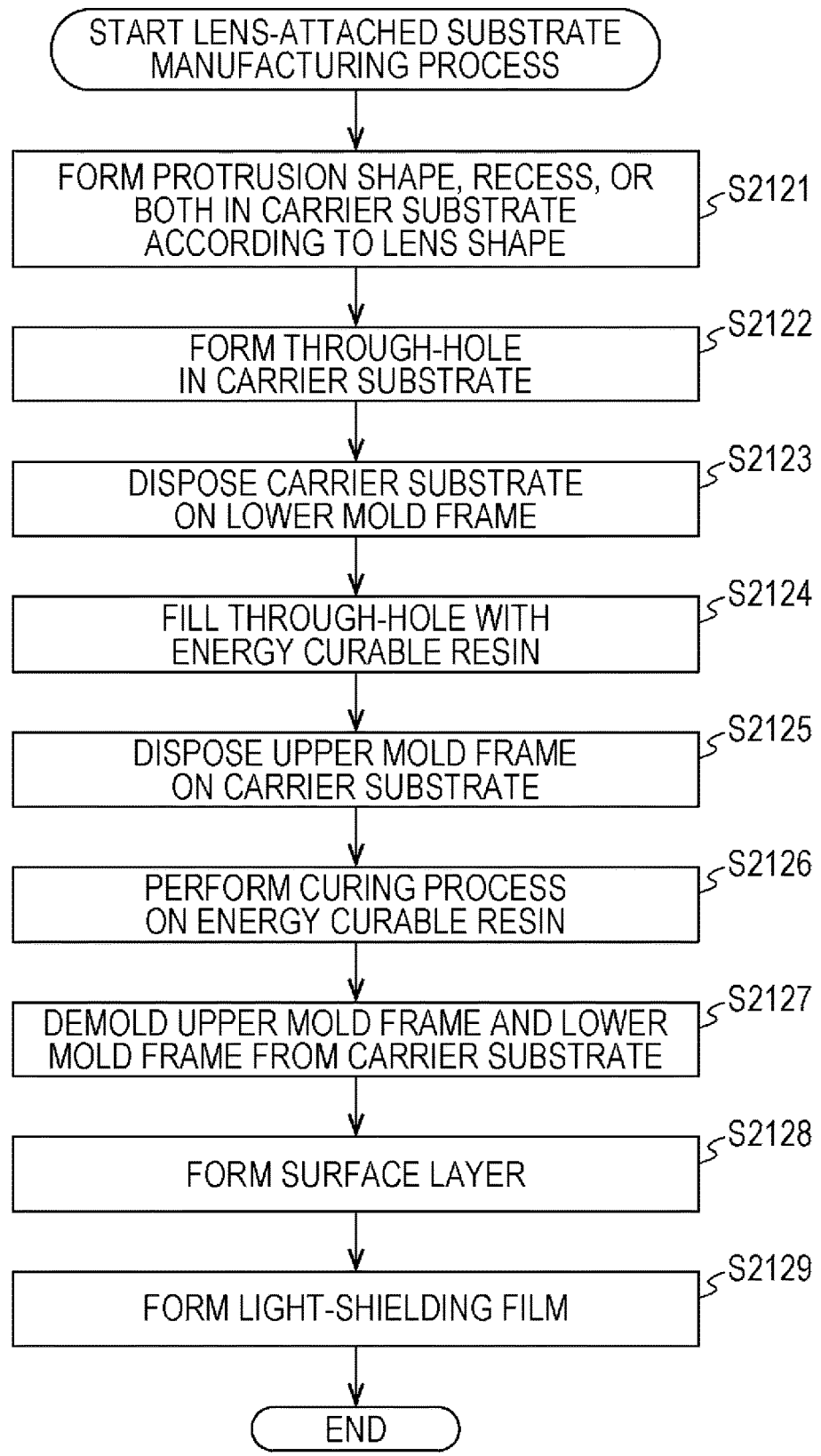
FIG. 79 is a flowchart illustrating an example of a procedure of a lens-attached substrate manufacturing process.

Therefore, in this case, the lens-attached substrate manufacturing process is performed as follows. An example of a flow of the lens-attached substrate manufacturing process of this case will be described with reference to FIG. 79.

When the lens-attached substrate manufacturing process is started, in step S2121, the surface processing unit 2551 (FIG. 72) forms a protrusion shape (that is, a convex portion 2521, a recess (that is, a concave portion 2561), or both of the protrusion shape and the recess on the light-incidence-side surface or the light-emitting-side surface or both of the surfaces of the carrier substrate 2511 according to a shape or the like of itself or the lens resin portion 2513 of the lens-attached substrate 2510 which is to be stacked.

Figure 73:
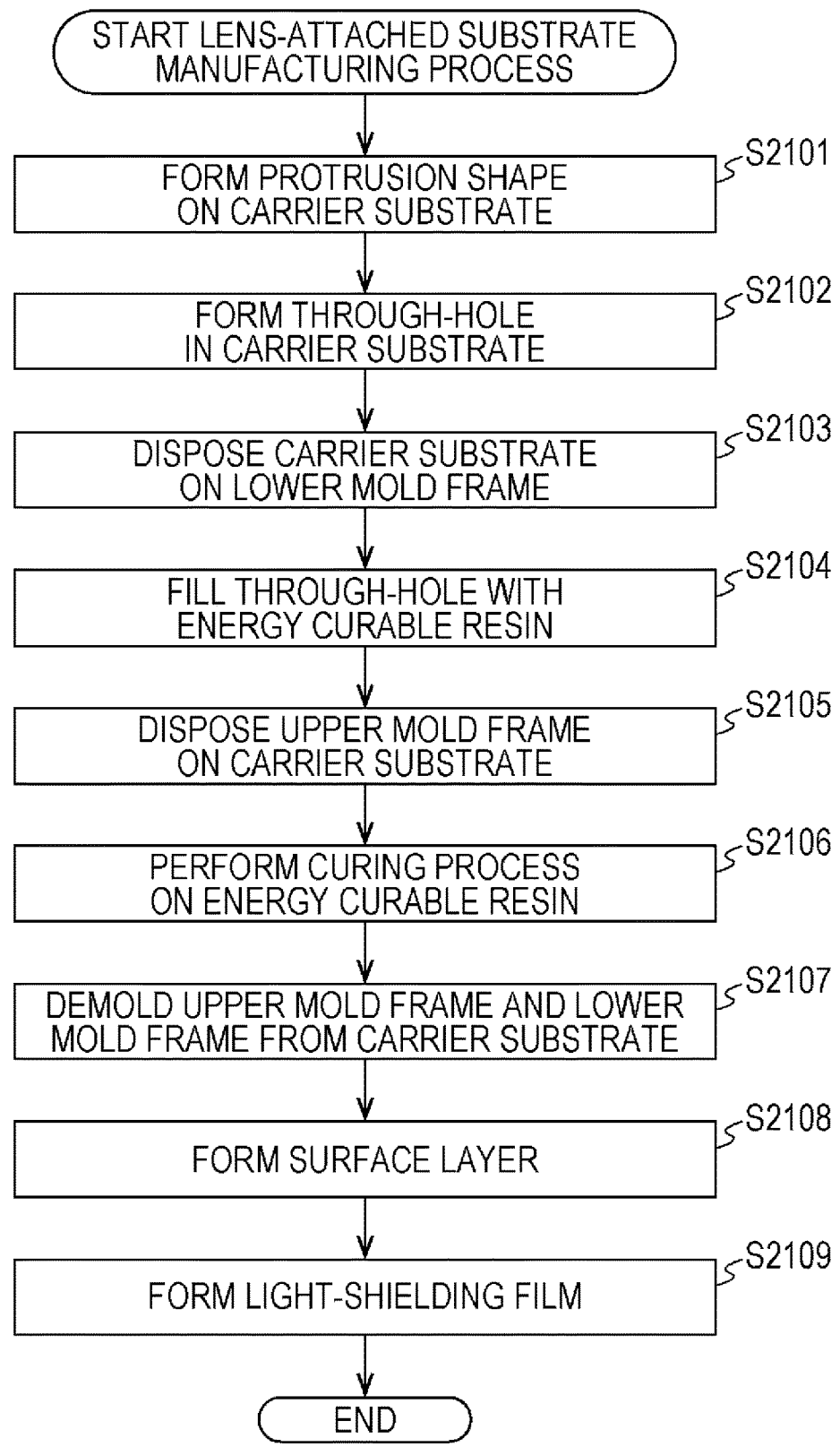
FIG. 73 is a flowchart illustrating an example of a procedure of a lens-attached substrate manufacturing process.

The processes of steps S2122 to S2129 are performed similarly to the respective processes of steps S2102 to S2109 of FIG. 73.

If the surface layer or the light-shielding film is formed, the lens-attached substrate manufacturing process is ended. By doing so as described heretofore, it is possible to manufacture the lens-attached substrate capable of obtaining the above-described effects.

<Stacked Lens Structure>

By manufacturing the lens-attached substrate constituting the stacked lens structure by using the manufacturing method described heretofore, the stacked lens structure can also obtain the same effects as those of the lens-attached substrate. In addition, only some lens-attached substrates among a plurality of the lens-attached substrates constituting the stacked lens structure may be manufactured by using the manufacturing method described heretofore.

<Camera Module>

In addition, by manufacturing the lens-attached substrate constituting the stacked lens structure included in the camera module by using the manufacturing method described heretofore, the camera module can also obtain the same effects as those of the lens-attached substrate. In addition, only some lens-attached substrates among a plurality of the lens-attached substrates constituting the camera module may be manufactured by using the manufacturing method described heretofore.

19. Other Embodiment 4

<Stacking of Carrier substrate>

In addition, instead of using the spacer or the like, the carrier substrate may be configured to be thicker than the lens resin portion. For this reason, for example, a plurality of the carrier substrates may be stacked. Namely, for example, the lens-attached substrate may be configured to include a stacked substrate where a plurality of substrates where a through-hole is formed are stacked and a lens resin portion which is formed inside the through-hole. In addition, the stacked lens structure 11 may be configured so as to include the lens-attached substrate. In addition, the camera module 1 may be configured so as to include the lens-attached substrate.

Figure 80:
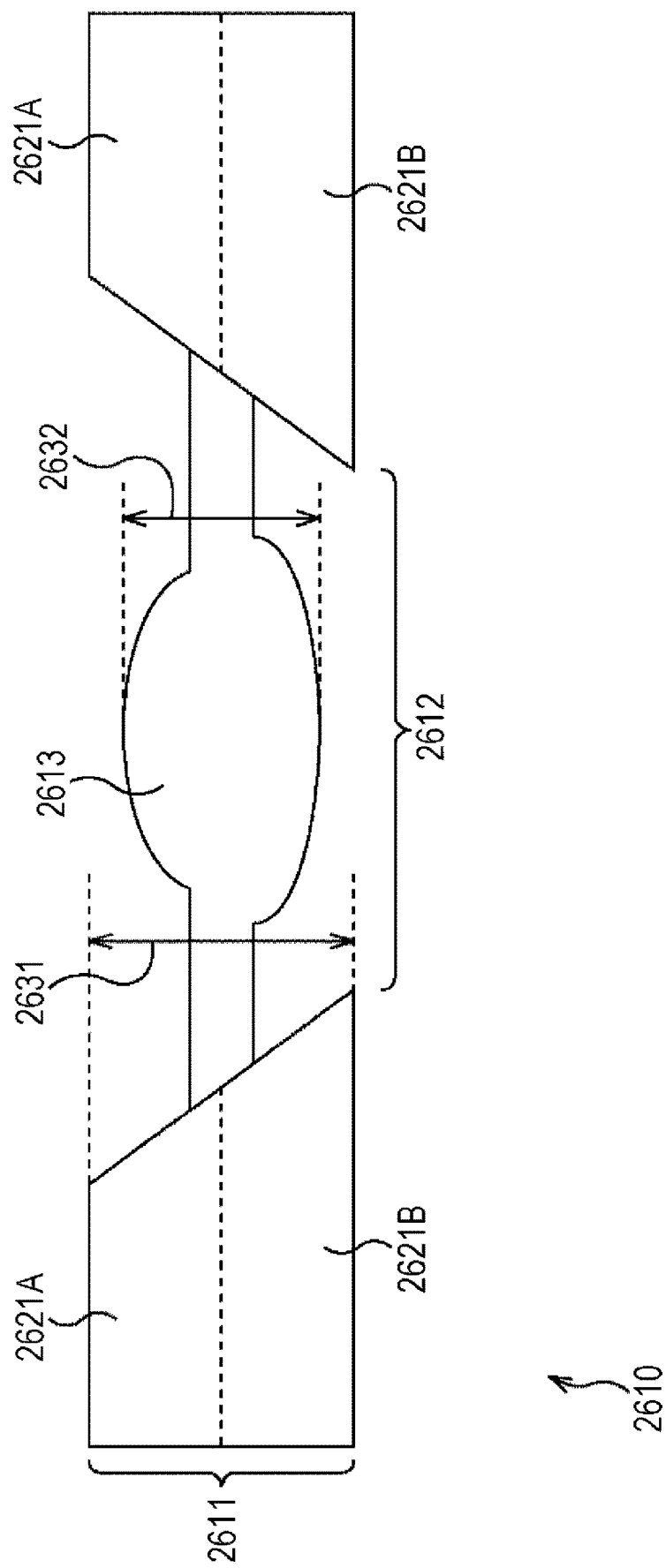
FIG. 80 is a cross-sectional diagram illustrating an example of a configuration of a lens-attached substrate.

FIG. 80 is a cross-sectional diagram illustrating an example of a configuration of the lens-attached substrate. The lens-attached substrate 2610 of the case basically has the same configuration as that of the above-described lens-attached substrate 2010 or the like. However, in case of the lens-attached substrate 2610, a through-hole 2612 is formed in a stacked carrier substrate 2611, and a lens resin portion 2613 is formed in the through-hole 2612.

The stacked carrier substrate 2611 is configured so that two carrier substrates (carrier substrate 2621A and carrier substrate 221B) are stacked and adhered. Similarly to the case of the lens-attached substrate 2010 or the like, the through-hole 2612 is formed so as to penetrate the stacked carrier substrate 2611.

In this manner, since a plurality of the carrier substrates are stacked, the stacked carrier substrate 2611 can be easily configured to be thicker than the lens resin portion 2613. Namely, the thickness of the stacked carrier substrate 2611 (length of the through-hole 2612) indicated by the double-headed arrow 2631 can be set to be larger than the maximum thickness of the lens resin portion 2613 indicated by the double-headed arrow 2632.

Therefore, the exposure of the lens resin portion 2613 is suppressed (the lens resin portion does not protrude at least to the outside of the through-hole 2612), and thus, the possibility that the lens resin portion 2613 is in contact with others can be suppressed, so that it is possible to suppress the occurrence of contamination or damage to the lens resin portion 2613. In addition, the number of carrier substrates 2621 stacked as the stacked carrier substrate 2611 is arbitrary. For example, three or more layers of the carrier substrates 2621 may be stacked.

<Manufacturing of Lens-Attached Substrate>

Figure 81:
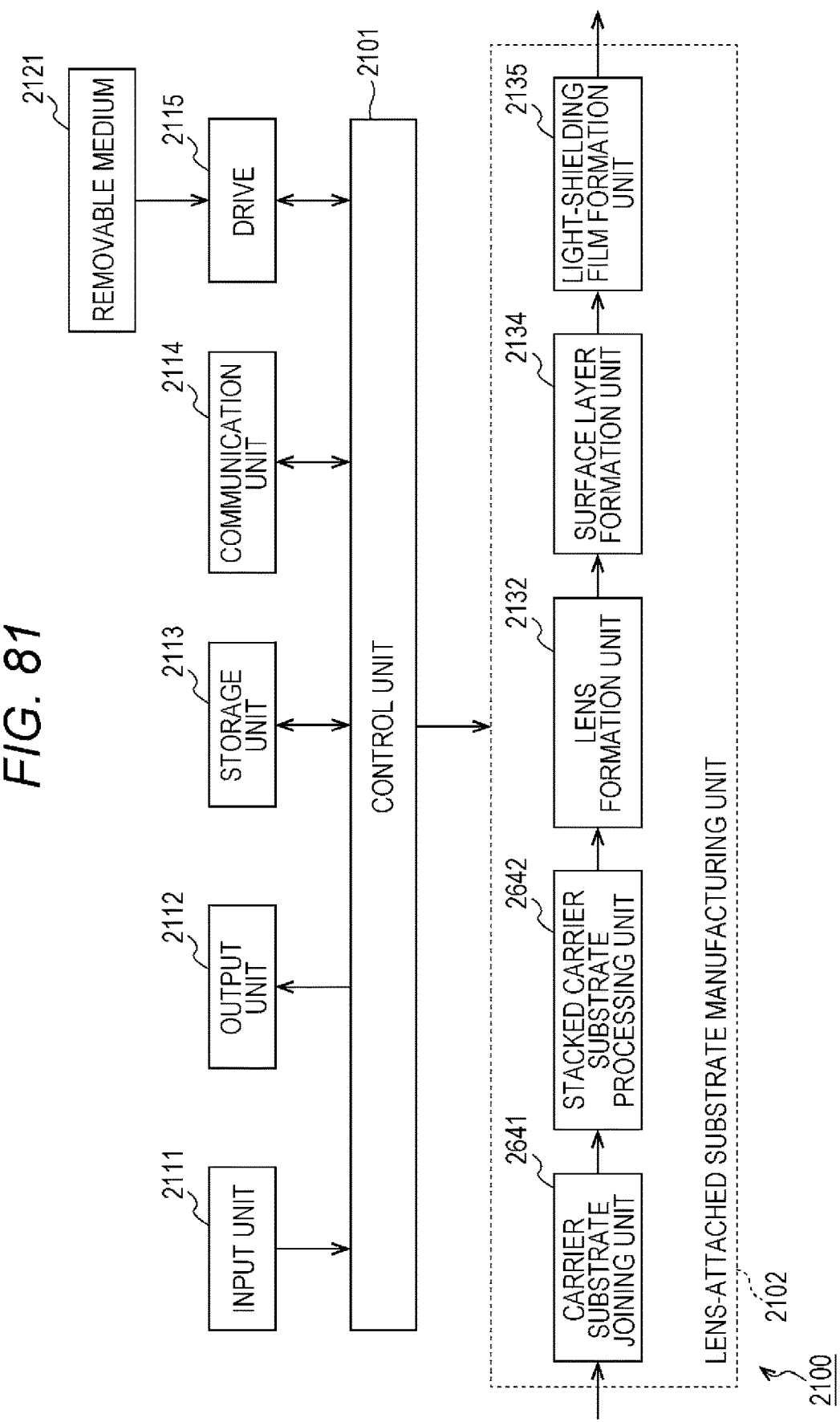
FIG. 81 is a block diagram illustrating an example of a main configuration of a manufacturing apparatus.

An example of main configurations of the manufacturing apparatus 2100 of this case is illustrated in FIG. 81. In this case, the lens-attached substrate manufacturing unit 2102 is configured to include a carrier substrate joining unit 2641, a stacked carrier substrate processing unit 2642, a lens formation unit 2132, a surface layer formation unit 2134, and a light-shielding film formation unit 2135.

The carrier substrate joining unit 2641 performs a process relating to the adhesion of the stacked carrier substrates. The stacked carrier substrate processing unit 2642 performs a process relating to the formation of the through-hole 2612 of the stacked carrier substrate 2611 formed by adhering a plurality of stacked carrier substrates.

An example of a flow of the lens-attached substrate manufacturing process of this case will be described with reference to the flowchart of FIG. 82. If necessary, the flow will be described with reference to FIGS. 83A to 83C.

In step S2141, the carrier substrate joining unit 2641 adheres the carrier substrates. For example, as illustrated in FIG. 83A, the carrier substrate joining unit 2641 stacks and adheres two carrier substrates of the carrier substrate 2621A and the carrier substrate 2621B. The adhering method is arbitrary. For example, the carrier substrate joining unit 2641 may join the carrier substrate 2621A and the carrier substrate 221B by plasma joining or may adhere the carrier substrate 2621A and the carrier substrate 221B by using an adhesive or the like. In addition, the carrier substrate joining unit 2641 may merely mount the carrier substrate 2621A on the carrier substrate 221B.

In step S2142, as illustrated in FIG. 83B, the stacked carrier substrate processing unit 2642 forms the through-hole 2612 in the stacked carrier substrate 2611. In addition, in FIG. 83B, as indicated by the dotted circle 2651 or the dotted circle 2652, in the portion where the carrier substrates for the through-hole 2612 are adhered to each other, a protrusion shape is formed with an oxide film.

In step S2143, the lens formation unit 2132 disposes the stacked carrier substrate on the lower mold. In step S2144, the lens formation unit 2132 fills the through-hole 2612 of the stacked carrier substrate 2611 with an energy curable resin. In step S2145, the lens formation unit 2132 disposes the upper mold frame on the stacked carrier substrate. In step S2146, the lens formation unit 2132 performs a process of curing the energy curable resin. In step S2147, the lens formation unit 2132 demolds the upper mold frame and the lower mold frame from the stacked carrier substrate. By these processes, as illustrated in FIG. 83C, the lens resin portion 2613 is formed in the through-hole 2612 of the stacked carrier substrate 2611.

In addition, as described above, in this case, since a protrusion shape is formed in the interface between the sidewall of the through-hole 2612 and the lens resin portion 2613, it is possible to improve joining strength between the sidewall and the lens resin portion 2613.

The processes of steps S2148 and S2149 are performed, for example, similarly to the respective processes of steps S2008 and S2009 of FIG. 57. By these processes, as necessary, thin films such as the upper surface layer, the lower surface layer, the light-shielding film, and the like are formed.

In this manner, by manufacturing the lens-attached substrate 2610, since the thickness of the carrier substrate (stacked carrier substrate 2611) can be more easily adjusted (increased), it is possible to more easily allow the lens resin portion 2613 not to be protruded from the carrier substrate (stacked carrier substrate 2611). Therefore, as described above, the possibility that the lens resin portion 2613 is in contact with others can be suppressed without using the spacer or the like, so that it is possible to suppress the occurrence of contamination or damage to the lens resin portion 2613.

<Configuration of Stacked Lens Structure>

Figure 84:
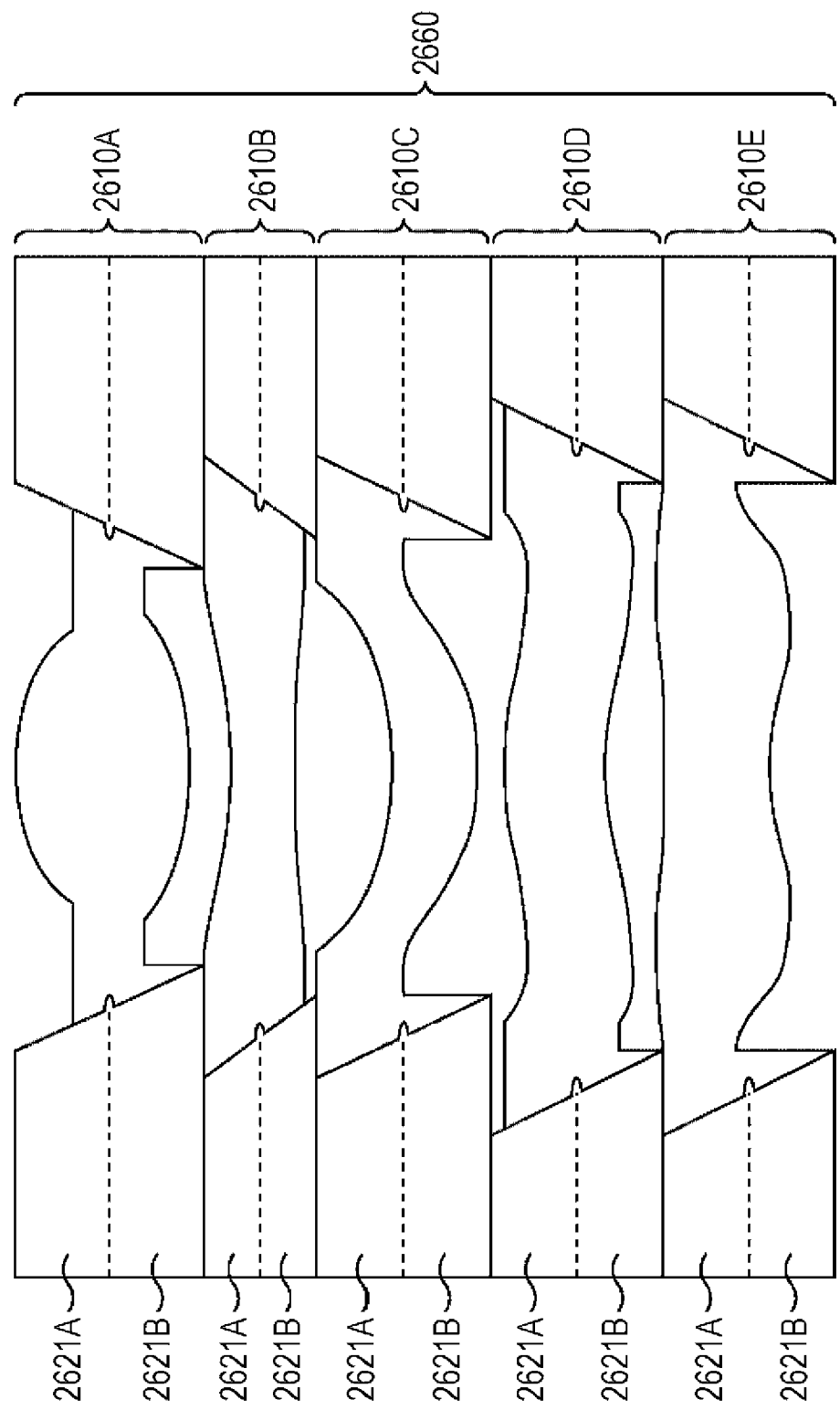
FIG. 84 is a cross-sectional diagram illustrating an example of a main configuration of a stacked lens structure.

In this case, the stacked lens structure 2660 may be configured, for example, as illustrated in FIG. 84. Namely, the stacked lens structure 2660 may be configured so that a plurality of the lens-attached substrates 2610 having the above-described stacked carrier substrate 2611 are stacked. In this case, in all the lens-attached substrates 2610, since the lens resin portion 2613 is not protruded from the stacked carrier substrate 2611, it is possible to more easily stack the lens-attached substrates 2610.

<Other Example of Manufacturing of Lens-Attached Substrate>

In addition, heretofore, although the example where the through-hole is formed in the state that a plurality of the carrier substrates are stacked and adhered is described, the manufacturing method for the lens-attached substrate is not limited to this method. For example, the through-holes may be formed in a plurality of the respective carrier substrates, and after that, the carrier substrates may be stacked and adhered.

Figure 85:
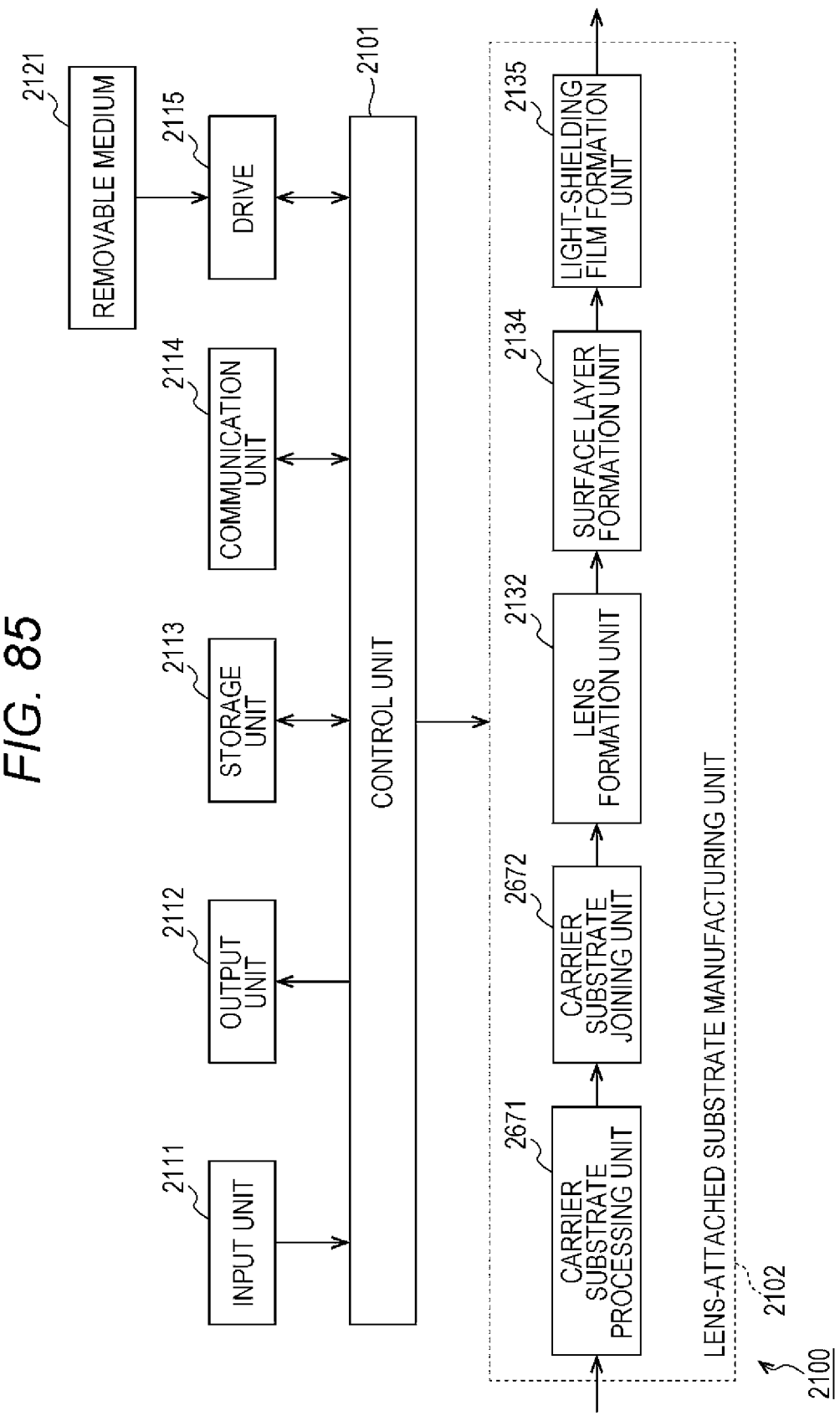
FIG. 85 is a block diagram illustrating an example of a main configuration of a manufacturing apparatus.

An example of main configurations of the manufacturing apparatus 2100 of this case is illustrated in FIG. 85. In this case, the lens-attached substrate manufacturing unit 2102 is configured to include a carrier substrate processing unit 2671, a carrier substrate joining unit 2672, a lens formation unit 2132, a surface layer formation unit 2134, and a light-shielding film formation unit 2135.

The carrier substrate processing unit 2671 performs a process relating to the formation of the through-hole of each of the carrier substrate. The carrier substrate joining unit 2672 performs a process relating to the adhesion of a plurality of the stacked carrier substrates.

An example of a flow of the lens-attached substrate manufacturing process will be described with reference to the flowchart of FIG. 86. If necessary, the flow will be described with reference to FIGS. 87A to 87C.

In step S2161, as illustrated in FIG. 87A, the carrier substrate processing unit 2671 forms through-holes in the carrier substrates (carrier substrate 2621A and carrier substrate 2621B) which are to be adhered to each other. In case of FIG. 87A, the carrier substrate processing unit 2671 forms a through-hole 2681A in the carrier substrate 2621A and forms a through-hole 2681B in the carrier substrate 2621B. The positions, sizes, shapes, and the like of the through-holes of the carrier substrates are formed so as to correspond to each other. Namely, the positions, sizes, shapes, and the like are set so that the through-holes of the carrier substrates become one through-hole in the state that the carrier substrates are stacked as the stacked carrier substrate 2611. For example, in case of FIG. 87A, the through-holes having a reverse-tapered shape are formed in the carrier substrate 2621A and the carrier substrate 2621B.

In step S2162, the carrier substrate joining unit 2672 adheres the carrier substrates 2621 where the through-hole is formed. For example, as illustrated in FIG. 87B, the carrier substrate joining unit 2672 generates the stacked carrier substrate 2611 by stacking and adhering the carrier substrate 2621A and the carrier substrate 2621B. In addition, similarly to the case of FIG. 82, the adhering process is arbitrary.

As illustrated in FIG. 87B, if the stacked carrier substrate 2611 is generated by adhering the carrier substrate 2621A and the carrier substrate 2621B, one through-hole 2612 is formed with the through-hole 2681A and the through-hole 2681B.

Figure 82:
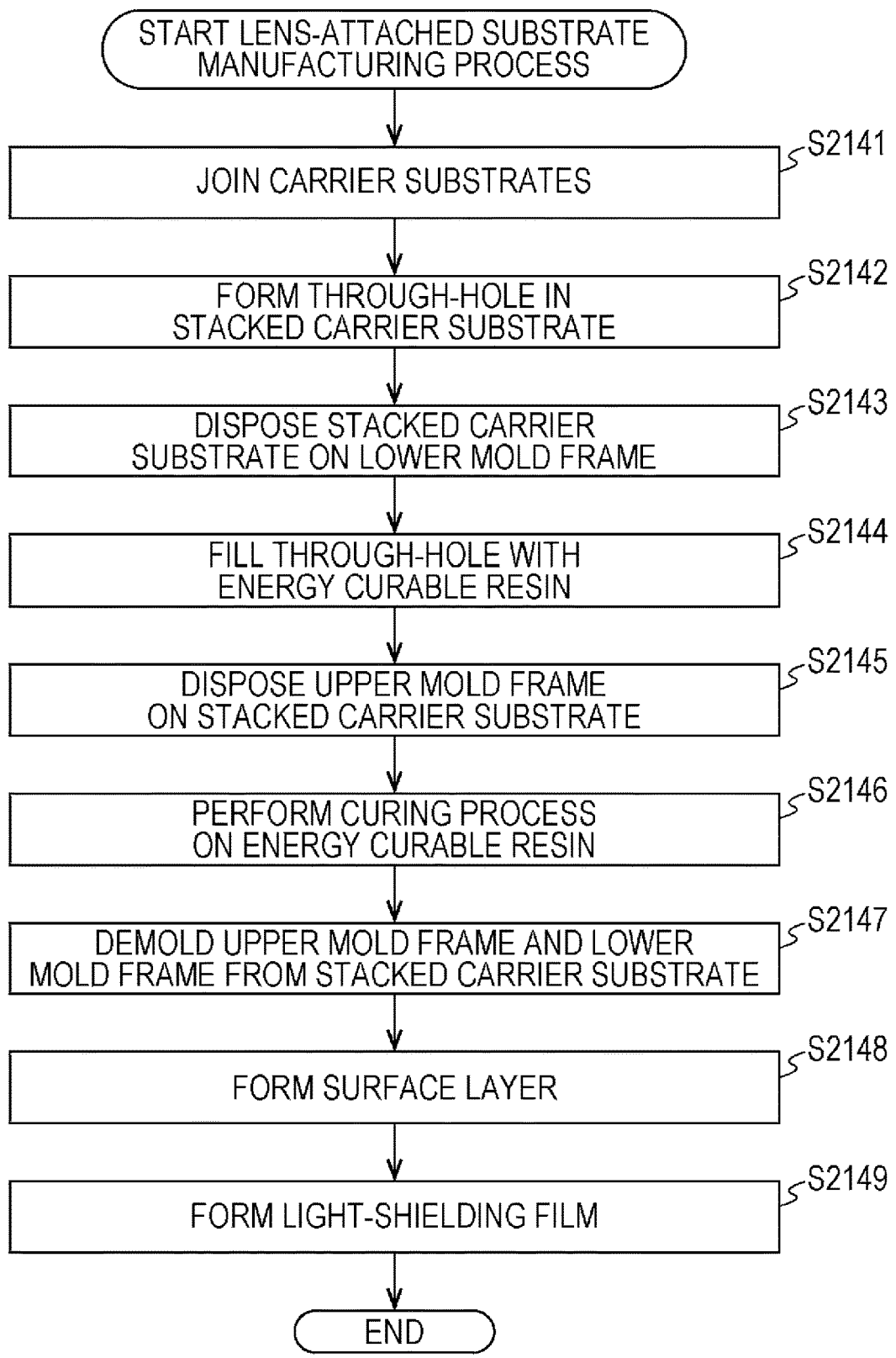
FIG. 82 is a flowchart illustrating an example of a procedure of a lens-attached substrate manufacturing process.
Figure 86:
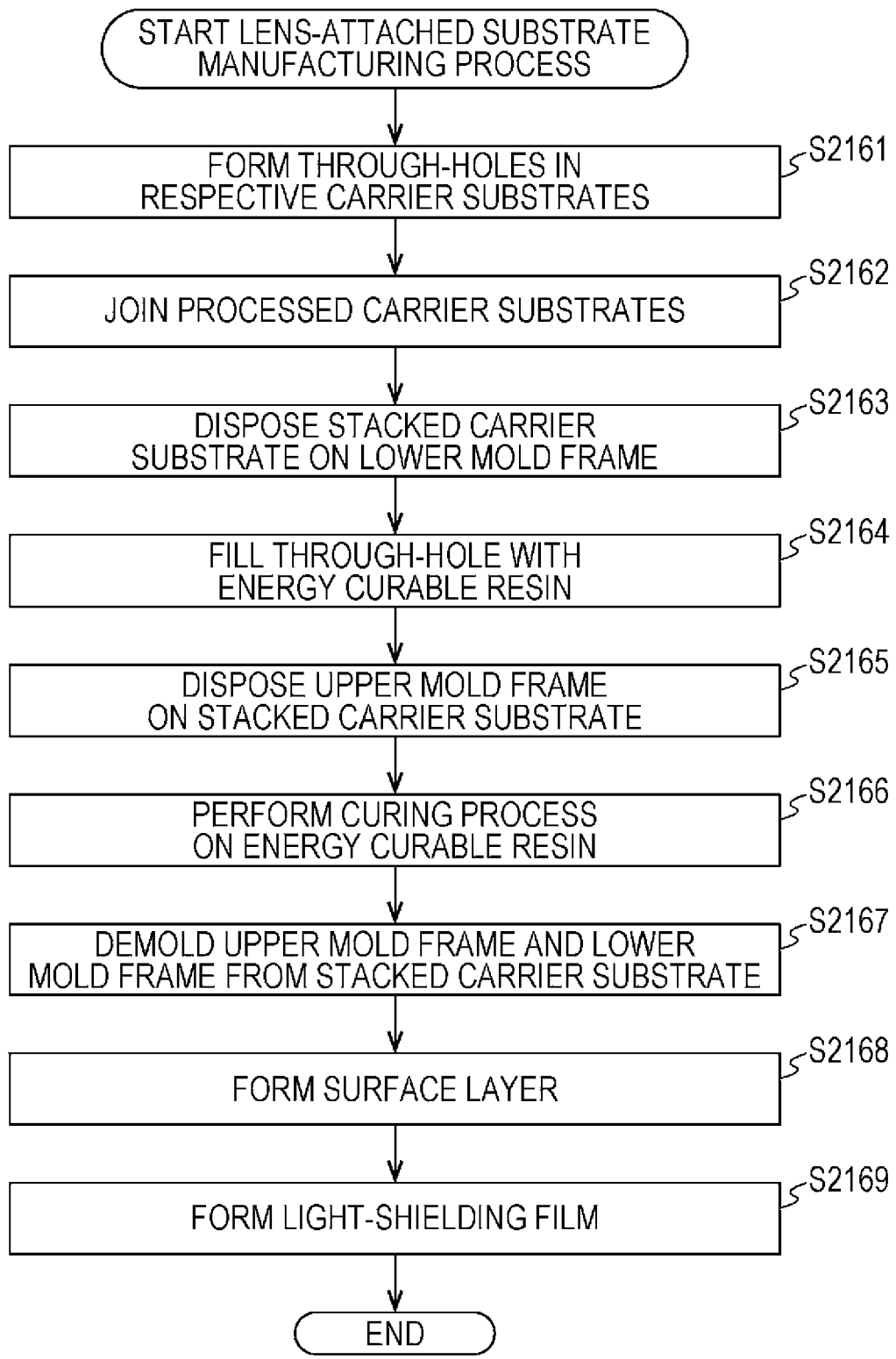
FIG. 86 is a flowchart illustrating an example of a procedure of a lens-attached substrate manufacturing process.

Next, the processes of steps S2163 to S2167 of FIG. 86 are performed similarly to the respective processes of steps S2143 to S2147 of FIG. 82. Therefore, as illustrated in FIG. 87C, the lens resin portion 2613 is formed for the through-hole 2612.

In this case, the lens resin portion 2613 is in contact with the interfaces between the sidewall of the through-hole 2612 and the carrier substrate 2621A and the carrier substrate 2621B. Therefore, when the lens resin portion 2613 is molded, the resin is infiltrated into the interfaces with respect to the carrier substrate 2621A and the carrier substrate 2621B, so that there is possibility that a joining strength between the lens resin portion 2613 and the sidewall is improved.

In addition, the processes of steps S2168 and S2169 are performed similarly to the respective processes of steps S2148 and S2149 of FIG. 82. By these processes, as necessary, thin films such as the upper surface layer, the lower surface layer, the light-shielding film, and the like are formed.

In this manner, by manufacturing the lens-attached substrate 2610, since the thickness of the carrier substrate (stacked carrier substrate 2611) can be more easily adjusted (increased), it is possible to more easily allow the lens resin portion 2613 not to be protruded from the carrier substrate (stacked carrier substrate 2611). Therefore, as described above, the possibility that the lens resin portion 2613 is in contact with others can be suppressed without using the spacer or the like, so that it is possible to suppress the occurrence of contamination or damage to the lens resin portion 2613.

<Configuration of Stacked Lens Structure>

Figure 88:
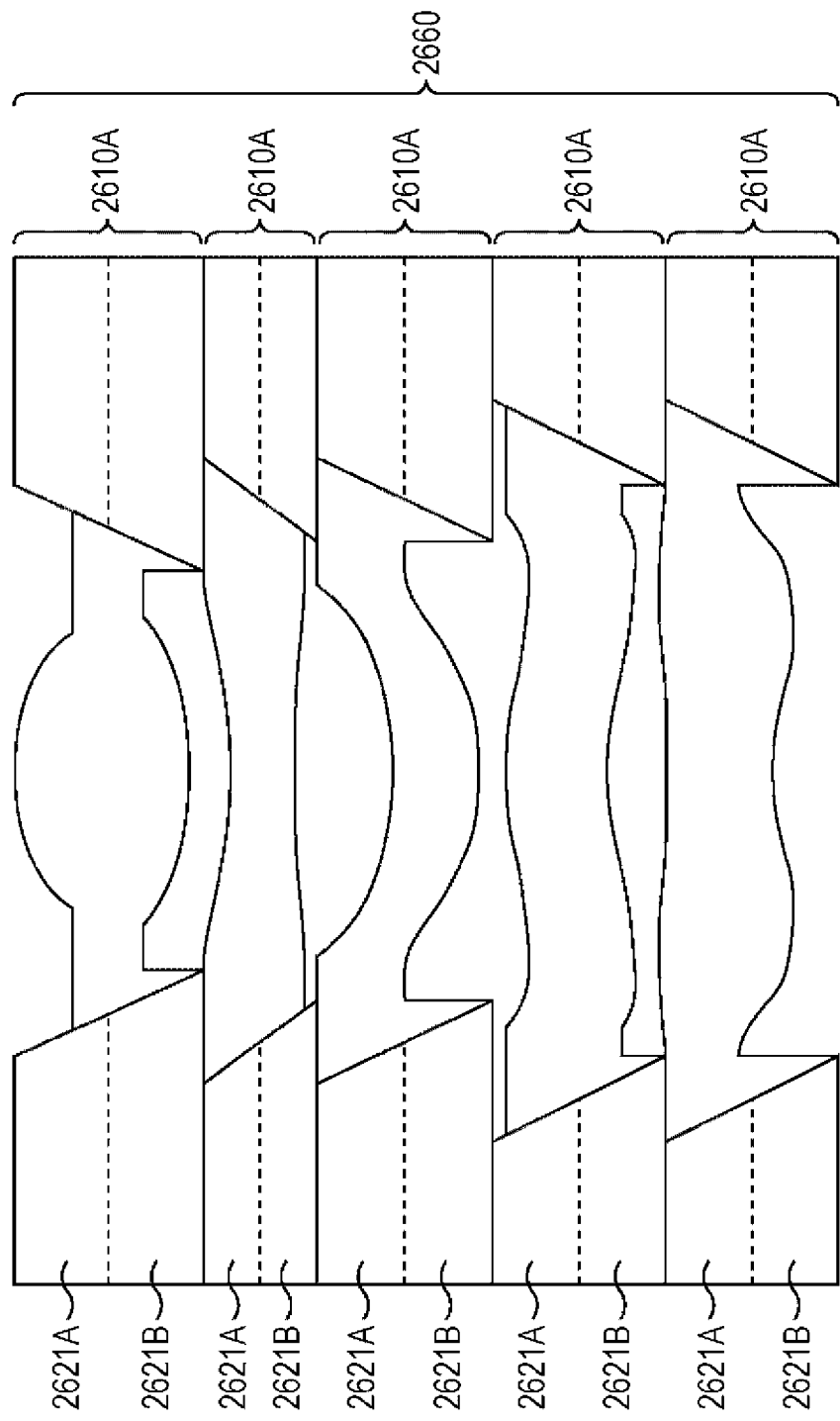
FIG. 88 is a cross-sectional diagram illustrating an example of a main configuration of a stacked lens structure.

In this case, the stacked lens structure 2660 may be configured, for example, as illustrated in FIG. 88. Namely, the stacked lens structure 2660 may be configured so that a plurality of the lens-attached substrates 2610 having the above-described stacked carrier substrate 2611 are stacked. In this case, in all the lens-attached substrates 2610, since the lens resin portion 2613 is not protruded from the stacked carrier substrate 2611, it is possible to more easily stack the lens-attached substrates 2610.

<Other Configuration of Lens-Attached Substrate>

Figure 89:
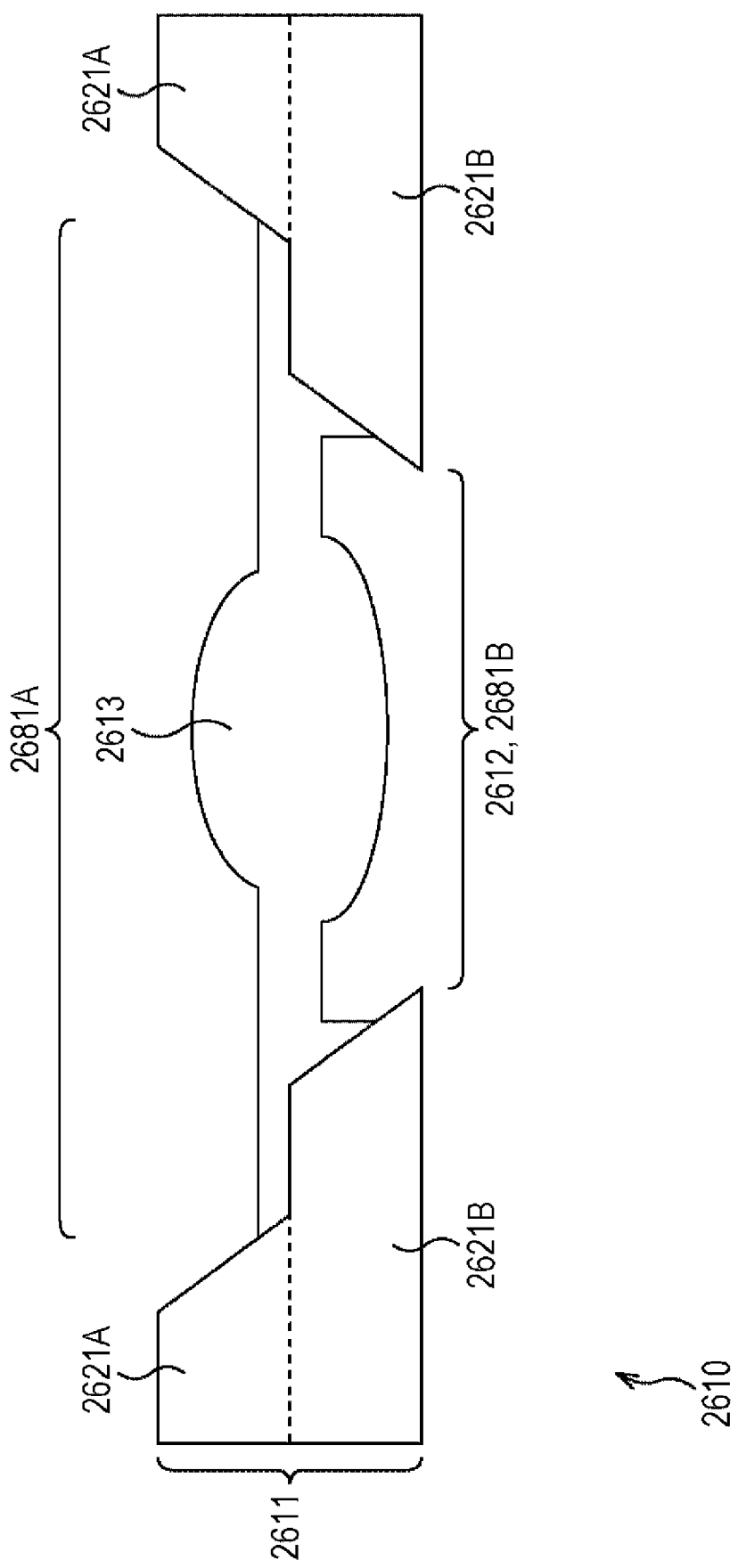
FIG. 89 is a cross-sectional diagram illustrating an example of a main configuration of a lens-attached substrate.

In addition, the size of a through-hole 2681A of a carrier substrate 2621A stacked as a component of the stacked carrier substrate 2611 and the size of a through-hole 2681B of a carrier substrate 2621B stacked as a component of the stacked carrier substrate may be configured so as not to correspond to each other. For example, like the lens-attached substrate 2610 of the example illustrated in FIG. 89, the through-hole 2681A of the carrier substrate 2621A may be larger than the through-hole 2681B of the carrier substrate 2621B. In this case, as illustrated in FIG. 89, a step difference is formed on the wall of the through-hole 2612. In this manner, by complicating the shape of the sidewall, it is possible to improve joining strength between the sidewall and the lens resin portion 2613.

<Stacked Lens Structure>

By manufacturing the lens-attached substrate constituting the stacked lens structure by using the manufacturing method described heretofore, the stacked lens structure can also obtain the same effects as those of the lens-attached substrate. In addition, only some lens-attached substrates among a plurality of the lens-attached substrates constituting the stacked lens structure may be manufactured by using the manufacturing method described heretofore.

<Camera Module>

In addition, by manufacturing the lens-attached substrate constituting the stacked lens structure included in the camera module by using the manufacturing method described heretofore, the camera module can also obtain the same effects as those of the lens-attached substrate. In addition, only some lens-attached substrates among a plurality of the lens-attached substrates constituting the camera module may be manufactured by using the manufacturing method described heretofore.

20. Example of Application to Electronic Apparatus

The above-described camera module 1 can be used in a form where the camera module is incorporated into an electronic apparatus using a solid-state image device in an image acquisition unit (photoelectric conversion unit), for example, an imaging apparatus such as a digital still camera or a video camera, a mobile terminal apparatus having an imaging function, a copier using a solid-state imaging device in an image reading unit, or the like.

Figure 90:
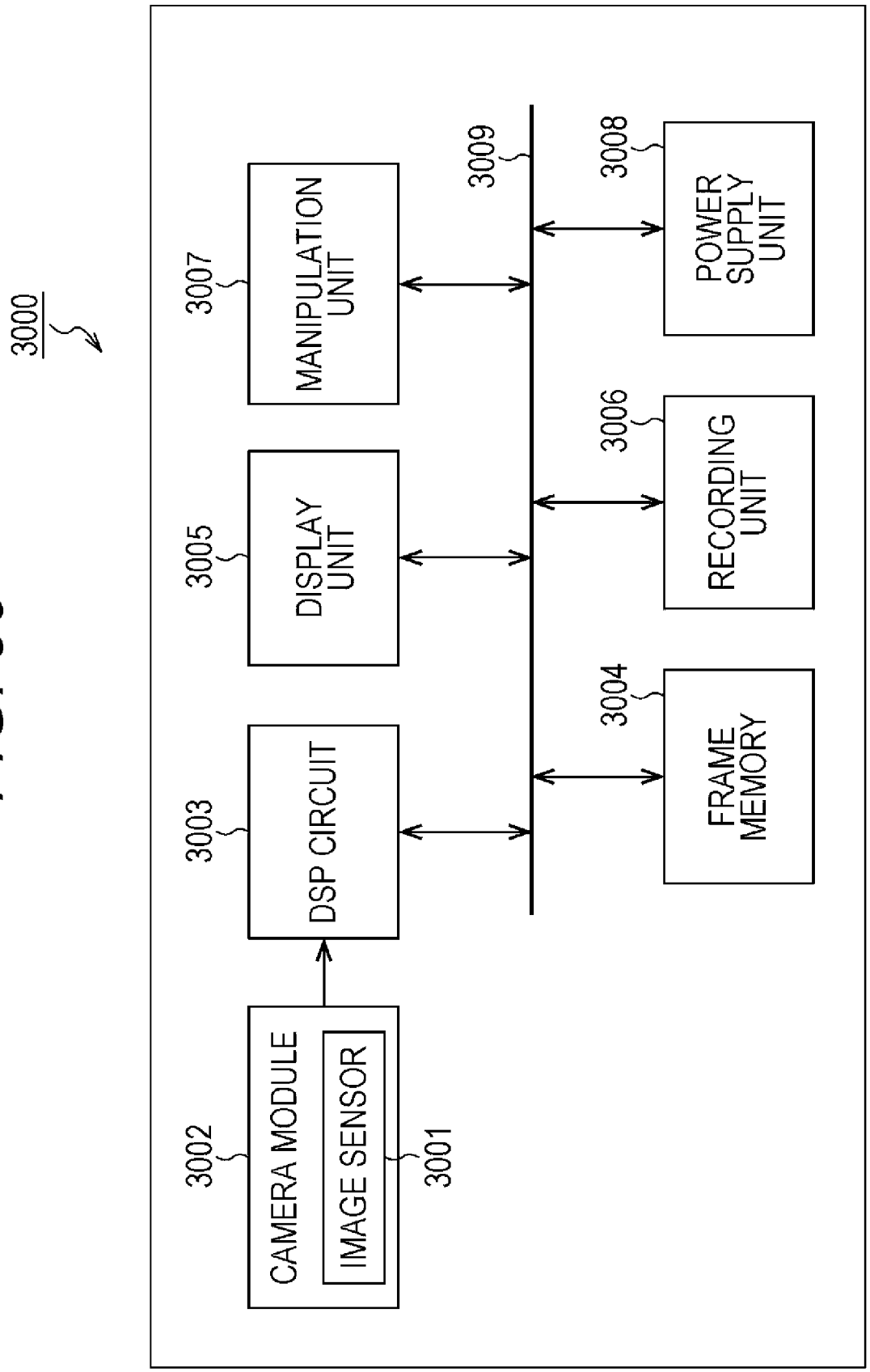
FIG. 90 is a block diagram illustrating an example of a configuration of an imaging apparatus as an electronic apparatus employing the present technology.

FIG. 90 is a block diagram illustrating an example of a configuration of an imaging apparatus as an electronic apparatus employing the present technology.

An imaging apparatus 3000 of FIG. 90 is configured to include a camera module 3002 and a digital signal processor (DSP) circuit 3003 which is a camera signal processing circuit. In addition, the imaging apparatus 3000 is configured to further include a frame memory 3004, a display unit 3005, a recording unit 3006, a manipulation unit 3007, and a power supply unit 3008. The DSP circuit 3003, the frame memory 3004, the display unit 3005, the recording unit 3006, the manipulation unit 3007, and the power supply unit 3008 are connected to each other via a bus line 3009.

The image sensor 3001 in the camera module 3002 receives incident light (image light) from a subject and converts a light amount of the incident light focused on an imaging plane into an electrical signal in units of a pixel to output a pixel signal. The above-described camera module 1 is employed as the camera module 3002, and the image sensor 3001 corresponds to the above-described light-receiving device 12.

The display unit 3005 is configured with, for example, a panel-type display device such as a liquid crystal panel or an organic electro luminescence (EL) and displays a moving picture or a still image captured by the image sensor 3001. The recording unit 3006 records the moving picture or the still image captured by the image sensor 3001 in a recording medium such as a hard disk or a semiconductor memory.

The manipulation unit 3007 issues manipulation commands with respect to various functions of the imaging apparatus 3000 according to user's manipulation. The power supply unit 3008 appropriately supplies various powers which are operating powers of the DSP circuit 3003, the frame memory 3004, the display unit 3005, the recording unit 3006 and the manipulation unit 3007 to the respective components.

As described above, the camera module 1 equipped with the stacked lens structure 11 which are position-aligned at a high accuracy and joined (stacked) is used as the camera module 3002, so that it is possible to implement high image quality and miniaturization. Therefore, with respect to the imaging apparatus 3000 such as a video camera, a digital still camera, or a camera module for a mobile device such as a mobile phone, both of the miniaturization of a semiconductor package and the high quality of captured image can be achieved.

21. Use Example of Image Sensor

The technology according to an embodiment of the present disclosure may be applied to various products. For example, the technology according to an embodiment of the present disclosure may be applied to an internal information acquisition system for a patient, which uses an endoscopic capsule.

Figure 91:
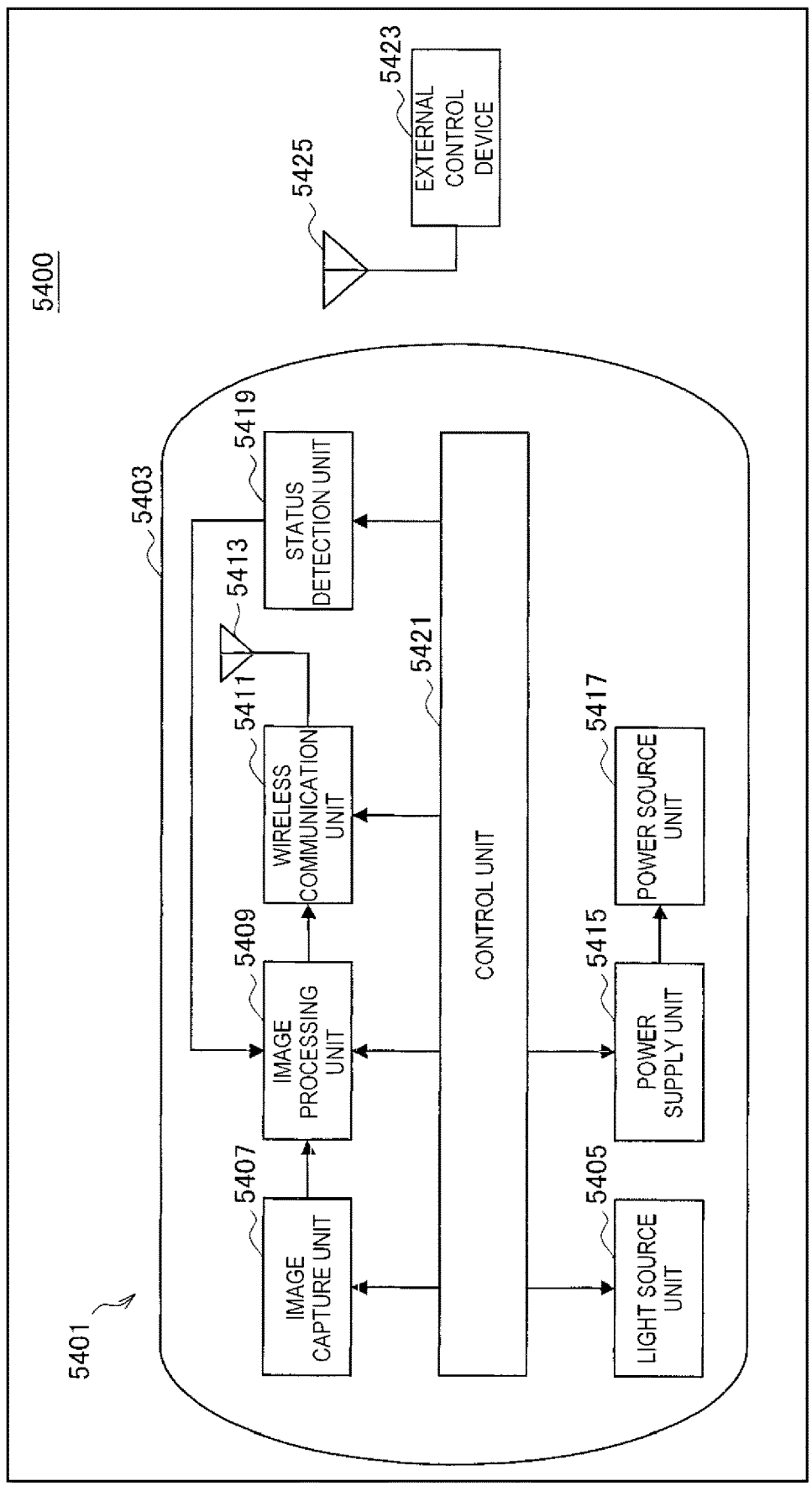
FIG. 91 is a block diagram illustrating an example of a schematic configuration of an internal information acquisition system.

FIG. 91 is a diagram illustrating an example of a schematic configuration of an internal information acquisition system 5400 to which the technology according to an embodiment of the present disclosure may be applied. Referring to FIG. 91, the internal information acquisition system 5400 includes an endoscopic capsule 5401, and an external control device 5423 that centrally controls the operation of the internal information acquisition system 5400. The endoscopic capsule 5401 is swallowed by a patient in an examination. The endoscopic capsule 5401 has an image capture function and a wireless communication function. The endoscopic capsule 5401 moves through the interior of organs such as the stomach and the intestines by peristaltic movement or the like until being excreted naturally from the patient, while also successively capturing images (hereinafter also called internal images) of the interior of the relevant organs at predetermined intervals, and successively wirelessly transmitting information about the internal images to the external control device 5423 outside the body. Based on the received information about the internal images, the external control device 5423 generates image data for displaying the internal images on a display device (not illustrated). In this way, with the internal information acquisition system 5400, images depicting the patient's internal conditions can be obtained continually from the time the endoscopic capsule 5401 is swallowed to the time the endoscopic capsule 5401 is excreted.

The configurations and functions of the endoscopic capsule 5401 and the external control device 5423 will be described in further detail. As illustrated in FIG. 91, the endoscopic capsule 5401 has the functions of a light source unit 5405, an image capture unit 5407, an image processing unit 5409, a wireless communication unit 5411, a power supply unit 5415, a power source unit 5417, a status detection unit 5419, and a control unit 5421 built in a capsule-shaped housing 5403.

The light source unit 5405 includes a light source such as a light-emitting diode (LED), for example, and irradiates the imaging field of the image capture unit 5407 with light.

The image capture unit 5407 includes an image sensor, and an optical system made up of multiple lenses provided in front of the image sensor. Reflected light (hereinafter called observation light) from the light used to irradiate a body tissue which is the object of observation is condensed by the optical system and incident on the image sensor. The image sensor receives and photoelectrically converts the observation light to thereby generate an electrical signal corresponding to the observation light, or in other words, an image signal corresponding to the observed image. The image signal generated by the image capture unit 5407 is provided to the image processing unit 5409. Note that various known image sensors such as a complementary metal-oxide-semiconductor (CMOS) image sensor or a charge-coupled device (CCD) image sensor may be used as the image sensor of the image capture unit 5407.

The image processing unit 5409 includes a processor such as a central processing unit (CPU) or a graphics processing unit (GPU), and performs various types of signal processing on the image signal generated by the image capture unit 5407. This signal processing may be a minimal level of processing (such as image data compression, frame rate conversion, data rate conversion, and/or format conversion, for example) for transmitting the image signal to the external control device 5423. Configuring the image processing unit 5409 to perform only a minimal necessary level of processing makes it possible to realize the image processing unit 5409 in a more compact form with lower power consumption, which is preferable for the endoscopic capsule 5401. However, if there is extra space or available power inside the housing 5403, additional signal processing (such as a noise removal process or other image quality-improving processes, for example) may also be performed by the image processing unit 5409. The image processing unit 5409 provides the image signal subjected to the signal processing to the wireless communication unit 5411 as raw data. Note that if information about the status (such as movement or orientation) of the endoscopic capsule 5401 is acquired by the status detection unit 5419, the image processing unit 5409 may also provide the image signal to the wireless communication unit 5411 in association with the information. This makes it possible to associate the position inside the body where an image is captured, the direction in which the image is captured and the like with the captured image.

The wireless communication unit 5411 includes a communication device capable of transmitting and receiving various types of information to and from the external control device 5423. This communication device includes, for example, an antenna 5413 and a processing circuit that performs processing such as modulation processing for transmitting and receiving signals. The wireless communication unit 5411 performs predetermined processing such as modulation processing on the image signal that was subjected to the signal processing by the image processing unit 5409, and transmits the image signal to the external control device 5423 via the antenna 5413. In addition, the wireless communication unit 5411 receives, from the external control device 5423 via the antenna 5413, a control signal related to driving control of the endoscopic capsule 5401. The wireless communication unit 5411 provides the received control signal to the control unit 5421.

The power supply unit 5415 includes, for example, an antenna coil for receiving power, a power regeneration circuit for regenerating power from a current produced in the antenna coil, and a voltage step-up circuit. In the power supply unit 5415, the principle of what is called contactless or wireless charging is used to generate power. Specifically, an external magnetic field (electromagnetic wave) of a predetermined frequency provided to the antenna coil of the power supply unit 5415 produces an induced electromotive force in the antenna coil. This electromagnetic wave may be a carrier wave transmitted from the external control device 5423 via an antenna 5425, for example. Power is regenerated from the induced electromotive force by the power regeneration circuit, and the electric potential of the power is suitably adjusted in the voltage step-up circuit, thereby generating power for power storage. The power generated by the power supply unit 5415 is stored in the power source unit 5417.

The power source unit 5417 includes a secondary battery, and stores power generated by the power supply unit 5415. FIG. 91 omits arrows or the like indicating the recipients of power from the power source unit 5417 for brevity, but power stored in the power source unit 5417 is supplied to the light source unit 5405, the image capture unit 5407, the image processing unit 5409, the wireless communication unit 5411, the status detection unit 5419, and the control unit 5421, and may be used to drive these components.

The status detection unit 5419 includes a sensor such as an acceleration sensor and/or a gyro sensor for detecting the status of the endoscopic capsule 5401. The status detection unit 5419 can acquire information about the status of the endoscopic capsule 5401 from detection results from the sensor. The status detection unit 5419 provides the acquired information about the status of the endoscopic capsule 5401 to the image processing unit 5409. As discussed earlier, in the image processing unit 5409, the information about the status of the endoscopic capsule 5401 may be associated with the image signal.

The control unit 5421 includes a processor such as a CPU, and centrally controls the operation of the endoscopic capsule 5401 by operating in accordance with a predetermined program. The control unit 5421 appropriately controls the driving of the light source unit 5405, the image capture unit 5407, the image processing unit 5409, the wireless communication unit 5411, the power supply unit 5415, the power source unit 5417, and the status detection unit 5419 in accordance with a control signal transmitted from the external control device 5423, thereby realizing the function of each component as described above.

The external control device 5423 may be a processor such as a CPU or GPU, or a device such as a microcontroller or a control board on which a processor and a storage element such as memory are mounted. The external control device 5423 includes the antenna 5425, and is capable of transmitting and receiving various types of information to and from the endoscopic capsule 5401 via the antenna 5425. Specifically, the external control device 5423 controls the operation of the endoscopic capsule 5401 by transmitting a control signal to the control unit 5421 of the endoscopic capsule 5401. For example, a light irradiation condition under which the light source unit 5405 irradiates a target of observation with light may be changed by a control signal from the external control device 5423. In addition, an image capture condition (such as the frame rate and the exposure level in the image capture unit 5407, for example) may be changed by a control signal from the external control device 5423. In addition, the content of processing in the image processing unit 5409 and a condition (such as the transmission interval and the number of images to transmit, for example) under which the wireless communication unit 5411 transmits the image signal may be changed by a control signal from the external control device 5423.

In addition, the external control device 5423 performs various types of image processing on the image signal transmitted from the endoscopic capsule 5401, and generates image data for displaying a captured internal image on a display device. For the image processing, various known signal processing, such as a development process (demosaicing process), an image quality-improving process (such as a band enhancement process, a super-resolution process, a noise reduction (NR) process, and/or a shake correction process), and/or an enlargement process (electronic zoom process), may be performed. The external control device 5423 controls the driving of a display device (not illustrated), and causes the display device to display a captured internal image on the basis of the generated image data. Alternatively, the external control device 5423 may also cause a recording device (not illustrated) to record the generated image data, or cause a printing device (not illustrated) to make a printout of the generated image data.

The above describes an example of the internal information acquisition system 5400 to which the technology according to an embodiment of the present disclosure may be applied. Among the configurations described in the foregoing, the technology according to an embodiment of the present disclosure may be applied favorably to an endoscopic capsule. Specifically, this invention is effective for downsizing an imaging device and reducing the burden on patients applying technology according to an embodiment of the present.

Figure 92:
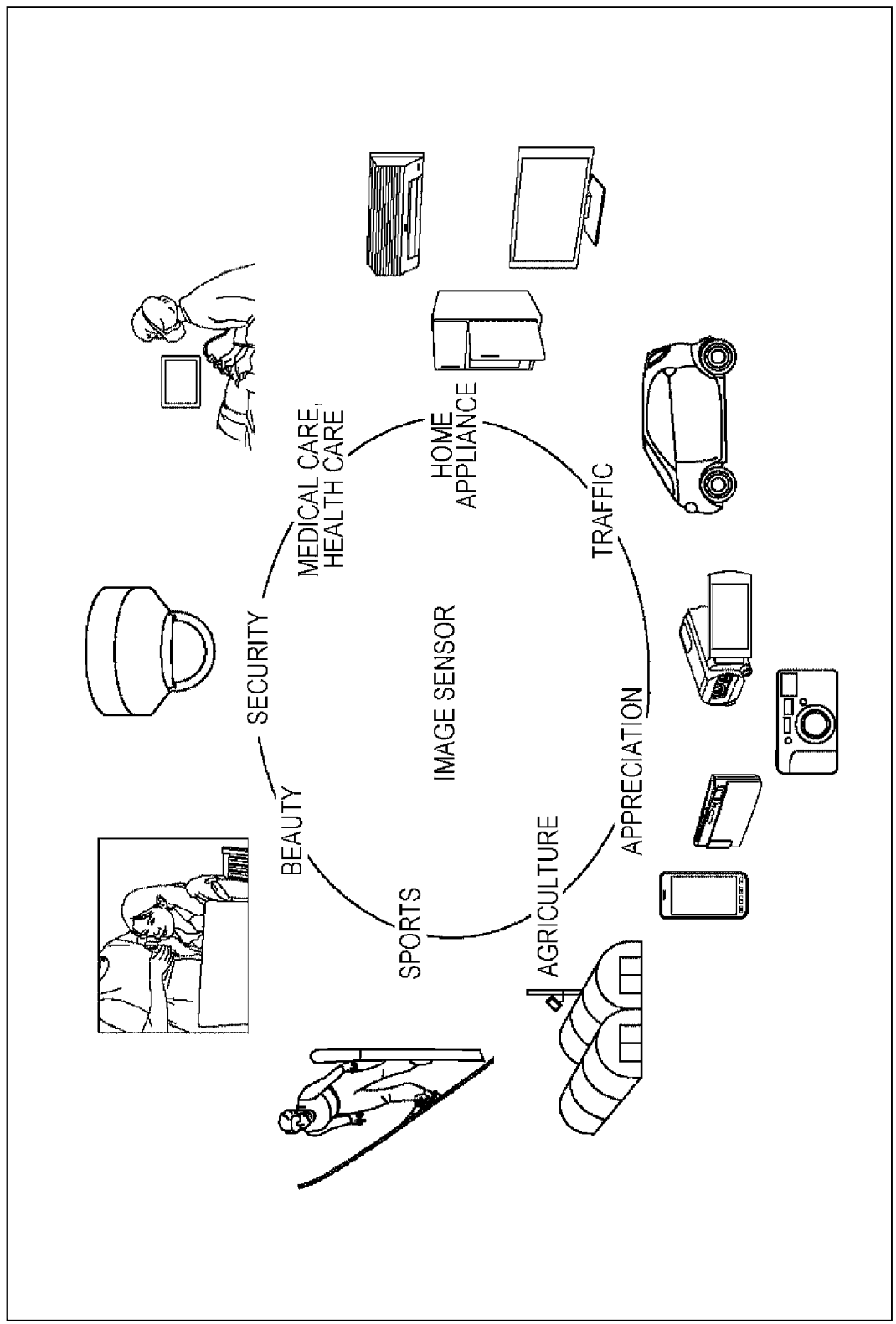
FIG. 92 is a diagram for explaining an example of use of an image sensor.

FIG. 92 is a diagram illustrating a use example using an image sensor configured as a camera module 1.

The image sensor configured as the camera module 1 can be used for various cases of sensing light such as visible light, infrared light, ultraviolet light, X-rays, for example, as follows.

Apparatuses capturing images provided for the use in appreciation such as a digital camera or a mobile apparatus with a camera function Apparatuses provided for the use in traffic such as an on-vehicle sensor imaging front and rear sides, surroundings, inside of a vehicle, a surveillance camera monitoring running vehicles and roads, or a distance measuring sensor measuring distances between vehicles for the purpose of safe driving such as automatic stop or recognition of driver's state or the like Apparatuses provided to home appliance such as a TV set, a refrigerator, or an air-conditioner to image user's gesture and manipulate the home appliance according to the gesture Apparatuses provided for the use in medical care or health care such as an endoscope or an apparatus performing angiography by receiving infrared light Apparatuses provided for the use in security such as a surveillance camera for crime prevention or a camera for person authentication Apparatuses provided for the use in beauty such as a skin measurement instrument imaging skin or a microscope imaging scalp Apparatuses provided for the use in sports such as an action camera dedicated to sports applications or a wearable camera Apparatuses provided for the use in agriculture such as a camera for monitoring states of fields or crops The embodiment of the present technique are not limited the above-described embodiments, but various changes are available within the scope without departing from the spirit of the present technique.

For example, the present technology is not limited to the application to the solid-state imaging device which detects a distribution of an incident amount of visible light and captures an image, but the present technology can be applied to a solid-state imaging device which captures a distribution of an incident amount of infrared light, X-rays, or particles or a solid-state imaging device (physical quantity distribution detection device) such as a fingerprint detection sensor which detects other physical quantities such as pressure or electrostatic capacitance and captures an image in a broad sense.

22. Software

A series of the processes described above may be performed in a hardware manner or may be performed in a software manner. In the case where a series of the processes described above are performed in a software manner, a program constituting the software is installed via a network or from a recording medium.

For example, in case of the manufacturing apparatus 2100 of FIGS. 56, 66, 72, 81, and 85, the recording medium is configured with the removable medium 2121 where a program is recorded, and the removable medium is distributed separately from an apparatus body to deliver the program to a user. The removable medium 2121 includes a magnetic disk (including a flexible disk) or an optical disk (including a CD-ROM or a DVD). In addition, the removable medium also includes an opto-magnetic disk (including an MD (Mini Disc)), a semiconductor memory, and the like. In this case, for example, the removable medium 2121 is mounted in the drive 2115, so that a program stored in the removable medium 2121 can be read to be installed in the storage unit 2113.

In addition, for example, in case of the manufacturing apparatus 2200 of FIG. 61, the recording medium is configured with the removable medium 2221 where a program is recorded, and the removable medium is distributed separately from an apparatus body to deliver the program to a user. The removable medium 2221 includes a magnetic disk or an optical disk. In addition, the removable medium also includes an opto-magnetic disk, a semiconductor memory, and the like. In this case, for example, the removable medium 2221 is mounted in the drive 2215, so that a program stored in the removable medium 2221 can be read to be installed in the storage unit 2213.

Furthermore, for example, in case of the manufacturing apparatus 2300 of FIG. 63, the recording medium is configured with the removable medium 2321 where a program is recorded, and the removable medium is distributed separately from an apparatus body to deliver the program to a user. The removable medium 2321 includes a magnetic disk or an optical disk. In addition, the removable medium also includes an opto-magnetic disk, a semiconductor memory, and the like. In this case, for example, the removable medium 2321 is mounted in the drive 2315, so that a program stored in the removable medium 2321 can be read to be installed in the storage unit 2313.

In addition, the program may be supplied through a wired or wireless transmission medium such as a local area network, the Internet, digital satellite broadcasting. For example, in case of the manufacturing apparatus 2100, the program may be received through the communication unit 2114 to be installed in the storage unit 2113. In addition, for example, in case of the manufacturing apparatus 2200, the program may be received through the communication unit 2214 to be installed in the storage unit 2213. Furthermore, for example, in case of the manufacturing apparatus 2300, the program may be received through the communication unit 2314 to be installed in the storage unit 2313.

Besides, the program may be installed in a storage unit, a ROM, or the like in advance. For example, in case of the manufacturing apparatus 2100, the program may be installed in the storage unit 2113, the ROM included in the control unit 2101, or the like in advance. In addition, for example, in case of the manufacturing apparatus 2200, the program may be installed in the storage unit 2213, the ROM included in the control unit 2201, or the like in advance. In addition, for example, in case of the manufacturing apparatus 2300, the program may be installed in the storage unit 2313, the ROM included in the control unit 2301, or the like in advance.

Furthermore, the program executed by the computer may be a program which is processed in a time sequence according to the order described in this specification or may be a program which is processed in parallel or at a necessary timing such as a calling time.

In addition, in this specification, steps describing the program recorded in the recording medium include processes which are performed in a time sequence according to the order described and processes which are not necessarily performed in a time sequence but performed in parallel or individually.

In addition, the processes of steps described above may be performed by the above-described apparatuses or an arbitrary apparatus other than the above-described apparatuses. In this case, the apparatus which performs the processes may be configured to have functions (functional blocks or the like) necessary for performing the above-described processes. In addition, information necessary for the processes may be configured to be appropriated transmitted to the apparatus.

23. Others

In addition, in this specification, a system denotes a set of a plurality of components (apparatuses, modules (parts), or the like), and it does not matter whether or not all the components are in the same housing. Therefore, a plurality of apparatuses which are accommodated in separate housings and are connected via a network are a system, and one apparatus where a plurality of modules are accommodated in one housing is also a system.

In addition, heretofore, a configuration described as one apparatus (or processing unit) may be divided to configure a plurality of apparatuses (or processing units). On the contrary, heretofore, configurations described as a plurality of apparatuses (processing units) may be collected to configure one apparatus (or processing unit). In addition, a configuration other than the above-described configurations may be added to each apparatus (or each processing unit). In addition, if configurations or operations are substantially the same in terms of the entire system, a portion of configuration of an apparatus (or processing unit) may be allowed to be included in a configuration of other apparatus (or processing unit).

Heretofore, although exemplary embodiments of the present disclosure are described in detail with reference to the attached drawings, the technical scope of the disclosure is not limited to the embodiments. It should be noted that, it is obvious that the skilled in the art which the present disclosure belongs to can contrive various changes or modifications within the scope disclosed in the claims, and these changes and modifications are also included within the scope of the present disclosure.

For example, the present technique may adopt a cloud computing configuration where one function is shared by a plurality of devices via a network to be cooperatively processed.

In addition, the steps described in the above-described flowcharts may be shared to be performed by a plurality of devices in addition to the performing of one device.

In addition, in the case where a plurality of processes are included in one step, the plurality of processes included in the one step may be shared to be performed by a plurality of devices in addition to the performing of one device.

In addition, the present technology is not limited thereto, but the present technology may be embodied as all the components included in such an apparatus or apparatuses constituting a system, for example, a processor as a system large scale integration (LSI) or the like, a module using a plurality of processors or the like, a unit using a plurality of modules or the like, or a set (some components of an apparatus) configured by adding other functions to a unit or the like.

In addition, the present technology may employ a combination of all or some of the above-described embodiments.

In addition, the effects disclosed in this specification are exemplary ones but not limited ones, and thus, there may be effects other than the effects disclosed in this specification.

In addition, the present technology may have the configurations as follows.

(1) A manufacturing apparatus of manufacturing a lens-attached substrate where a lens resin portion is formed in a through-hole of the substrate, including an adhesion unit which adheres a spacer, which is thicker than a height of the lens resin portion protruded from the substrate, to the substrate.

(2) The manufacturing apparatus disclosed in (1) further including a lens formation unit which forms the lens resin portion in the through-hole of the substrate.

(3) The manufacturing apparatus disclosed in (2), wherein the adhesion unit adheres the spacer to the substrate before the lens resin portion is formed on the substrate by the lens formation unit.

(4) The manufacturing apparatus disclosed in (2), wherein the adhesion unit adheres the spacer to the substrate after the lens resin portion is formed on the substrate by the lens formation unit.

(5) The manufacturing apparatus disclosed in any one of (1) to (4), wherein in the spacer, a through-hole is formed at a position corresponding to the through-hole of the substrate.

(6) The manufacturing apparatus disclosed in any one of (1) to (4), wherein in the spacer, a hole which does not penetrate is formed at a position corresponding to the through-hole of the substrate.

(7) The manufacturing apparatus disclosed in any one of (1) to (6), wherein the adhesion unit joins the spacer to the substrate by plasma joining.

(8) The manufacturing apparatus disclosed in any one of (1) to (6), wherein the adhesion unit adheres the spacer to the substrate by using an adhesive.

(9) The manufacturing apparatus disclosed in any one of (1) to (6), wherein the adhesion unit mounts the substrate on the spacer.

(10) The manufacturing apparatus disclosed in any one of (1) to (9) further including a peeling unit which peels off the spacer, which is adhered to the substrate by the adhesion unit, from the substrate.

(11) A manufacturing method of manufacturing a lens-attached substrate where a lens resin portion is formed in a through-hole of the substrate, including adhering a spacer, which is thicker than a height of the lens resin portion protruded from the substrate, to the substrate.

(12) A manufacturing apparatus of manufacturing a stacked lens structure using a lens-attached substrate where a lens resin portion is formed in a through-hole of the substrate, including:

a lens-attached substrate manufacturing unit including an adhesion unit which adheres a spacer, which is thicker than a height of the lens resin portion protruded from the substrate, to the substrate; and a joining unit which stacks and joins a plurality of lens-attached substrates including the lens-attached substrate manufactured by the lens-attached substrate manufacturing unit.

(13) A manufacturing method of manufacturing a stacked lens structure using a lens-attached substrate where a lens resin portion is formed in a through-hole of the substrate, including:

adhering a spacer, which is thicker than a height of the lens resin portion protruded from the substrate, to the substrate and manufacturing the lens-attached substrate; and stacking and joining a plurality of lens-attached substrates including the manufactured lens-attached substrate.

(14) A manufacturing apparatus of manufacturing a camera module including a stacked lens structure using a lens-attached substrate where a lens resin portion is formed in a through-hole of the substrate and a sensor substrate where an optical sensor is formed on the substrate, including:

a stacked lens structure manufacturing unit including a lens-attached substrate manufacturing unit including an adhesion unit which adheres a spacer, which is thicker than a height of the lens resin portion protruded from the substrate, to the substrate, and a first joining unit which stacks and joins a plurality of lens-attached substrates including the lens-attached substrate manufactured by the lens-attached substrate manufacturing unit; and a second joining unit which stacks and joins the stacked lens structure manufactured by the stacked lens structure manufacturing unit and the sensor substrate.

(15) A manufacturing method of manufacturing a camera module including a stacked lens structure using a lens-attached substrate where a lens resin portion is formed in a through-hole of the substrate and a sensor substrate where an optical sensor is formed on the substrate, including:

adhering a spacer, which is thicker than a height of the lens resin portion protruded from the substrate, to the substrate, manufacturing the lens-attached substrate, and stacking and joining a plurality of lens-attached substrates including the manufactured lens-attached substrate, thereby manufacturing the stacked lens structure; and stacking and joining the manufactured stacked lens structure and the sensor substrate.

(16) A manufacturing apparatus of manufacturing a lens-attached substrate where a lens resin portion is formed in a through-hole of the substrate, including a lens formation unit which molds the lens resin portion by using a mold frame configured with two layers of molds in an inner side of the through-hole formed in the substrate and, after the molding of the lens resin portion, in a state that one mold is adhered to the substrate, demolds the other mold from the substrate.

(17) The manufacturing apparatus disclosed in (16), wherein the lens formation unit molds the lens resin portion by interposing the lens resin portion with which the through-hole is filled between two mold frames.

(18) The manufacturing apparatus disclosed in (17), wherein one mold frame of the two mold frames is configured with the two layers of molds, and wherein, when demolding the mold frame from the substrate, the lens formation unit demolds the other mold from the substrate in a state that the one mold is adhered to the substrate with respect to the one mold frame.

(19) The manufacturing apparatus disclosed in (17), wherein both of the two mold frames are configured with the two layers of molds, and wherein, when demolding the mold frame from the substrate, the lens formation unit demolds the other mold from the substrate in a state that the one mold is adhered to the substrate with respect to each of the mold frames.

(20) The manufacturing apparatus disclosed in any one of (16) to (19) further including:

a film formation unit which forms a predetermined thin film with respect to the substrate in a state that the one mold is adhered or with respect to the lens resin portion which is formed in the substrate; and a peeling unit which peels off the one mold from the substrate after the thin film is formed by the film formation unit.

(21) A manufacturing method of manufacturing a lens-attached substrate where a lens resin portion is formed in a through-hole of the substrate, including molding the lens resin portion by using a mold frame configured with two layers of molds in an inner side of the through-hole formed in the substrate, and after the molding of the lens resin portion, in a state that one mold is adhered to the substrate, demolding the other mold from the substrate.

(22) A manufacturing apparatus of manufacturing a stacked lens structure using a lens-attached substrate where a lens resin portion is formed in a through-hole of the substrate, including:

a lens-attached substrate manufacturing unit including a lens formation unit which molds the lens resin portion by using a mold frame configured with two layers of molds in an inner side of the through-hole formed in the substrate and, after the molding of the lens resin portion, in a state that one mold is adhered to the substrate, demolds the other mold from the substrate; and a joining unit which stacks and joins a plurality of lens-attached substrates including the lens-attached substrate manufactured by the lens-attached substrate manufacturing unit.

(23) A manufacturing method of manufacturing a stacked lens structure using a lens-attached substrate where a lens resin portion is formed in a through-hole of the substrate, including:

molding the lens resin portion by using a mold frame configured with two layers of molds in an inner side of the through-hole formed in the substrate, and after the molding of the lens resin portion, in a state that one mold is adhered to the substrate, demolding the other mold from the substrate, and manufacturing the lens-attached substrate; and stacking and joining a plurality of lens-attached substrates including the manufactured lens-attached substrate.

(24) A manufacturing apparatus of manufacturing a camera module including a stacked lens structure using a lens-attached substrate where a lens resin portion is formed in a through-hole of the substrate and a sensor substrate where an optical sensor is formed on the substrate, including:

a stacked lens structure manufacturing unit including a lens-attached substrate manufacturing unit including a lens formation unit which molds the lens resin portion by using a mold frame configured with two layers of molds in an inner side of the through-hole formed in the substrate and, after the molding of the lens resin portion, in a state that one mold is adhered to the substrate, demolds the other mold from the substrate, and a first joining unit which stacks and joins a plurality of lens-attached substrates including the lens-attached substrate manufactured by the lens-attached substrate manufacturing unit; and a second joining unit which stacks and joins the stacked lens structure manufactured by the stacked lens structure manufacturing unit and the sensor substrate.

(25) A manufacturing method of manufacturing a camera module including a stacked lens structure using a lens-attached substrate where a lens resin portion is formed in a through-hole of the substrate and a sensor substrate where an optical sensor is formed on the substrate, including:

molding the lens resin portion by using a mold frame configured with two layers of molds in an inner side of the through-hole formed in the substrate, and after the molding of the lens resin portion, in a state that one mold is adhered to the substrate, demolding the other mold from the substrate, manufacturing the lens-attached substrate, and stacking and joining a plurality of lens-attached substrates including the manufactured lens-attached substrate, thereby manufacturing the stacked lens structure; and stacking and joining the manufactured stacked lens structure and the sensor substrate.

(26) A lens-attached substrate including:

a substrate where a through-hole is formed and a convex portion is formed on a light-incidence-side surface or a light-emitting-side surface; and a lens resin portion which is formed in an inner side of the through-hole, a portion of the lens resin portion being protruded from the through-hole with a height which is lower than a height of the convex portion.

(27) The lens-attached substrate disclosed in (26), wherein a concave portion is formed on a surface of the substrate facing a surface where the convex portion is formed.

(28) A stacked lens structure where a plurality of lens-attached substrates are stacked, the plurality of lens-attached substrates including the lens-attached substrate including:

a substrate where a through-hole is formed and a convex portion is formed on a light-incidence-side surface or a light-emitting-side surface; and a lens resin portion which is formed in an inner side of the through-hole, a portion of the lens resin portion being protruded from the through-hole with a height which is lower than a height of the convex portion.

(29) A camera module where a stacked lens structure and a sensor substrate are stacked, wherein in the stacked lens structure, a plurality of lens-attached substrates are stacked, and the plurality of lens-attached substrates include the lens-attached substrate including a substrate where a through-hole is formed and a convex portion is formed on a light-incidence-side surface or a light-emitting-side surface, and a lens resin portion which is formed in an inner side of the through-hole, a portion of the lens resin portion being protruded from the through-hole with a height which is lower than a height of the convex portion, and wherein in the sensor substrate, an optical sensor is formed on the substrate.

(30) A manufacturing apparatus of manufacturing a lens-attached substrate where a lens resin portion is formed in a through-hole of the substrate, including:

a convex portion formation unit which forms a convex portion on a light-incidence-side surface or a light-emitting-side surface of the substrate;

a through-hole formation unit which forms the through-hole in a portion which is not the convex portion on the surface of the substrate where the convex portion is formed by the convex portion formation unit; and a lens formation unit which forms the lens resin portion in an inner side of the through-hole formed by the through-hole formation unit so that a portion thereof is protruded from the through-hole with a height which is lower than a height of the convex portion.

(31) The manufacturing apparatus disclosed in (30), wherein the convex portion formation unit forms a step difference on a surface of the substrate by processing the substrate to form the convex portion.

(32) The manufacturing apparatus disclosed in (30), wherein the convex portion formation unit forms the convex portion by applying a different material to the surface of the substrate.

(33) The manufacturing apparatus disclosed in any one of (30) to (32), wherein the convex portion formation unit further forms a concave portion on a surface of the substrate facing a surface where the convex portion is formed.

(34) A manufacturing method of manufacturing a lens-attached substrate where a lens resin portion is formed in a through-hole of the substrate, including:

forming a convex portion on a light-incidence-side surface or a light-emitting-side surface of the substrate;

forming the through-hole in a portion which is not the convex portion on the surface of the substrate where the convex portion is formed; and forming the lens resin portion in an inner side of the formed through-hole so that a portion thereof is protruded from the through-hole with a height which is lower than a height of the convex portion.

(35) A manufacturing apparatus of manufacturing a stacked lens structure using a lens-attached substrate where a lens resin portion is formed in a through-hole of the substrate, including:

a lens-attached substrate manufacturing unit including a convex portion formation unit which forms a convex portion on a light-incidence-side surface or a light-emitting-side surface of the substrate, a through-hole formation unit which forms the through-hole in a portion which is not the convex portion on the surface of the substrate where the convex portion is formed by the convex portion formation unit, and a lens formation unit which forms the lens resin portion in an inner side of the through-hole formed by the through-hole formation unit so that a portion thereof is protruded from the through-hole with a height which is lower than a height of the convex portion; and
a joining unit which stacks and joins a plurality of lens-attached substrates including the lens-attached substrate manufactured by the lens-attached substrate manufacturing unit.

(36) A manufacturing method of manufacturing a stacked lens structure using a lens-attached substrate where a lens resin portion is formed in a through-hole of the substrate, including:
forming a convex portion on a light-incidence-side surface or a light-emitting-side surface of the substrate, forming the through-hole in a portion which is not the convex portion of a surface of the substrate where the convex portion is formed, forming the lens resin portion in an inner side of the formed through-hole so that a portion thereof is protruded from the through-hole with a height which is lower than a height of the convex portion, and manufacturing the lens-attached substrate; and
stacking and joining a plurality of lens-attached substrates including the manufactured lens-attached substrate.

(37) A manufacturing apparatus of manufacturing a camera module including a stacked lens structure using a lens-attached substrate where a lens resin portion is formed in a through-hole of the substrate and a sensor substrate where an optical sensor is formed on the substrate, including:
a stacked lens structure manufacturing unit including
a lens-attached substrate manufacturing unit including
a convex portion formation unit which forms a convex portion on a light-incidence-side surface or a light-emitting-side surface of the substrate,
a through-hole formation unit which forms the through-hole in a portion which is not the convex portion on the surface of the substrate where the convex portion is formed by the convex portion formation unit, and
a lens formation unit which forms the lens resin portion in an inner side of the through-hole formed by the through-hole formation unit so that a portion thereof is protruded from the through-hole with a height which is lower than a height of the convex portion, and
a first joining unit which stacks and joins a plurality of lens-attached substrates including the lens-attached substrate manufactured by the lens-attached substrate manufacturing unit; and
a second joining unit which stacks and joins the stacked lens structure manufactured by the stacked lens structure manufacturing unit and the sensor substrate.

(38) A manufacturing method of manufacturing a camera module including a stacked lens structure using a lens-attached substrate where a lens resin portion is formed in a through-hole of the substrate and a sensor substrate where an optical sensor is formed on the substrate, including:
forming a convex portion on a light-incidence-side surface or a light-emitting-side surface of the substrate, forming the through-hole in a portion which is not the convex portion of a surface of the substrate where the convex portion is formed, forming the lens resin portion in an inner side of the formed through-hole so that a portion thereof is protruded from the through-hole with a height which is lower than a height of the convex portion, manufacturing the lens-attached substrate, and stacking and joining a plurality of lens-attached substrates including the manufactured lens-attached substrate, thereby manufacturing the stacked lens structure; and stacking and joining the manufactured stacked lens structure and the sensor substrate.

(39) A lens-attached substrate including:
a stacked substrate where a through-hole is formed and a plurality of substrates are stacked; and
a lens resin portion which is formed in an inner side of the through-hole.

(40) The lens-attached substrate disclosed in (39), wherein a step difference is formed on a sidewall of the through-hole between the substrates of the stacked substrate.

(41) A stacked lens structure where a plurality of lens-attached substrates including a lens-attached substrate are stacked, wherein the lens-attached substrate includes:
a stacked substrate where a through-hole is formed and a plurality of substrates are stacked; and
a lens resin portion which is formed in an inner side of the through-hole.

(42) A camera module where a stacked lens structure and a sensor substrate are stacked,
wherein in the stacked lens structure, a plurality of lens-attached substrates including a lens-attached substrate are stacked, and the lens-attached substrate includes:
a stacked substrate where a through-hole is formed and a plurality of substrates are stacked; and
a lens resin portion which is formed in an inner side of the through-hole, and
wherein in the sensor substrate, an optical sensor is formed on the substrate.

(43) A manufacturing apparatus of manufacturing a lens-attached substrate where a lens resin portion is formed in a through-hole of the substrate, including:
an adhesion unit which stacks and adheres a plurality of the substrates; and
a lens formation unit which forms the lens resin portion in the through-hole formed in a stacked substrate where a plurality of the substrates are stacked and adhered by the adhesion unit.

(44) The manufacturing apparatus disclosed in (43) further including a through-hole formation unit which forms the through-hole,
wherein the lens formation unit is configured to form the lens resin portion in the through-hole formed by the through-hole formation unit.

(45) The manufacturing apparatus disclosed in (44), wherein the through-hole formation unit forms the through-hole in the stacked substrate.

(46) The manufacturing apparatus disclosed in (44),
wherein the through-hole formation unit forms the through-hole in each of the substrates before the stacking, and
wherein the adhesion unit stacks and adheres a plurality of the substrates including the substrate where the through-hole is formed by the through-hole formation unit.

(47) A manufacturing method of manufacturing a lens-attached substrate where a lens resin portion is formed in a through-hole of the substrate, including:
stacking and adhering a plurality of the substrates; and
forming the lens resin portion in the through-hole formed in a stacked substrate where a plurality of the substrates are stacked and adhered.

(48) A manufacturing apparatus of manufacturing a stacked lens structure using a lens-attached substrate where a lens resin portion is formed in a through-hole of the substrate, including:
a lens-attached substrate manufacturing unit including
an adhesion unit which stacks and adheres a plurality of the substrates, and a lens formation unit which forms the lens resin portion in the through-hole formed in a stacked substrate where a plurality of the substrates are stacked and adhered by the adhesion unit; and a joining unit which stacks and joins a plurality of lens-attached substrates including the lens-attached substrate manufactured by the lens-attached substrate manufacturing unit.

(49) A manufacturing method of manufacturing a stacked lens structure using a lens-attached substrate where a lens resin portion is formed in a through-hole of the substrate, including stacking and adhering a plurality of the substrates, forming the lens resin portion in the through-hole formed in a stacked substrate where a plurality of the substrates are stacked and adhered, manufacturing the lens-attached substrate, and stacking and joining a plurality of lens-attached substrates including the manufactured lens-attached substrate.

(50) A manufacturing apparatus of manufacturing a camera module including a stacked lens structure using a lens-attached substrate where a lens resin portion is formed in a through-hole of the substrate and a sensor substrate where an optical sensor is formed on the substrate, including:

a stacked lens structure manufacturing unit including a lens-attached substrate manufacturing unit including an adhesion unit which stacks and adheres a plurality of the substrates, and a lens formation unit which forms the lens resin portion in the through-hole formed in a stacked substrate where a plurality of the substrates are stacked and adhered by the adhesion unit, and a first joining unit which stacks and joins a plurality of lens-attached substrates including the lens-attached substrate manufactured by the lens-attached substrate manufacturing unit; and a second joining unit which stacks and joins the stacked lens structure manufactured by the stacked lens structure manufacturing unit and the sensor substrate.

(51) A manufacturing method of manufacturing a camera module including a stacked lens structure using a lens-attached substrate where a lens resin portion is formed in a through-hole of the substrate and a sensor substrate where an optical sensor is formed on the substrate, including:

stacking and adhering a plurality of the substrates, forming the lens resin portion in the through-hole formed in a stacked substrate where a plurality of the substrates are stacked and adhered, manufacturing the lens-attached substrate, and stacking and joining a plurality of lens-attached substrates including the manufactured lens-attached substrate, thereby manufacturing the stacked lens structure; and stacking and joining the manufactured stacked lens structure and the sensor substrate.

(52) A method of manufacturing a lens substrate, the method comprising:

providing a substrate that includes a through-hole with a lens portion formed therein, wherein the lens portion protrudes from the substrate; and adhering a spacer to the substrate, wherein a thickness of the spacer is greater than a height of the lens portion protruding from the substrate.

(53) The method of manufacturing according to (52), further comprising: forming the lens portion in the through-hole of the substrate.

(54) The method of manufacturing according to (53), further comprising: adhering the spacer to the substrate before the lens portion is formed in the through-hole.

(55) The method of manufacturing according to (53), further comprising: adhering the spacer to the substrate after the lens portion is formed in the through-hole.

(56) The method of manufacturing according to any one of (52) to (55), wherein the spacer includes a through-hole disposed at a position corresponding to the through-hole of the substrate.

(57) The method of manufacturing according to any one of (52) to (56), wherein the spacer includes a concave portion disposed at a position corresponding to the through-hole of the substrate.

(58) The method of manufacturing according to any one of (52) to (57), wherein plasma bonding is used to adhere the spacer to the substrate.

(59) The method of manufacturing according to any one of (52) to (58), wherein an adhesive adheres the spacer to the substrate.

(60) The method of manufacturing according to any one of (52) to (59), wherein the substrate is mounted on the spacer.

(61) The method of manufacturing according to any one of (52) to (60), further comprising: removing the spacer from the substrate.

(62) The method of manufacturing according to any one of (52) to (61), further comprising: stacking and bonding a plurality of lens substrates, wherein each lens substrate of the plurality of lens substrates includes a through-hole with a lens portion formed therein.

(63) A method of manufacturing a substrate including a lens, the method comprising:

forming a through-hole in the substrate;

forming a lens portion in the through-hole of the substrate, the lens portion having a protruding portion that protrudes from the substrate; and adhering a spacer to the substrate, wherein a thickness of the spacer is greater than a height of the lens portion protruding from the substrate.

(64) A method of manufacturing a lens substrate, the method comprising:

providing a substrate that includes a through-hole with lens material disposed therein;

molding the lens material into a lens portion using a mold frame, wherein a first portion of the mold frame contacts the lens material and a second portion of the mold frame adheres to a side of the substrate; and after molding the lens material into the lens portion, disengaging the first portion of the mold frame from the lens portion.

(65) The method of manufacturing according to (64), further comprising: forming the lens portion by compressing the lens material between the mold frame and a second mold frame.

(66) The method of manufacturing according to (64), further comprising: disengaging the second mold frame from the substrate.

(67) The method of manufacturing according to (64), wherein a third portion of the second mold frame contacts the lens material and a fourth portion of the second mold frame adheres to a second side of the substrate when molding the lens material into the lens portion, and the third portion of the second mold frame is disengaged from the lens portion before the first portion of the first mold frame is disengaged from the lens portion.

(68) The method of manufacturing according to any one of (63) to (67), further comprising:
forming a film on at least a portion of the substrate; and
removing the second portion of the mold frame from the substrate after forming the film.
(69) The method of manufacturing according to any one of (63) to (68), further comprising: stacking and bonding a plurality of lens substrates, wherein each lens substrate of the plurality of lens substrates includes a through-hole with a lens portion formed therein.
(70) A method of manufacturing a camera module including a stacked lens structure and a sensor substrate including an optical sensor, the method comprising:
providing a substrate that includes a through-hole with a lens portion formed therein, wherein the lens portion protrudes from the substrate;
adhering a spacer to the substrate, wherein a thickness of the spacer is greater than a height of the lens portion protruding from the substrate;
removing the spacer from the substrate;
stacking and bonding a plurality of lens substrates to form the stacked lens structure, wherein each lens substrate of the plurality of lens substrates includes a through-hole with a lens portion formed therein; and
stacking and bonding the stacked lens structure and the sensor substrate.
(71) A method of manufacturing a camera module including a stacked lens structure and a sensor substrate including an optical sensor, the method comprising:
providing a substrate that includes a through-hole with lens material disposed therein;
molding the lens material into a lens portion using a mold frame, wherein a first portion of the mold frame contacts the lens material and a second portion of the mold frame adheres to a side of the substrate;
after molding the lens material into the lens portion, disengaging the first portion of the mold frame from the lens portion;
removing the second portion of the mold frame from the side of the substrate;
stacking and bonding a plurality of lens substrates to form the stacked lens structure, wherein each lens substrate of the plurality of lens substrates includes a through-hole with a lens portion formed therein; and
stacking and bonding the stacked lens structure and the sensor substrate.
(72) A lens substrate comprising:
a substrate including a through-hole and a convex portion formed on a light-incidence-side surface of the substrate or a light-emitting-side surface of the substrate; and
a lens portion formed at an inner side of the through-hole, wherein part of the lens portion protrudes from the through-hole with a height which is lower than a height of the convex portion.
(73) The lens substrate according to (72), wherein a concave portion is formed on a surface of the substrate facing the light-incidence-side surface of the substrate or the light-emitting-side surface of the substrate where the convex portion is formed.
(74) A stacked lens structure including a plurality of stacked lens substrates, each lens substrate of the plurality of stacked lens substrates comprising:
a substrate including a through-hole and a convex portion formed on a light-incidence-side surface of the substrate or a light-emitting-side surface of the substrate; and
a lens portion formed at an inner side of the through-hole, wherein part of the lens portion protrudes from the through-hole and has a height which is lower than a height of the convex portion.
(75) A camera module comprising:
a stacked lens structure including a plurality of stacked lens substrates, each lens substrate of the plurality of stacked lens substrates including:
a substrate including a through-hole and a convex portion formed on a light-incidence-side surface of the substrate or a light-emitting-side surface of the substrate, and
a lens portion formed at an inner side of the through-hole, wherein part of the lens portion protrudes from the through-hole and has a height which is lower than a height of the convex portion; and
an optical sensor formed on a sensor substrate, wherein the sensor substrate and the stacked lens structure are stacked.
(76) A method of manufacturing a lens substrate, the method comprising:
forming a convex portion on a light-incidence-side surface of a substrate or a light-emitting-side surface of the substrate;
forming a through-hole in the lens substrate; and
forming a lens portion at an inner side of the through-hole so that a portion thereof protrudes from the through-hole with a height which is lower than a height of the convex portion.
(77) The method of manufacturing according to (76), wherein a step difference on a surface of the substrate is formed by processing the substrate to form the convex portion.
(78) The method of manufacturing according to (76) or (77), wherein the convex portion is formed by applying a different material to the surface of the substrate.
(79) The method of manufacturing according to any one of (76) to (78), further comprising:
forming a concave portion on a surface of the substrate facing a surface where the convex portion is formed.
(80) A method of manufacturing a stacked lens structure, the method comprising:
forming a convex portion on a light-incidence-side surface of a lens substrate or a light-emitting-side surface of the lens substrate,
forming a through-hole in the substrate
forming a lens portion at an inner side of the through-hole so that a portion thereof protrudes from the through-hole with a height which is lower than a height of the convex portion; and
stacking and bonding a plurality of lens substrates to form a stacked lens structure,
wherein each lens substrate of the plurality of lens substrates includes a through-hole with a lens portion formed therein.
(81) A method of manufacturing a stacked lens structure, the method comprising:
forming a convex portion on a light-incidence-side surface of a lens substrate or a light-emitting-side surface of the lens substrate, forming a through-hole in the lens substrate, forming a lens portion at an inner side of the through-hole so that a portion thereof protrudes from the through-hole with a height which is lower than a height of the convex portion, and stacking and bonding a plurality of lens substrates.
(82) A method of manufacturing a camera module including a stacked lens structure and a sensor substrate including an optical sensor, the method comprising:

forming a convex portion on a light-incidence-side surface of a lens substrate or a light-emitting-side surface of the lens substrate, forming a through-hole in the lens substrate, and forming a lens portion at an inner side of the through-hole so that a portion thereof protrudes from the through-hole with a height which is lower than a height of the convex portion, and stacking and bonding a plurality of lens substrates to form a stacked lens structure, wherein each lens substrate of the plurality of lens substrates includes a through-hole with a lens portion formed therein; and stacking and bonding the stacked lens structure and the sensor substrate.

(83) A lens substrate comprising:

a stacked substrate including a plurality of substrates;

a through-hole formed in the stacked substrate; and a lens portion formed at an inner side of the through-hole.

(84) The lens substrate according to (83), further comprising:

a step difference at a sidewall of the through-hole between the plurality of substrates of the stacked substrate.

(85) A stacked lens structure including a plurality of stacked lens substrates, each lens substrate of the plurality of stacked lens substrates comprising:

a stacked substrate including a plurality of substrates;

a through-hole formed in the stacked substrate; and a lens portion formed at an inner side of the through-hole.

(86) A camera module including a stacked lens structure stacked on a sensor substrate, the camera module comprising:

a stacked lens structure including a plurality of stacked lens substrates, each lens substrate of the plurality of stacked lens substrates including:

a stacked substrate including a plurality of substrates, a through-hole formed in the stacked substrate, and a lens portion formed at an inner side of the through-hole, wherein the sensor substrate includes an optical sensor.

(87) A method of manufacturing a lens substrate, the method comprising:

stacking and adhering a plurality of substrates thereby forming a stacked substrate;

forming a through-hole in the stacked substrate; and forming a lens portion in the through-hole.

(88) The method of manufacturing according to (87), wherein a lens formation unit forms the lens portion in the through-hole.

(89) The method of manufacturing according to (88), wherein a through-hole formation unit forms the through-hole in the stacked substrate.

(90) The method of manufacturing according to any one of (87) to (89), further comprising: forming the through-hole in each substrate of the plurality of substrates before the substrates are stacked.

(91) A method of manufacturing a stacked lens structure including a lens substrate, comprising: stacking and adhering a plurality of substrates, forming a lens portion in a through-hole formed in a stacked substrate where a plurality of the substrates are stacked and adhered, and stacking and bonding a plurality of lens substrates to form a stacked lens structure.

(92) A method of manufacturing a camera module including a stacked lens structure and a sensor substrate including an optical sensor, the method comprising:

stacking and adhering a plurality of substrates, forming a lens portion in a through-hole formed in a stacked substrate where a plurality of the substrates are stacked and adhered, and stacking and bonding a plurality of lens substrates thereby forming a stacked lens structure, wherein each lens substrate of the plurality of lens substrates includes a through-hole with a lens portion formed therein; and stacking and bonding the stacked lens structure and the sensor substrate.

REFERENCE SIGNS LIST

1 Camera module
11 Stacked lens structure
12 Light-receiving device
13 Optical unit
21 Lens
41 (41a to 41e)Lens-attached substrate
43 Sensor substrate
51 Aperture stop plate
52 Aperture portion
81 Carrier substrate
82 Lens resin portion
83 Through-hole
121 Light-shielding film
122 Upper surface layer
123 Lower surface layer
141 Etching mask
142 Protective film
2010 Lens-attached substrate
2011 Carrier substrate
2012 Through-hole
2013 Lens resin portion
2021 Spacer substrate
2022 Hole
2100 Manufacturing apparatus
2101 Control unit
2102 Lens-attached substrate manufacturing unit
2131 Carrier substrate processing unit
2132 Lens formation unit
2133 Spacer substrate adhesion unit
2134 Surface layer formation unit
2135 Light-shielding film formation unit
2136 Spacer substrate peeling unit
2151 Lens-attached substrate
2200 Manufacturing apparatus
2201 Control unit
2202 Stacked lens structure manufacturing unit
2231 Lens-attached substrate manufacturing unit
2232 Lens-attached substrate joining unit
2300 Manufacturing apparatus
2301 Control unit
2302 Camera module manufacturing unit
2331 Stacked lens structure manufacturing unit
2332 Sensor substrate manufacturing unit
2333 Joining unit
2334 Dicing unit
2335 Modularization unit
2401 Lower mold frame
2410 Lower mold frame
2411 and 2412 Mold
2436 Mold peeling unit
2441 Upper mold frame
2450 Monolithic type wafer-level lens
2451 Resin
2460 Hybrid-type wafer-level lens
2461 Glass substrate
2462 Resin 2470 One-side hybrid type wafer-level lens
2480 Upper mold frame
2481 and 2482 Mold
2510 Lens-attached substrate
2511 Carrier substrate
2512 Through-hole
2513 Lens resin portion
2521 Convex portion
2551 Surface processing unit
2552 Through-hole formation unit
2561 Concave portion
2610 Lens-attached substrate
2611 Stacked carrier substrate
2612 Through-hole
2613 Lens resin portion
2621 Carrier substrate
2641 Carrier substrate joining unit
2642 Stacked carrier substrate processing unit
2660 Stacked lens structure
2671 Carrier substrate processing unit
2672 Carrier substrate joining unit
2681 Through-hole
3000 Imaging apparatus
3001 Image sensor
3002 Camera module

What is claimed is:

1. A method of manufacturing a lens substrate, the method comprising:
providing the lens substrate that includes a through-hole with a lens portion formed therein, wherein the lens portion protrudes from the lens substrate;
adhering a spacer to the lens substrate, wherein the spacer has substantially a same size and shape as that of the lens substrate, wherein a hole in the spacer is disposed at a position corresponding to the through-hole of the lens substrate, wherein a thickness of the spacer is greater than a height of the lens portion protruding from the lens substrate; and,
after removing the spacer from the lens substrate, stacking and bonding said lens substrate with a plurality of lens substrates to form a stacked lens structure.

2. The method of manufacturing according to claim 1, further comprising:
adhering the spacer to the lens substrate before the lens portion is formed in the through-hole.

3. The method of manufacturing according to claim 1, further comprising:
adhering the spacer to the lens substrate after the lens portion is formed in the through-hole.

4. The method of manufacturing according to claim 1, wherein the spacer includes a concave portion disposed at the position corresponding to the through-hole of the lens substrate.

5. The method of manufacturing according to claim 1, wherein plasma bonding is used to adhere the spacer to the lens substrate.

6. The method of manufacturing according to claim 1, wherein an adhesive adheres the spacer to the lens substrate.

7. The method of manufacturing according to claim 1, wherein each lens substrate of the plurality of lens substrates includes a through-hole with a lens portion formed therein.

8. A method of manufacturing a substrate including a lens, the method comprising:
forming a through-hole in the substrate;
forming a lens portion in the through-hole of the substrate, the lens portion having a protruding portion that protrudes from the substrate; and
adhering a spacer to the substrate, wherein the spacer has substantially the same size and shape as that of the substrate, wherein a hole in the spacer is disposed at a position corresponding to the through-hole of the substrate, wherein a thickness of the spacer is greater than a height of the lens portion protruding from the substrate;
removing the spacer from the substrate; and
stacking and bonding said substrate with a plurality of substrates to form a stacked lens structure.

* * * * *